US012581851B2

(12) United States Patent
Lee et al.

(10) Patent No.: US 12,581,851 B2
(45) Date of Patent: Mar. 17, 2026

(54) ORGANIC ELECTROLUMINESCENT DEVICE

(71) Applicant: ROHM AND HAAS ELECTRONIC MATERIALS KOREA LTD, Chungcheongnam-do (KR)

(72) Inventors: Tae-Jin Lee, Gyeonggi-do (KR); Dong-Hyung Lee, Gyeonggi-do (KR); Bitnari Kim, Gyeonggi-do (KR); Hong-Se Oh, Gyeonggi-do (KR); Young-Kwang Kim, Gyeonggi-do (KR)

(73) Assignee: DuPont Specialty Materials Korea Ltd. (KR)

( * ) Notice: Subject to any disclaimer, the term of this patent is extended or adjusted under 35 U.S.C. 154(b) by 0 days.

(21) Appl. No.: 16/333,642

(22) PCT Filed: Oct. 11, 2017

(86) PCT No.: PCT/KR2017/011178
§ 371 (c)(1),
(2) Date: Mar. 15, 2019

(87) PCT Pub. No.: WO2018/070773
PCT Pub. Date: Apr. 19, 2018

(65) Prior Publication Data

US 2019/0259947 A1 Aug. 22, 2019

(30) Foreign Application Priority Data

Oct. 11, 2016 (KR) ........................ 10-2016-0131398
Sep. 22, 2017 (KR) ........................ 10-2017-0122792

(51) Int. Cl.

| | |
|---|---|
| ***H01L 51/00*** | (2006.01) |
| ***H10K 85/60*** | (2023.01) |
| *H10K 50/11* | (2023.01) |
| *H10K 50/15* | (2023.01) |
| *H10K 101/00* | (2023.01) |
| *H10K 101/10* | (2023.01) |

(52) U.S. Cl.
CPC ......... *H10K 85/633* (2023.02); *H10K 85/615* (2023.02); *H10K 85/636* (2023.02); *H10K 85/654* (2023.02); *H10K 85/6572* (2023.02); *H10K 85/6574* (2023.02); *H10K 85/6576* (2023.02); *H10K 50/11* (2023.02); *H10K 50/15* (2023.02); *H10K 50/156* (2023.02); *H10K 2101/10* (2023.02); *H10K 2101/90* (2023.02)

(58) Field of Classification Search
None
See application file for complete search history.

(56) References Cited

U.S. PATENT DOCUMENTS

| | | | | |
|---|---|---|---|---|
| 2010/0187977 | A1 | 7/2010 | Kai et al. | |
| 2012/0104940 | A1* | 5/2012 | Shin | C09K 11/06 585/27 |
| 2012/0161615 | A1* | 6/2012 | Hong | C07D 213/74 313/504 |
| 2015/0263293 | A1 | 9/2015 | Hwang et al. | |
| 2016/0028014 | A1 | 1/2016 | Kim et al. | |
| 2018/0182972 | A1* | 6/2018 | So | C07D 209/88 |

FOREIGN PATENT DOCUMENTS

| | | | |
|---|---|---|---|
| KR | 2016-0111559 | A | 9/2016 |
| WO | WO-2008/056746 | A1 * | 5/2008 |
| WO | 2010050778 | A1 | 5/2010 |
| WO | WO-2010/114243 | * | 10/2010 |
| WO | WO-2010/147318 | A2 * | 12/2010 |
| WO | WO-2015/084114 | A1 * | 6/2015 |
| WO | WO-2016/200070 | A2 * | 12/2016 |
| WO | 2017191896 | A1 | 11/2017 |
| WO | WO-2018/026197 | A1 * | 2/2018 |

OTHER PUBLICATIONS

Machine English Translation of Lee et al. (WO 2018/026197 A1). Jan. 23, 2023.*

Search Report for Chinese Patent Application No. 201780059142.7; Application Date: Oct. 11, 2017.

* cited by examiner

*Primary Examiner* — Jay Yang
(74) *Attorney, Agent, or Firm* — G. Creston Campbell

(57) ABSTRACT

The present disclosure relates to an organic electroluminescent device. The organic electroluminescent device of the present disclosure can provide a low driving voltage and excellent luminous efficiency by comprising a specific combination of a host compound and a hole transport material.

6 Claims, No Drawings

ORGANIC ELECTROLUMINESCENT DEVICE

TECHNICAL FIELD

The present disclosure relates to an organic electroluminescent device.

BACKGROUND ART

An electroluminescent device (EL device) is a self-light-emitting display device which has advantages in that it provides a wider viewing angle, a greater contrast ratio, and a faster response time. The first organic EL device was developed by Eastman Kodak in 1987, by using small aromatic diamine molecules and aluminum complexes as materials for forming a light-emitting layer [Appl. Phys. Lett. 51, 913, 1987].

An organic EL device (OLED) changes electric energy into light by applying electricity to an organic light-emitting material, and commonly comprises an anode, a cathode, and a medium layer formed between the two electrodes. The medium layer of the organic EL device may comprise a hole injection layer, a hole transport layer, an electron blocking layer, a light-emitting layer, an electron buffer layer, a hole blocking layer, an electron transport layer, an electron injection layer, etc. The materials used in the medium layer are classified into a hole injection material, a hole transport material, an electron blocking material, a light-emitting material, an electron buffer material, a hole blocking material, an electron transport material, an electron injection material, etc., depending on functions. In the organic EL device, holes from an anode and electrons from a cathode are injected into a light-emitting layer by the application of electric voltage, and an exciton having high energy is produced by the recombination of the holes and electrons. The organic light-emitting compound moves into an excited state by the energy and emits light from energy when the organic light-emitting compound returns to the ground state from the excited state.

A low molecular green light-emitting organic electroluminescent device was developed by Tang, etc., of Eastman Kodak in 1987 by using TPD/ALq3 bi-layer consisting of a light-emitting layer and a charge transport layer. Thereafter, the development of organic EL devices was rapidly effected and the devices were currently commercialized. Current organic EL devices mostly use phosphorescent materials with excellent luminous efficiency for panel manufacture. For long-term use and high resolution of the display, a low driving voltage and high efficiency are required. If the efficiency is high, there is a problem in that lifespan decreases and driving voltage increases. If the driving voltage is low, there is a problem in that the efficiency is low. In order to obtain low driving voltage, it is possible to use a hole transport layer wherein the mobility of the holes is fast and a light-emitting layer of which the driving voltage is low. However, this causes a decrease of efficiency.

Korean Patent Appln. Laying-Open No. 2015-0066202 discloses an organic electroluminescent device using a compound wherein a diarylamine, etc., is bonded to a 5-membered ring and a benzene ring, respectively, of a benzo[b]fluorene in a hole transport layer. However, the reference does not specifically disclose applying to an organic electroluminescent device a combination of a compound wherein a diarylamine is bonded at the fifth carbon position of a naphthalene ring of a benzo[b]fluorene and a compound wherein a nitrogen-containing heteroaryl is bonded to a nitrogen atom of an indolocarbazole.

DISCLOSURE OF THE INVENTION

Problems to be Solved

The objective of the present disclosure is to provide an organic electroluminescent device having a low driving voltage and excellent luminous efficiency by comprising a specific combination of compounds in a hole transport zone and a light-emitting layer.

Solution to Problems

The present inventors found that the problem of the decrease of the efficiency when lowering the driving voltage can be improved by an organic electroluminescent device comprising: a first electrode; a second electrode opposing the first electrode; one or more light-emitting layers disposed between the first electrode and the second electrode; and a hole transport zone of one or more layers disposed between the first electrode and the light-emitting layer, wherein at least one layer of the hole transport zone comprises a compound represented by the following formula 1, and at least one layer of the light-emitting layers comprises a compound represented by the following formula 2:

(1)

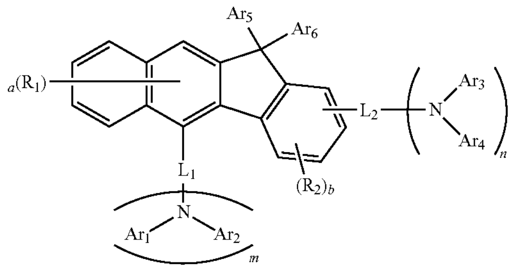

(2)

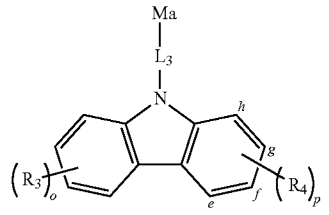

(2-a)

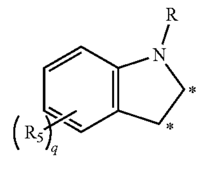

wherein $Ar_1$ to $Ar_6$ each independently represent a substituted or unsubstituted (C1-C30)alkyl, a substituted or unsubstituted (C6-C30)aryl, a substituted or unsubstituted (5- to 30-membered)heteroaryl, or a substituted or unsubstituted spiro[fluorene-(C3-C30)cycloalkane]; or $Ar_1$ and $Ar_2$, $Ar_3$ and $Ar_4$, and $Ar_5$ and $Ar_6$ are linked to each other to form a mono- or polycyclic, (3- to 30-membered) alicyclic or aromatic ring, or the combination thereof, whose carbon atom(s) may be replaced with at least one hetero atom selected from nitrogen, oxygen, and sulfur;

$L_1$ represents a single bond, a substituted or unsubstituted (C6-C30)arylene, or a substituted or unsubstituted (5- to 30-membered)heteroarylene;

$L_2$ represents a single bond, a substituted or unsubstituted (C1-C30)alkylene, a substituted or unsubstituted (C6-C30)arylene, or a substituted or unsubstituted (5- to 30-membered)heteroarylene, with a proviso that where n is 0, $L_2$ does not exist;

$R_1$ and $R_2$ each independently represent hydrogen, deuterium, a halogen, a substituted or unsubstituted (C1-C30)alkyl, a substituted or unsubstituted (C6-C30)aryl, a substituted or unsubstituted (5- to 30-membered) heteroaryl, a substituted or unsubstituted (C3-C30) cycloalkyl, a substituted or unsubstituted (3- to 7-membered)heterocycloalkyl, a substituted or unsubstituted (C6-C30)aryl(C1-C30)alkyl, $—NR_{11}R_{12}$, $—SiR_{13}R_{14}R_{15}$, $—SR_{16}$, $—OR_{17}$, a cyano, a nitro, or a hydroxyl; or are linked to an adjacent substituent(s) to form a mono- or polycyclic, (3- to 30-membered) alicyclic or aromatic ring, or the combination thereof, whose carbon atom(s) may be replaced with at least one hetero atom selected from nitrogen, oxygen, and sulfur;

$R_{11}$ to $R_{17}$ each independently represent hydrogen, deuterium, a halogen, a substituted or unsubstituted (C1-C30)alkyl, a substituted or unsubstituted (C6-C30)aryl, a substituted or unsubstituted (5- to 30-membered) heteroaryl, a substituted or unsubstituted (3- to 7-membered)heterocycloalkyl, or a substituted or unsubstituted (C3-C30)cycloalkyl; or are linked to an adjacent substituent(s) to form a mono- or polycyclic, (3- to 30-membered) alicyclic or aromatic ring, or the combination thereof, whose carbon atom(s) may be replaced with at least one hetero atom selected from nitrogen, oxygen, and sulfur;

m represents an integer of 1 to 2, where m is 2, each of $NAr_1Ar_2$ may be the same or different;

n represents an integer of 0 to 2, where n is 2, each of $NAr_3Ar_4$ may be the same or different;

a represents an integer of 1 to 5, where a is an integer of 2 or more, each of $R_1$ may be the same or different;

b represents an integer of 1 to 4, where b is an integer of 2 or more, each of $R_2$ may be the same or different;

Ma represents a substituted or unsubstituted nitrogen-containing (3- to 30-membered)heteroaryl;

$L_3$ represents a single bond, a substituted or unsubstituted (C6-C30)arylene, or a substituted or unsubstituted nitrogen-containing (3- to 30-membered)heteroarylene;

formula 2 and formula 2-a are fused at the positions of e and f, f and g, or g and h of formula 2 and at the positions of * of formula 2-a to form a ring;

$R_3$ to $R_5$ each independently represent hydrogen, deuterium, a substituted or unsubstituted (C1-C30)alkyl, a substituted or unsubstituted (C6-C30)aryl(C1-C30)alkyl, a substituted or unsubstituted (C6-C30)aryl, a substituted or unsubstituted (C1-C30)alkyl(C6-C30) aryl, a substituted or unsubstituted (3- to 30-membered) heteroaryl, a substituted or unsubstituted (C3-C30) cycloalkyl, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl (C6-C30)arylamino;

R represents hydrogen, deuterium, a substituted or unsubstituted (C1-C30)alkyl, a substituted or unsubstituted (C6-C30)aryl(C1-C30)alkyl, a substituted or unsubstituted (C6-C30)aryl, a substituted or unsubstituted (C1-C30)alkyl(C6-C30)aryl, a substituted or unsubstituted (3- to 30-membered)heteroaryl, a substituted or unsubstituted (C3-C30)cycloalkyl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino;

and q each independently represent an integer of 1 to 4, and p represents an integer of 1 to 2, where o, p, and q are an integer of 2 or more, each of $R_3$ to $R_5$ may be the same or different;

the heteroaryl(ene) contains at least one hetero atom selected from B, N, O, S, Si, and P; and the heterocycloalkyl contains at least one hetero atom selected from O, S, and N.

Effects of the Invention

According to the present disclosure, an organic electroluminescent device having a low driving voltage and excellent luminous efficiency can be provided, and it is possible to produce a display device or a lighting device using the same.

EMBODIMENTS OF THE INVENTION

Hereinafter, the present disclosure will be described in detail. However, the following description is intended to explain the disclosure, and is not meant in any way to restrict the scope of the disclosure.

The term “organic electroluminescent compound” in the present disclosure means a compound that may be used in an organic electroluminescent device, and may be comprised in any layer constituting an organic electroluminescent device, as necessary.

The term “organic electroluminescent material” in the present disclosure means a material that may be used in an organic electroluminescent device, and may comprise at least one compound. The organic electroluminescent material may be comprised in any layer constituting an organic electroluminescent device, as necessary. For example, the organic electroluminescent material may be a hole injection material, a hole transport material, a hole auxiliary material, a light-emitting auxiliary material, an electron blocking material, a light-emitting material, an electron buffer material, a hole blocking material, an electron transport material, or an electron injection material.

Hereinafter, the organic electroluminescent device of the present disclosure will be described in detail.

Herein, “(C1-C30)alkyl(ene)” is meant to be a linear or branched alkyl having 1 to 30 carbon atoms constituting the chain, in which the number of carbon atoms is preferably 1 to 10, more preferably 1 to 6, and includes methyl, ethyl, n-propyl, isopropyl, n-butyl, isobutyl, tert-butyl, etc. “(C2-C30)alkenyl” is meant to be a linear or branched alkenyl having 2 to 30 carbon atoms constituting the chain, in which the number of carbon atoms is preferably 2 to 20, more preferably 2 to 10, and includes vinyl, 1-propenyl, 2-propenyl, 1-butenyl, 2-butenyl, 3-butenyl, 2-methylbut-2-enyl, etc. "(C2-C30)alkynyl" is a linear or branched alkynyl having 2 to 30 carbon atoms constituting the chain, in which the number of carbon atoms is preferably 2 to 20, more preferably 2 to 10, and includes ethynyl, 1-propynyl, 2-propynyl, 1-butynyl, 2-butynyl, 3-butynyl, 1-methylpent-2-ynyl, etc. "(C3-C30)cycloalkyl" is a mono- or polycyclic hydrocarbon having 3 to 30 ring backbone carbon atoms, in which the number of carbon atoms is preferably 3 to 20, more preferably 3 to 7, and includes cyclopropyl, cyclobutyl, cyclopentyl, cyclohexyl, etc. "(3- to 7-membered)heterocycloalkyl" is a cycloalkyl having at least one hetero atom selected from the group consisting of B, N, O, S, Si, and P, preferably O, S, and N, and 3 to 7 ring backbone atoms, and includes tetrahydrofuran, pyrrolidine, thiolan, tetrahydropyran, etc. "(C6-C30)aryl(ene)" is a monocyclic or fused ring-type radical derived from an aromatic hydrocarbon having 6 to 30 ring backbone carbon atoms, in which the number of ring backbone carbon atoms is preferably 6 to 20, more preferably 6 to 15, may be partially saturated, and includes phenyl, biphenyl, terphenyl, naphthyl, binaphthyl, phenylnaphthyl, naphthylphenyl, fluorenyl, phenylfluorenyl, benzofluorenyl, dibenzofluorenyl, phenanthrenyl, phenylphenanthrenyl, anthracenyl, indenyl, triphenylenyl, pyrenyl, tetracenyl, perylenyl, chrysenyl, naphthacenyl, fluoranthenyl, etc. "(5- to 30-membered)heteroaryl(ene)" is an aryl group having at least one, preferably 1 to 4 hetero atoms selected from the group consisting of B, N, O, S, Si, and P, and 5 to 30 ring backbone atoms, in which the number of ring backbone atoms is preferably 5 to 20, more preferably 5 to 15; is a monocyclic ring, or a fused ring condensed with at least one benzene ring; may be partially saturated; may be one formed by linking at least one heteroaryl or aryl group to a heteroaryl group via a single bond(s); and includes a monocyclic ring-type heteroaryl including furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl, etc., and a fused ring-type heteroaryl including benzofuranyl, benzothiophenyl, isobenzofuranyl, dibenzofuranyl, dibenzothiophenyl, benzonaphthothiophenyl, benzimidazolyl, benzothiazolyl, benzoisothiazolyl, benzoisoxazolyl, benzoxazolyl, isoindolyl, indolyl, indazolyl, benzothiadiazolyl, quinolyl, isoquinolyl, cinnolinyl, quinazolinyl, quinoxalinyl, carbazolyl, phenoxazinyl, phenanthridinyl, benzodioxolyl, etc. "Nitrogen-containing (5- to 30-membered)heteroaryl(ene)" is an aryl group having at least one hetero atom of N, preferably 1 to 4 hetero atoms, and 5 to 30 ring backbone atoms, in which the number of ring backbone atoms is preferably 5 to 20, more preferably 5 to 15; is a monocyclic ring, or a fused ring condensed with at least one benzene ring; may be partially saturated; may be one formed by linking at least one heteroaryl or aryl group to a heteroaryl group via a single bond(s); and includes a monocyclic ring-type heteroaryl including pyrrolyl, imidazolyl, pyrazolyl, triazinyl, tetrazinyl, triazolyl, tetrazolyl, pyridyl, pyrazinyl, pyrimidinyl, pyridazinyl, etc., and a fused ring-type heteroaryl including benzimidazolyl, isoindolyl, indolyl, indazolyl, benzothiadiazolyl, quinolyl, isoquinolyl, cinnolinyl, quinazolinyl, quinoxalinyl, carbazolyl, phenanthridinyl, etc. "Halogen" includes F, Cl, Br, and I.

Herein, "substituted" in the expression "substituted or unsubstituted" means that a hydrogen atom in a certain functional group is replaced with another atom or functional group, i.e., a substituent. The substituents of the substituted alkyl(ene), the substituted aryl(ene), the substituted heteroaryl(ene), the substituted nitrogen-containing heteroaryl(ene), the substituted cycloalkyl, the substituted heterocycloalkyl, the substituted trialkylsilyl, the substituted dialkylarylsilyl, the substituted alkyldiarylsilyl, the substituted triarylsilyl, the substituted mono- or di-alkylamino, the substituted mono- or di-arylamino, the substituted alkylarylamino, the substituted arylalkyl, the substituted alkylaryl, and the substituted spiro[fluorene-(C3-C30)cycloalkane] in $Ar_1$ to $Ar_6$, $L_1$ to $L_3$, $R_1$ to $R_5$, $R_{11}$ to $R_{17}$, R, and Ma each independently are at least one selected from the group consisting of deuterium, a halogen, a cyano, a carboxyl, a nitro, a hydroxyl, a (C1-C30)alkyl, a halo(C1-C30)alkyl, a (C2-C30) alkenyl, a (C2-C30) alkynyl, a (C1-C30)alkoxy, a (C1-C30)alkylthio, a (C3-C30)cycloalkyl, a (C3-C30)cycloalkenyl, a (3- to 7-membered)heterocycloalkyl, a (C6-C30)aryloxy, a (C6-C30)arylthio, a (5- to 30-membered) heteroaryl unsubstituted or substituted with a (C6-C30)aryl, a (C6-C30)aryl unsubstituted or substituted with a (5- to 30-membered)heteroaryl, a tri(C1-C30)alkylsilyl, a tri(C6-C30)arylsilyl, a di(C1-C30)alkyl(C6-C30)arylsilyl, a (C1-C30)alkyldi(C6-C30)arylsilyl, an amino, a mono- or di-(C1-C30)alkylamino, a mono- or di-(C6-C30)arylamino unsubstituted or substituted with a (C1-C30)alkyl, a (C1-C30)alkyl(C6-C30)arylamino, a (C1-C30)alkylcarbonyl, a (C1-C30)alkoxycarbonyl, a (C6-C30)arylcarbonyl, a di(C6-C30)arylboronyl, a di(C1-C30)alkylboronyl, a (C1-C30)alkyl(C6-C30)arylboronyl, a (C6-C30)aryl(C1-C30)alkyl, and a (C1-C30)alkyl(C6-C30)aryl; and preferably selected from the group consisting of a (C1-C6)alkyl; a (C6-C18)aryl unsubstituted or substituted with a cyano, a (C1-C6)alkyl, or a (C6-C12)aryl; and a (5- to 20-membered)heteroaryl unsubstituted or substituted with a (C6-C12)aryl.

According to one embodiment of the organic electroluminescent device of the present disclosure, formula 1 may be represented by the following formula 3 or 4:

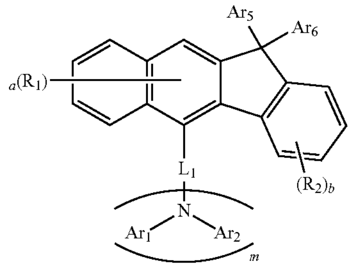
(3)

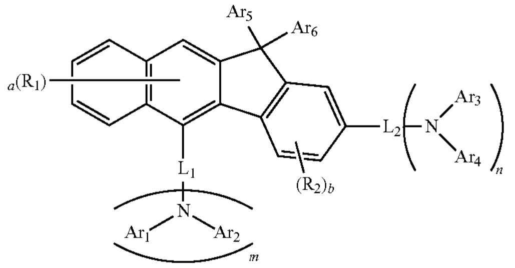
(4)

wherein $Ar_1$ to $Ar_6$, $L_1$, $L_2$, $R_1$, $R_2$, a, b, m, and n are as defined in formula 1.

According to one embodiment of the organic electroluminescent device of the present disclosure, formula 2 may be represented by any one of the following formulas 5 to 10:

(5)

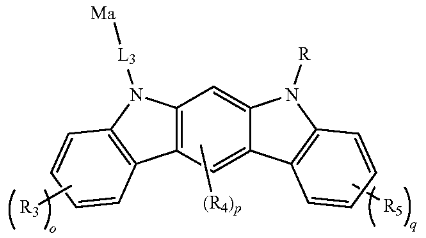

(6)

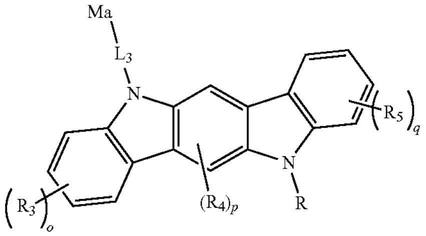

(7)

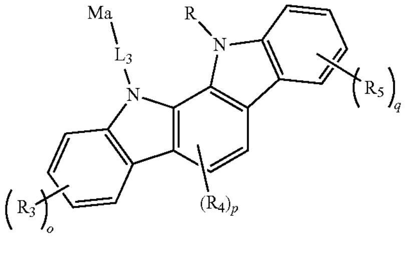

(8)

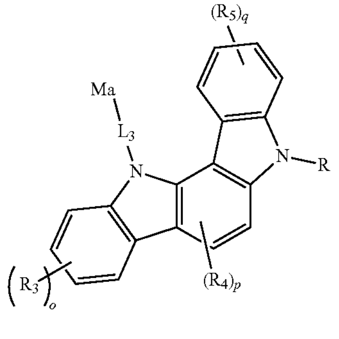

(9)

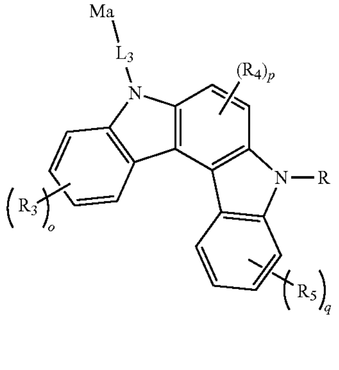

-continued (10)

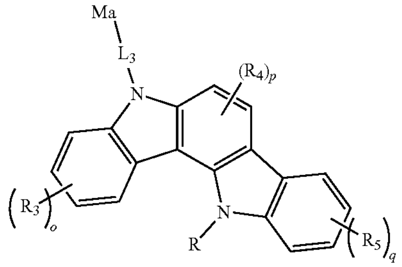

wherein Ma, $L_3$, $R_3$ to $R_5$, R, o, p, and q are as defined in formula 2.

In formula 1 above, $Ar_1$ to $Ar_6$ each independently represent a substituted or unsubstituted (C1-C30)alkyl, a substituted or unsubstituted (C6-C30)aryl, a substituted or unsubstituted (5- to 30-membered)heteroaryl, or a substituted or unsubstituted spiro[fluorene-(C3-C30)cycloalkane]; or $Ar_1$ and $Ar_2$, $Ar_3$ and $Ar_4$, and $Ar_5$ and $Ar_6$ may be linked to each other to form a mono- or polycyclic, (3- to 30-membered) alicyclic or aromatic ring, or the combination thereof, whose carbon atom(s) may be replaced with at least one hetero atom selected from nitrogen, oxygen, and sulfur.

Preferably, $Ar_1$ to $Ar_2$ each independently represent a substituted or unsubstituted (C6-C25)aryl, a substituted or unsubstituted (5- to 15-membered)heteroaryl, or a substituted or unsubstituted spiro[fluorene-(C5-C8)cycloalkane], and more preferably, $Ar_1$ to $Ar_4$ each independently represent a (C6-C25)aryl unsubstituted or substituted with a (C1-C6)alkyl or a (C6-C20)aryl; a (5- to 15-membered) heteroaryl unsubstituted or substituted with a (C1-C6)alkyl or a (C6-C12)aryl; an unsubstituted spiro[fluorene-cyclopentane]; or an unsubstituted spiro[fluorene-cyclohexane]. Specifically, $Ar_1$ to $Ar_4$ may each independently represent a phenyl, a biphenyl, a terphenyl, a fluorenyl substituted with a methyl(s), a fluorenyl substituted with a phenyl(s), a benzofluorenyl substituted with a methyl(s), a naphthylphenyl, a phenyl substituted with a fluorene, a pyridinyl substituted with a phenyl, a dibenzofuranyl, a dibenzothiophenyl, a dibenzosilolyl substituted with a methyl(s), a dibenzosilolyl substituted with a phenyl(s), a spiro[fluorene-cyclopentane], a spiro[fluorene-cyclohexane], etc.

Preferably, $Ar_5$ and $Ar_6$ each independently represent a substituted or unsubstituted (C1-C6)alkyl, or a substituted or unsubstituted (C6-C12)aryl; or may be linked to each other to form a mono- or polycyclic, (5- to 15-membered) alicyclic or aromatic ring, or the combination thereof, and more preferably, $Ar_5$ and $Ar_6$ each independently represent an unsubstituted (C1-C6)alkyl, or an unsubstituted (C6-C12) aryl; or may be linked to each other to form a monocyclic, (5- to 15-membered) alicyclic ring. Specifically, $Ar_5$ and $Ar_6$ may each independently represent a methyl, a phenyl, etc., or may be linked to each other to form a spirocyclopentane.

In formula 1, $L_1$ represents a single bond, a substituted or unsubstituted (C6-C30)arylene, or a substituted or unsubstituted (5- to 30-membered)heteroarylene, preferably represents a single bond, a substituted or unsubstituted (C6-C20)arylene, or a substituted or unsubstituted (5- to 15-membered)heteroarylene, and more preferably represents a single bond, an unsubstituted (C6-C20)arylene, or an unsubstituted (5- to 15-membered)heteroarylene. Specifically, $L_1$ may represent a single bond, a phenylene, a naphthylene, a biphenylene, a naphthylphenylene, a pyridinephenylene, a pyridinylene, a phenylpyridinylene, a bipyridinylene, a dibenzofuranylene, a dibenzothiophenylene, etc.

In formula 1, $L_2$ represents a single bond, a substituted or unsubstituted (C1-C30)alkylene, a substituted or unsubstituted (C6-C30)arylene, or a substituted or unsubstituted (5- to 30-membered)heteroarylene, with a proviso that where n is 0, $L_2$ does not exist. $L_2$ preferably represents a single bond, or a substituted or unsubstituted (C6-C12)arylene, and more preferably represents a single bond, or an unsubstituted (C6-C12)arylene. Specifically, $L_2$ may represent a single bond, a phenylene, etc.

In formula 1, $R_1$ and $R_2$ each independently represent hydrogen, deuterium, a halogen, a substituted or unsubstituted (C1-C30)alkyl, a substituted or unsubstituted (C6-C30)aryl, a substituted or unsubstituted (5- to 30-membered) heteroaryl, a substituted or unsubstituted (C3-C30) cycloalkyl, a substituted or unsubstituted (3- to 7-membered)heterocycloalkyl, a substituted or unsubstituted (C6-C30)aryl(C1-C30)alkyl, $-NR_{11}R_{12}$, $-SiR_{13}R_{14}R_{15}$, $-SR_{16}$, $-OR_{17}$, a cyano, a nitro, or a hydroxyl; or are linked to an adjacent substituent(s) to form a mono- or polycyclic, (3- to 30-membered) alicyclic or aromatic ring, or the combination thereof, whose carbon atom(s) may be replaced with at least one hetero atom selected from nitrogen, oxygen, and sulfur, preferably each independently represent hydrogen, or a substituted or unsubstituted (C6-C20)aryl, and more preferably each independently represent hydrogen, or an unsubstituted (C6-C20) aryl. Specifically, $R_1$ and $R_2$ may each independently represent hydrogen, biphenyl, etc.

Herein, $R_{11}$ to $R_{17}$ each independently represent hydrogen, deuterium, a halogen, a substituted or unsubstituted (C1-C30)alkyl, a substituted or unsubstituted (C6-C30)aryl, a substituted or unsubstituted (5- to 30-membered)heteroaryl, a substituted or unsubstituted (3- to 7-membered) heterocycloalkyl, or a substituted or unsubstituted (C3-C30) cycloalkyl; or are linked to an adjacent substituent(s) to form a mono- or polycyclic, (3- to 30-membered) alicyclic or aromatic ring, or the combination thereof, whose carbon atom(s) may be replaced with at least one hetero atom selected from nitrogen, oxygen, and sulfur.

In formula 2, Ma represents a substituted or unsubstituted nitrogen-containing (3- to 30-membered)heteroaryl, preferably represents a substituted or unsubstituted nitrogen-containing (5- to 15-membered)heteroaryl. The nitrogen-containing heteroaryl may be substituted with at least one selected from the group consisting of a (C1-C6)alkyl; a (C6-C18)aryl unsubstituted or substituted with a cyano, a (C1-C6)alkyl, or a (C6-C12)aryl; and a (5- to 20-membered) heteroaryl unsubstituted or substituted with a (C6-C12)aryl. Specifically, Ma may represent a substituted or unsubstituted pyridyl, a substituted or unsubstituted pyrimidinyl, a substituted or unsubstituted triazinyl, a substituted or unsubstituted quinazolinyl, or a substituted or unsubstituted quinoxalinyl. In addition, Ma may represent a pyridyl, a pyrimidinyl, a triazinyl, a quinazolinyl, or a quinoxalinyl, unsubstituted or substituted with a phenyl, a naphthyl, a biphenyl, a terphenyl, a binaphthyl, a naphthylphenyl, a phenylnaphthyl, a dimethylfluorenyl, a cyanophenyl, a phenylpyridyl, or a carbazolyl.

In formula 2, $L_3$ represents a single bond, a substituted or unsubstituted (C6-C30)arylene, or a substituted or unsubstituted nitrogen-containing (3- to 30-membered)heteroarylene, preferably represents a single bond, a substituted or unsubstituted (C6-C15)arylene, or a substituted or unsubstituted nitrogen-containing (5- to 15-membered)heteroarylene, and more preferably represents a single bond, a (C6-C15)arylene unsubstituted or substituted with a (C1-C6)alkyl, or an unsubstituted nitrogen-containing (5- to 15-membered)heteroarylene. Specifically, $L_3$ may represent a single bond, a phenylene, a naphthylene, a dimethylfluorenylene, or a pyridylene.

In formula 2, $R_3$ to $R_5$ each independently represent hydrogen, deuterium, a substituted or unsubstituted (C1-C30)alkyl, a substituted or unsubstituted (C6-C30)aryl(C1-C30)alkyl, a substituted or unsubstituted (C6-C30)aryl, a substituted or unsubstituted (C1-C30)alkyl(C6-C30)aryl, a substituted or unsubstituted (3- to 30-membered)heteroaryl, a substituted or unsubstituted (C3-C30)cycloalkyl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; preferably each independently represent hydrogen, or a substituted or unsubstituted (C6-C12)aryl, and more preferably each independently represent hydrogen, or an unsubstituted (C6-C12)aryl. Specifically, $R_3$ to $R_5$ may each independently represent hydrogen or a phenyl.

In formula 2, R represents hydrogen, deuterium, a substituted or unsubstituted (C1-C30)alkyl, a substituted or unsubstituted (C6-C30)aryl(C1-C30)alkyl, a substituted or unsubstituted (C6-C30)aryl, a substituted or unsubstituted (C1-C30)alkyl(C6-C30)aryl, a substituted or unsubstituted (3- to 30-membered)heteroaryl, a substituted or unsubstituted (C3-C30)cycloalkyl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino, preferably represents a substituted or unsubstituted (C6-C15)aryl, or a substituted or unsubstituted nitrogen-containing (5- to 15-membered)heteroaryl, and more preferably represents a (C6-C15)aryl unsubstituted or substituted with a (C1-C6) alkyl, or an unsubstituted nitrogen-containing (5- to 15-membered)heteroaryl. Specifically, R may represent a phenyl, a naphthyl, a dimethylfluorenyl, or a pyridyl.

The compound represented by formula 1 includes the following compounds, but is not limited thereto:

C-1

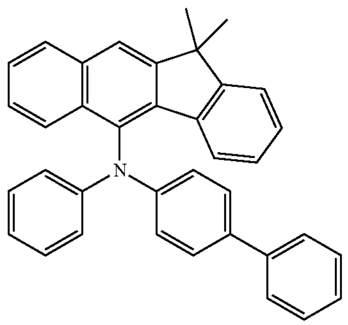

C-2
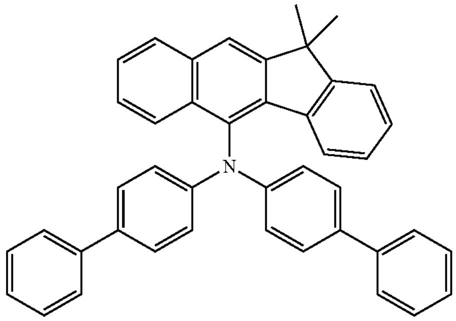
C-3
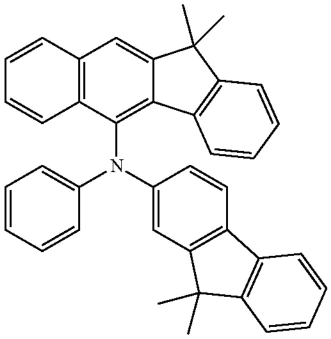
C-4
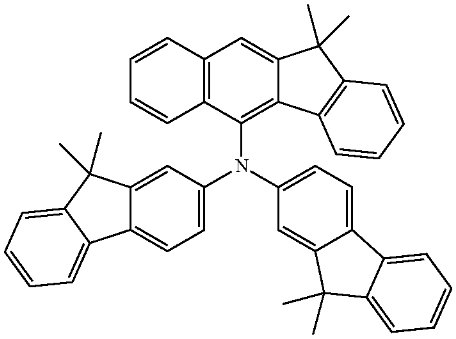
C-5
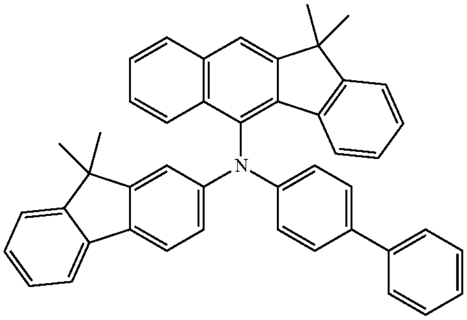
C-6
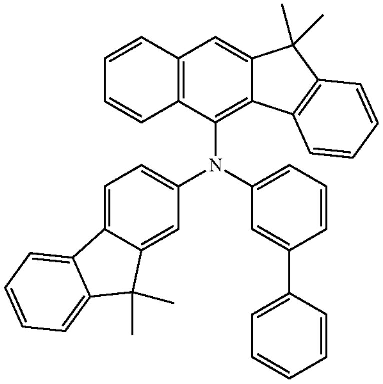
C-7
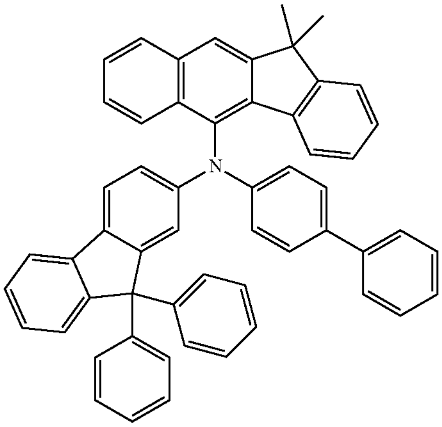
C-8
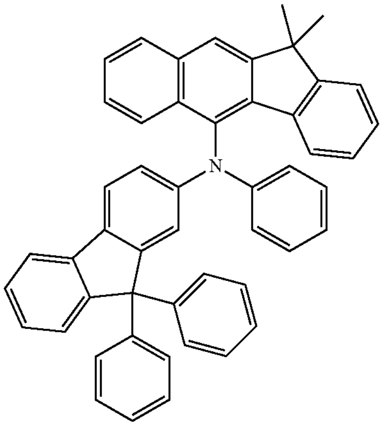

-continued
C-9
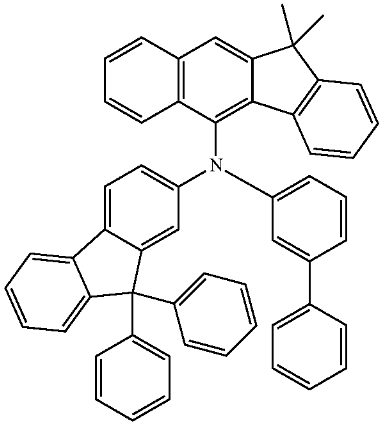
C-10
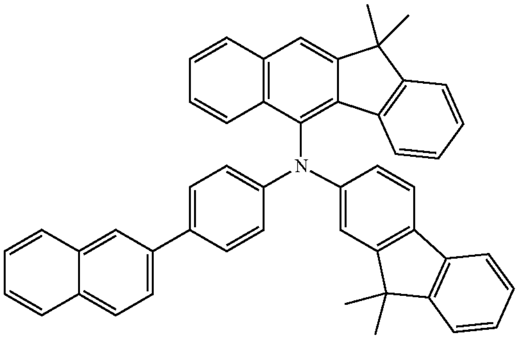
C-11
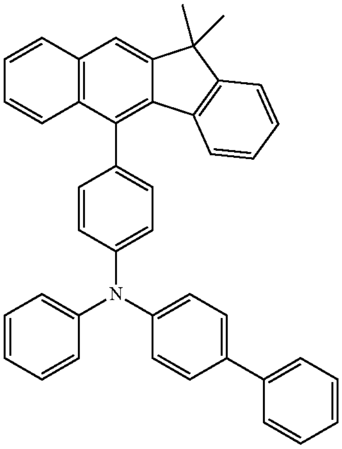
-continued
C-12
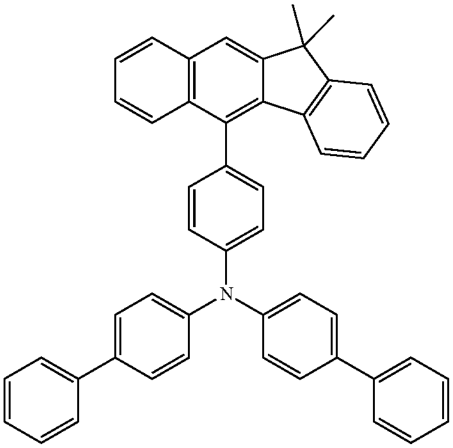
C-13
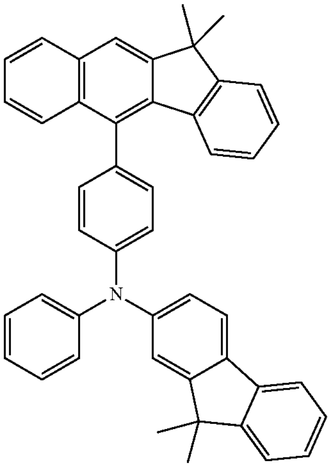
C-14
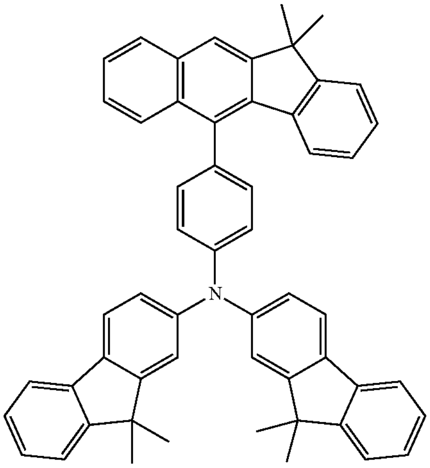

-continued
C-15
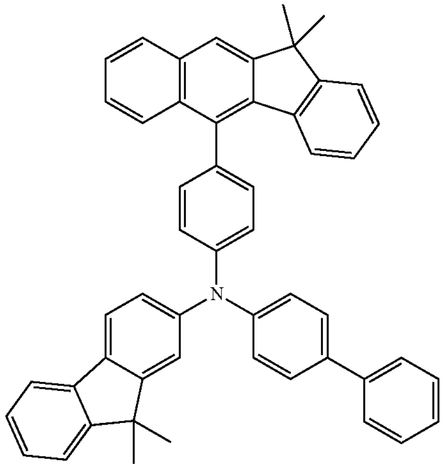
C-16
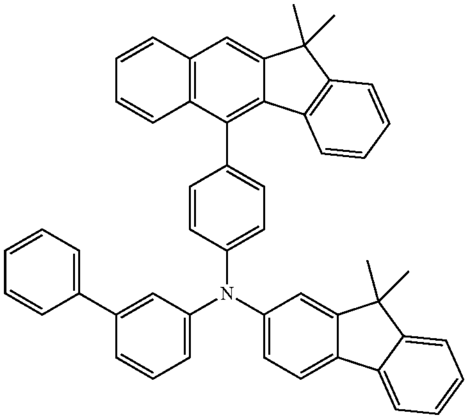
C-17
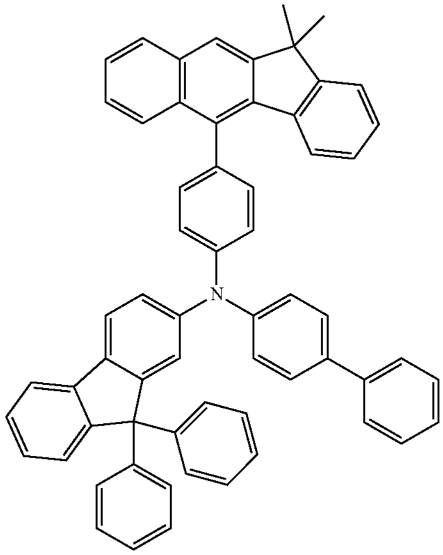
-continued
C-18
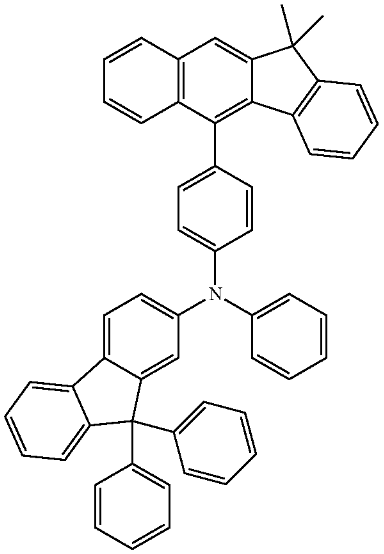
C-19
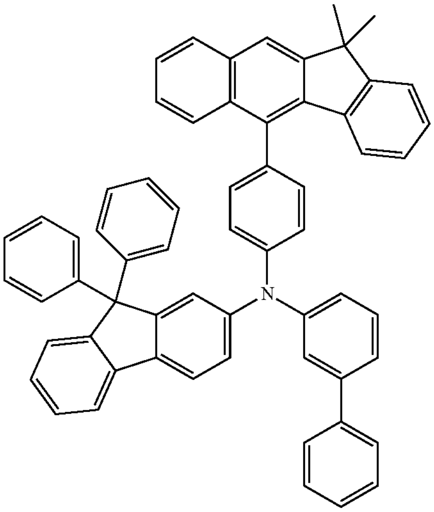
C-20
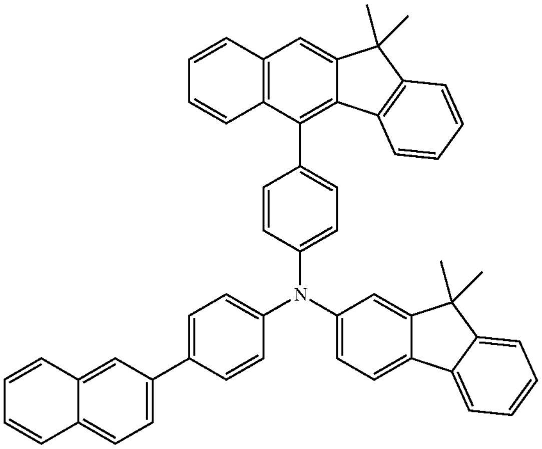

-continued
C-21
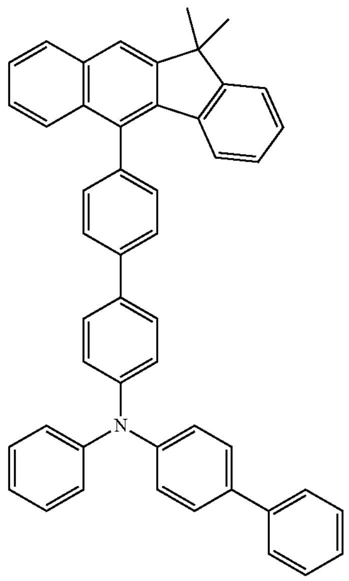
C-22
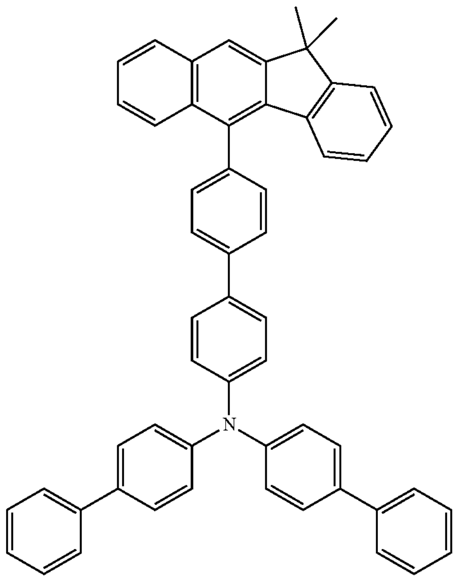
-continued
C-23
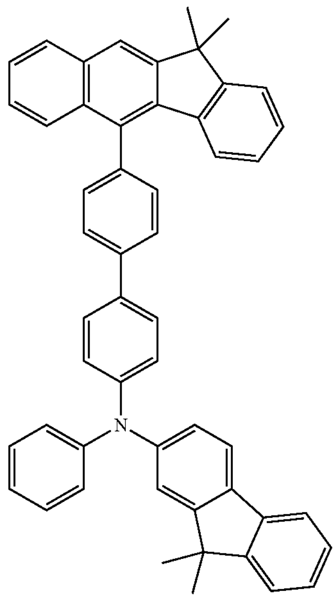
C-24
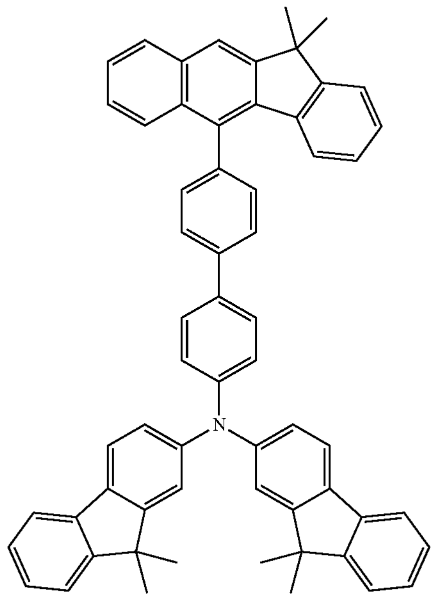

-continued
C-25
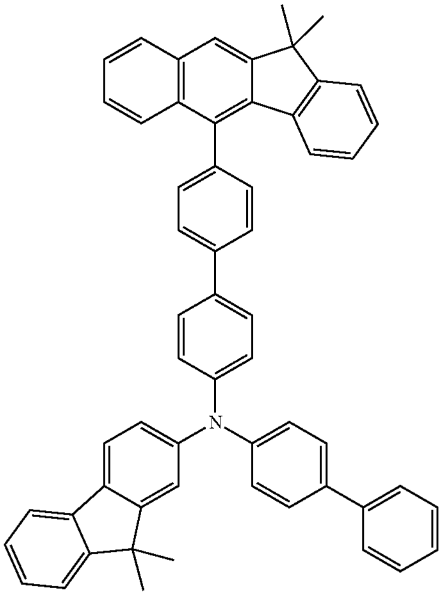
C-26
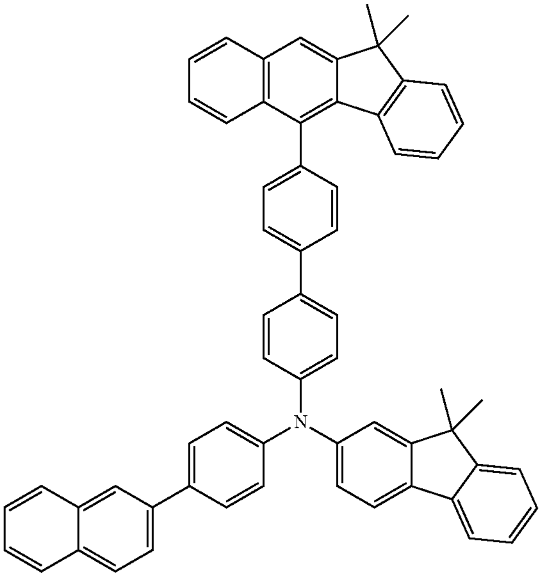
-continued
C-27
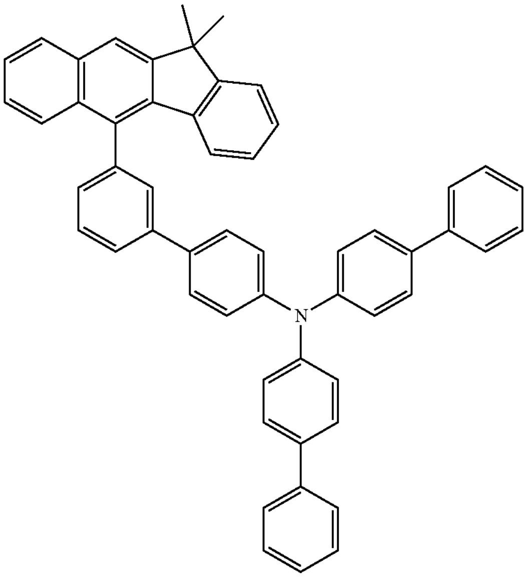
C-28
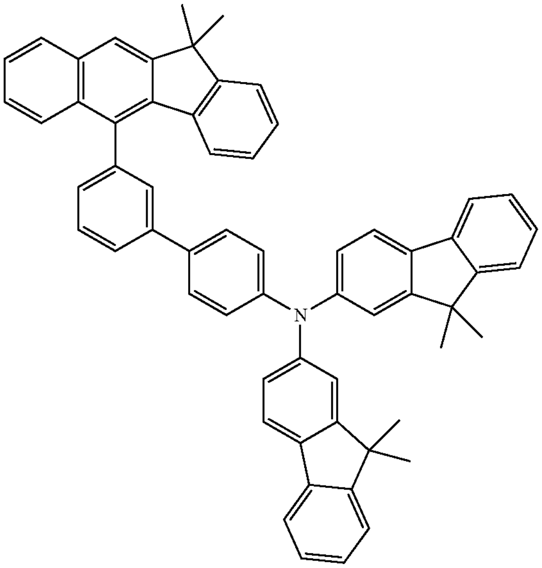

-continued
C-29
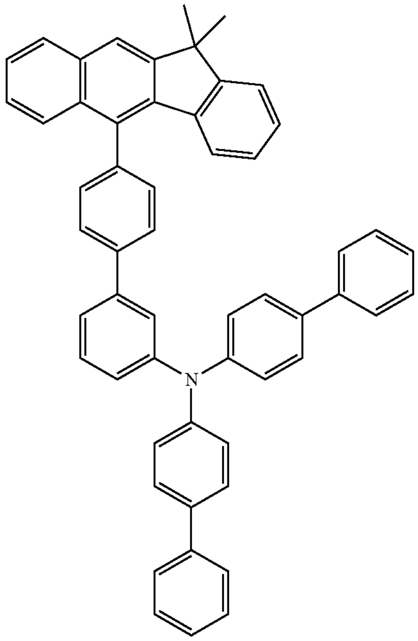
C-30
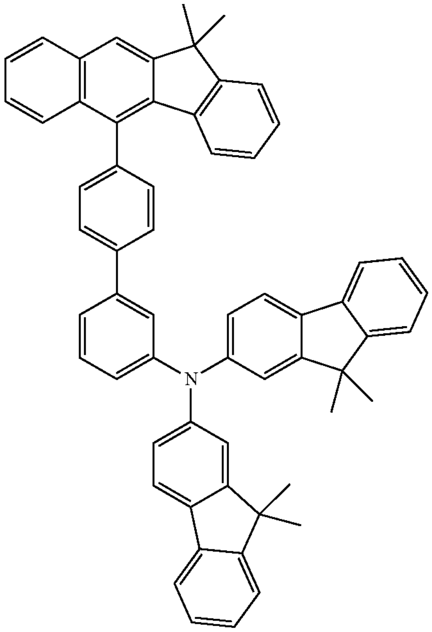
-continued
C-31
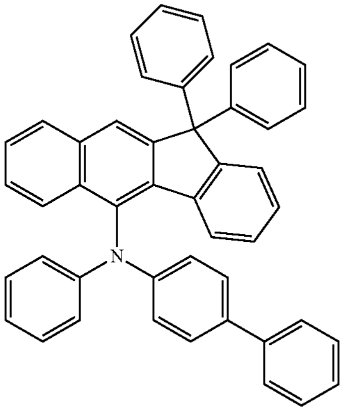
C-32
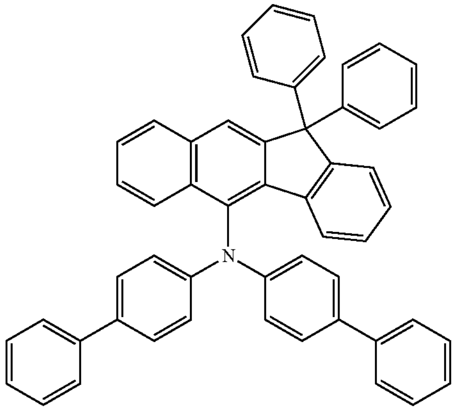
C-33
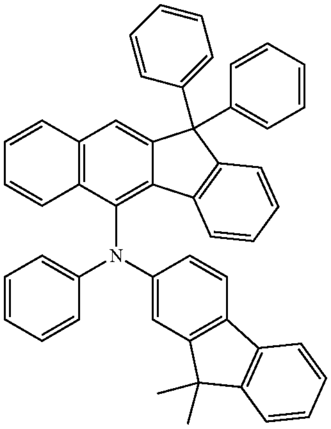

-continued
C-34
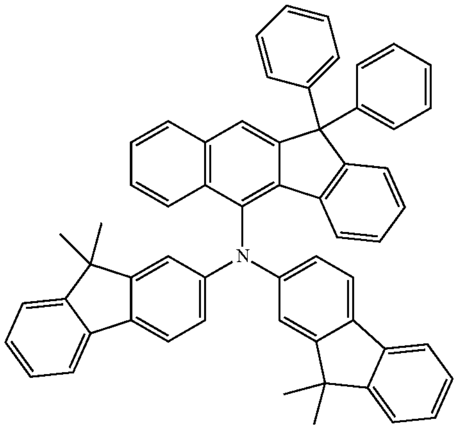
C-35
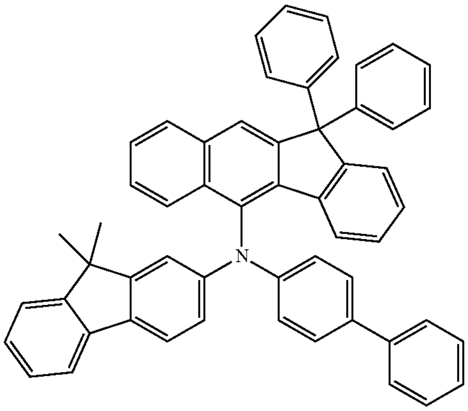
C-36
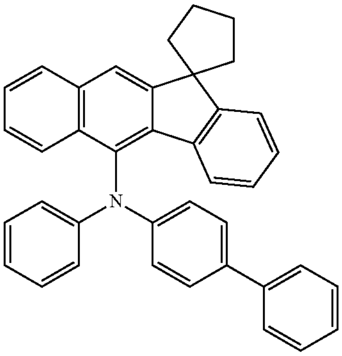
C-37
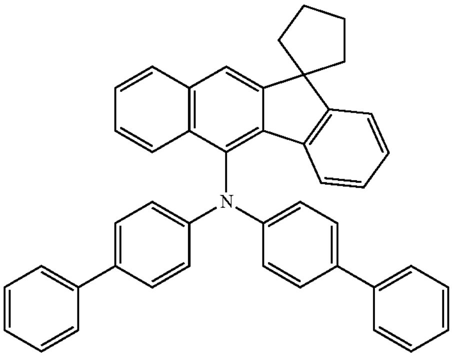
-continued
C-38
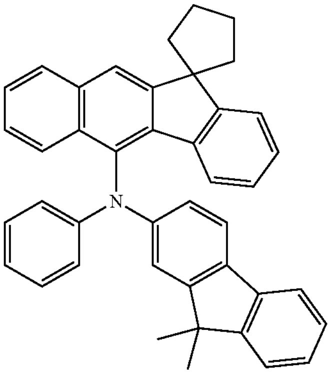
C-39
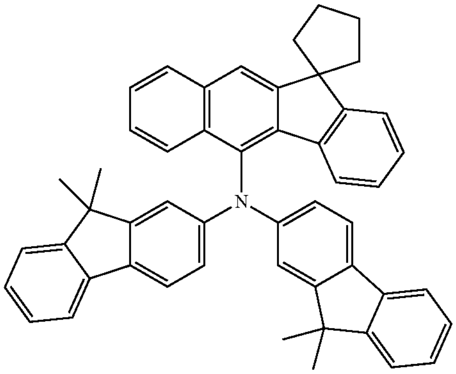
C-40
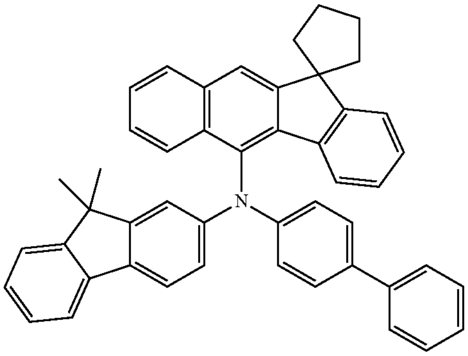

-continued
C-41
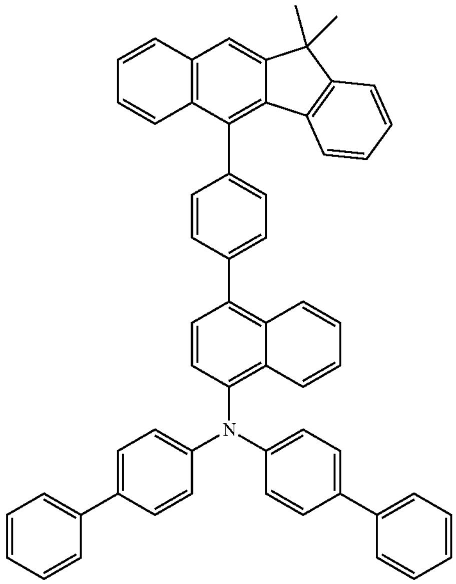
C-42
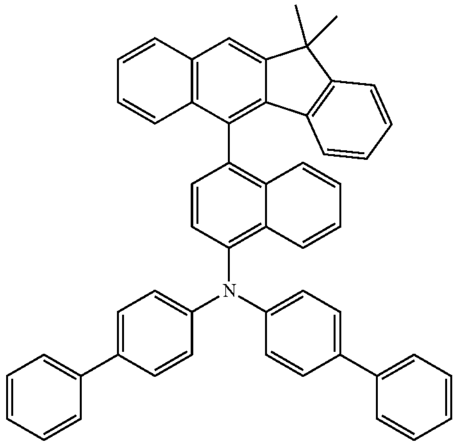
C-43
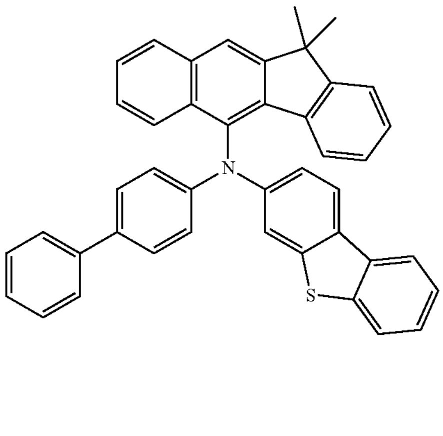
-continued
C-44
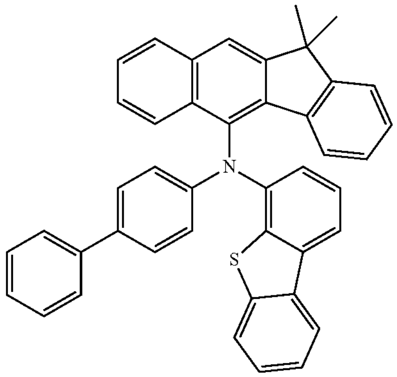
C-45
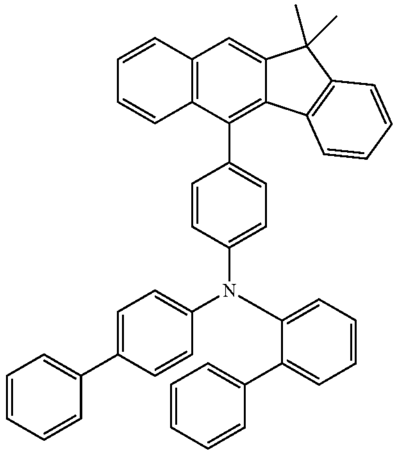
C-46
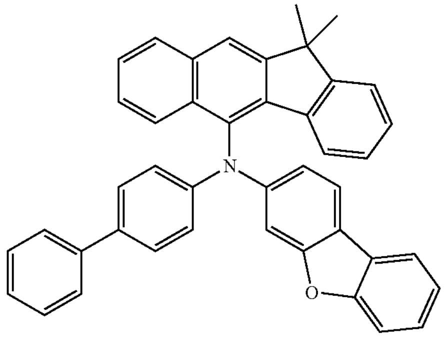
C-47
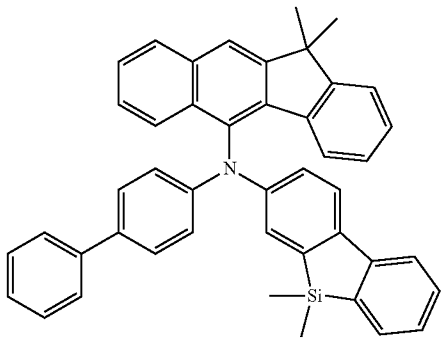

-continued
C-48
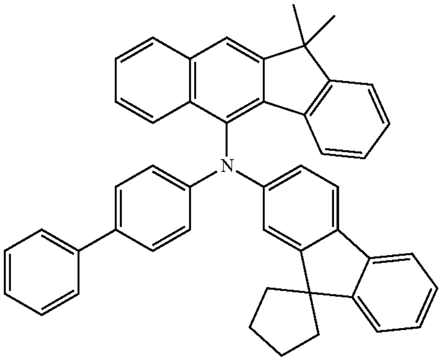
C-49
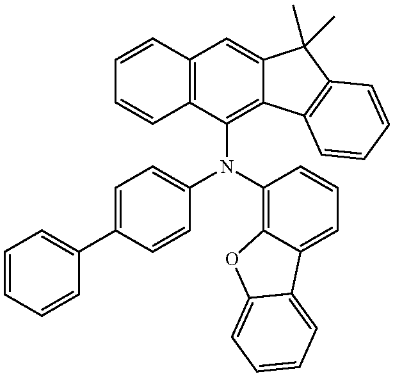
C-50
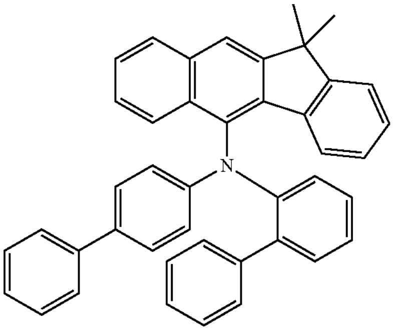
C-51
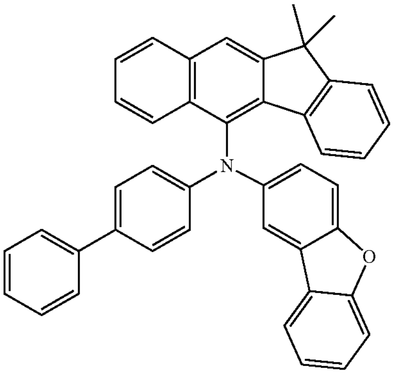
-continued
C-52
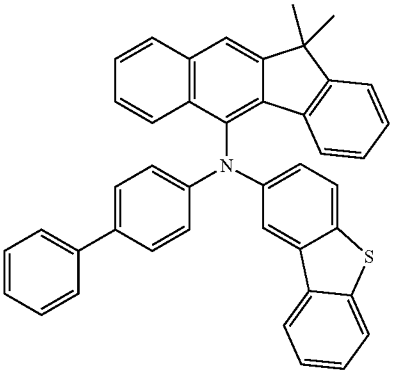
C-53
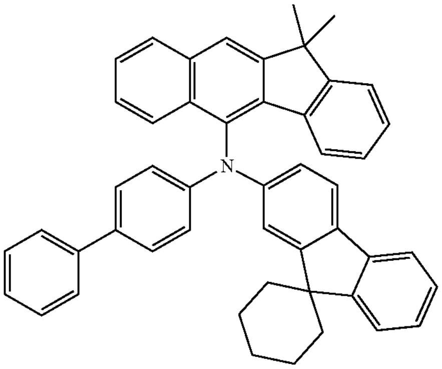
C-54
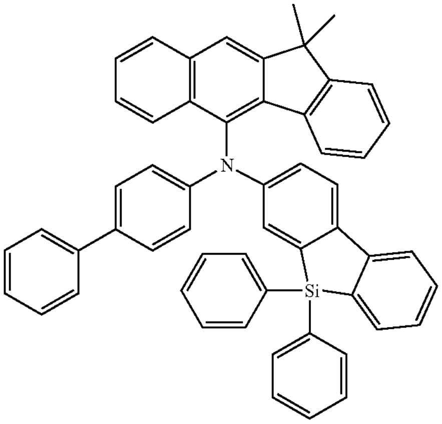

-continued
C-55
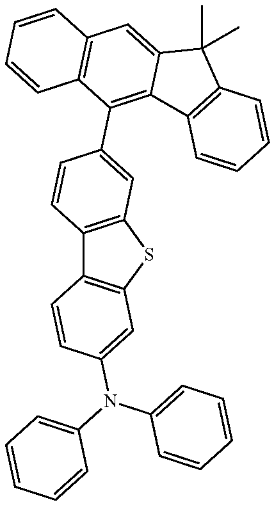
C-56
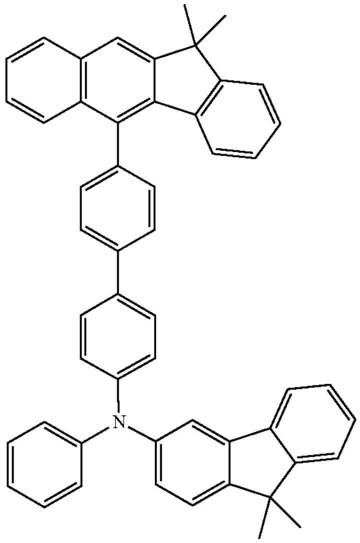
C-57
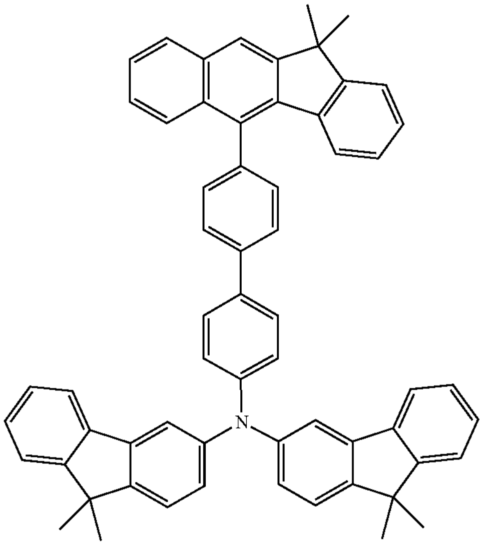
-continued
C-58
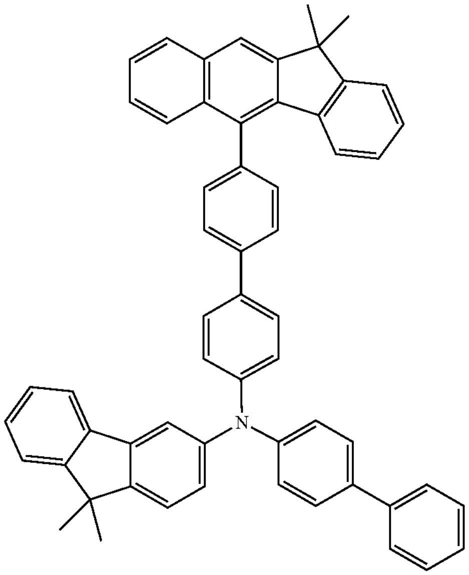
C-59
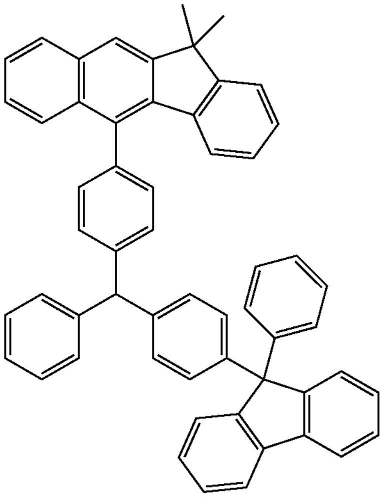
C-60
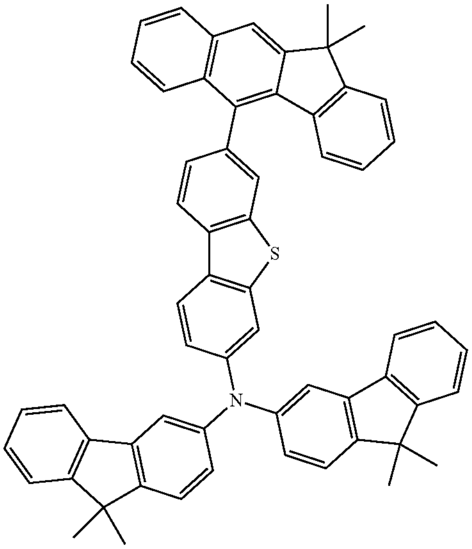

-continued
C-61
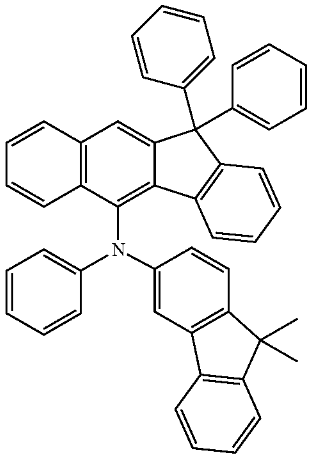
C-62
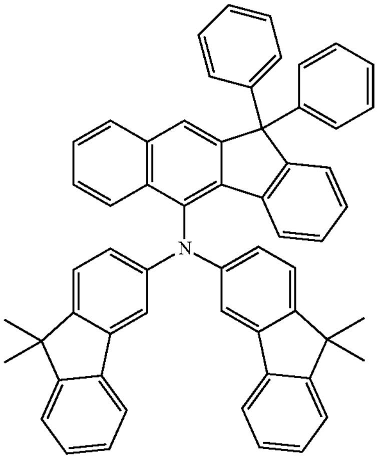
C-63
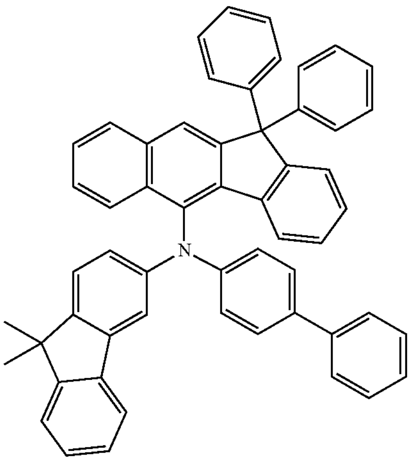
-continued
C-64
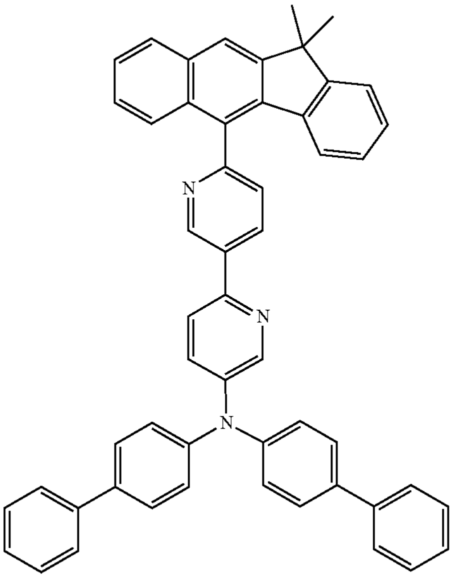
C-65
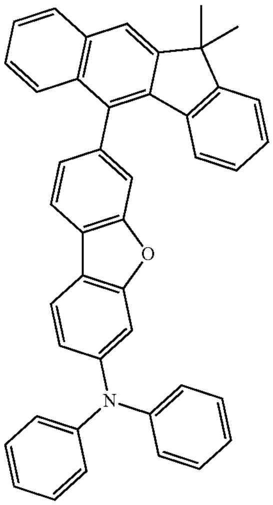
C-66
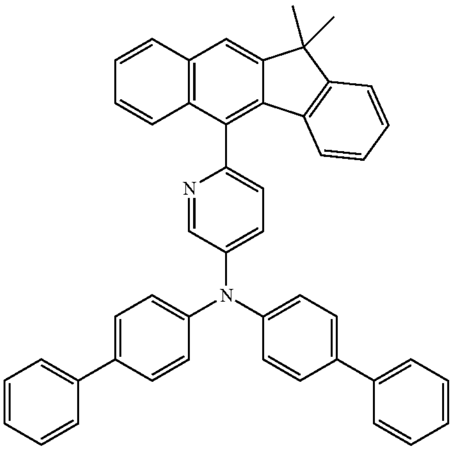

-continued
C-67
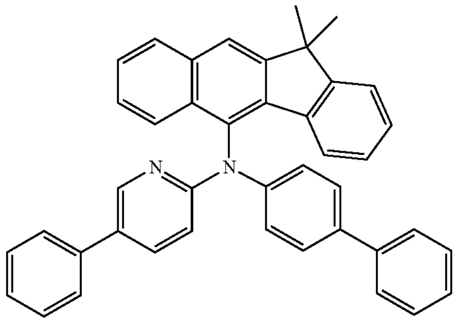
C-68
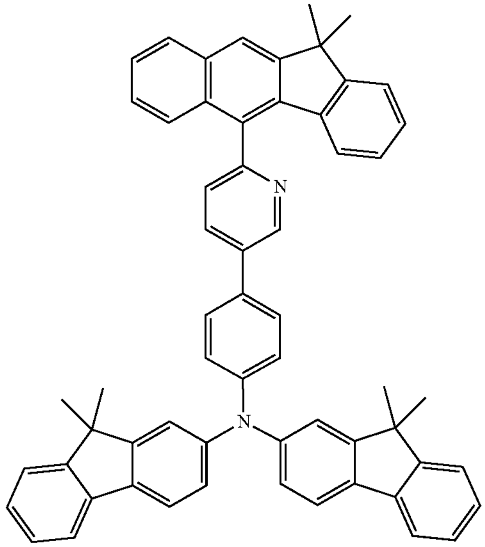
C-69
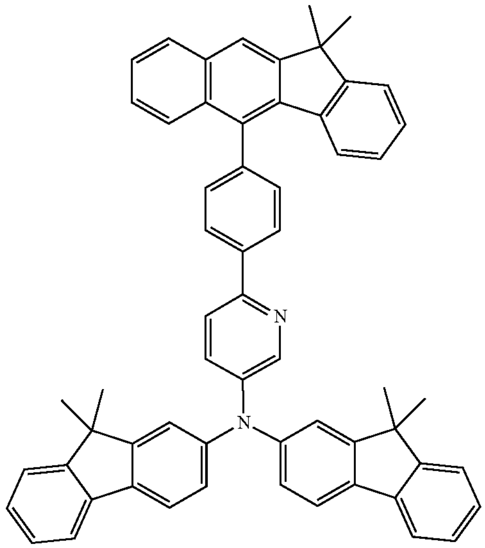
-continued
C-70
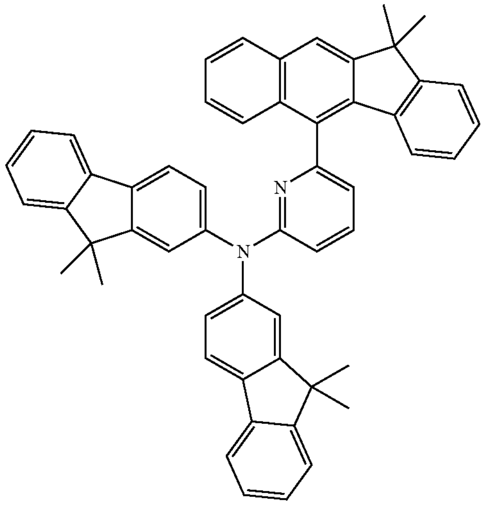
C-71
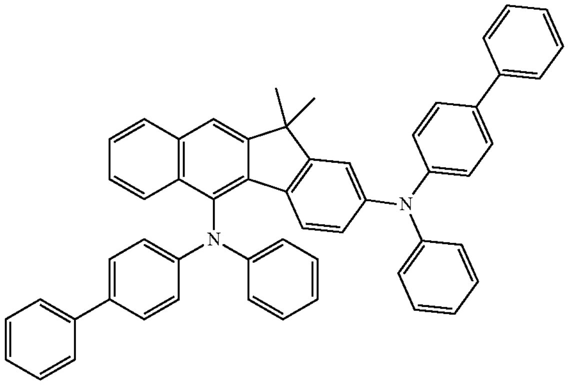
C-72
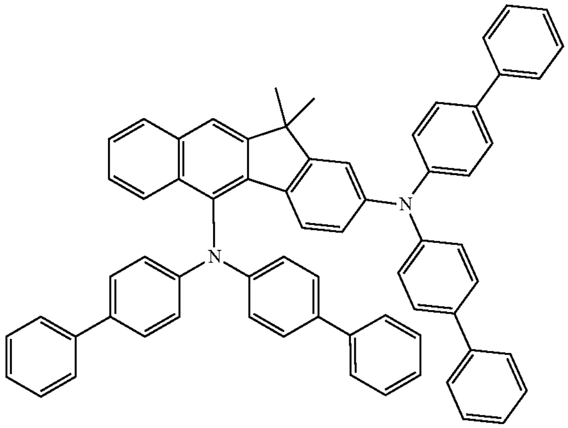

-continued
C-73
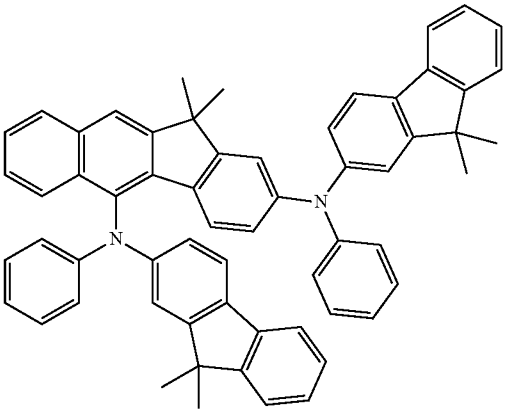
C-74
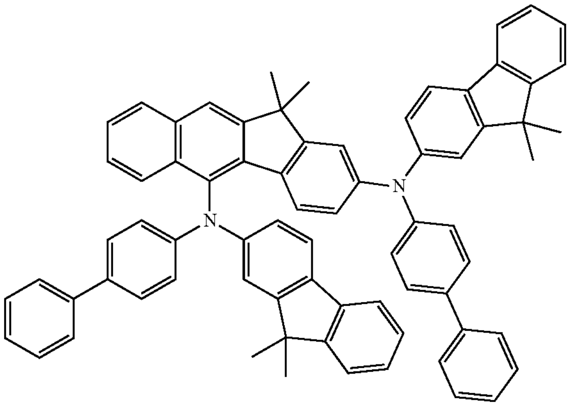
C-75
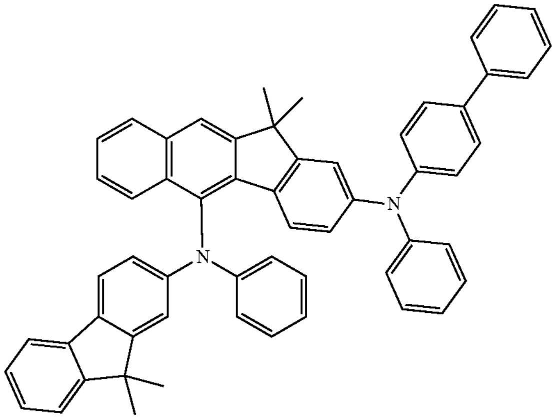
-continued
C-76
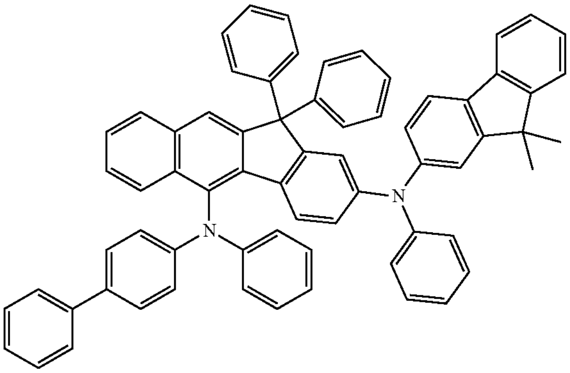
C-77
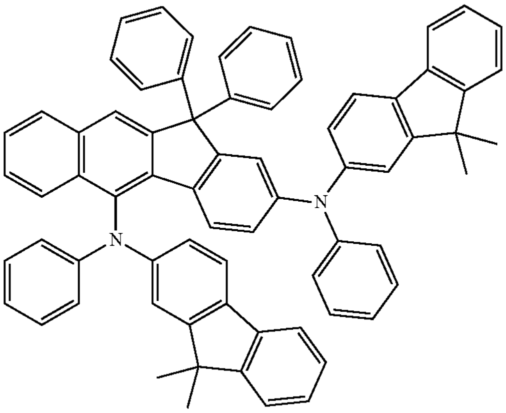
C-78
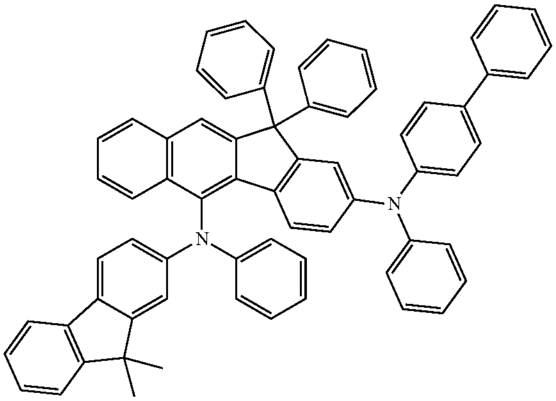
C-79
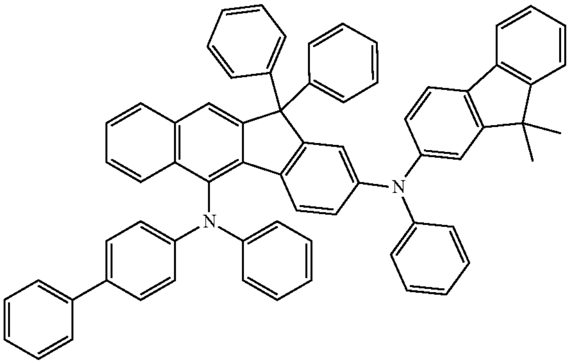

-continued
C-80
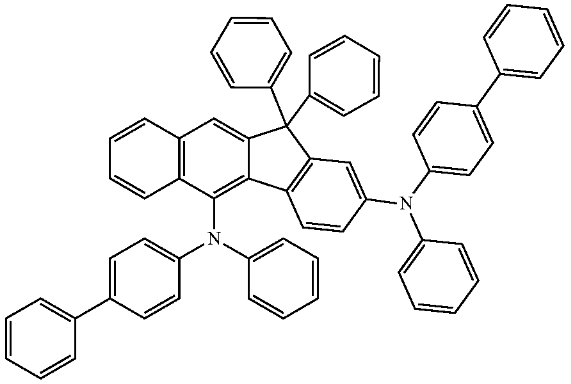
C-81
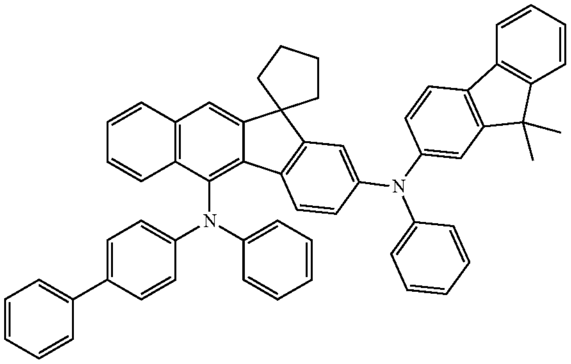
C-82
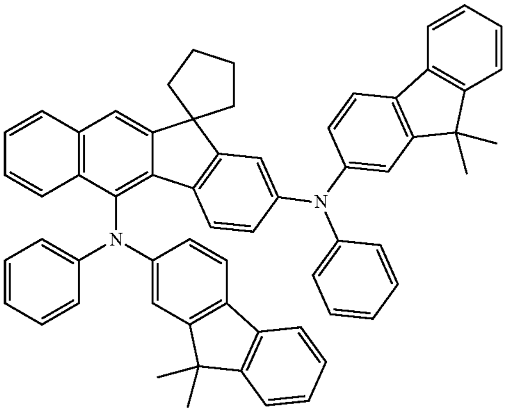
C-83
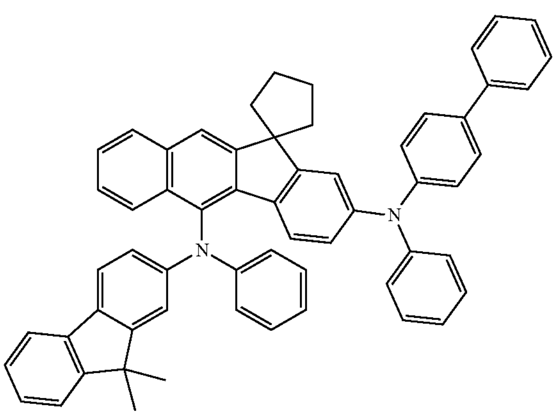
-continued
C-84
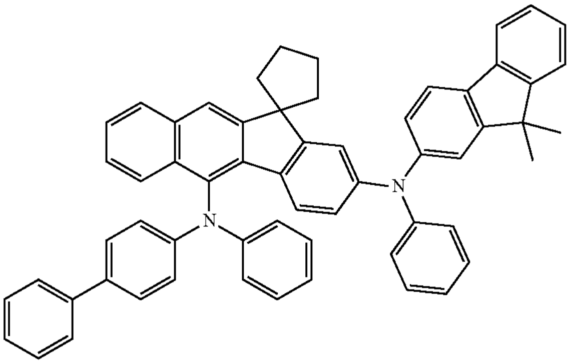
C-85
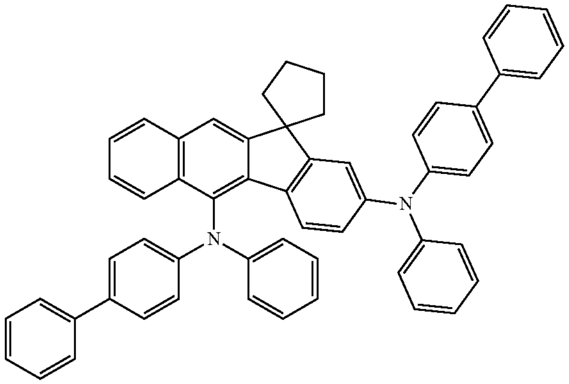
C-86
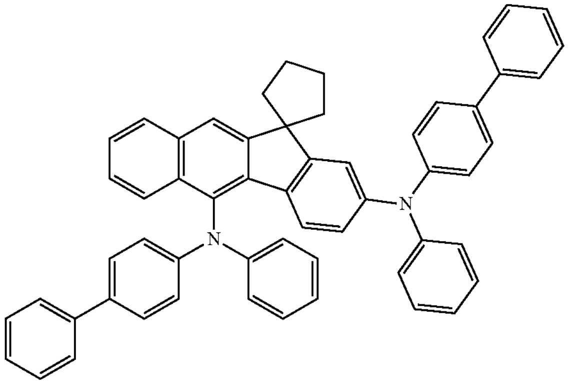
C-87
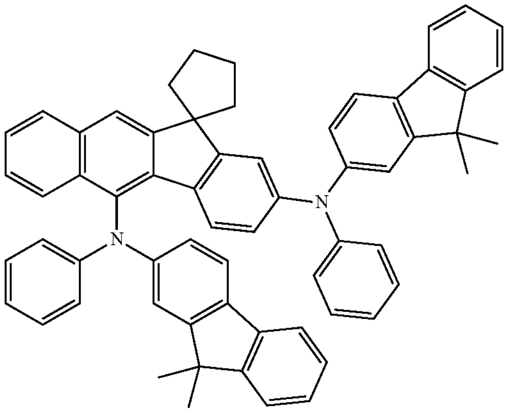

-continued
C-88
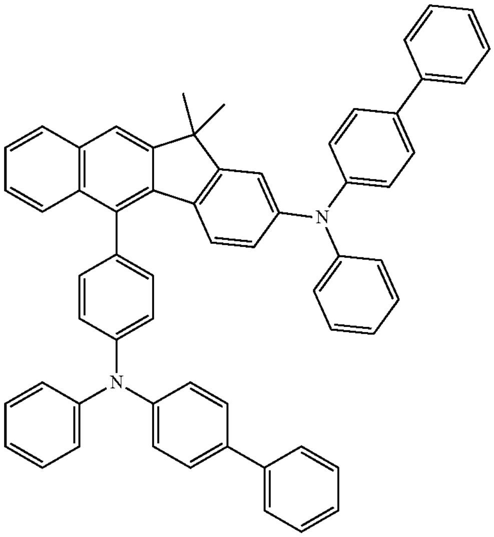
C-89
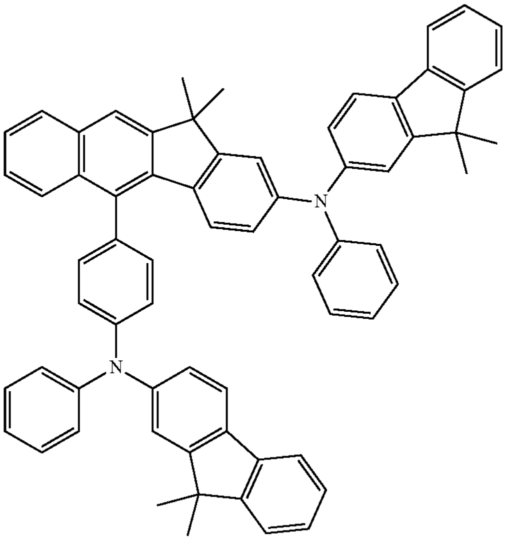
C-90
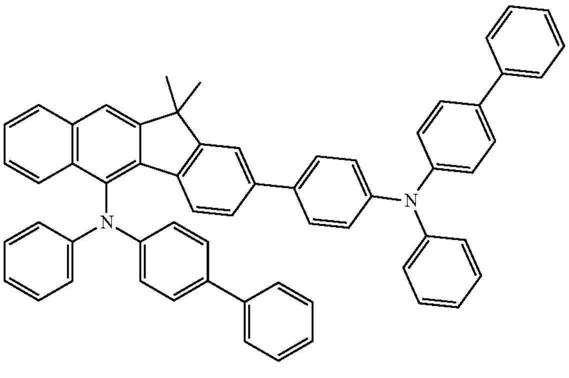
-continued
C-91
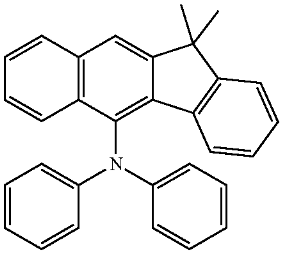
C-92
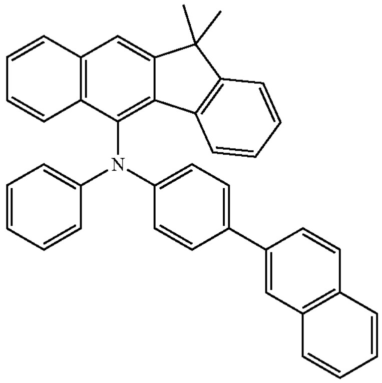
C-93
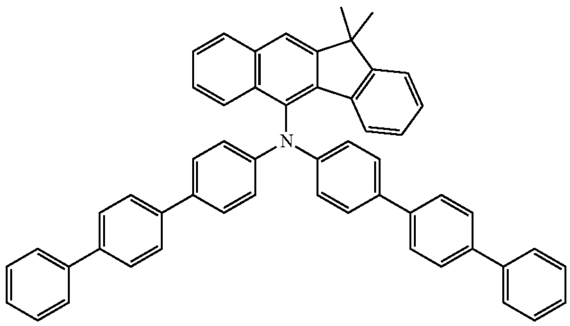
C-94
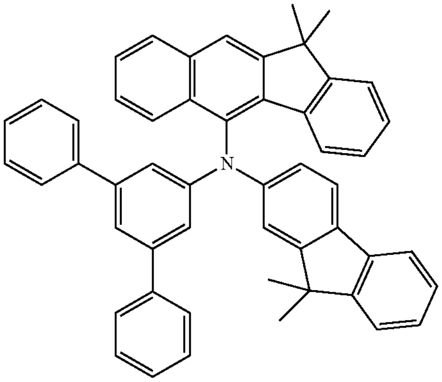

-continued
C-95
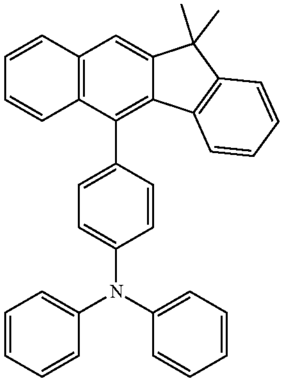
C-96
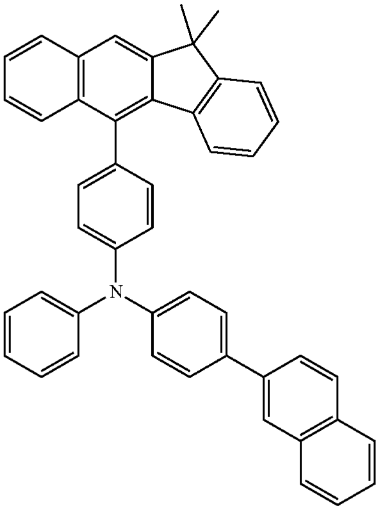
C-97
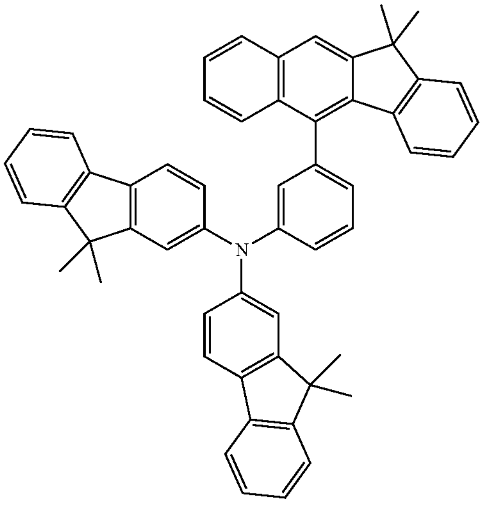
-continued
C-98
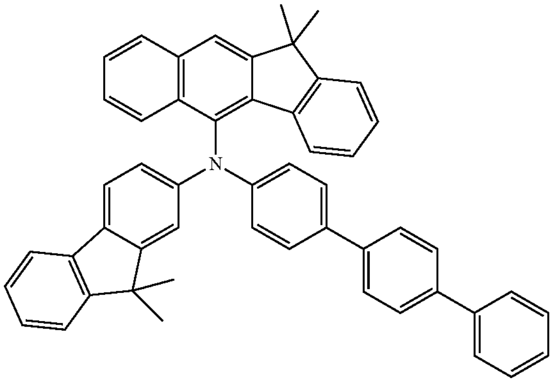
C-99
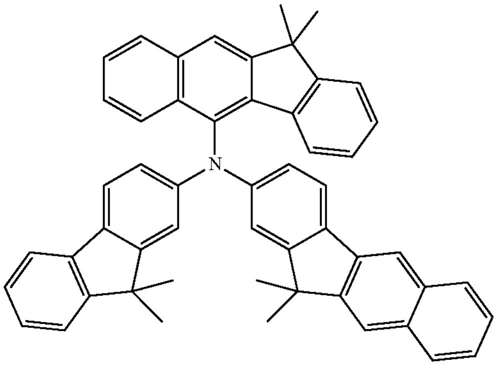
C-100
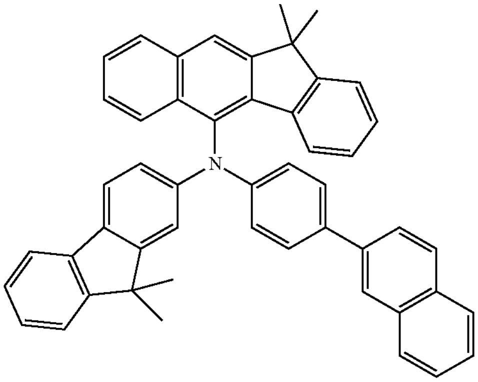
C-101
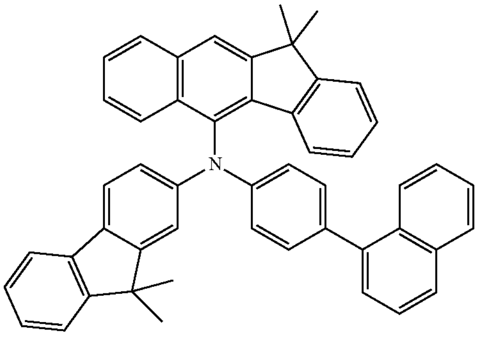

-continued
C-102
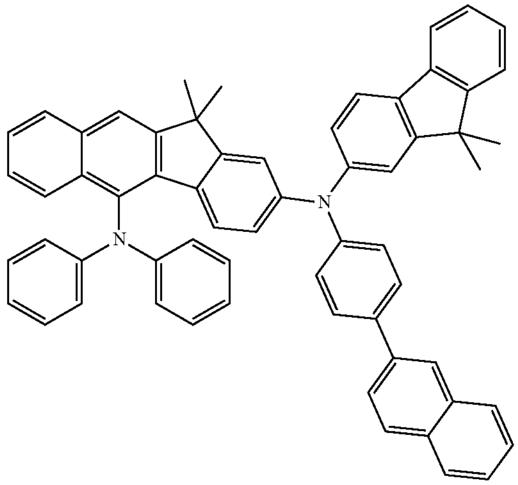
C-103
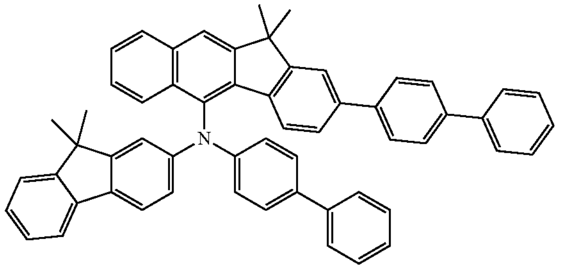
,
The compound represented by formula 2 includes the following compounds, but is not limited thereto:
H-1
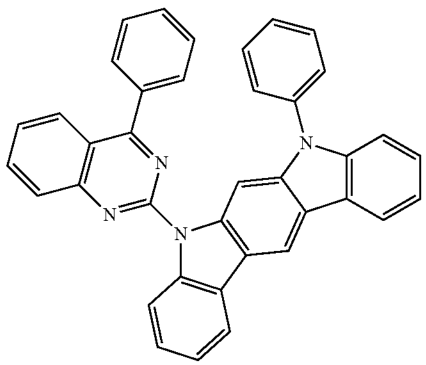
-continued
H-2
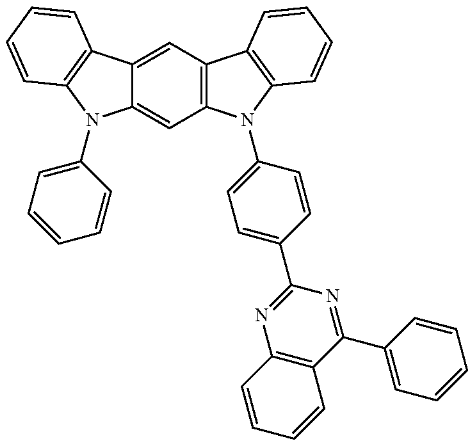
H-3
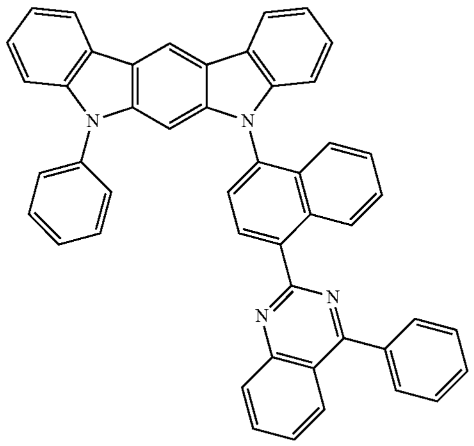
H-4
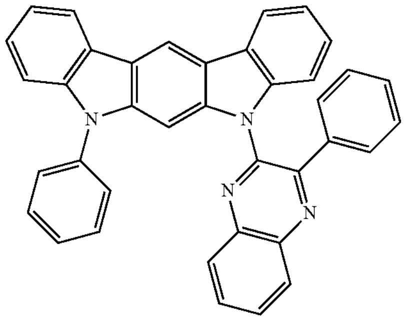
H-5
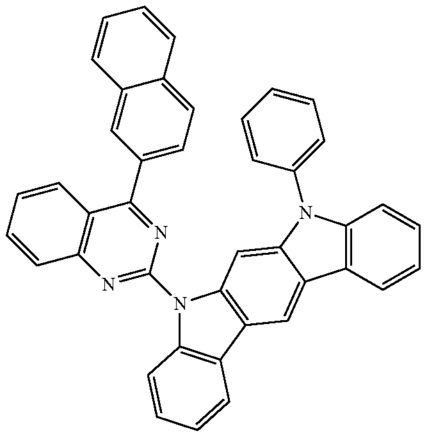

-continued
H-6
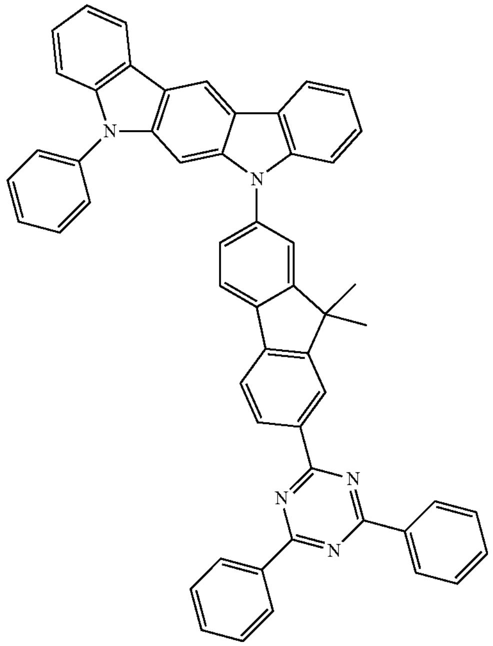
H-7
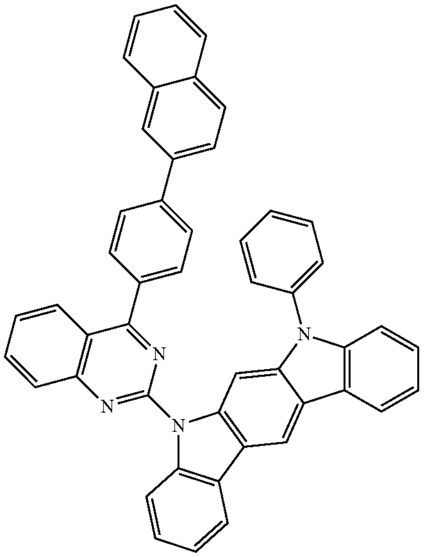
-continued
H-8
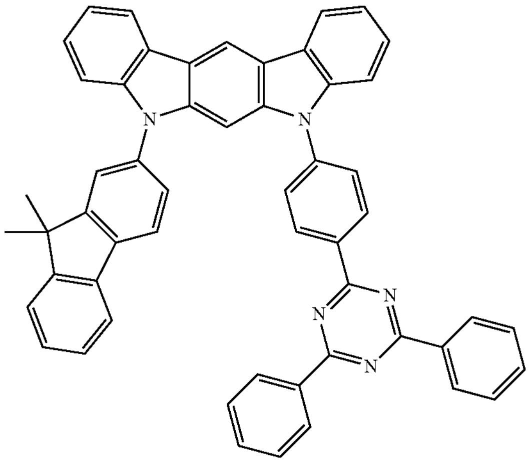
H-9
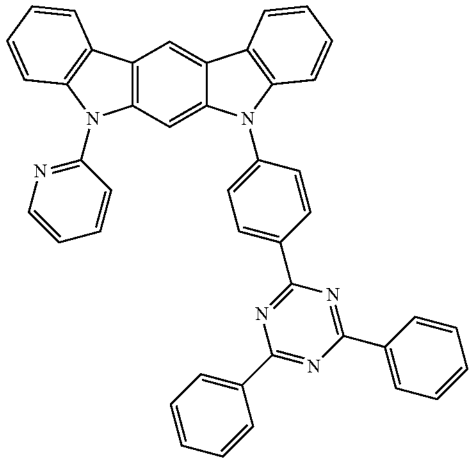
H-10
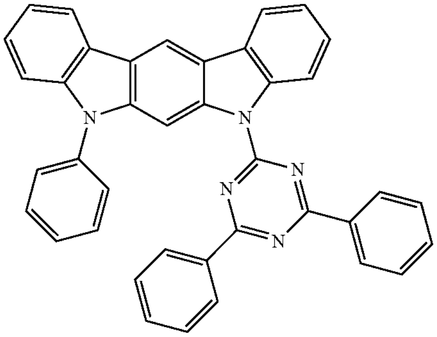

-continued
H-11
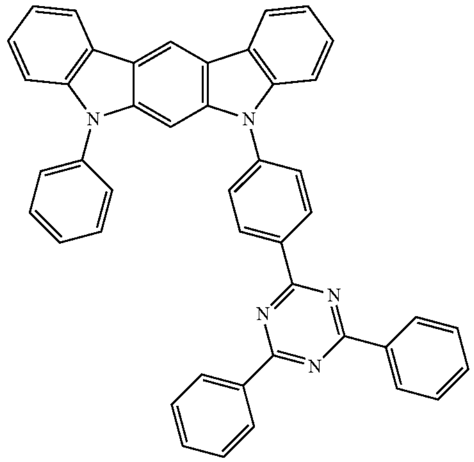
H-12
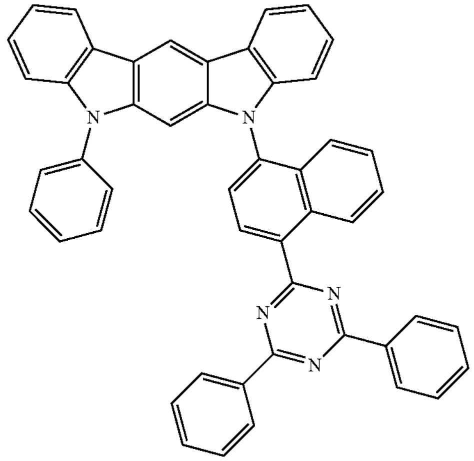
H-13
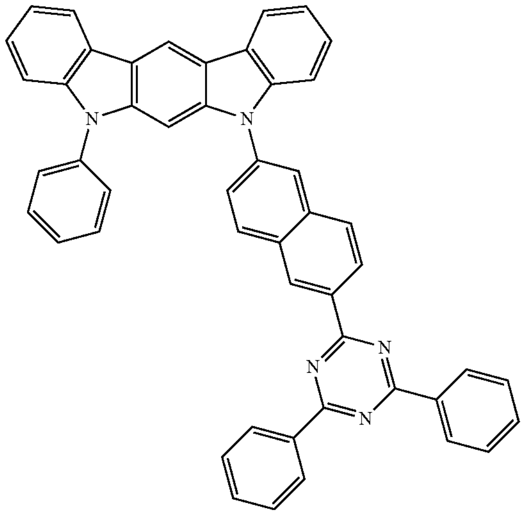
-continued
H-14
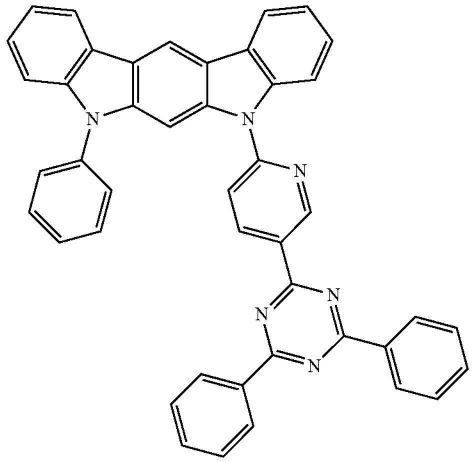
H-15
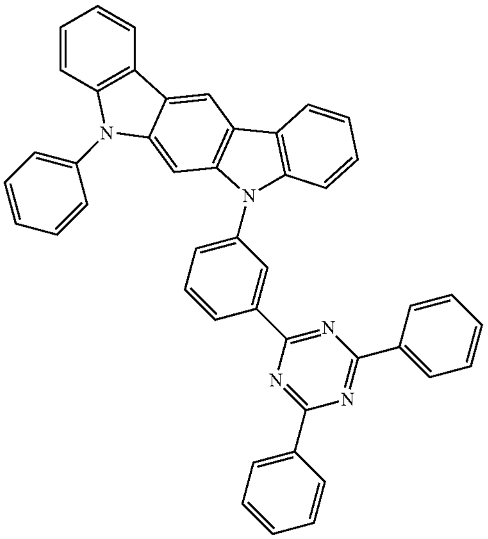
H-16
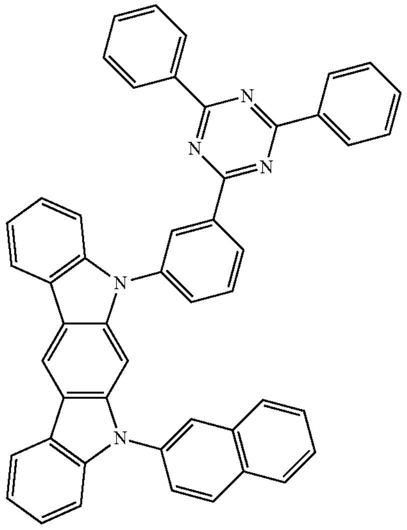

-continued
H-17
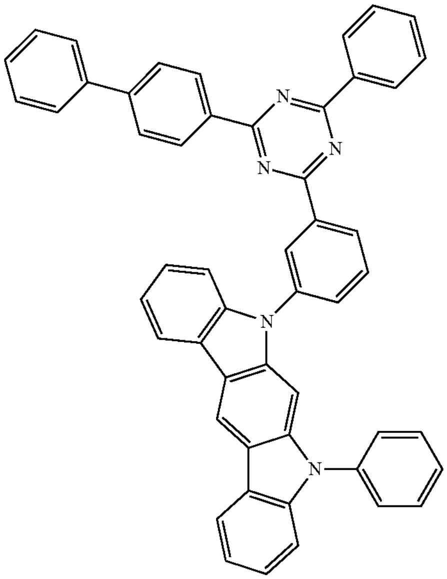
H-18
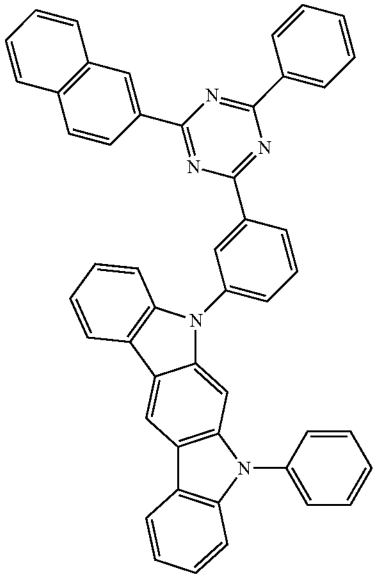
-continued
H-19
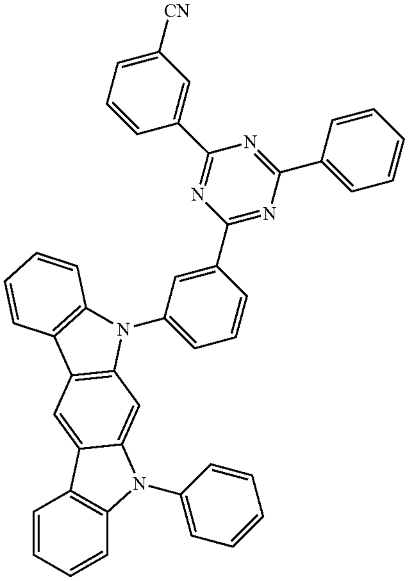
H-20
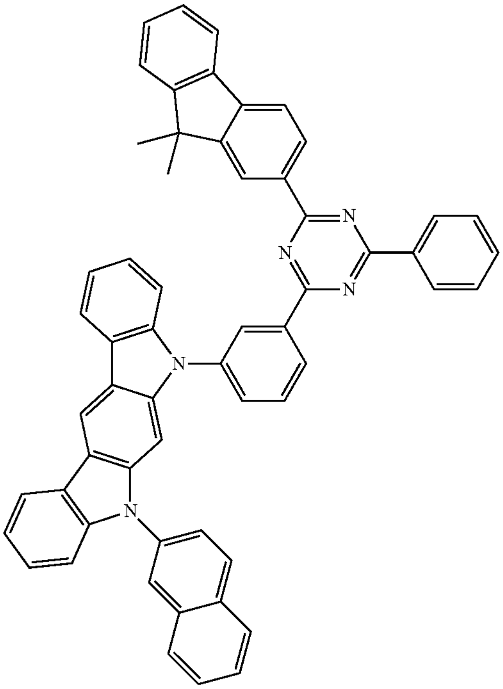

-continued
H-21
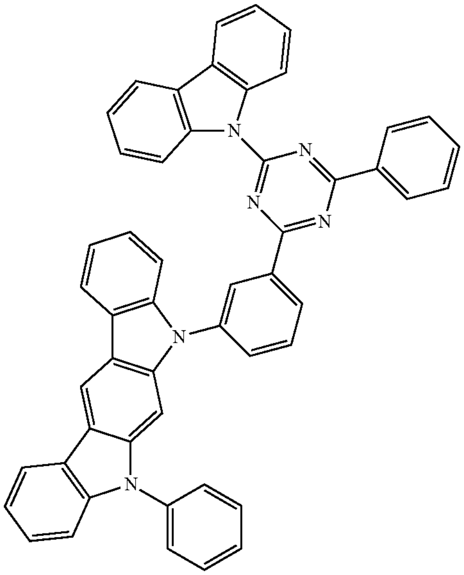
H-22
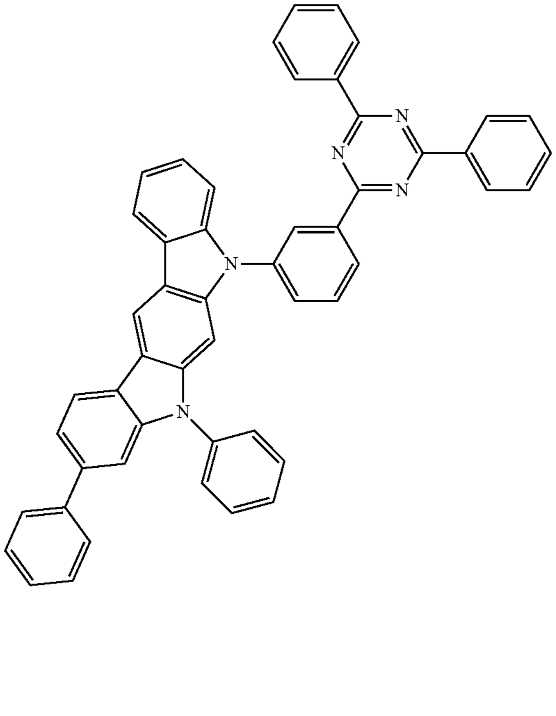
-continued
H-23
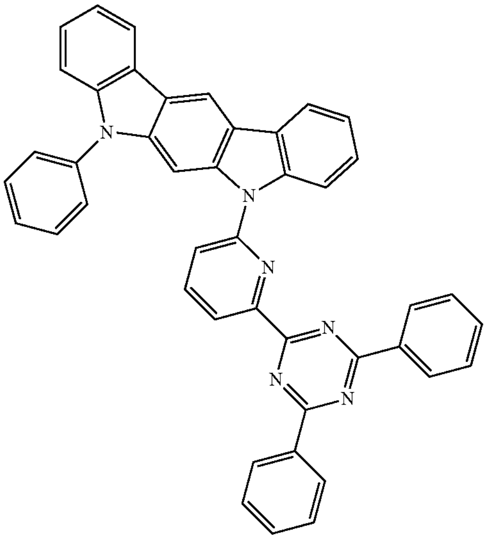
H-24
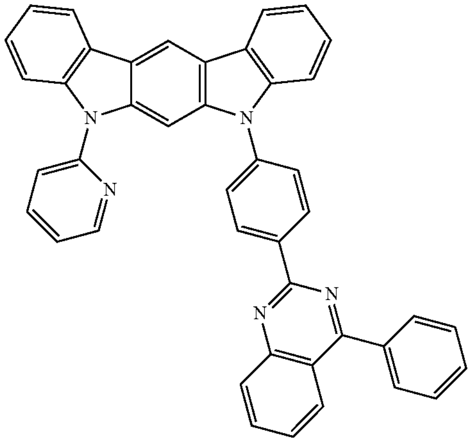
H-25
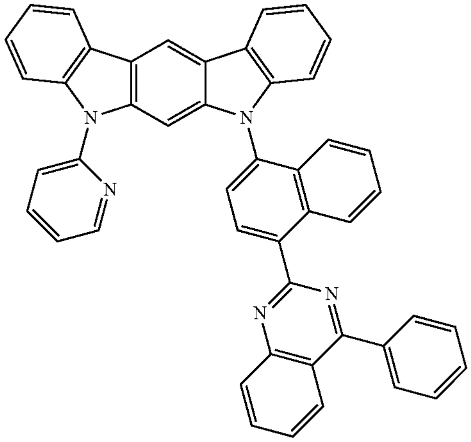

-continued
H-26
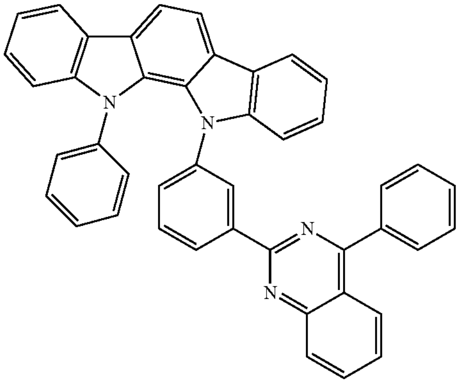
H-27
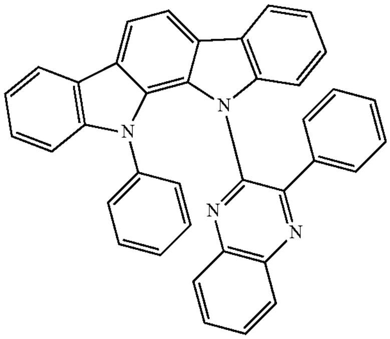
H-28
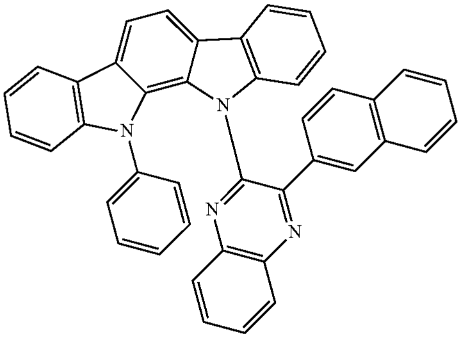
H-29
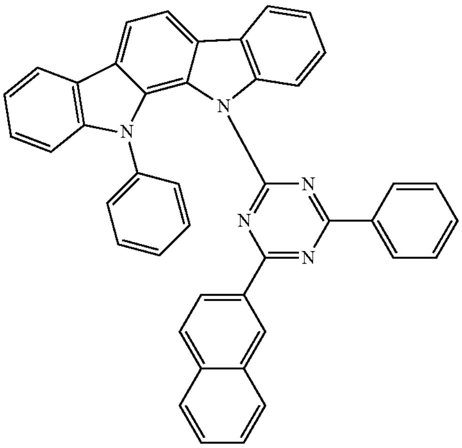
H-30
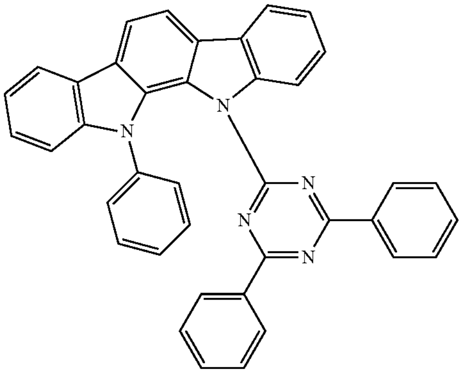
H-31
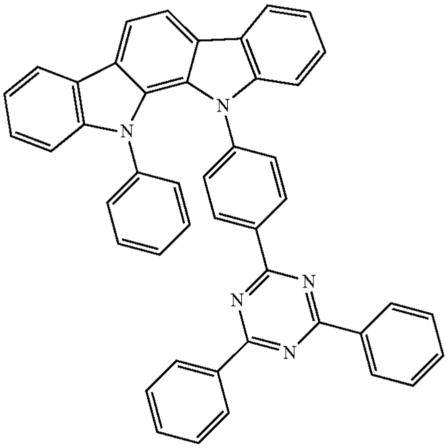
H-32
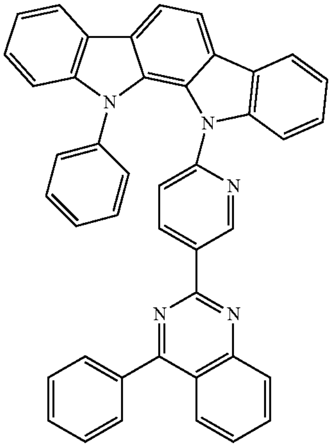

-continued
H-33
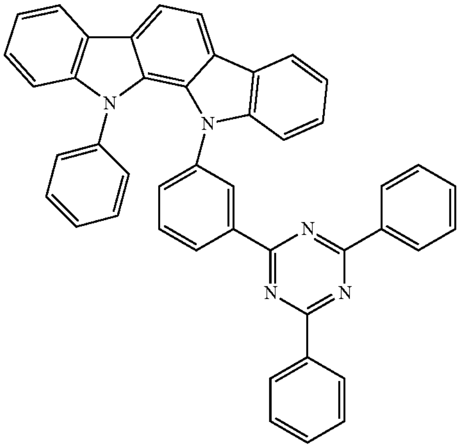
H-34
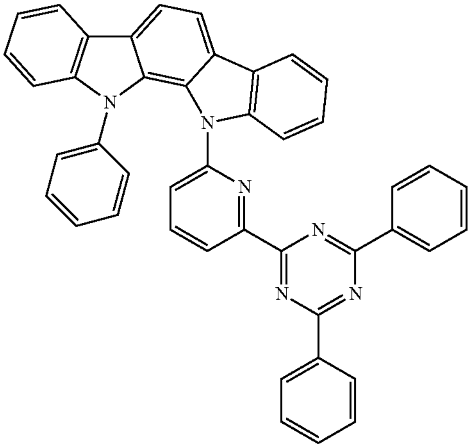
H-35
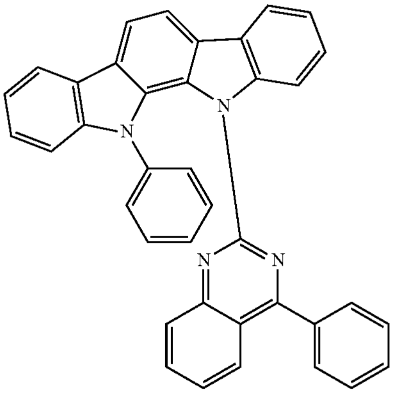
-continued
H-36
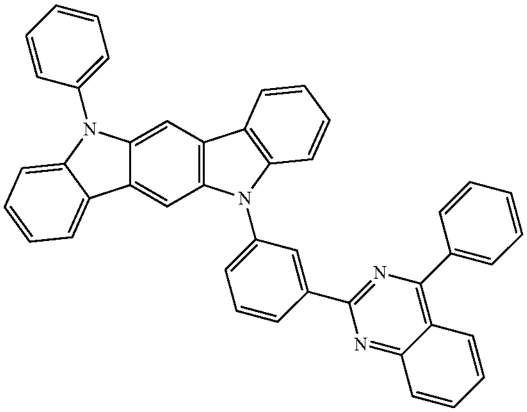
H-37
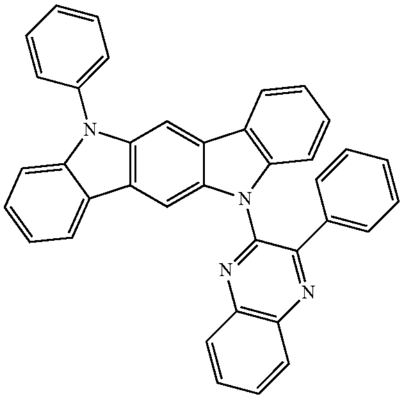
H-38
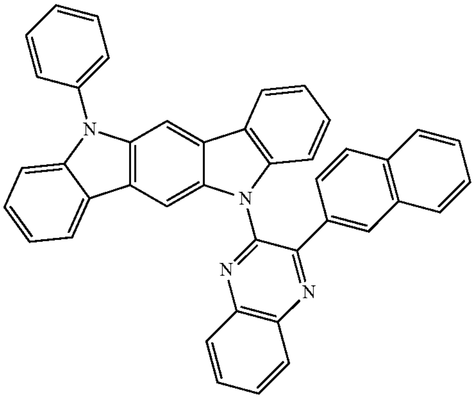

-continued
H-39
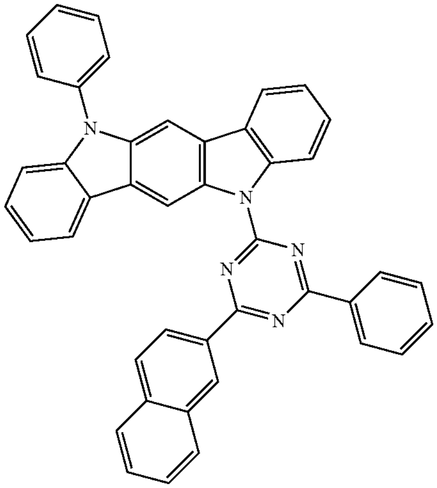
H-40
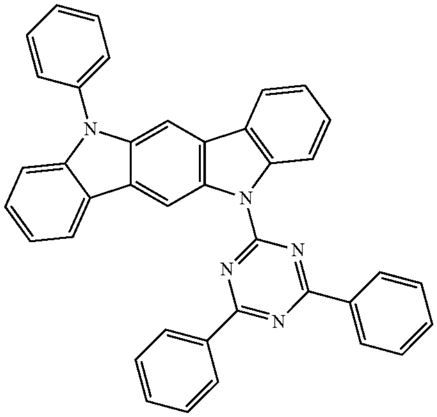
H-41
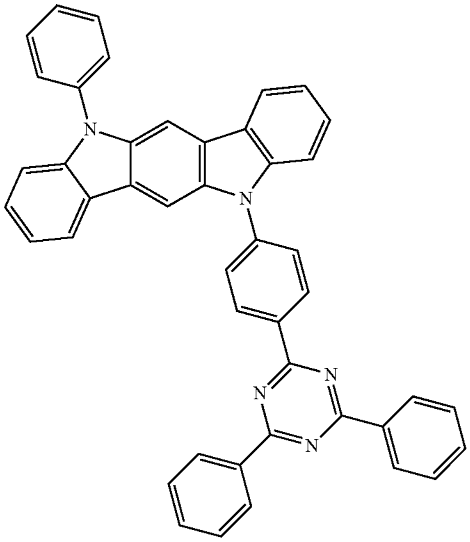
-continued
H-42
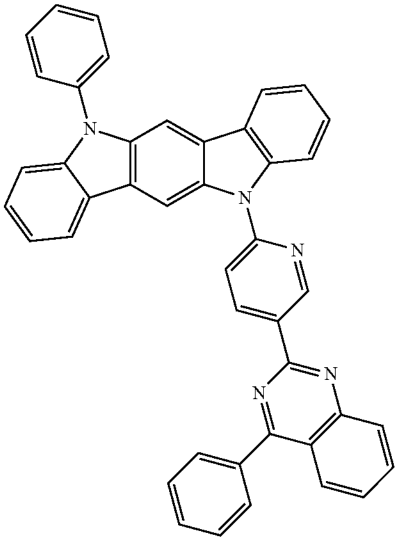
H-43
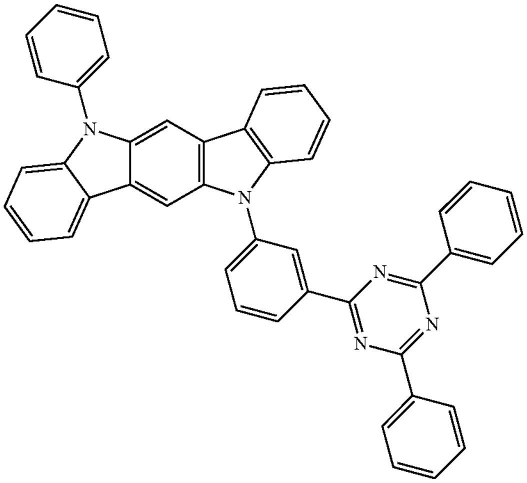
H-44
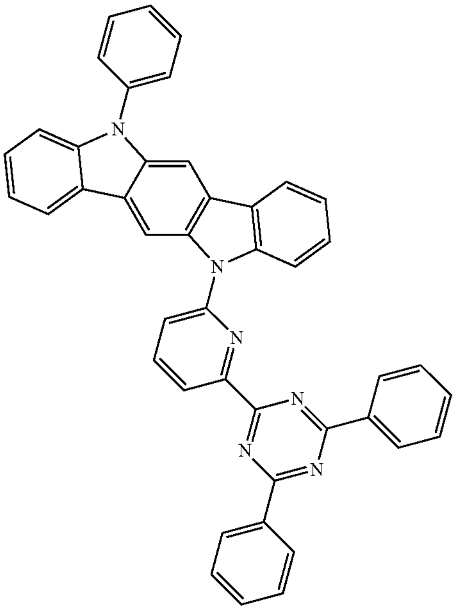

-continued
H-45
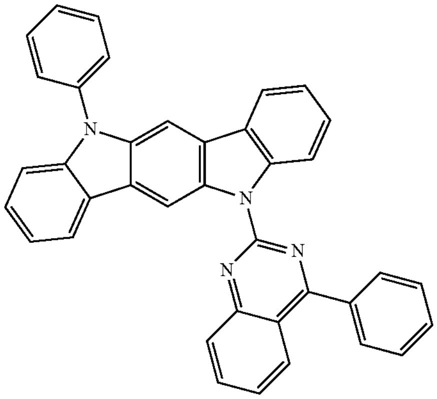
H-46
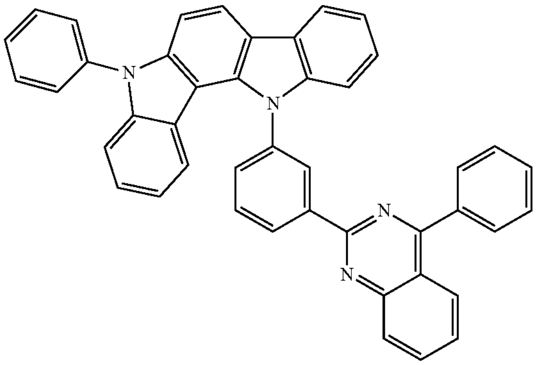
H-47
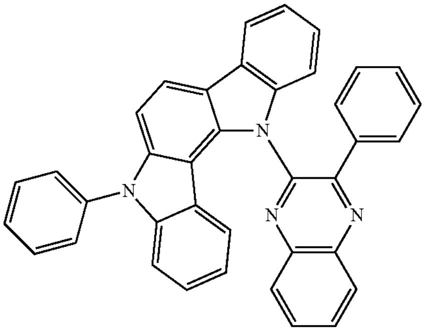
H-48
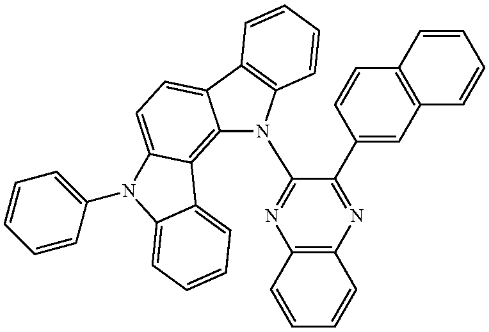
-continued
H-49
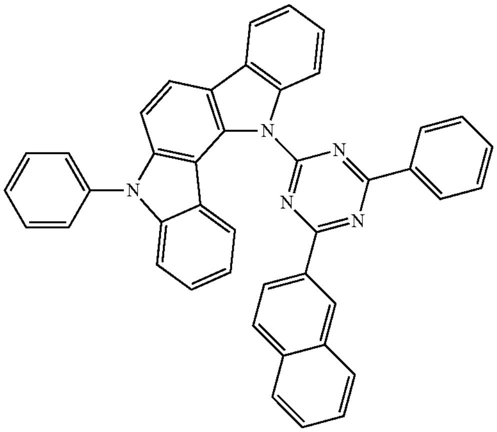
H-50
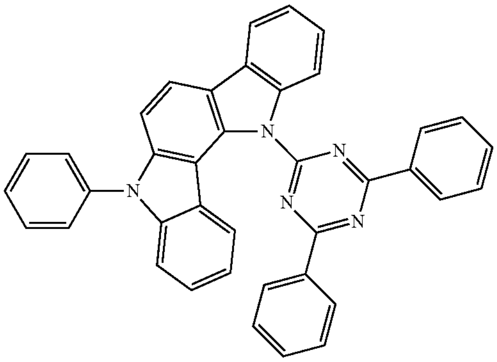
H-51
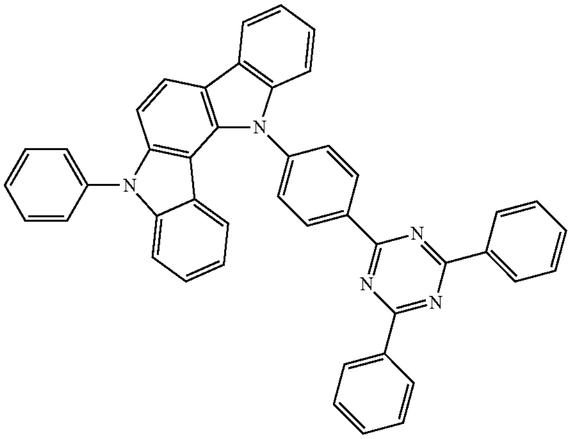

-continued
H-52
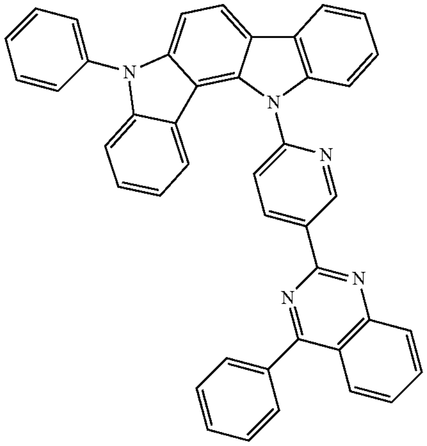
H-53
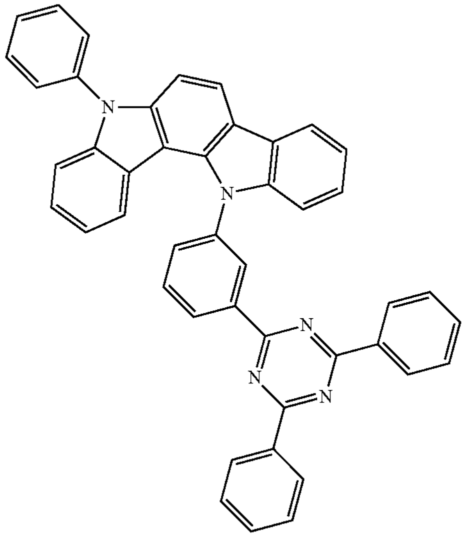
H-54
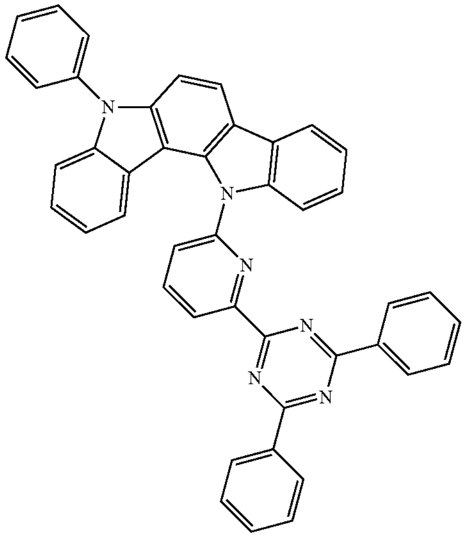
-continued
H-55
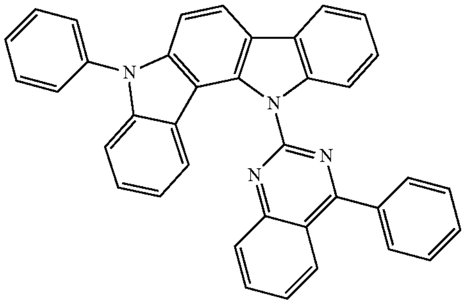
H-56
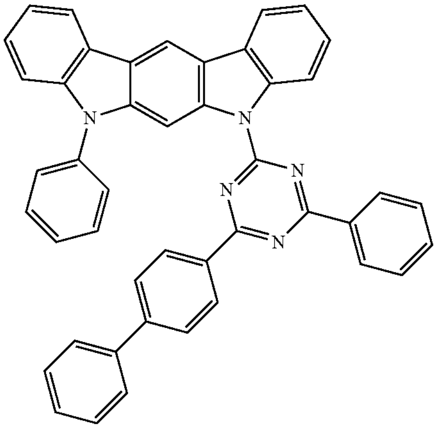
H-57
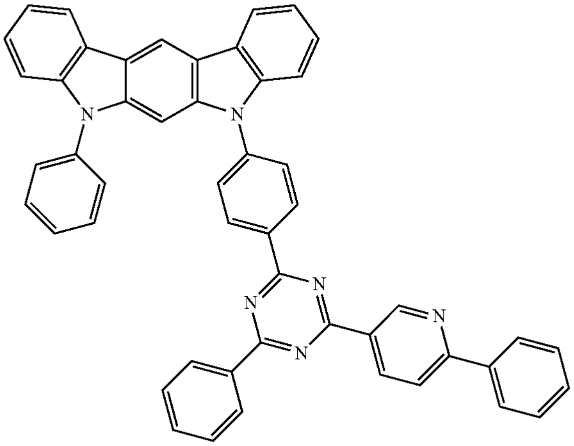

-continued
H-58
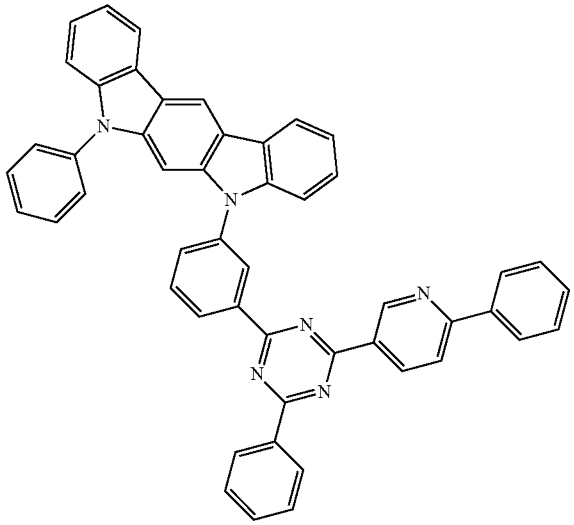
H-59
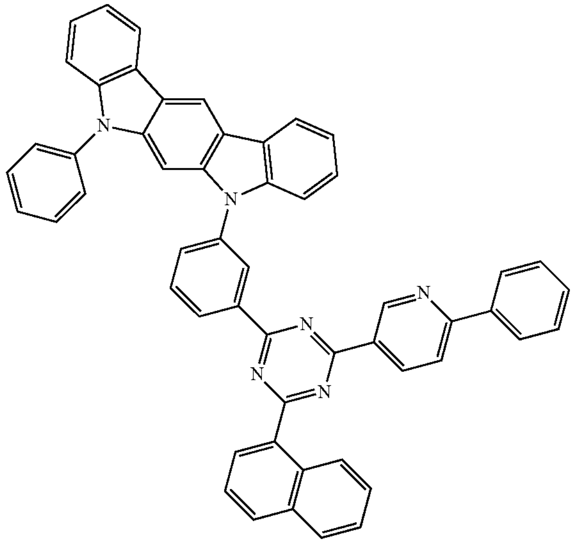
H-60
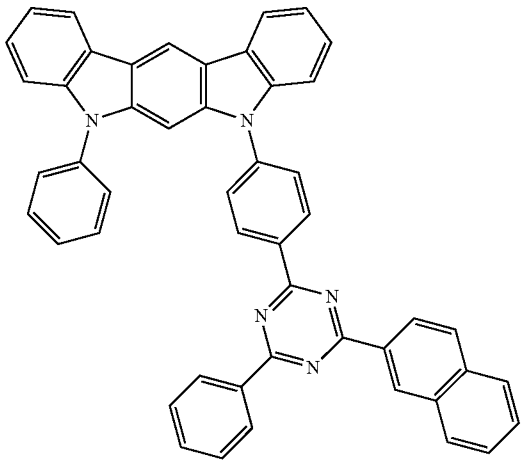
-continued
H-61
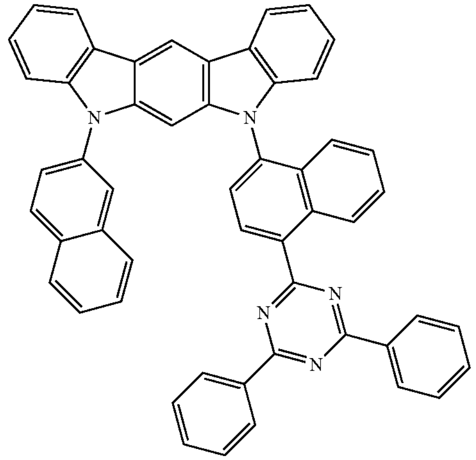
H-62
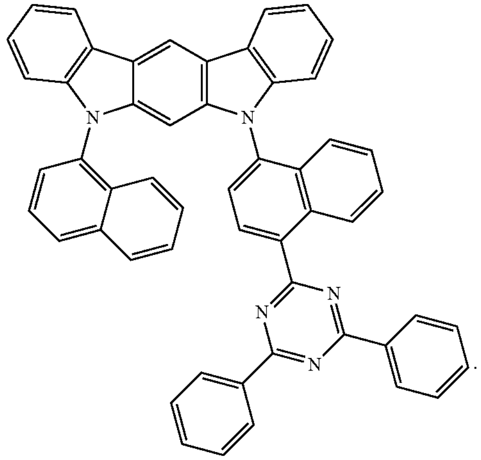
The compounds of formulas 1 and 2 of the present disclosure can be prepared by a synthetic method known to a person skilled in the art. For example, the compound of formula 1 can be prepared according to the following reaction scheme.
[Reaction Scheme 1]
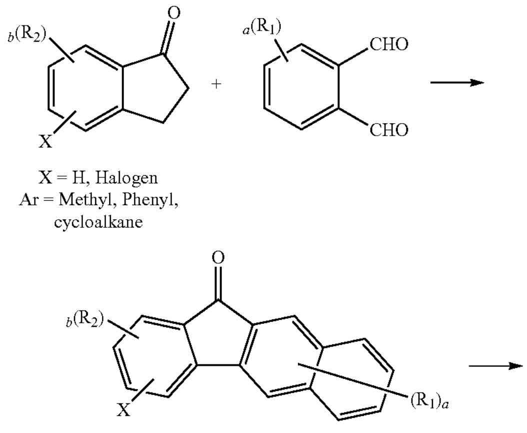

-continued

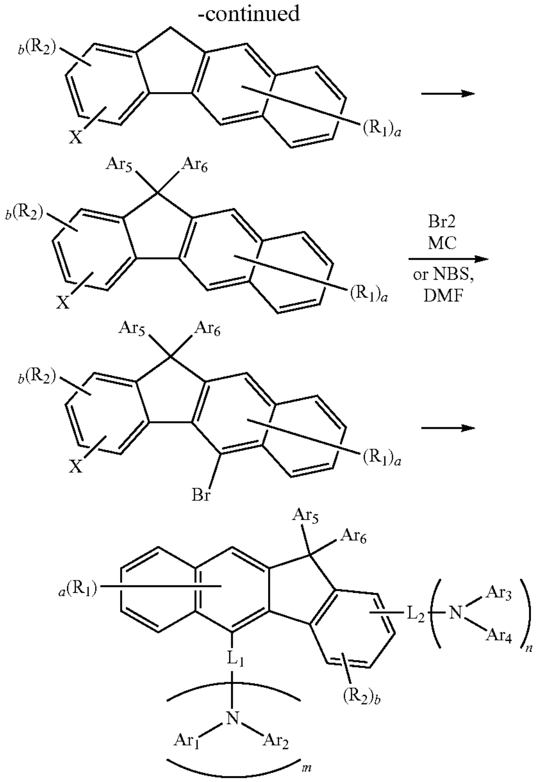

wherein $Ar_1$ to $Ar_6$, $L_1$, $L_2$, $R_1$, $R_2$, a, b, m, and n are as defined in formula 1.

The organic electroluminescent device according to one embodiment of the present disclosure may comprise a first electrode; a second electrode opposing the first electrode; one or more light-emitting layers disposed between the first electrode and the second electrode; and a hole transport zone of one or more layers disposed between the first electrode and the light-emitting layer, wherein at least one layer of the hole transport zone comprises a compound represented by formula 1, and at least one layer of the light-emitting layers comprises a compound represented by formula 2.

According to one embodiment of the present disclosure, compounds of formulas 1 and 2 may be comprised in the same layer or may be each comprised in different layers of the organic electroluminescent device. The compound of formula 1 may be comprised in the hole transport zone and the compound of formula 2 may be comprised in the light-emitting layer, and more specifically, the compound of formula 1 may be comprised in the hole transport layer and the compound of formula 2 may be comprised in the light-emitting layer as a host compound, for example, but not limited thereto.

In addition to the light-emitting layer and the hole transport zone, at least one layer selected from a light-emitting auxiliary layer, an electron transport layer, an electron buffer layer, an electron injection layer, an interlayer, and a hole blocking layer may be comprised between the first electrode and the second electrode.

The hole transport zone of the present disclosure may consist of at least one layer selected from the group consisting of a hole transport layer, a hole injection layer, an electron blocking layer, and a hole auxiliary layer, and each layer may consist of one or more layers.

According to one embodiment of the present disclosure, the hole transport zone comprises a hole transport layer. Further, the hole transport zone may comprise a hole transport layer and further comprise one or more layers of a hole injection layer, an electron blocking layer, and a hole auxiliary layer.

Herein, the hole auxiliary layer or the light-emitting auxiliary layer is placed between the hole transport layer and the light-emitting layer, and may be used for controlling the transport rate of holes. The hole auxiliary layer or the light-emitting auxiliary layer may provide an effect of improving the efficiency and the lifespan of the organic electroluminescent device.

The light-emitting auxiliary layer may be placed between the anode and the light-emitting layer, or between the cathode and the light-emitting layer. When the light-emitting auxiliary layer is placed between the anode and the light-emitting layer, it can be used for promoting the hole injection and/or hole transport, or for preventing the overflow of electrons. When the light-emitting auxiliary layer is placed between the cathode and the light-emitting layer, it can be used for promoting the electron injection and/or electron transport, or for preventing the overflow of holes. Also, the hole auxiliary layer may be placed between the hole transport layer (or hole injection layer) and the light-emitting layer, and may be effective to promote or block the hole transport rate (or hole injection rate), thereby enabling the charge balance to be controlled. Further, the electron blocking layer may be placed between the hole transport layer (or hole injection layer) and the light-emitting layer, and can confine the excitons within the light-emitting layer by blocking the overflow of electrons from the light-emitting layer to prevent a light-emitting leakage. When an organic electroluminescent device includes two or more hole transport layers, the hole transport layer, which is further included, may be used as a hole auxiliary layer or an electron blocking layer. The hole auxiliary layer and the electron blocking layer may have an effect of improving the efficiency and/or the lifespan of the organic electroluminescent device.

According to one embodiment of the present disclosure, the hole transport layer may consist of a single layer, and a hole transport material comprising the compound represented by formula 1 of the present disclosure may be comprised herein.

According to another embodiment of the present disclosure, the hole transport zone may comprise a hole transport layer, and the hole transport layer may consist of multi-layers of two or more layers. A hole transport material comprising the compound represented by formula 1 of the present disclosure may be comprised in at least one layer of the multi-layers. In the hole transport layer comprising the compound of formula 1 or the other layers, any compound used for the conventional hole transport material may be comprised. For example, a compound of the following formula 11 may be comprised.

(11)

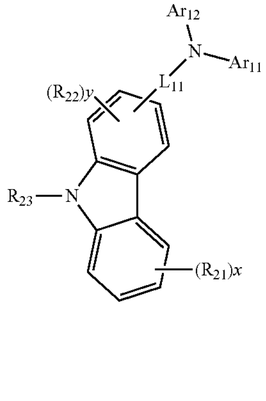

wherein $L_{11}$ represents a single bond, a substituted or unsubstituted (C6-C30)arylene, or a substituted or unsubstituted (5- to 30-membered)heteroarylene;

$Ar_{11}$ and $Ar_{12}$ each independently represent a substituted or unsubstituted (C6-C30)aryl, or a substituted or unsubstituted (5- to 30-membered)heteroaryl, or $Ar_{11}$ and $L_{11}$ may form a nitrogen-containing (5- to 30-membered)heteroaryl with the bonded nitrogen;

$R_{21}$ to $R_{23}$ each independently represent hydrogen, deuterium, a halogen, a cyano, a carboxyl, a nitro, a hydroxyl, a substituted or unsubstituted (C1-C30)alkyl, a substituted or unsubstituted (C2-C30)alkenyl, a substituted or unsubstituted (C2-C30)alkynyl, a substituted or unsubstituted (C1-C30)alkoxy, a substituted or unsubstituted (C3-C30)cycloalkyl, a substituted or unsubstituted (C3-C30)cycloalkenyl, a substituted or unsubstituted (3- to 7-membered)heterocycloalkyl, a substituted or unsubstituted (C6-C30)aryl, a substituted or unsubstituted (5- to 30-membered)heteroaryl, $-NR_{31}R_{32}$, $-SiR_{33}R_{34}R_{35}$, $-SR_{36}$, $-OR_{37}$, $-COR_{38}$, or $-B(OR_{39})(OR_{40})$, or are linked to an adjacent substituent(s) to form a mono- or polycyclic, (3- to 30-membered) alicyclic or aromatic ring, or the combination thereof, whose carbon atom(s) may be replaced with at least one hetero atom selected from nitrogen, oxygen, and sulfur;

$R_{31}$ to $R_{40}$ each independently represent hydrogen, deuterium, a halogen, a cyano, a carboxyl, a nitro, a hydroxyl, a substituted or unsubstituted (C1-C30)alkyl, a substituted or unsubstituted (C2-C30)alkenyl, a substituted or unsubstituted (C2-C30)alkynyl, a substituted or unsubstituted (C1-C30)alkoxy, a substituted or unsubstituted (C3-C30)cycloalkyl, a substituted or unsubstituted (C3-C30)cycloalkenyl, a substituted or unsubstituted (3- to 7-membered)heterocycloalkyl, a substituted or unsubstituted (C6-C30)aryl, or a substituted or unsubstituted (5- to 30-membered)heteroaryl, or are linked to an adjacent substituent(s) to form a mono- or polycyclic, (3- to 30-membered) alicyclic or aromatic ring, or the combination thereof, whose carbon atom(s) may be replaced with at least one hetero atom selected from nitrogen, oxygen, and sulfur;

x represents an integer of 1 to 4, where x is an integer of 2 or more, each of $R_{21}$ may be the same or different;

y represents an integer of 1 to 3, where y is an integer of 2 or more, each of $R_{22}$ may be the same or different;

the heteroaryl(ene) contains at least one hetero atom selected from B, N, O, S, Si, and P; and the heterocycloalkyl contains at least one hetero atom selected from O, S, and N.

The compound of formula 2 of the present disclosure may be comprised in the light-emitting layer. Where used in the light-emitting layer, the organic electroluminescent compound of formula 2 of the present disclosure can be comprised as a host material. Preferably, the light-emitting layer can further comprise one or more dopants. If necessary, the compound of formula 2 of the present disclosure can be used as a co-host material. That is, the light-emitting layer can additionally comprise a compound other than the organic electroluminescent compound of formula 2 of the present disclosure (first host material) as a second host material. Herein, the weight ratio of the first host material to the second host material is in the range of 1:99 to 99:1.

The second host material can be any of the known phosphorescent hosts. The host selected from the group consisting of the compounds of formulas 12 to 17 below is preferable in terms of luminous efficiency.

$$H—(Cz—L_4)_c—M \qquad (12)$$

$$H—(Cz)_d—L_4—M \qquad (13)$$

(14)

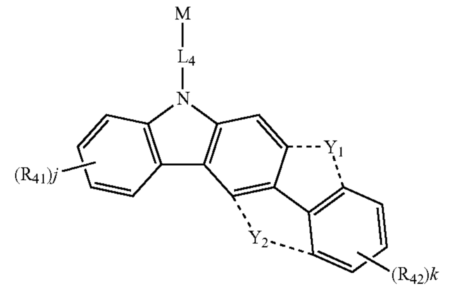

(15)

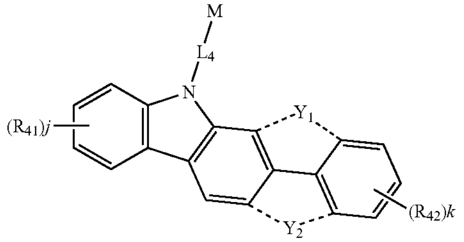

(16)

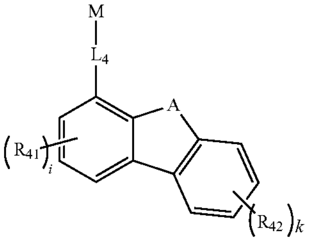

wherein

Cz represents the following structure:

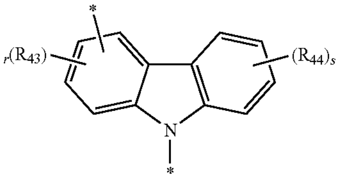

A represents —O— or —S—; and $R_{41}$ to $R_{44}$, each independently, represent hydrogen, deuterium, a halogen, a substituted or unsubstituted (C1-C30)alkyl, a substituted or unsubstituted (C6-C30)aryl, a substituted or unsubstituted (5- to 30-membered) heteroaryl, or $-SiR_{45}R_{46}R_{47}$; in which $R_{45}$ to $R_{47}$, each independently, represent a substituted or unsubstituted (C1-C30)alkyl, or a substituted or unsubstituted (C6-C30)aryl; $L_4$ represents a single bond, a substituted or unsubstituted (C6-C30)arylene, or a substituted or unsubstituted (5- to 30-membered)heteroarylene; M represents a substituted or unsubstituted (C6-C30)aryl, or a substituted or unsubstituted (5- to 30-membered) heteroaryl; $Y_1$ and $Y_2$, each independently, represent —O—, —S—, —$N(R_{51})$— or —$C(R_{52})(R_{53})$—, with the proviso that $Y_1$ and $Y_2$ are not present simultaneously; $R_{51}$ to $R_{53}$, each independently, represent a substituted or unsubstituted (C1-C30)alkyl, a substituted or unsubstituted (C6-C30)aryl, or a substituted or unsubstituted (5- to 30-membered)heteroaryl; $R_{52}$ and $R_{53}$ may be the same or different; c and d, each independently, represent an integer of 1 to 3; j, k, r, and s, each independently, represent an integer of 0 to 4; i represents an integer of 0 to 3; if c, d, i, j, k, r, or s represents an integer of 2 or more, each ($Cz-L_4$), each (Cz), each $R_{41}$, each $R_{42}$, each $R_{43}$, or each $R_{44}$ may be the same or different;

(17)

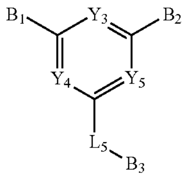

wherein $Y_3$ to $Y_5$, each independently, represent $CR_{54}$ or N;

$R_{54}$ represents hydrogen, a substituted or unsubstituted (C1-C30)alkyl, a substituted or unsubstituted (C6-C30)aryl, or a substituted or unsubstituted (5- to 30-membered)heteroaryl;

$B_1$ and $B_2$, each independently, represent hydrogen, a substituted or unsubstituted (C6-C30)aryl, or a substituted or unsubstituted (5- to 30-membered)heteroaryl;

$B_3$ represents a substituted or unsubstituted (C6-C30)aryl, or a substituted or unsubstituted (5- to 30-membered)heteroaryl; and $L_5$ represents a single bond, a substituted or unsubstituted (C6-C30)arylene, or a substituted or unsubstituted (5- to 30-membered)heteroarylene.

Specifically, the preferable examples of the second host material are as follows, but are not limited thereto.

B-1

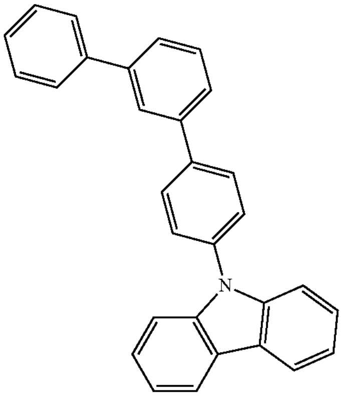

-continued

B-2

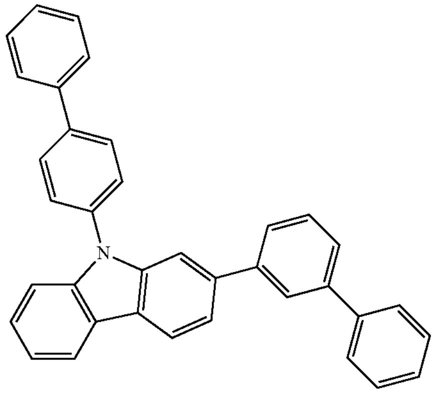

B-3

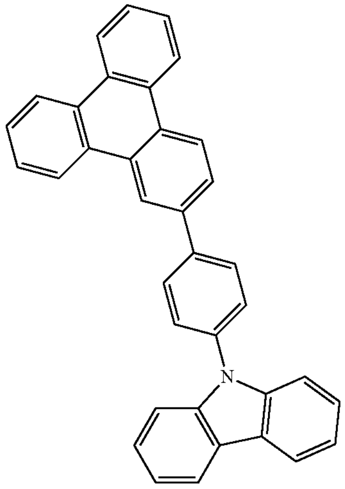

B-4

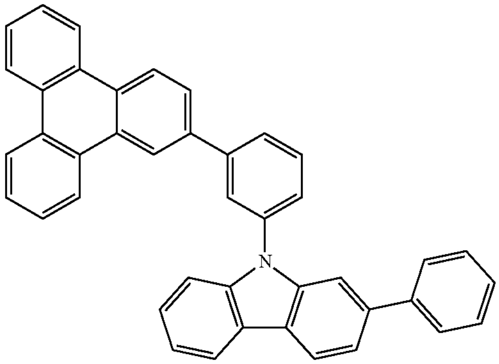

B-5

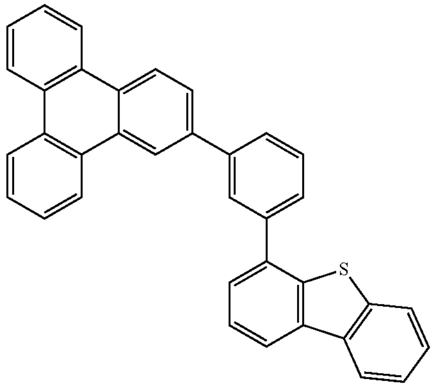

-continued
B-6
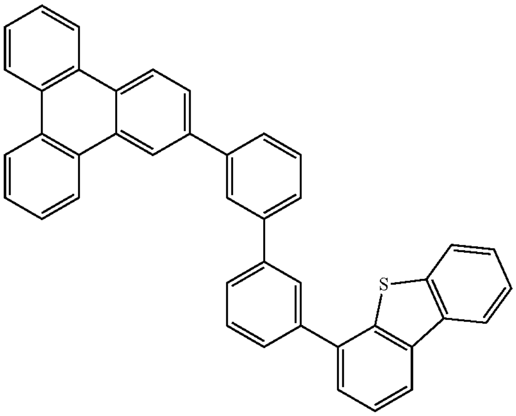
B-7
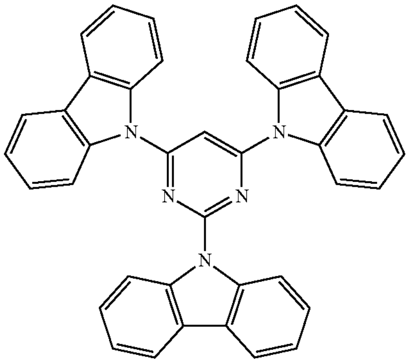
B-8
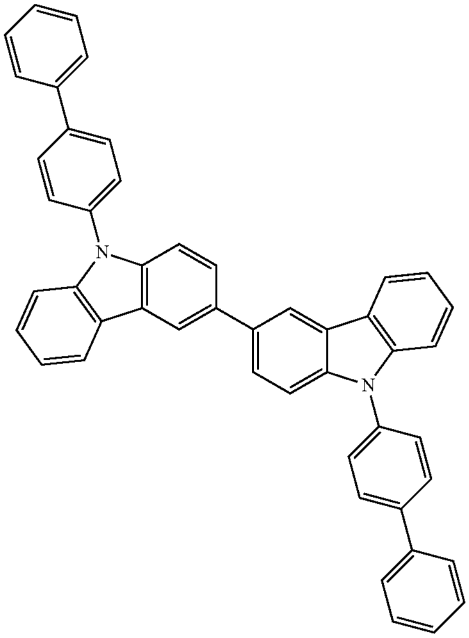
-continued
B-9
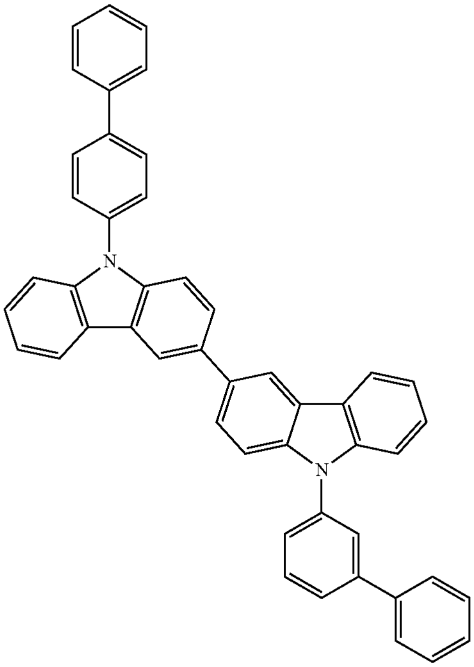
B-10
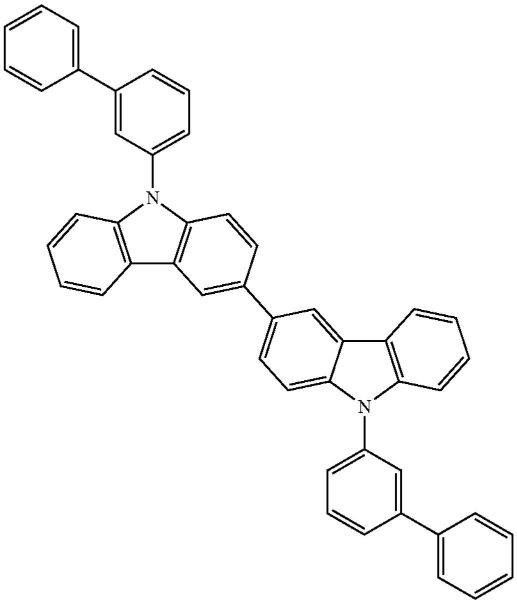

-continued
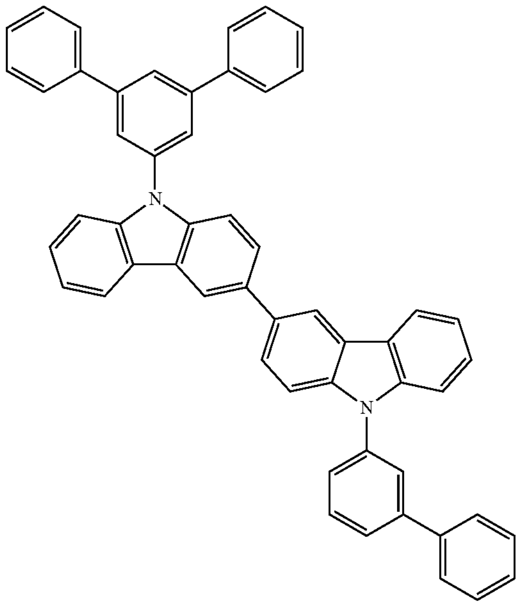
B-11
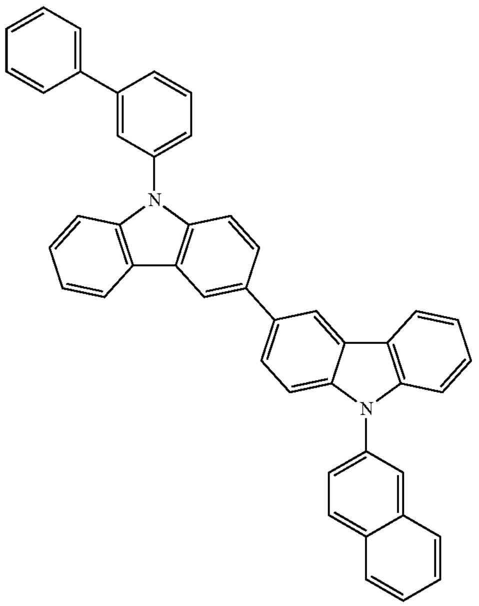
B-12
-continued
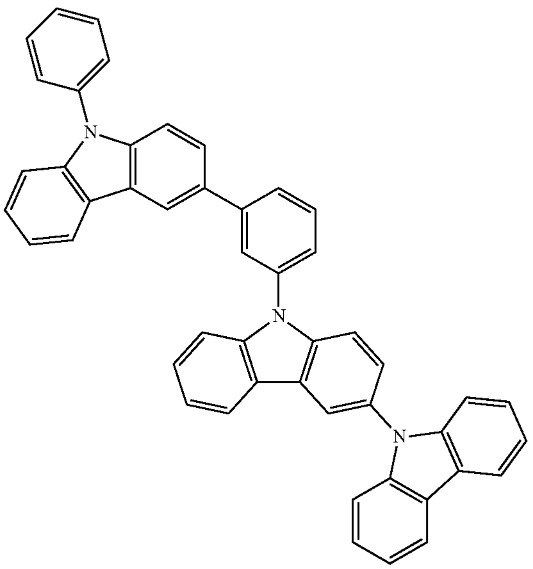
B-13
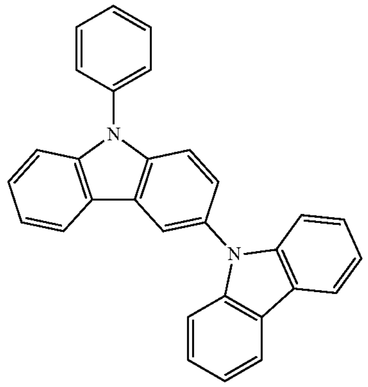
B-14
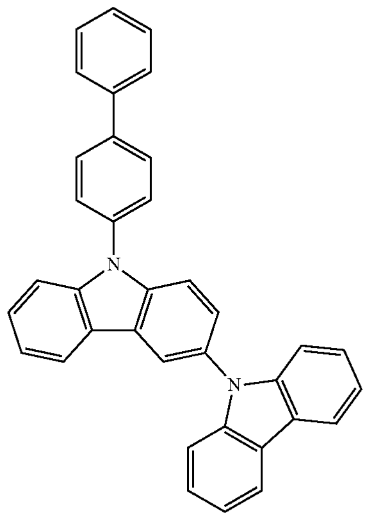
B-15

-continued
B-16
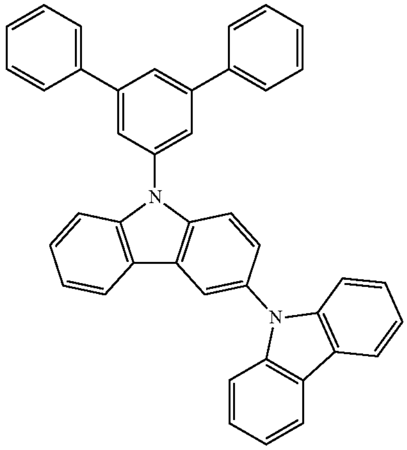
B-17
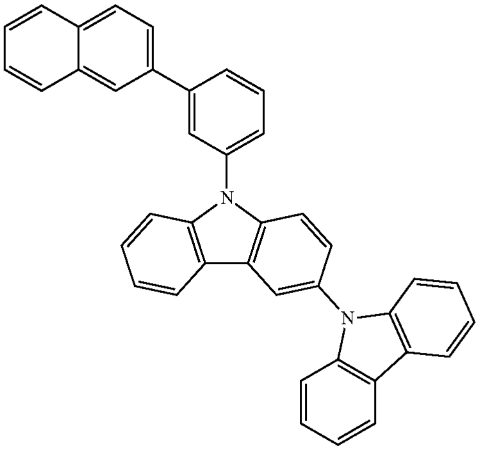
B-18
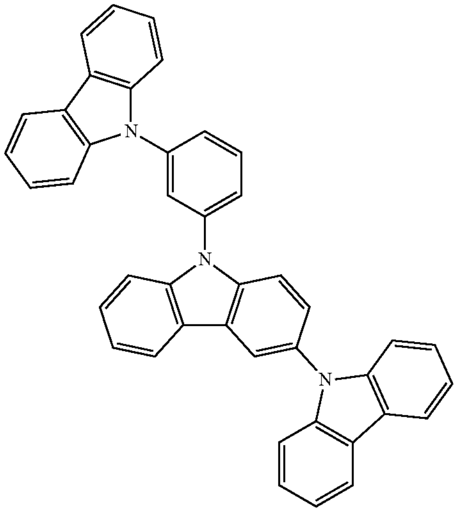
-continued
B-19
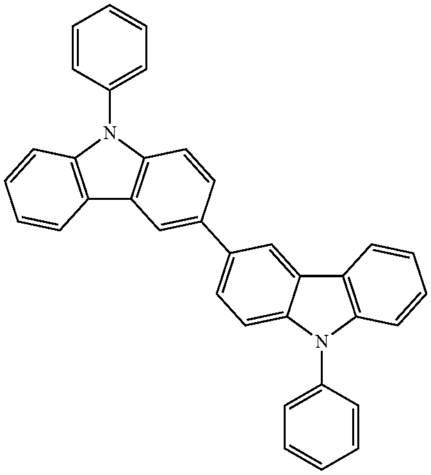
B-20
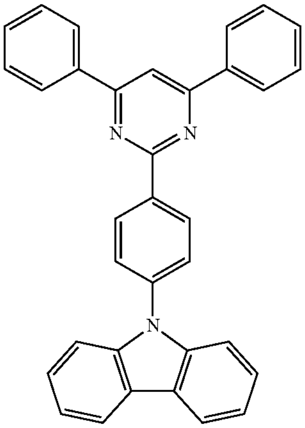
B-21
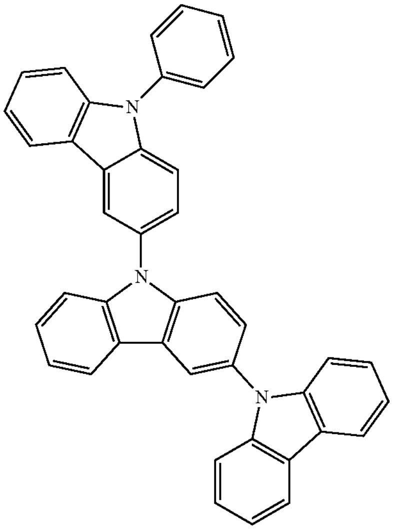

-continued
B-22
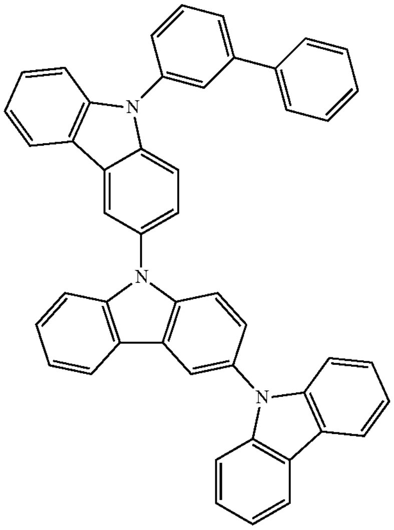
B-23
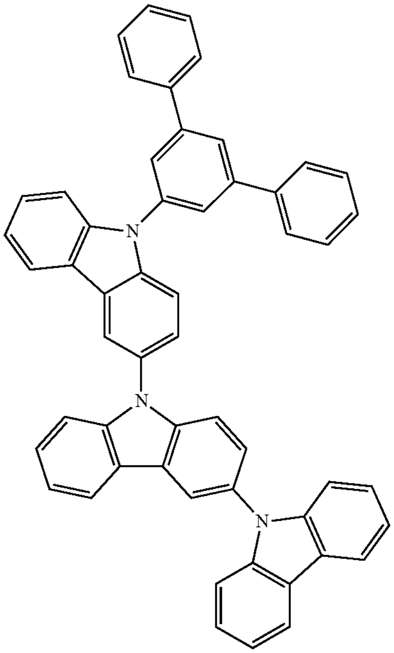
-continued
B-24
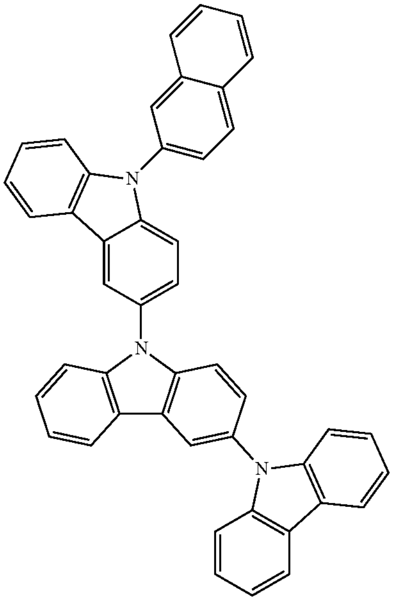
B-25
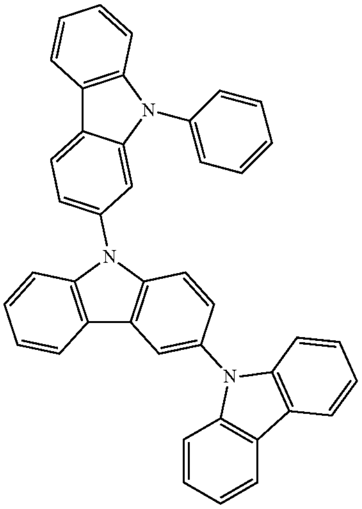
B-26
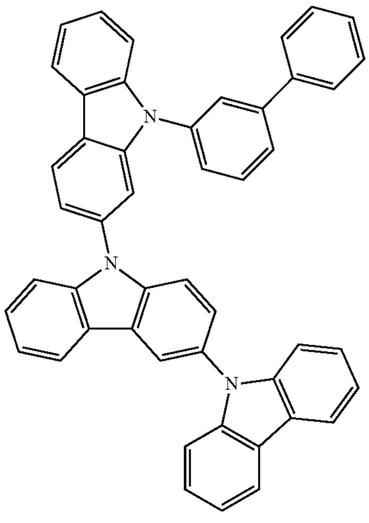

-continued
B-27
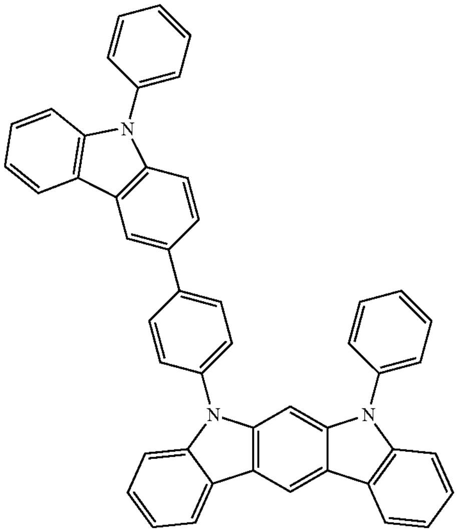
B-28
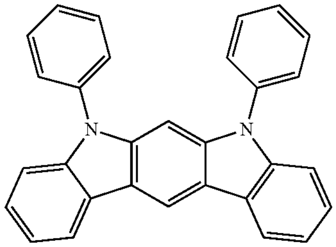
B-29
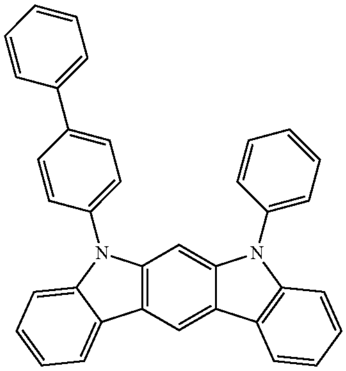
B-30
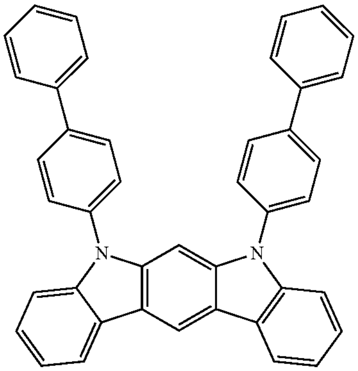
-continued
B-31
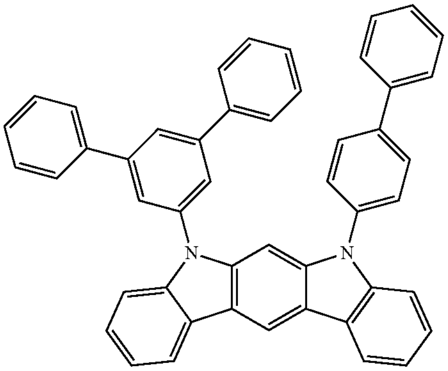
B-32
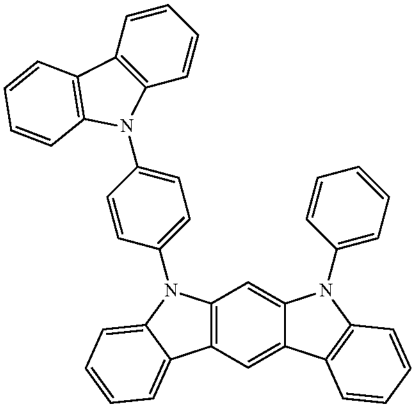
B-33
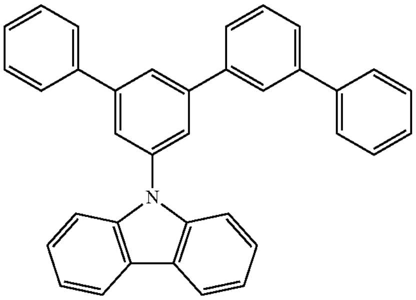
B-34
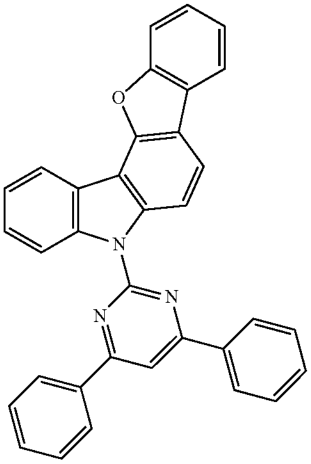

-continued
B-35
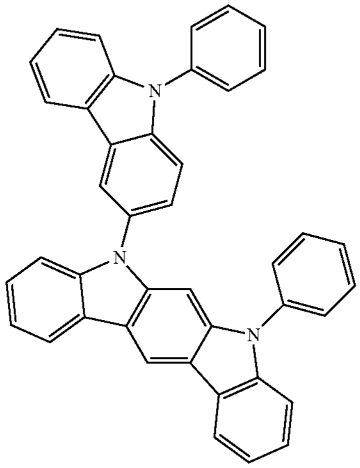
B-36
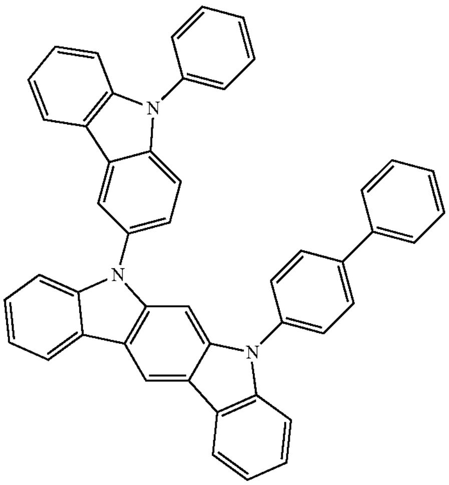
B-37
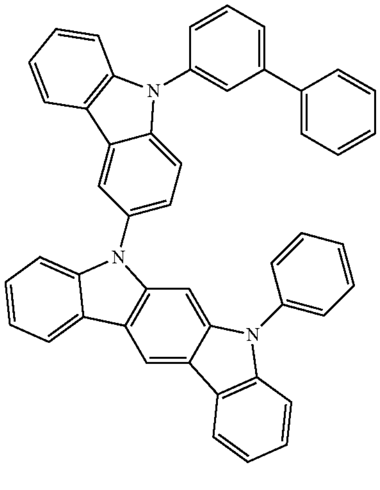
-continued
B-38
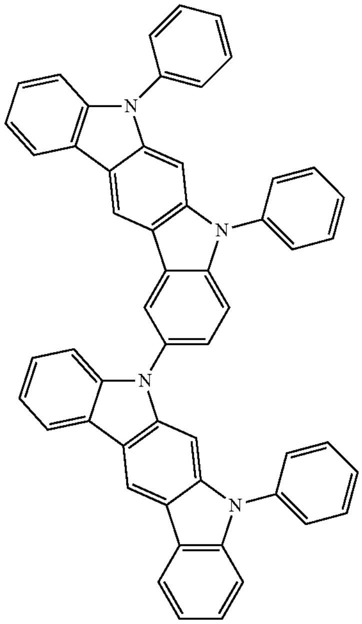
B-39
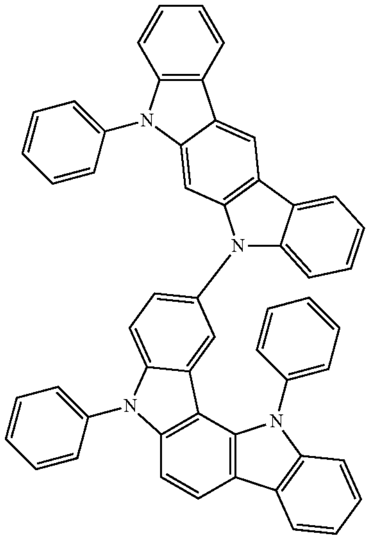
B-40
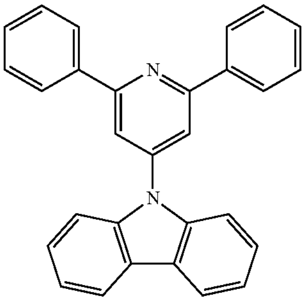

-continued
B-41
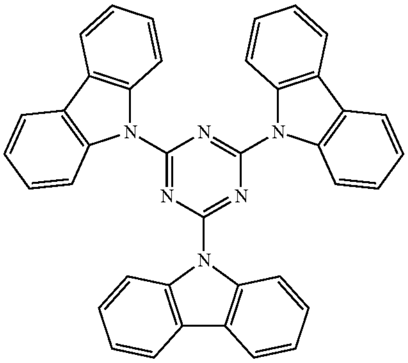
B-42
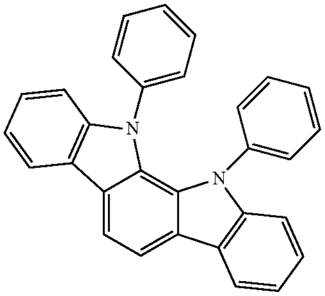
B-43
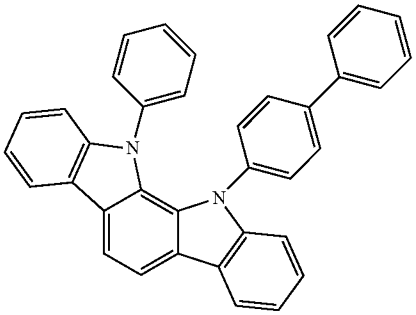
B-44
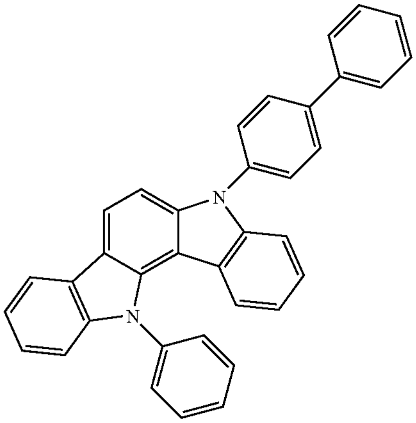
-continued
B-45
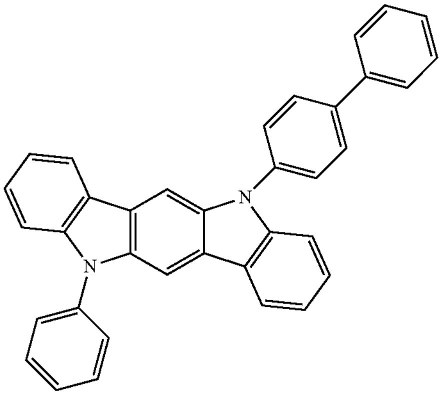
B-46
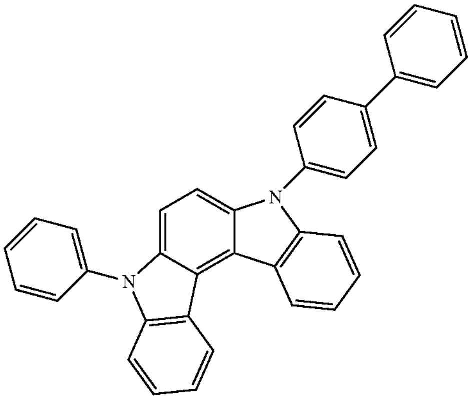
B-47
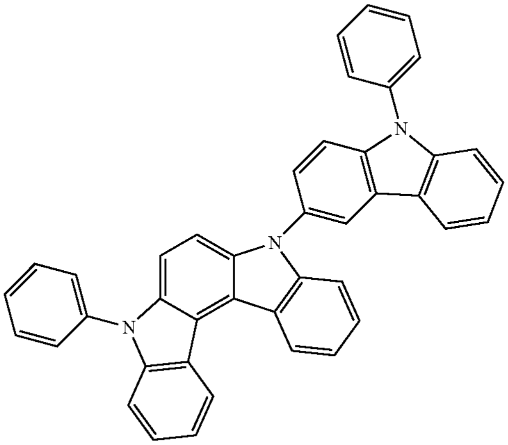

-continued
B-48
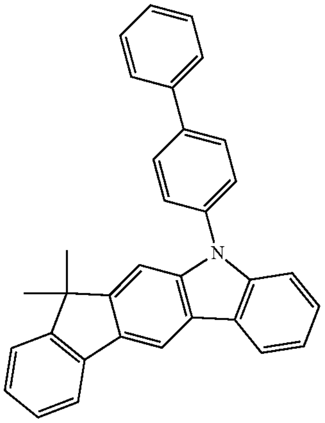
B-49
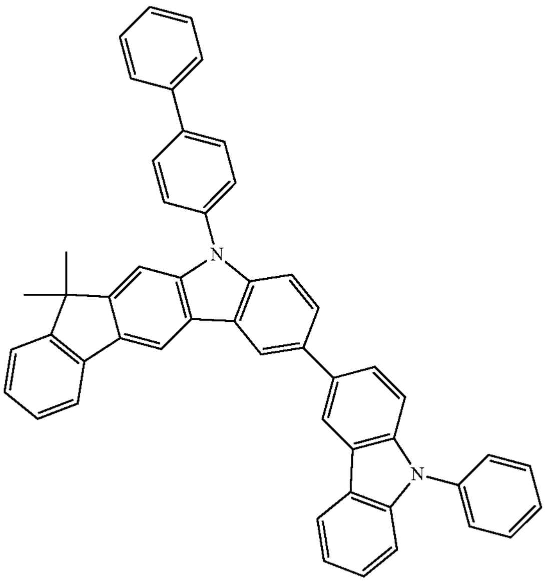
B-50
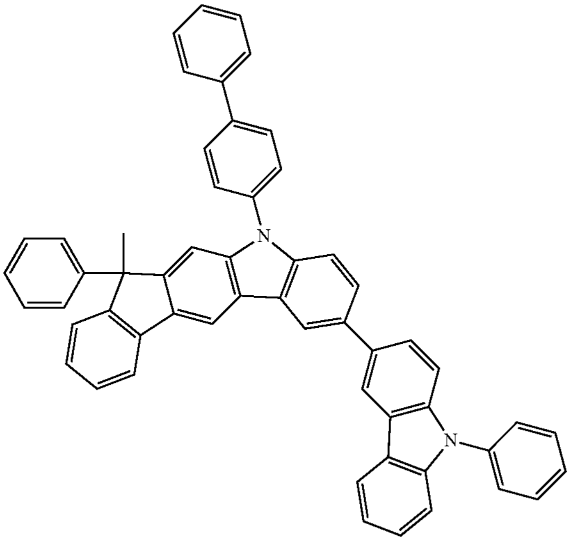
-continued
B-51
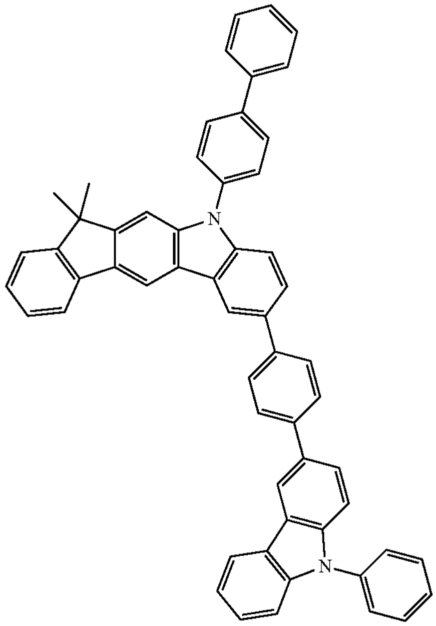
B-52
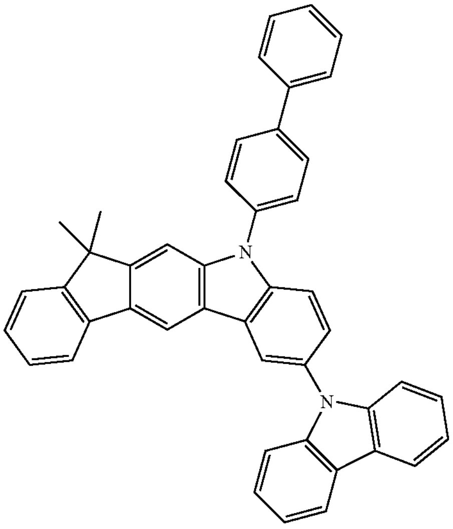

-continued
B-53
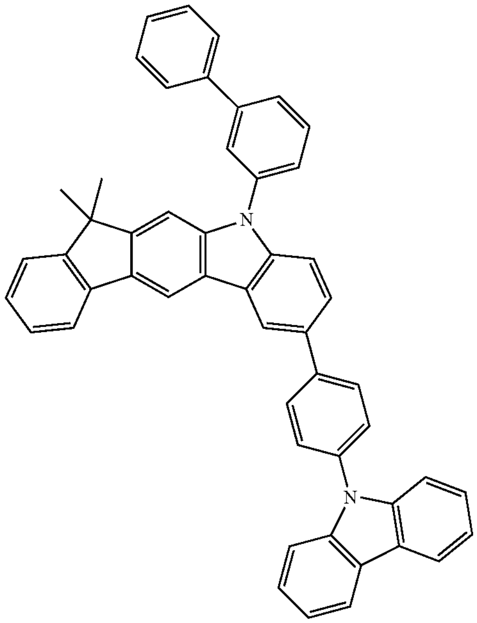
B-54
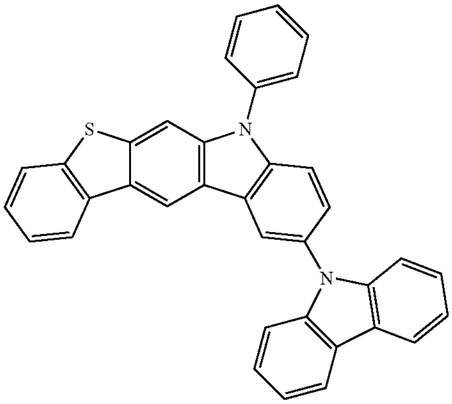
B-55
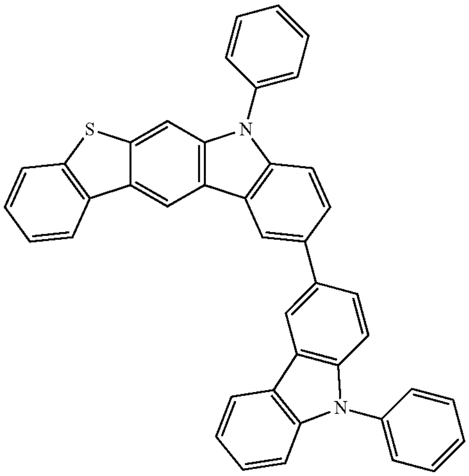
-continued
B-56
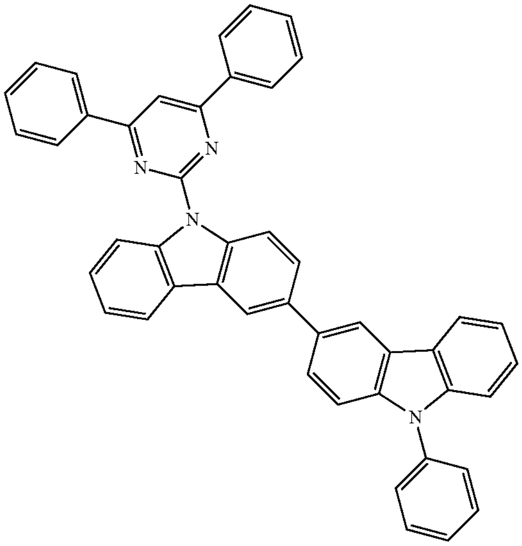
B-57
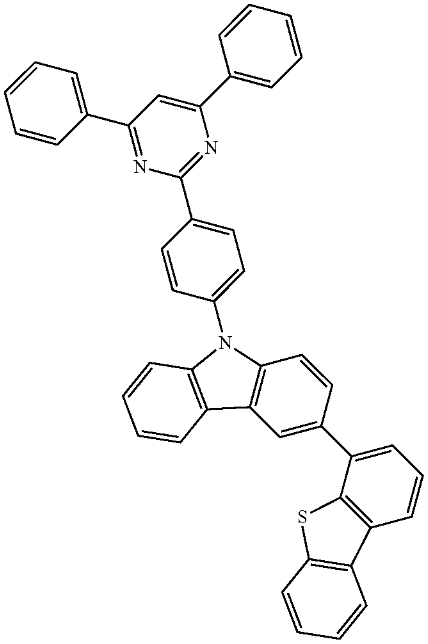

-continued
B-58
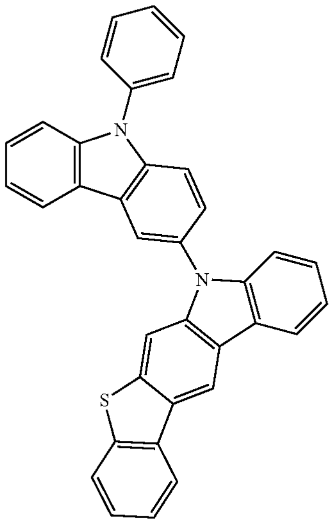
B-59
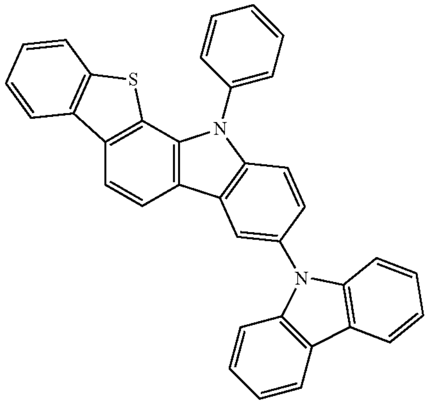
B-60
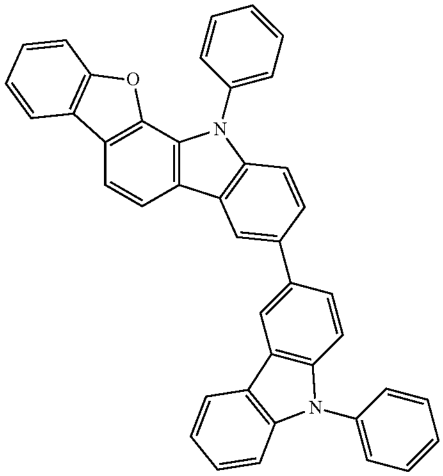
-continued
B-61
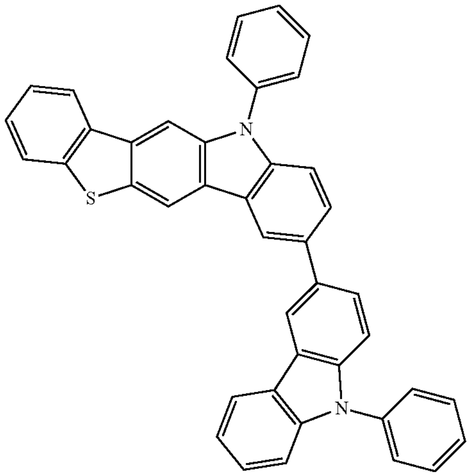
B-62
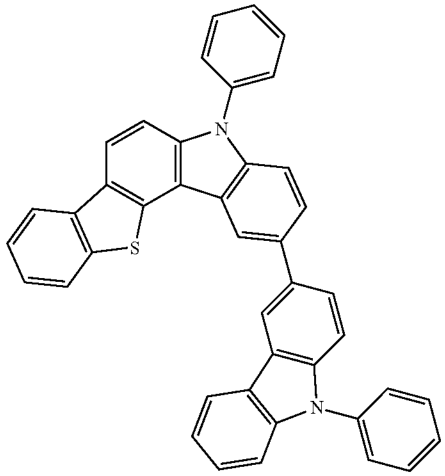
B-63
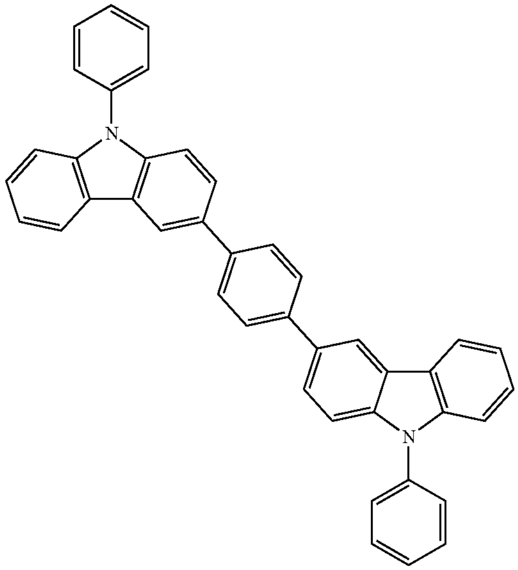

-continued
B-64
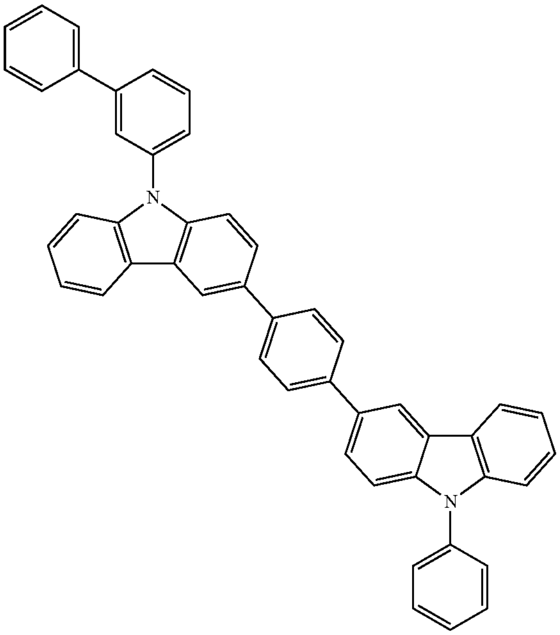
B-65
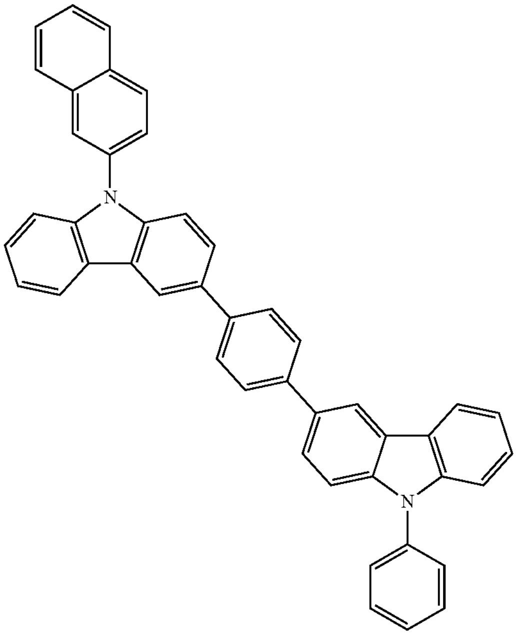
-continued
B-66
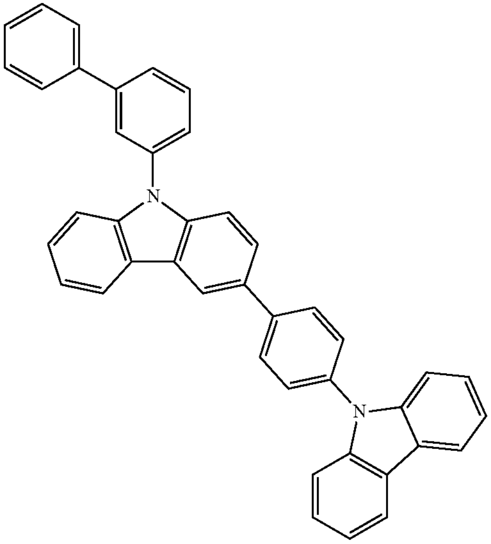
B-67
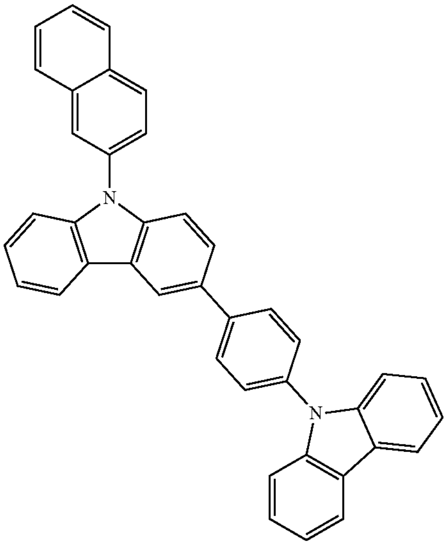
B-68
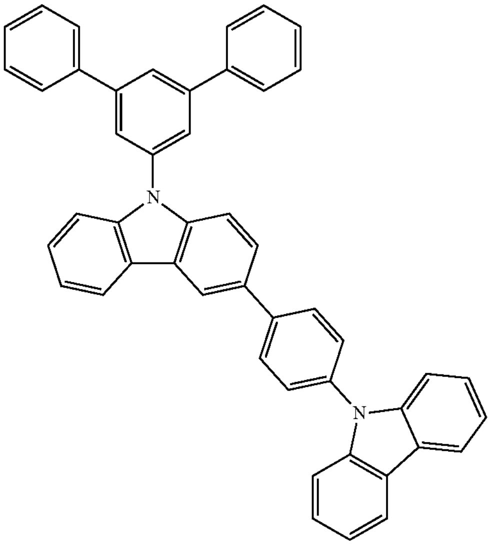

B-69
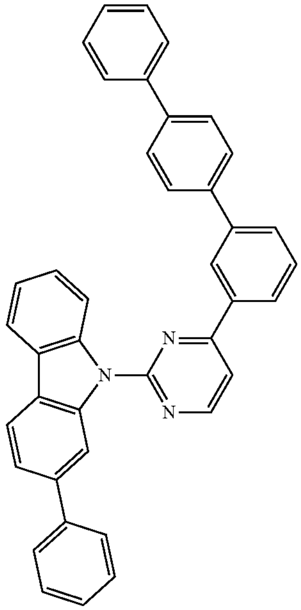
B-70
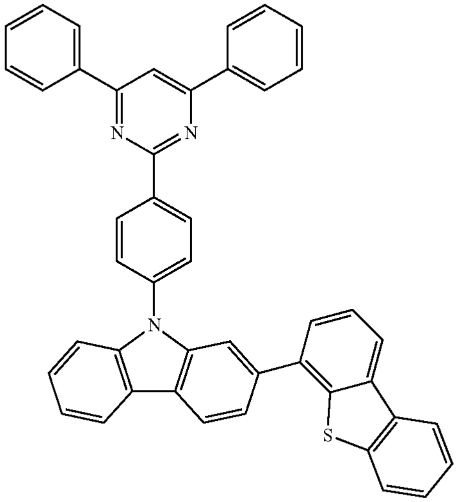
B-71
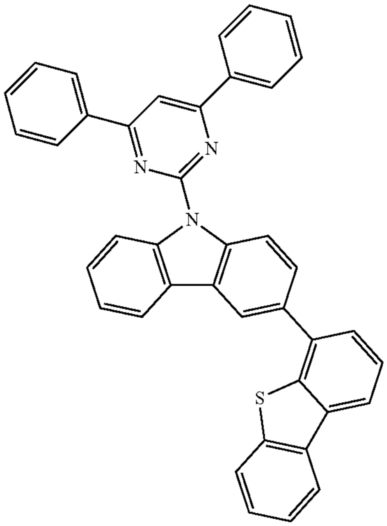
B-72
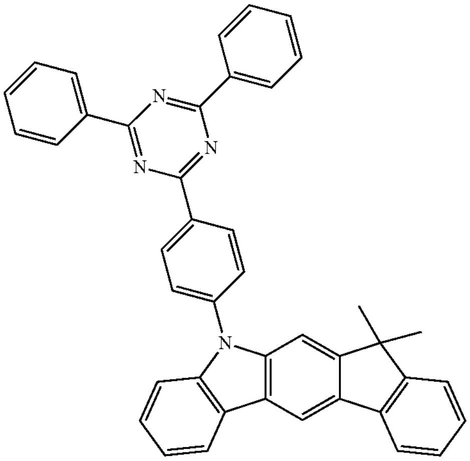
B-73
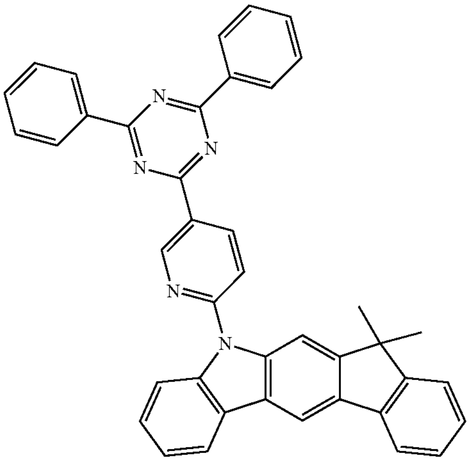
B-74
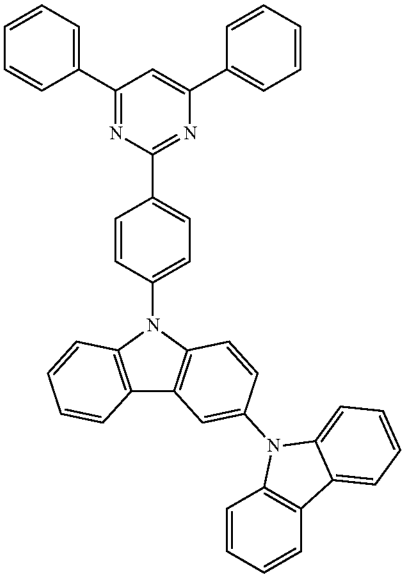

-continued
B-75
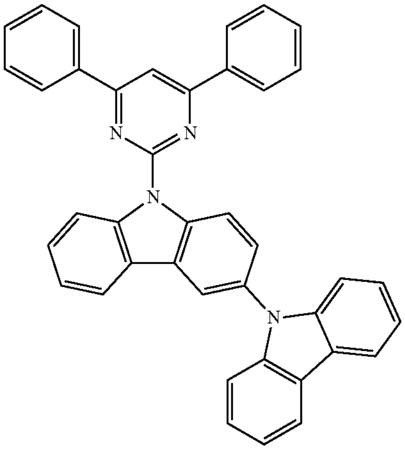
B-76
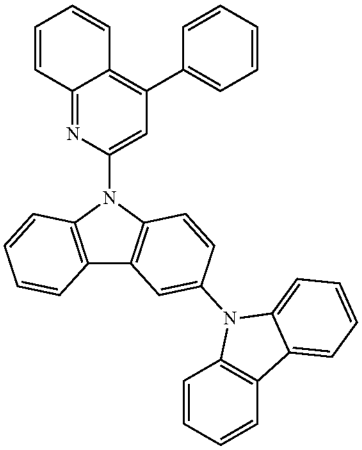
B-77
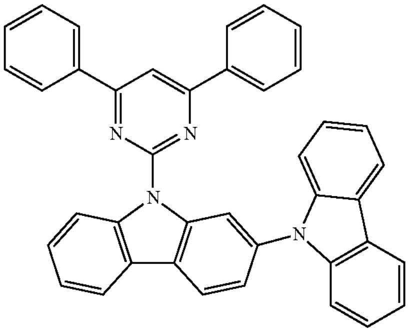
B-78
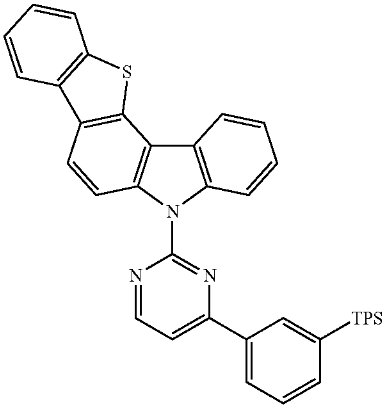
-continued
B-79
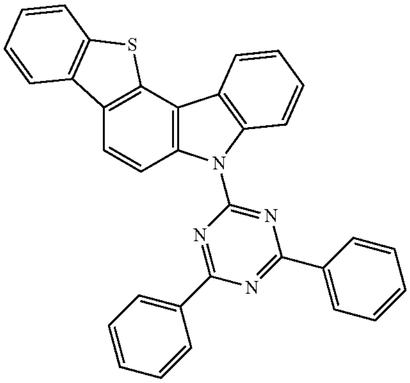
B-80
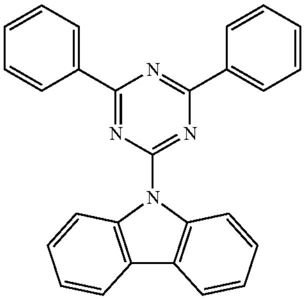
B-81
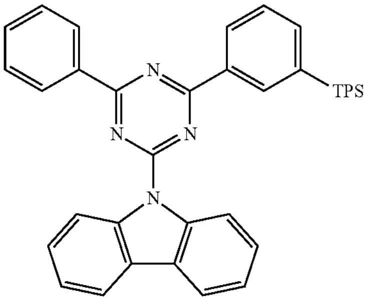
B-82
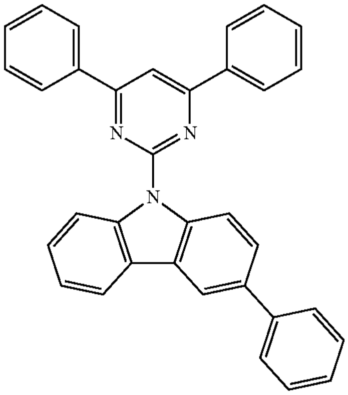

-continued
B-83
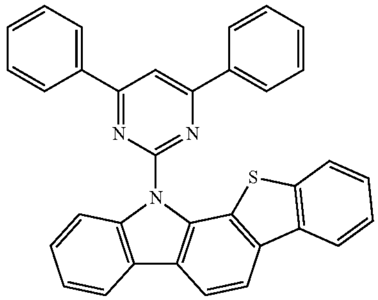
B-84
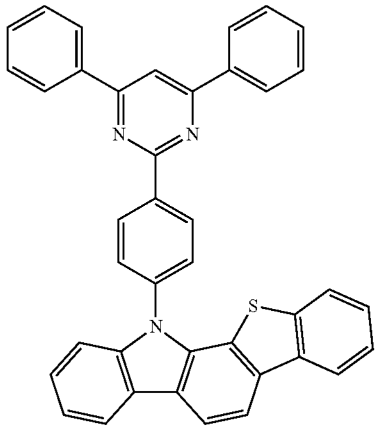
B-85
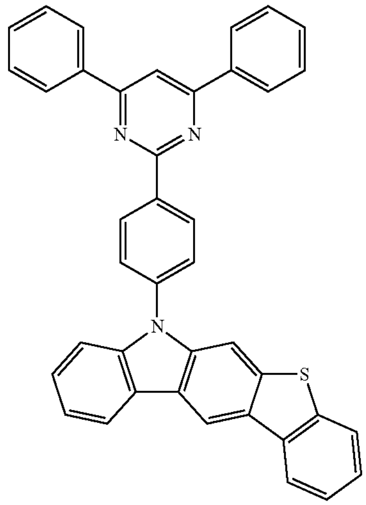
-continued
B-86
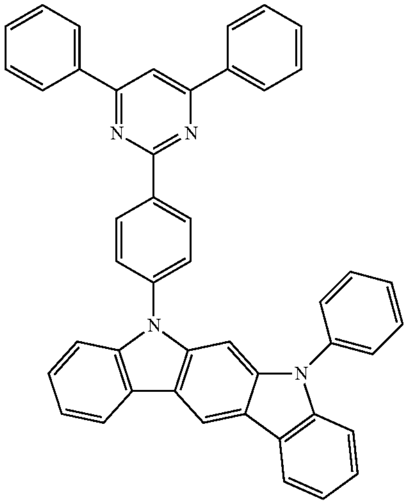
B-87
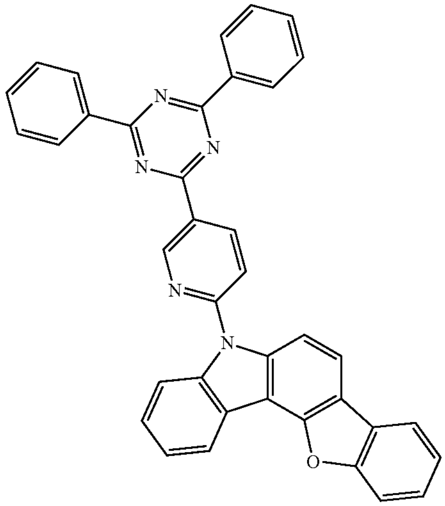
B-88
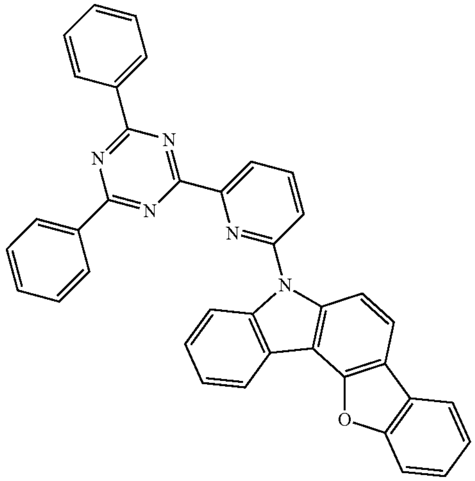

-continued
B-89
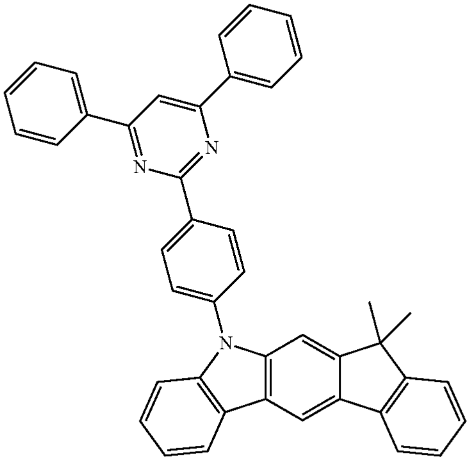
B-90
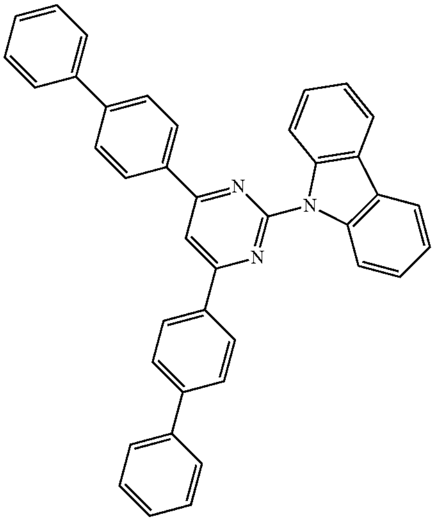
B-91
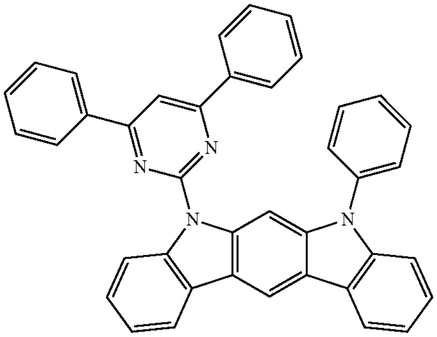
-continued
B-92
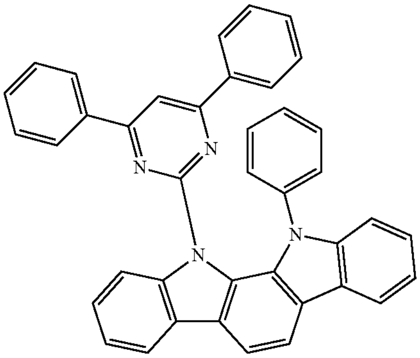
B-93
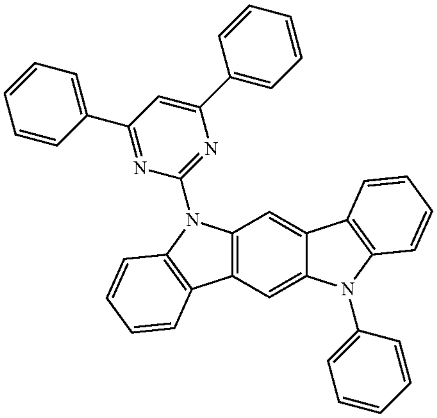
B-94
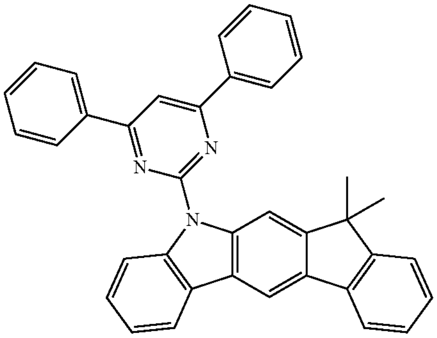
B-95
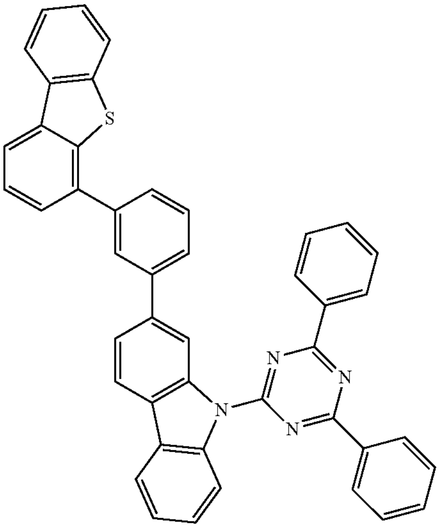

-continued
B-96
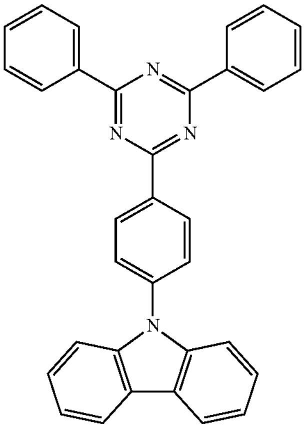
B-97
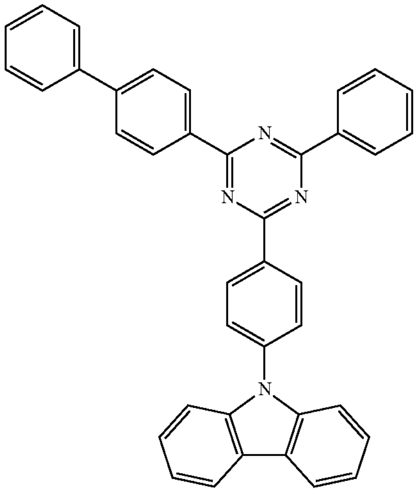
B-98
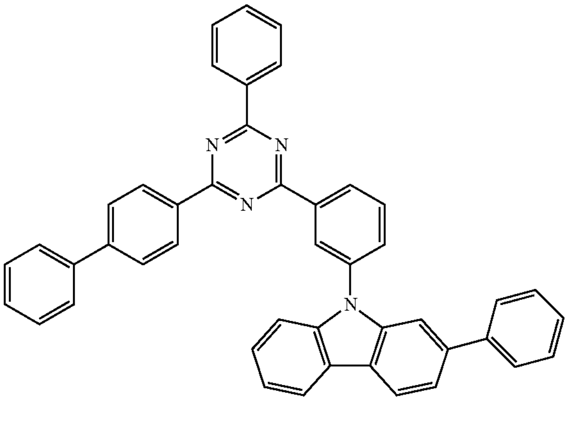
-continued
B-99
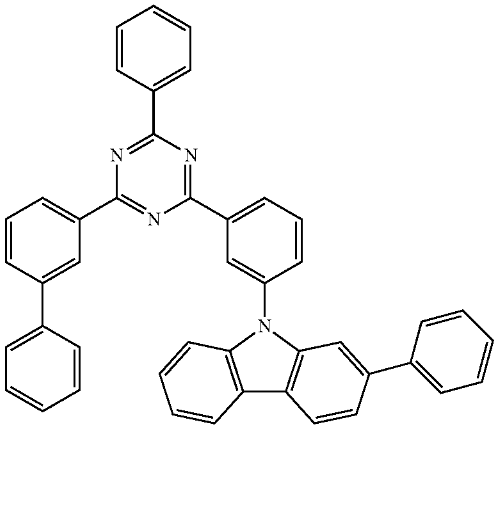
B-100
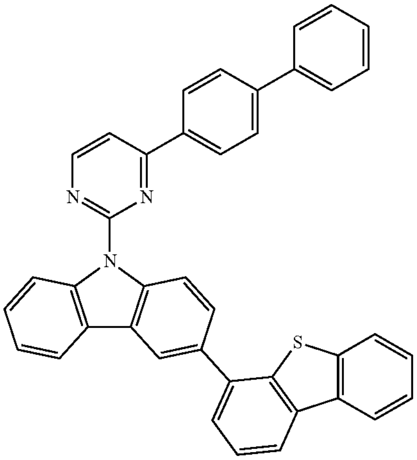
B-101
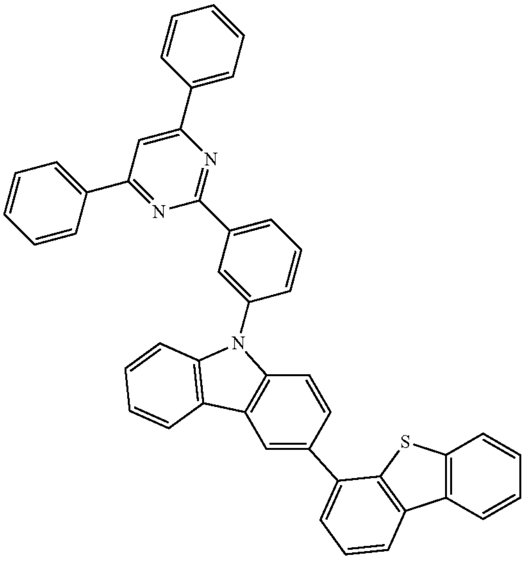

-continued
B-102
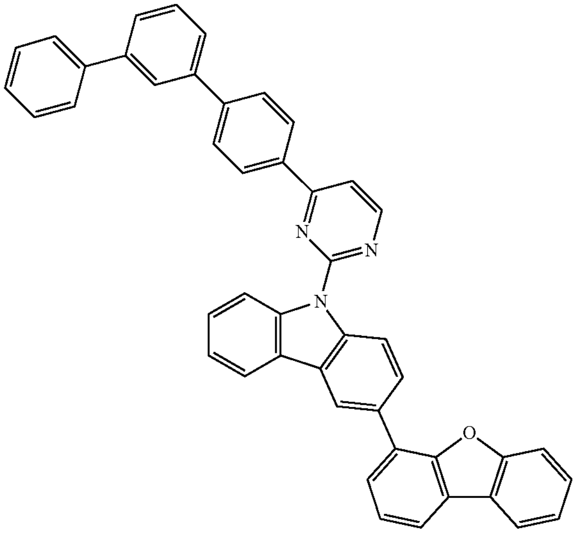
B-103
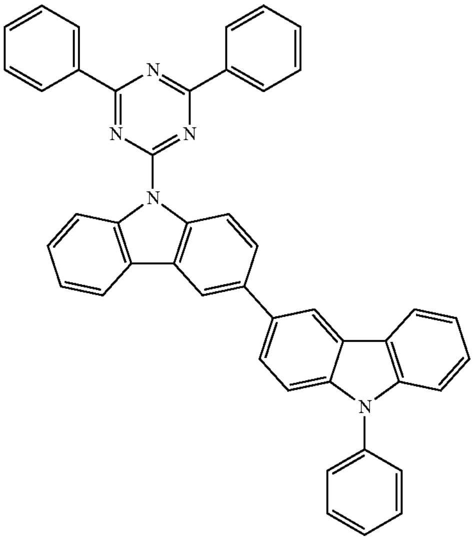
B-104
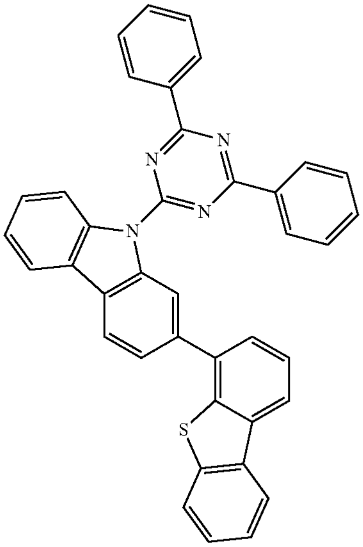
-continued
B-105
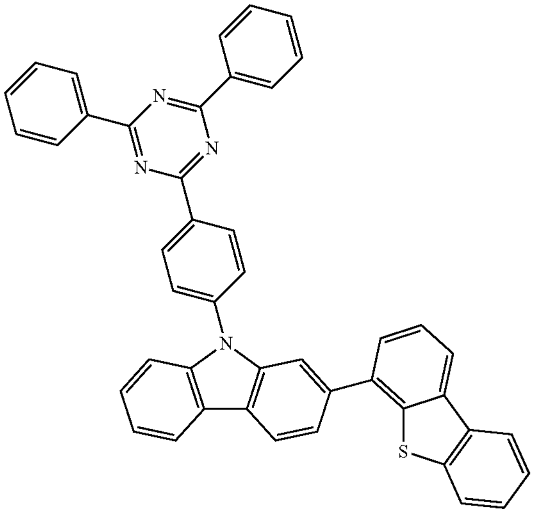
B-106
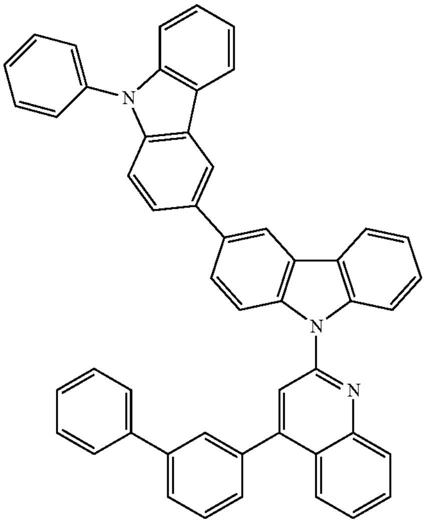
B-107
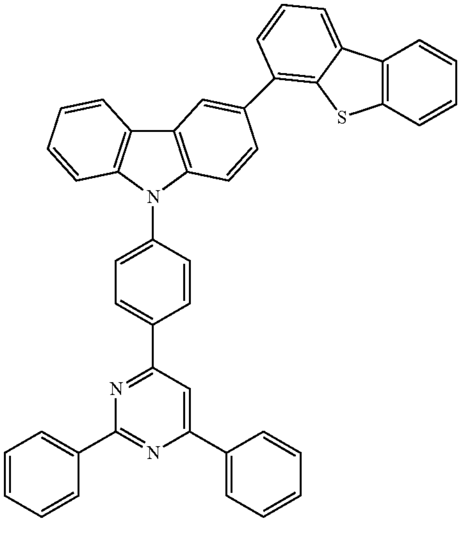

-continued
B-108
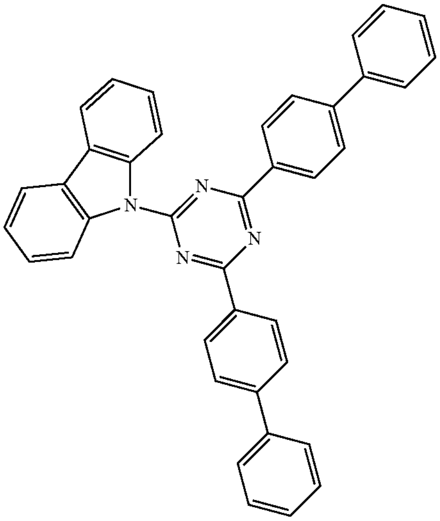
B-109
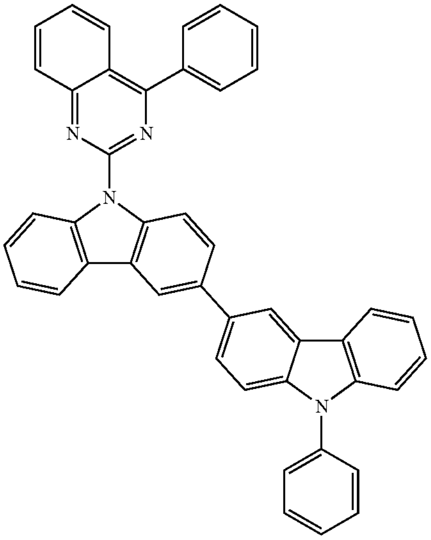
B-110
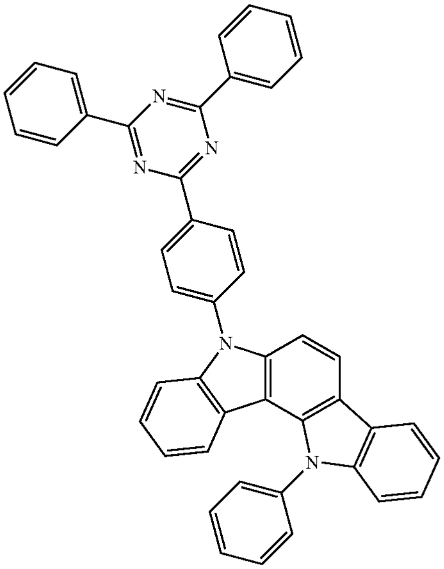
-continued
B-111
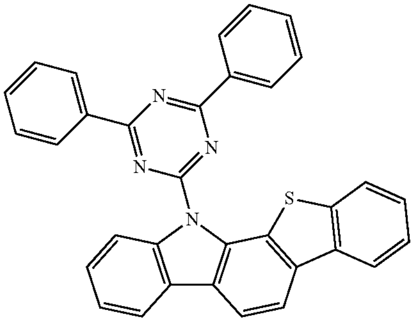
B-112
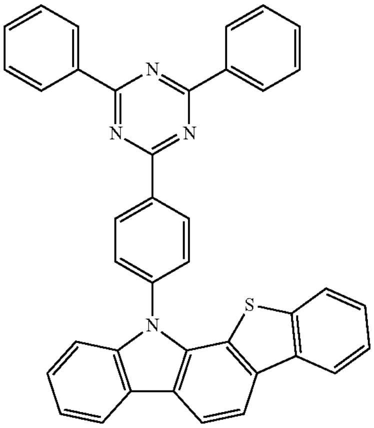
B-113
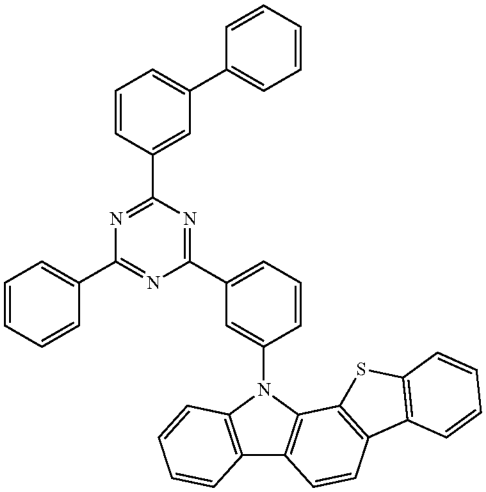

-continued
B-114
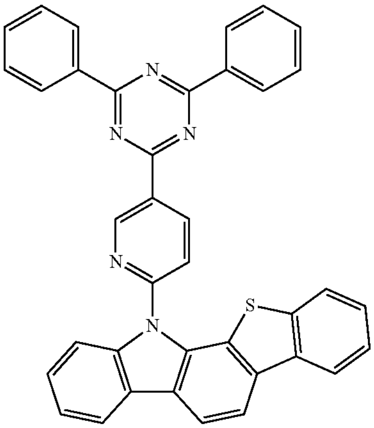
B-115
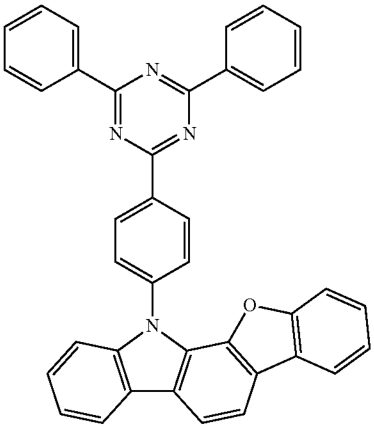
B-116
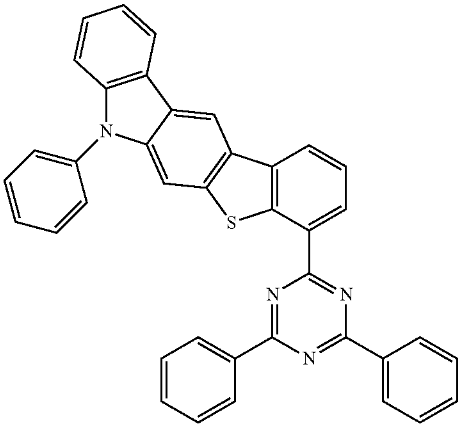
-continued
B-117
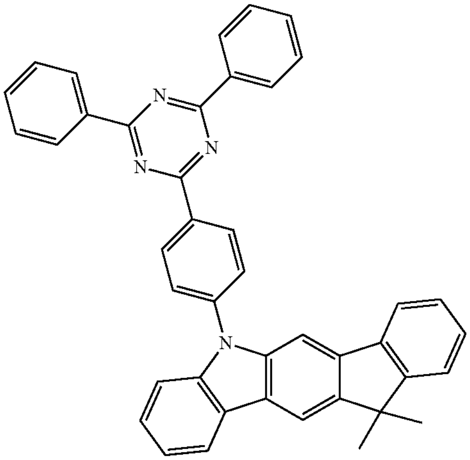
B-118
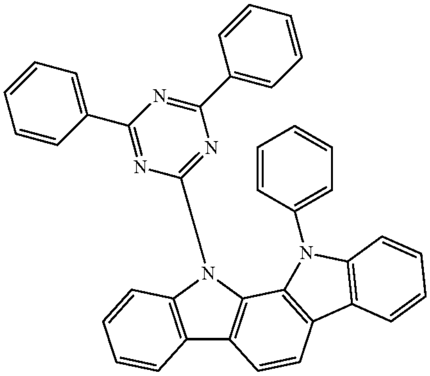
B-119
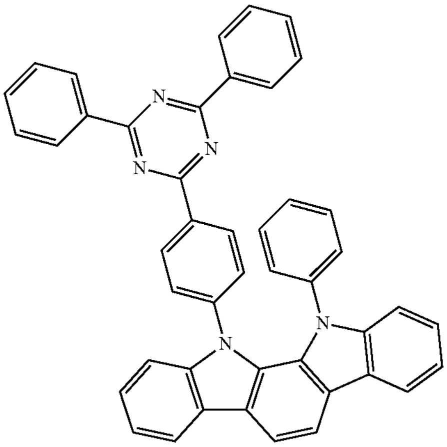

-continued
B-120
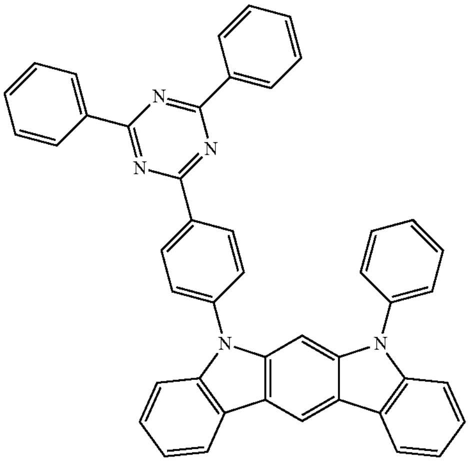
B-121
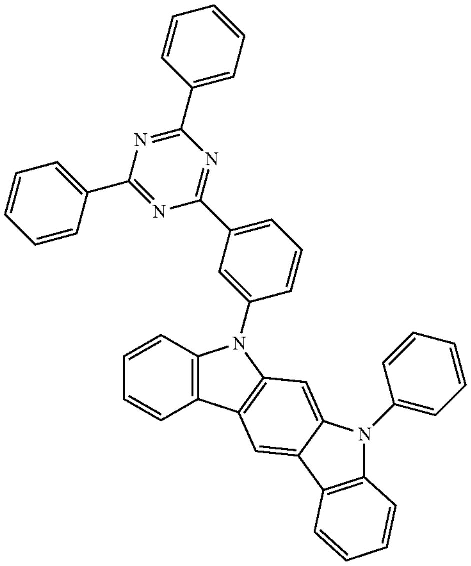
B-122
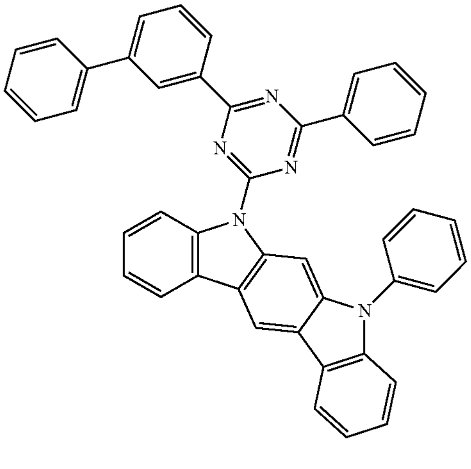
-continued
B-123
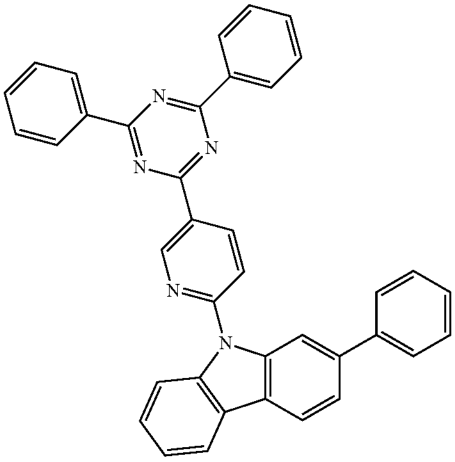
B-124
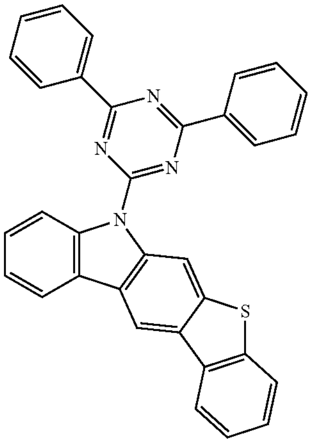
B-125
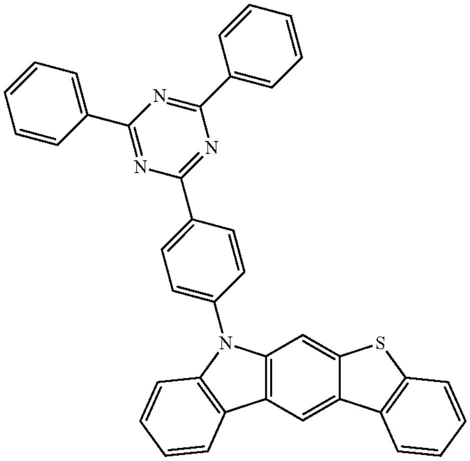

-continued
B-126
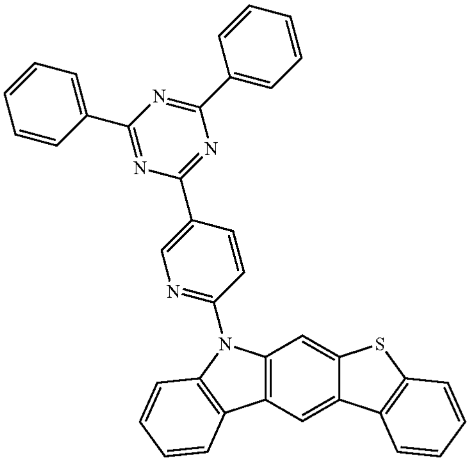
B-127
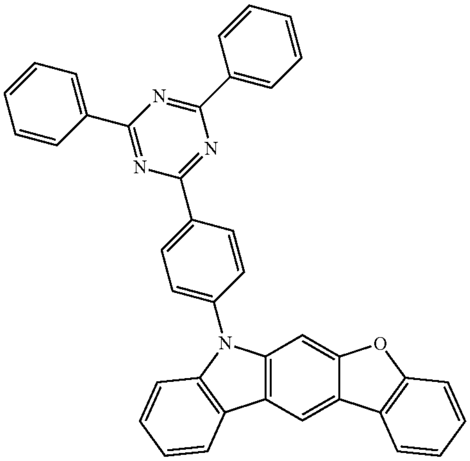
B-128
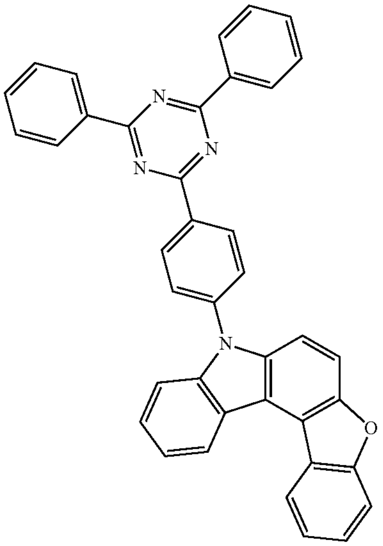
-continued
B-129
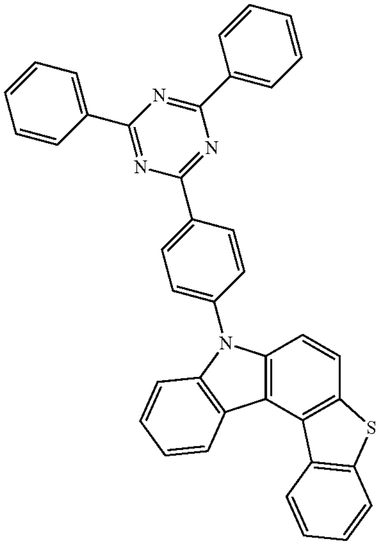
B-130
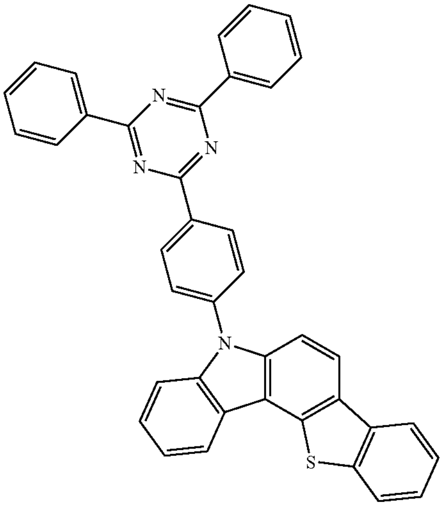
B-131
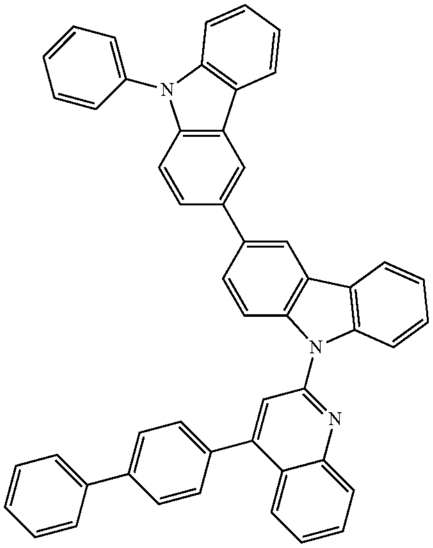

-continued
B-132
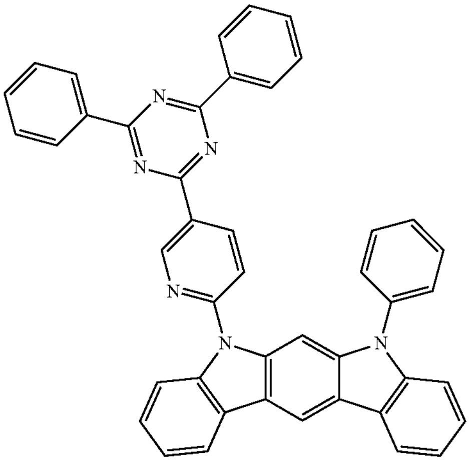
B-133
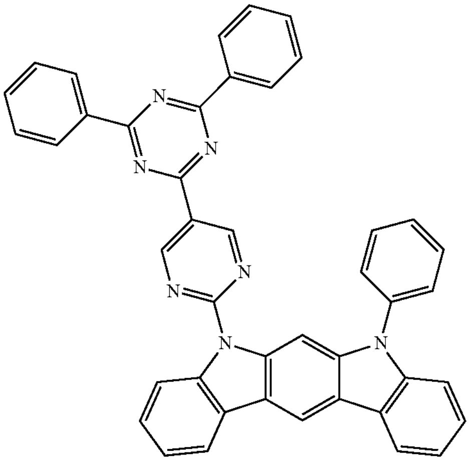
B-134
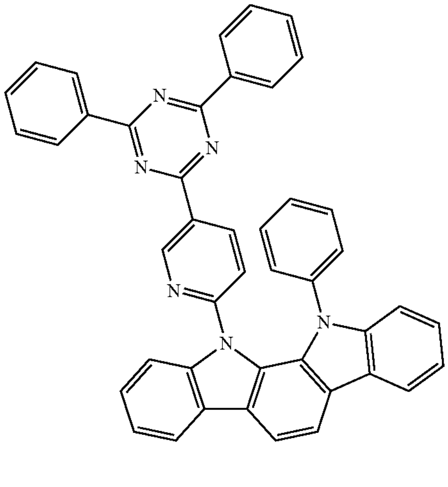
-continued
B-135
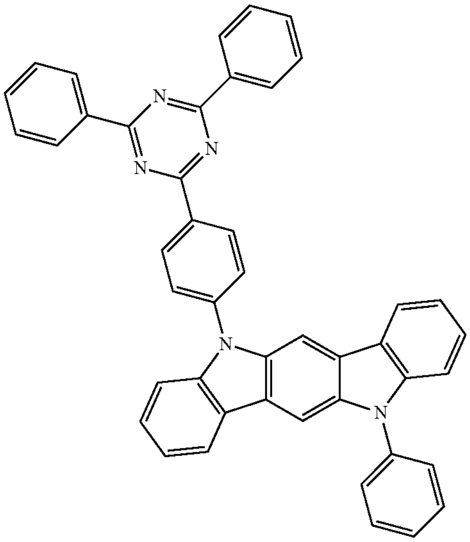
B-136
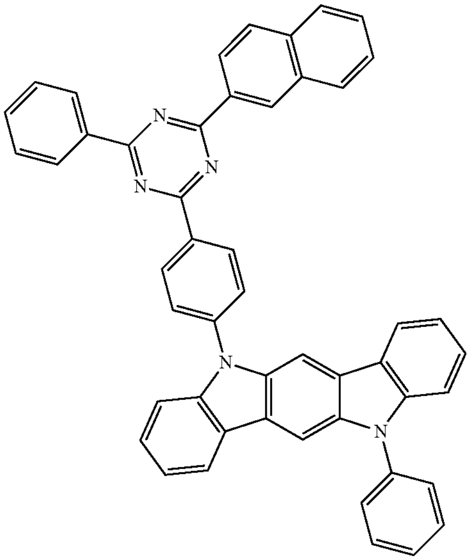
B-137
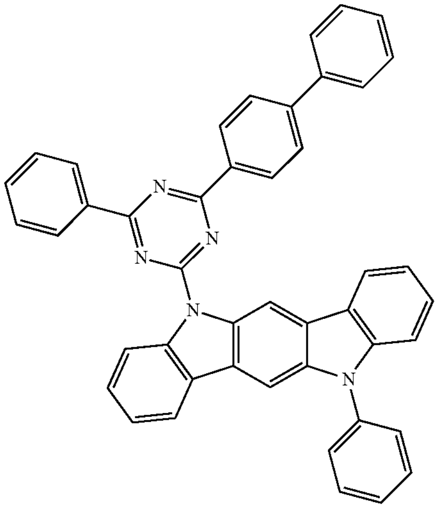

-continued
B-138
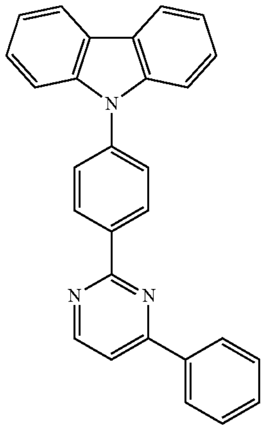
B-139
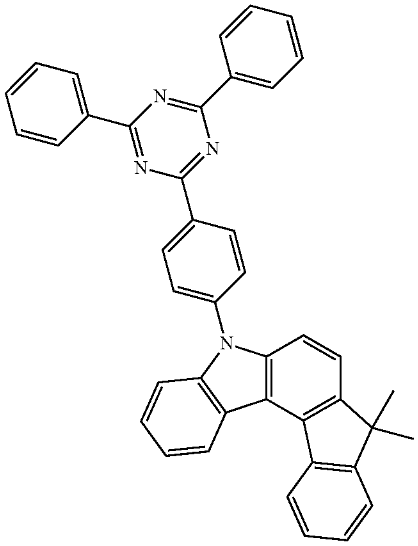
B-140
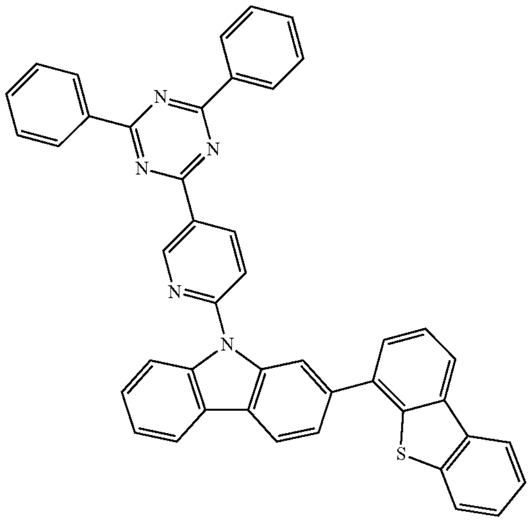
-continued
B-141
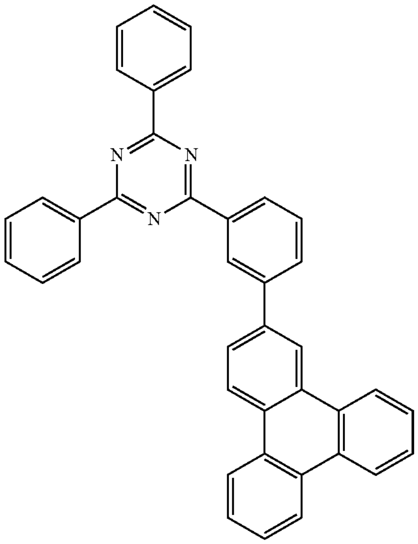
B-142
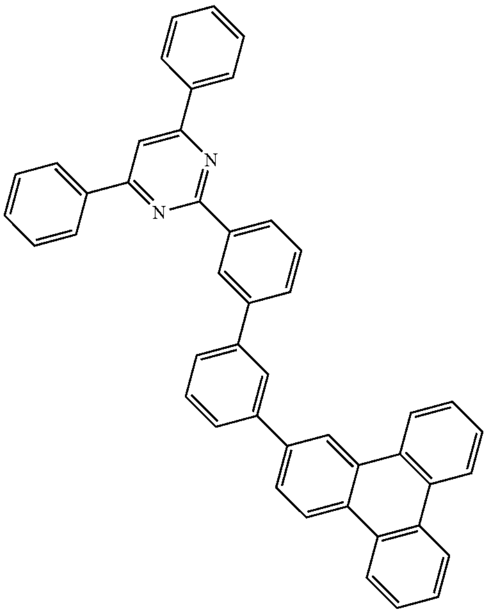

-continued
B-143
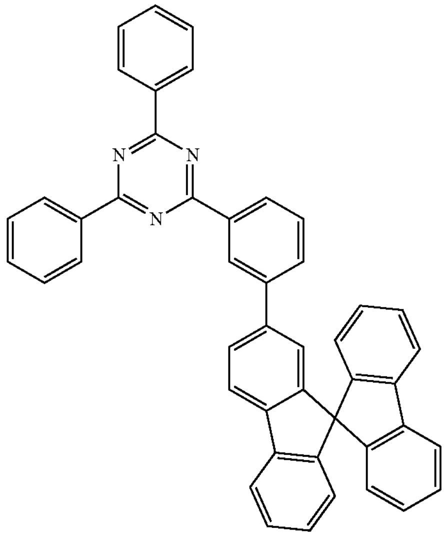
B-144
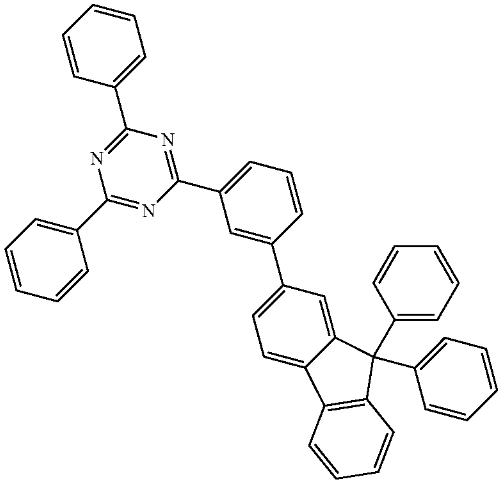
B-145
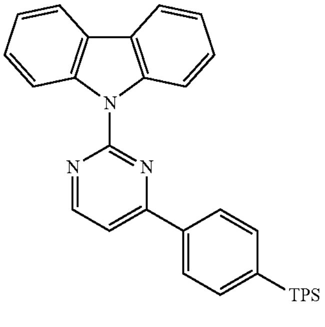
-continued
B-146
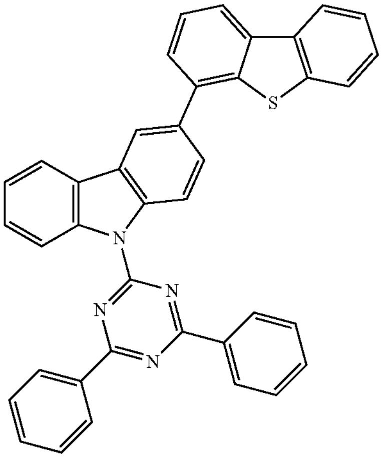
B-147
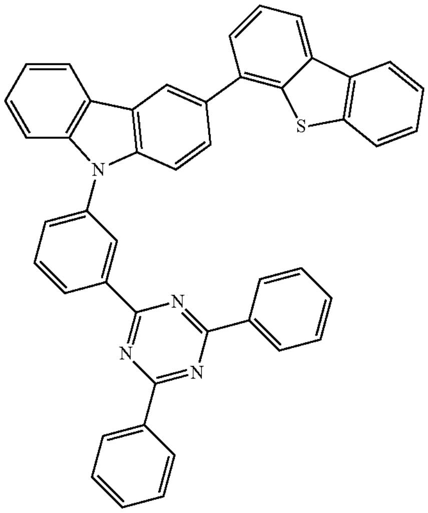
B-148
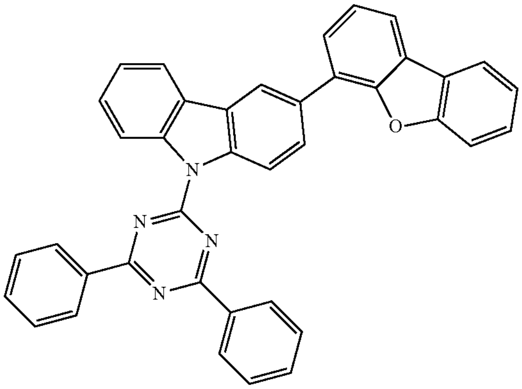

B-149
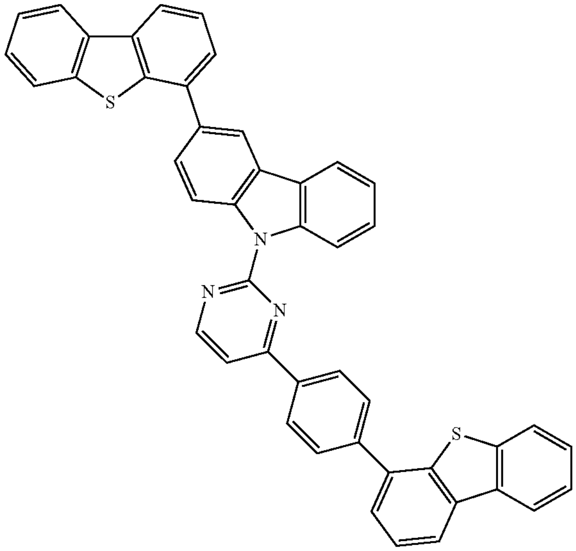
B-150
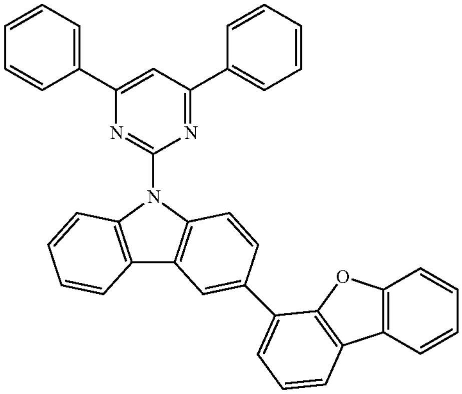
B-151
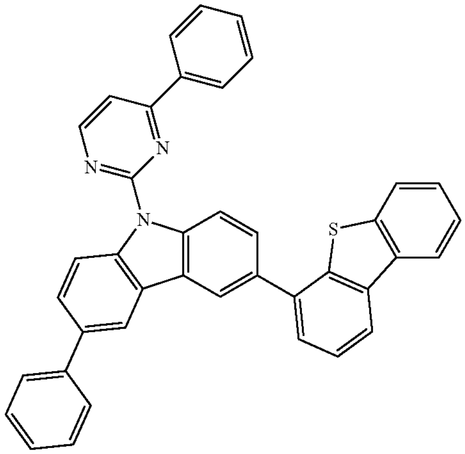
B-152
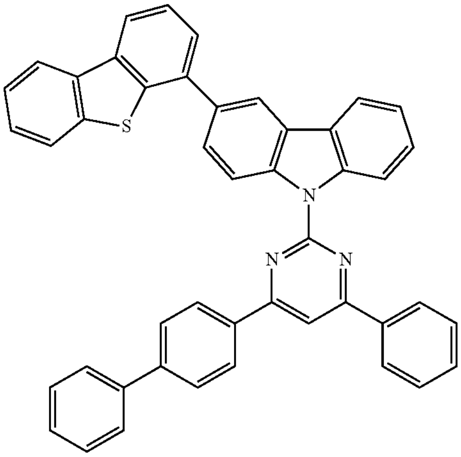
B-153
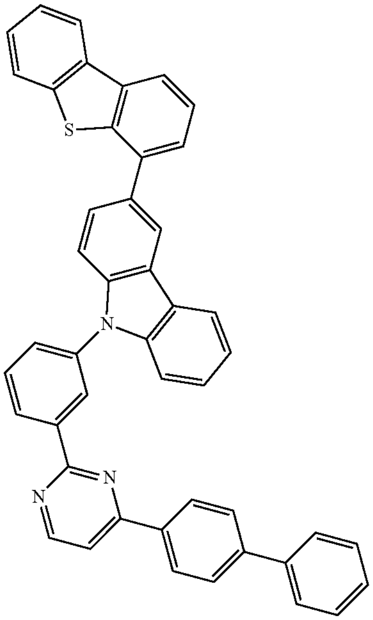

-continued
B-154
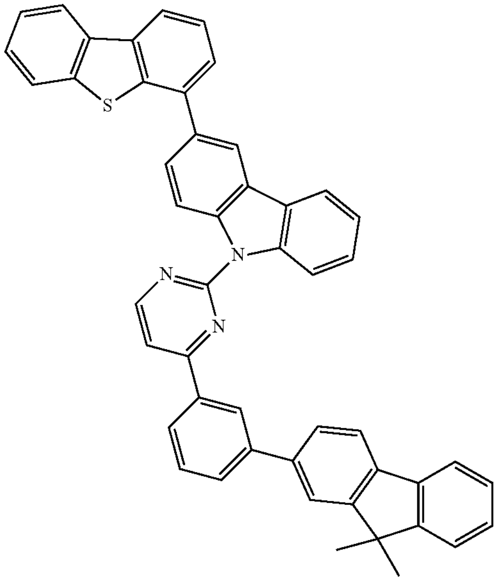
B-155
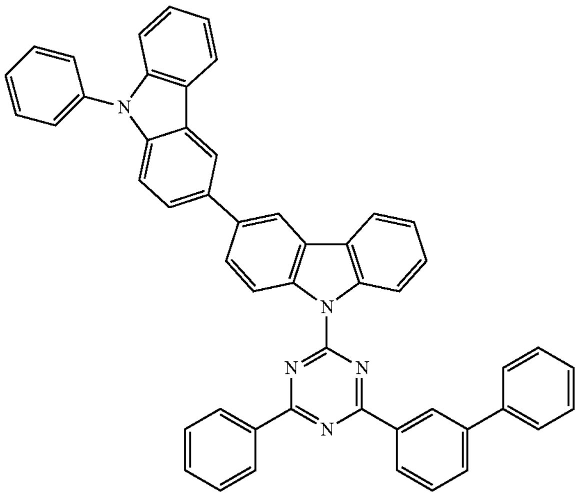
-continued
B-156
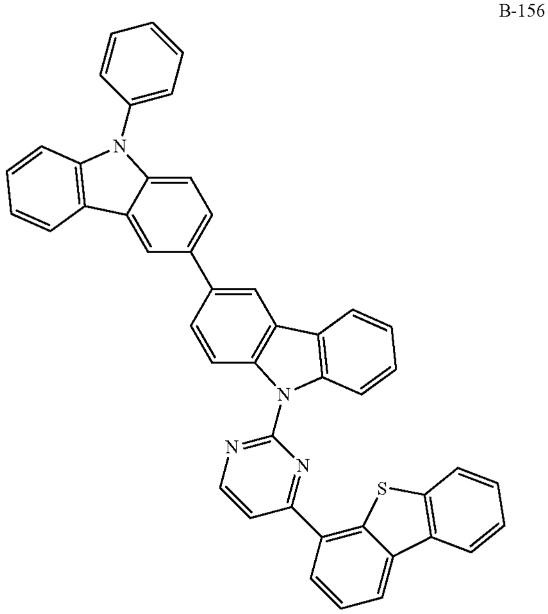
B-157
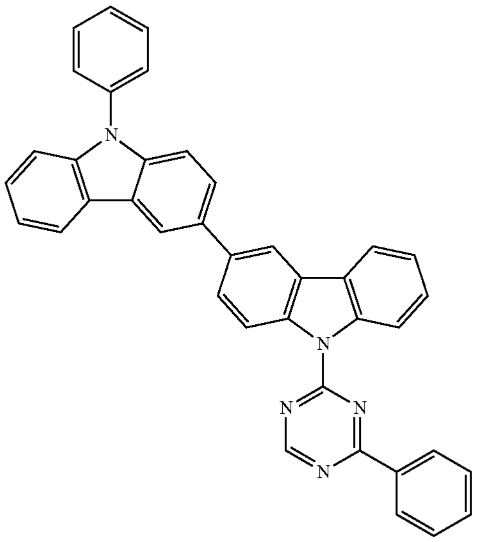

-continued
B-158
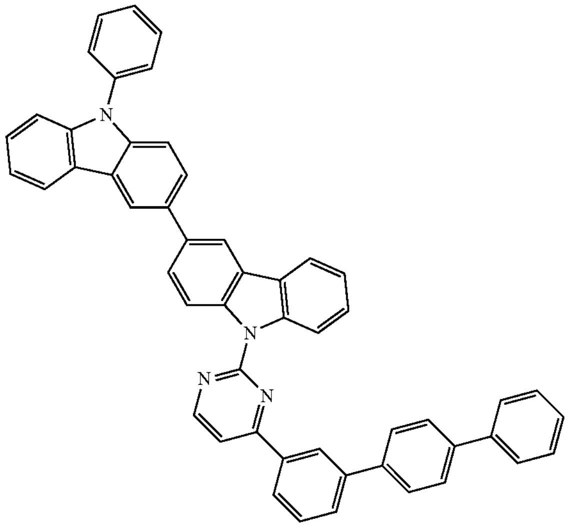
B-159
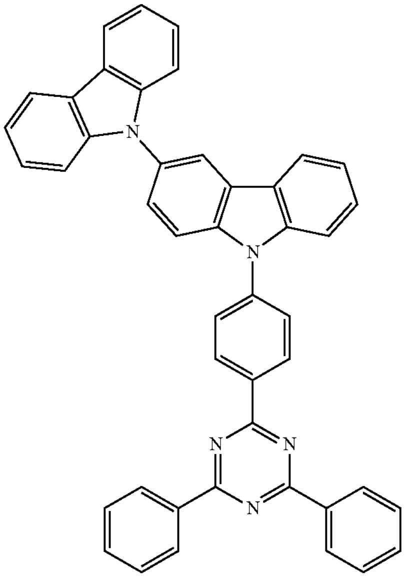
-continued
B-160
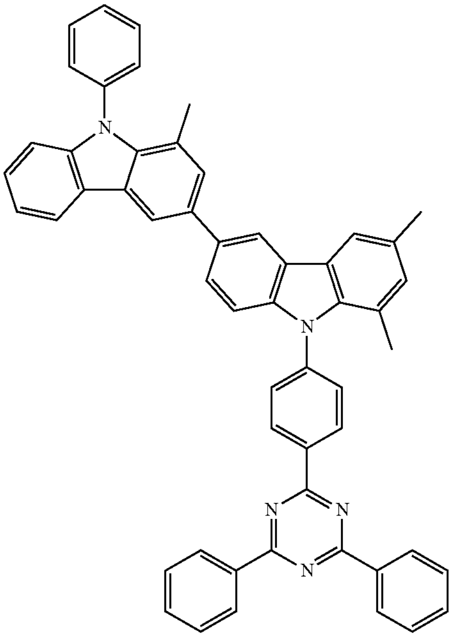
B-161
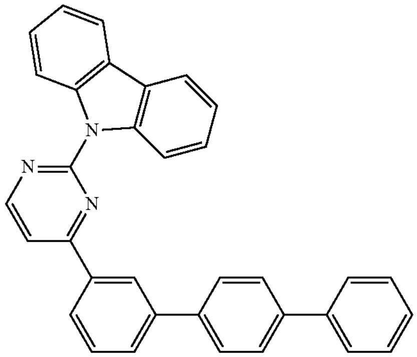
B-162
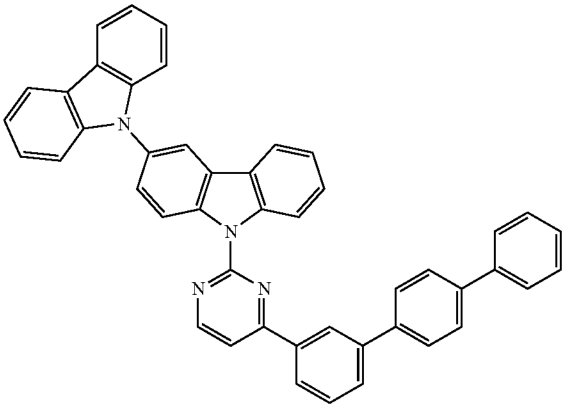

B-163
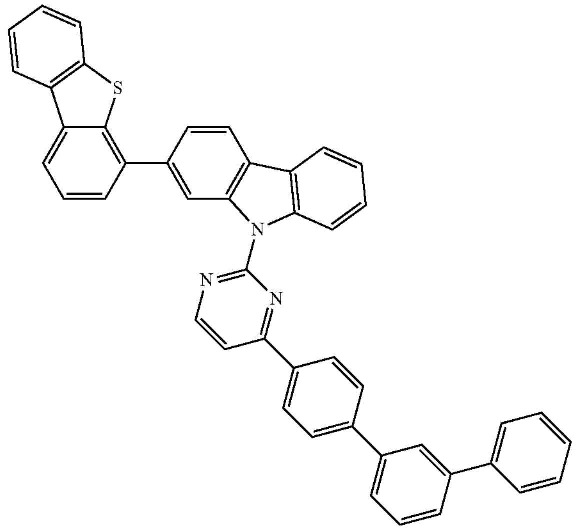
B-164
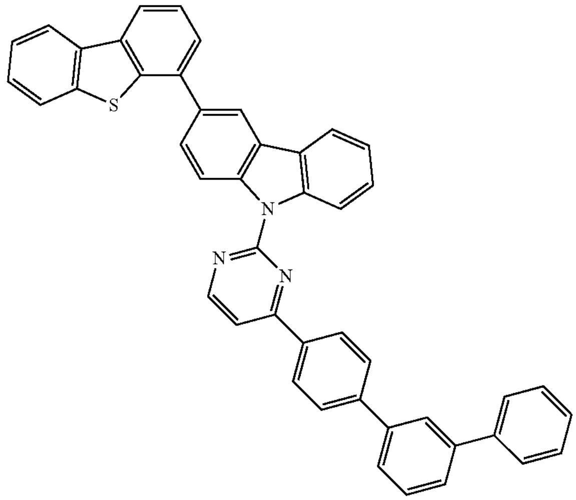
B-165
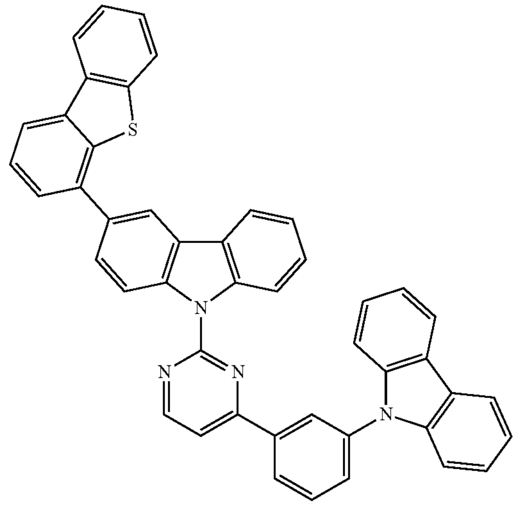
B-166
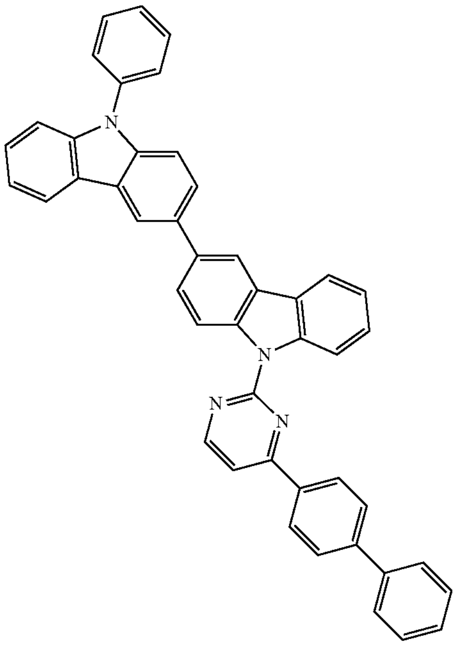
B-167
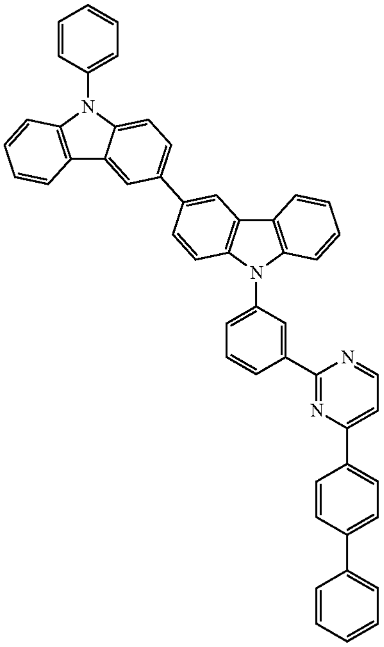

-continued
B-168
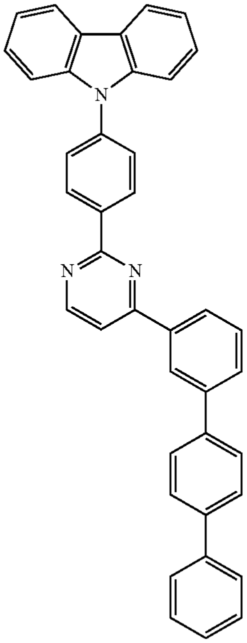
B-169
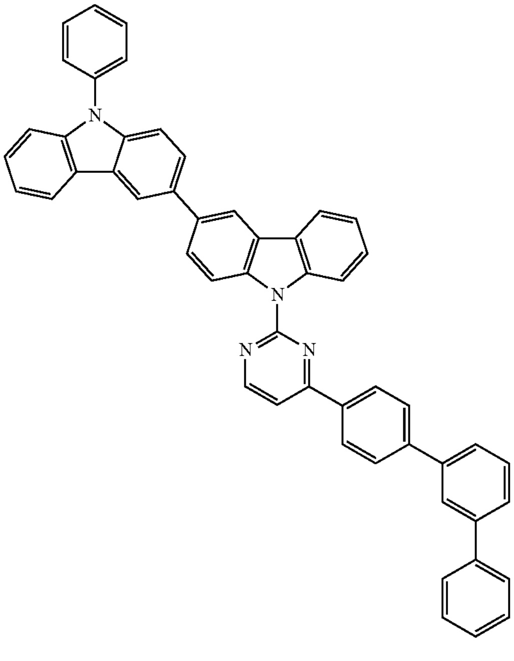
-continued
B-170
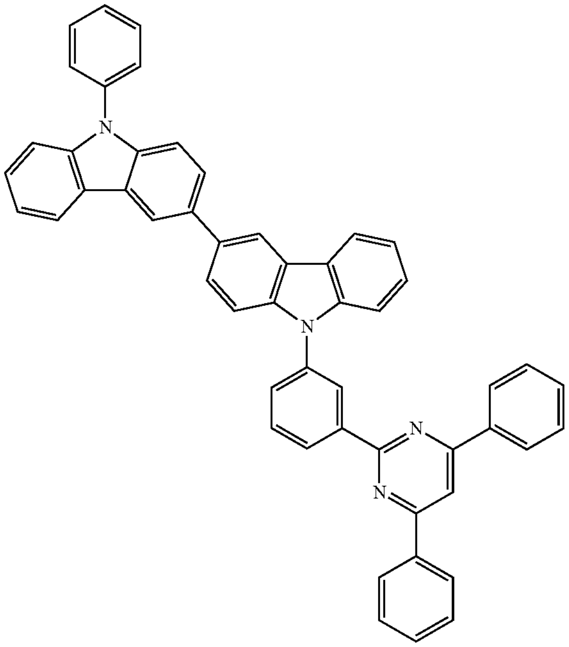
B-171
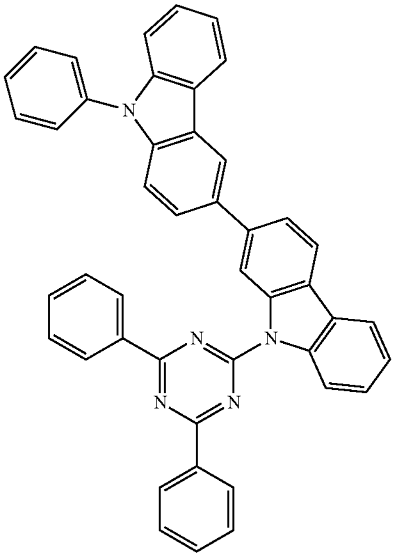

-continued
B-172
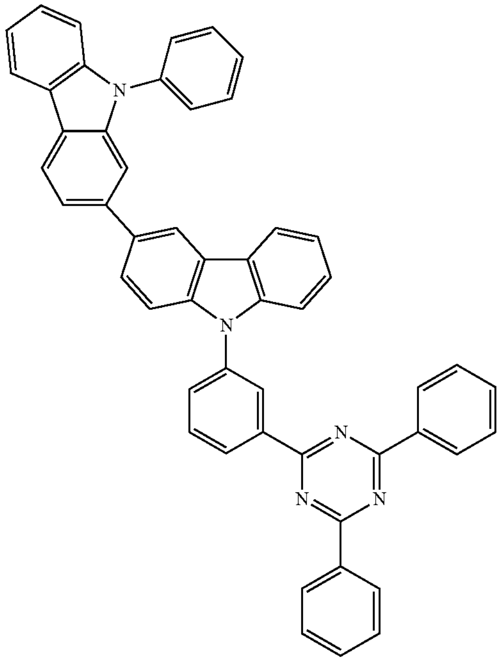
B-173
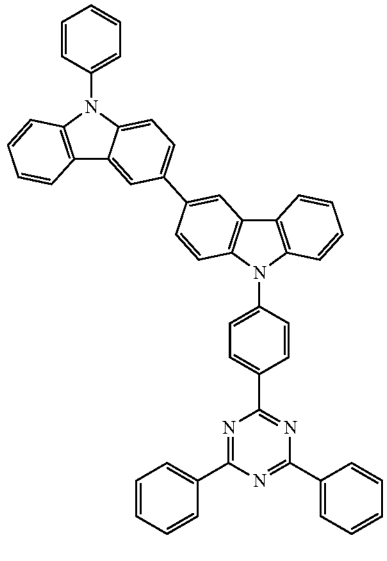
-continued
B-174
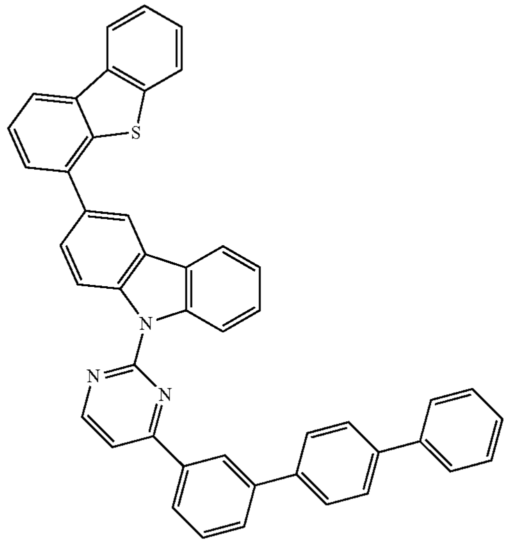
B-175
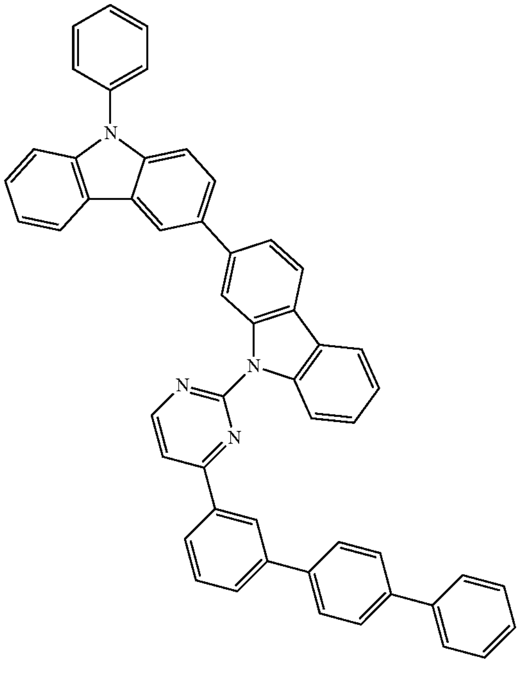

-continued
B-176
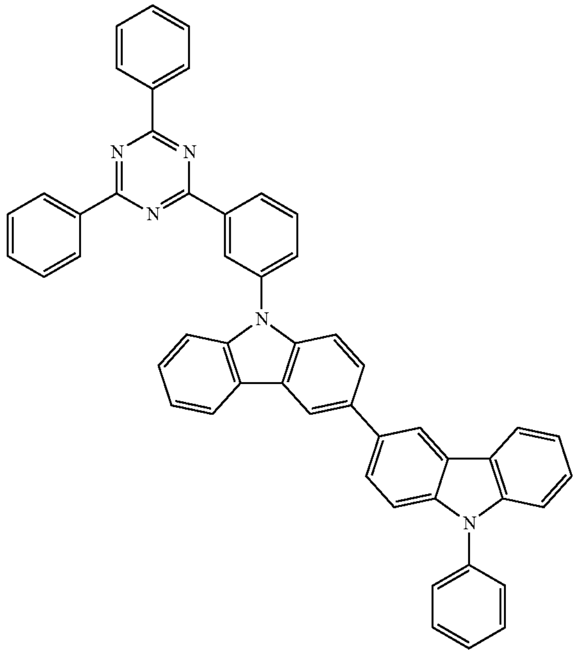
B-177
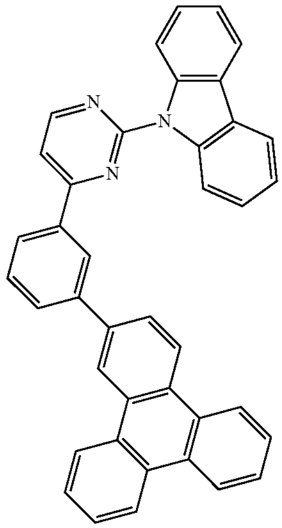
-continued
B-178
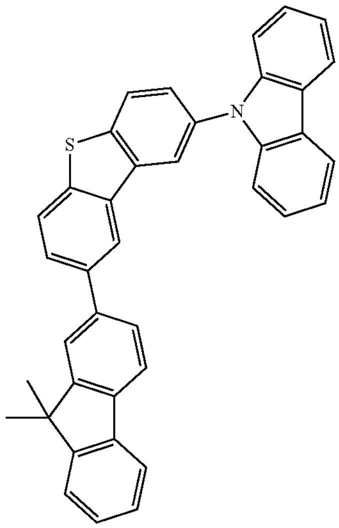
B-179
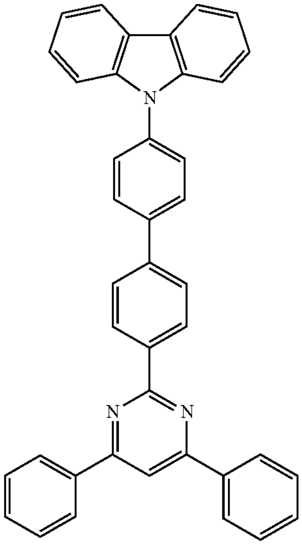

-continued
B-180
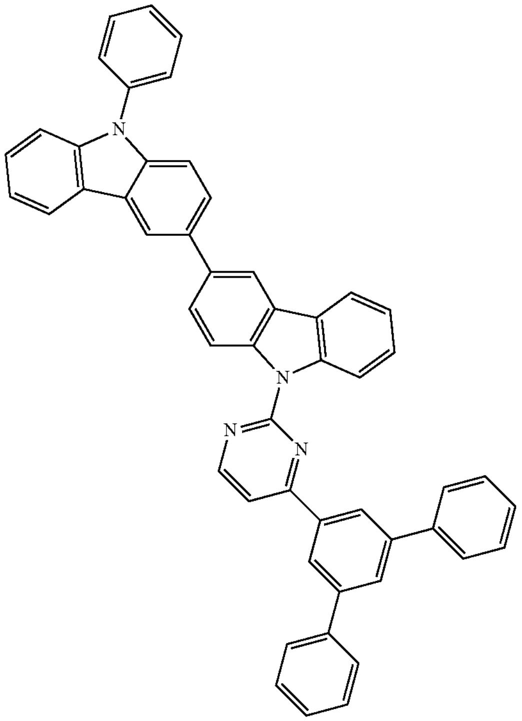
B-181
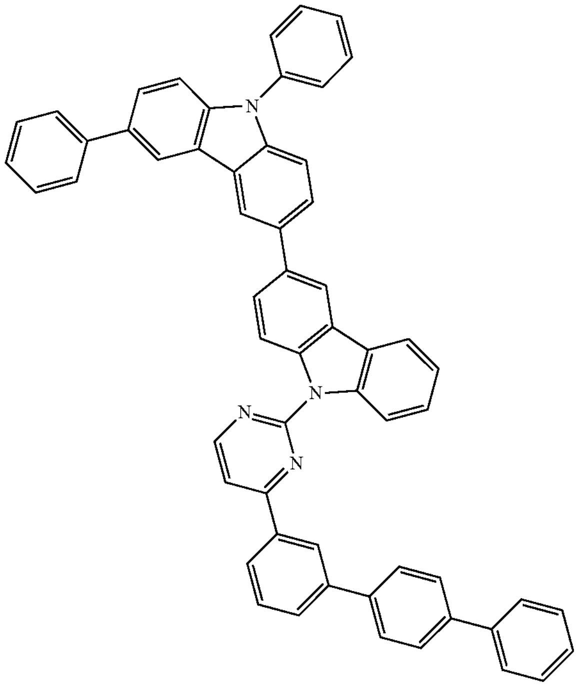
B-182
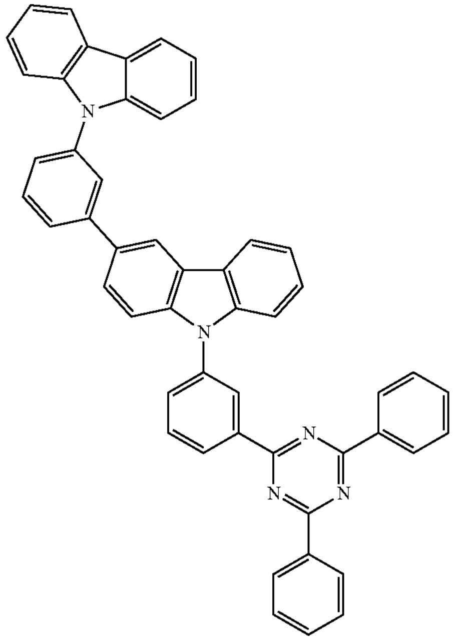
B-183
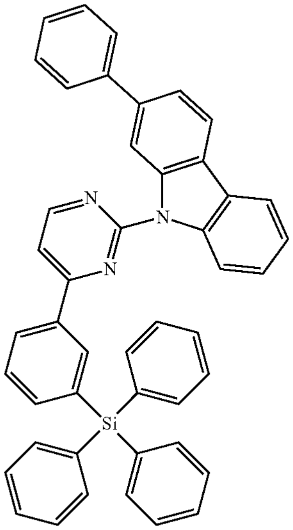

-continued
B-184
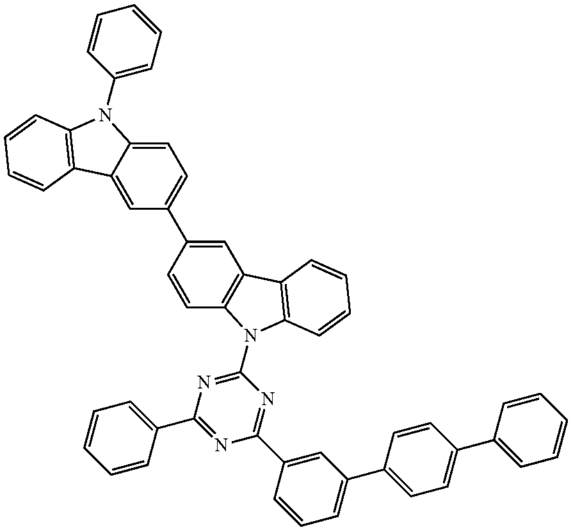
B-185
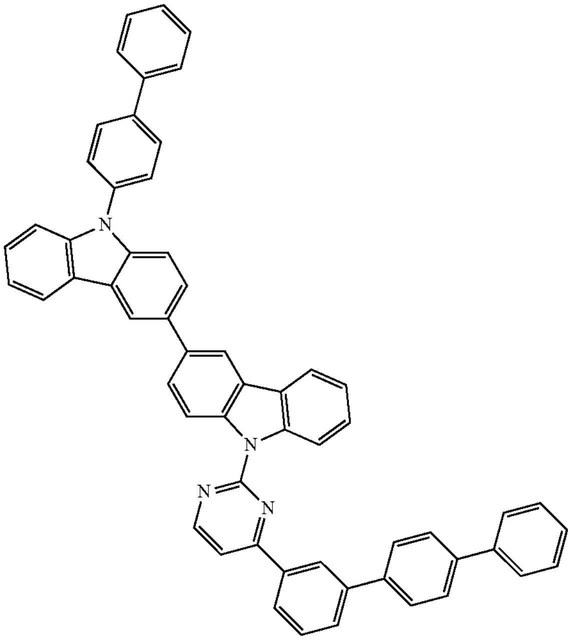
B-186
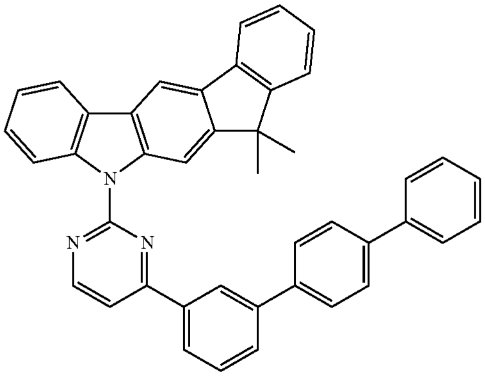
-continued
B-187
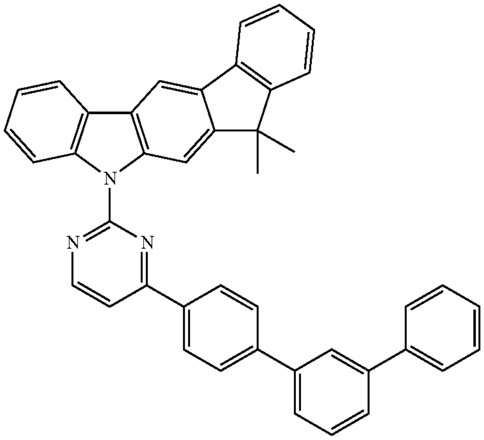
B-188
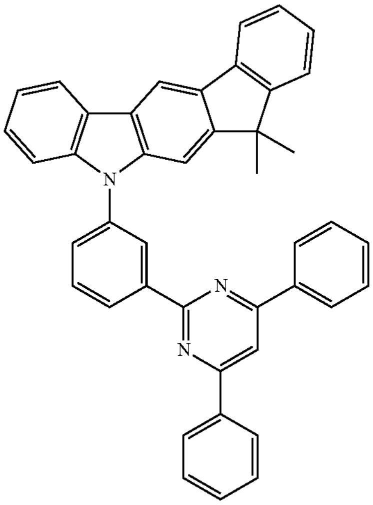
B-189
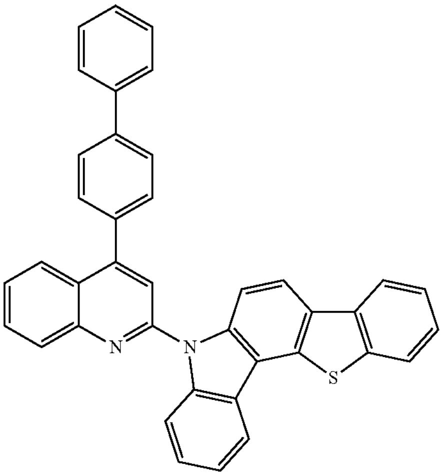

-continued
B-190
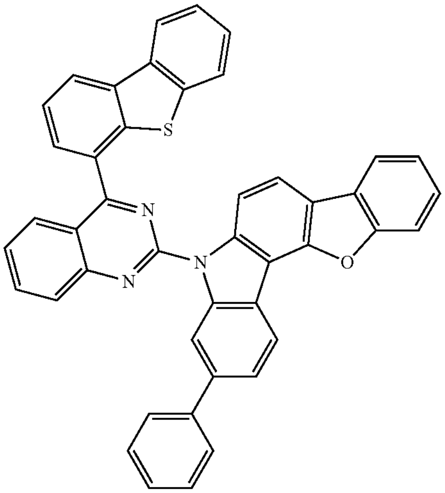
B-191
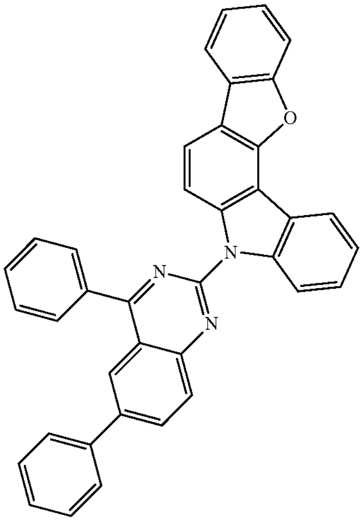
B-192
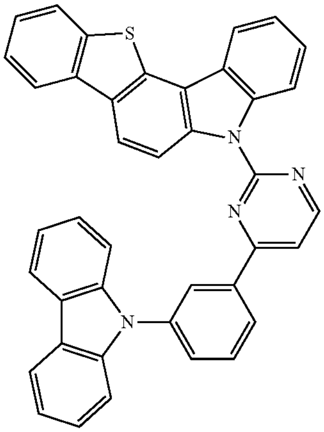
-continued
B-193
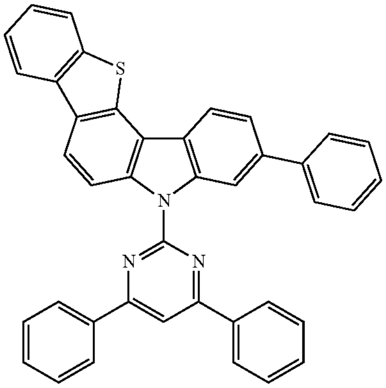
B-194
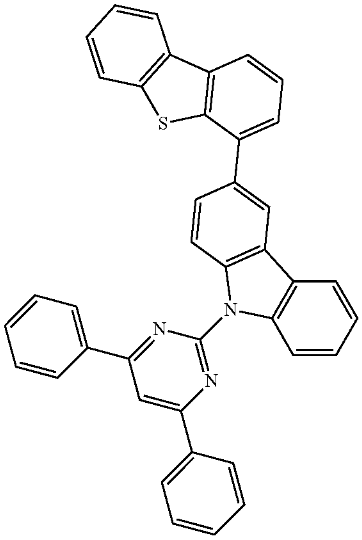
B-195
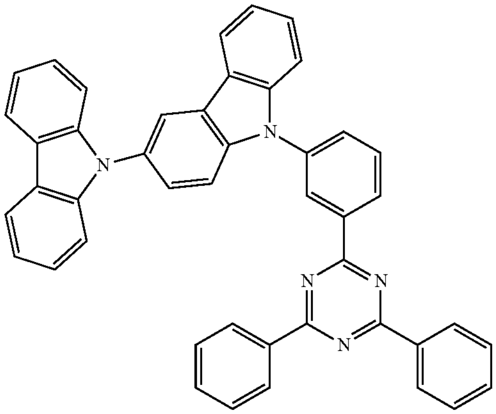

-continued

B-196

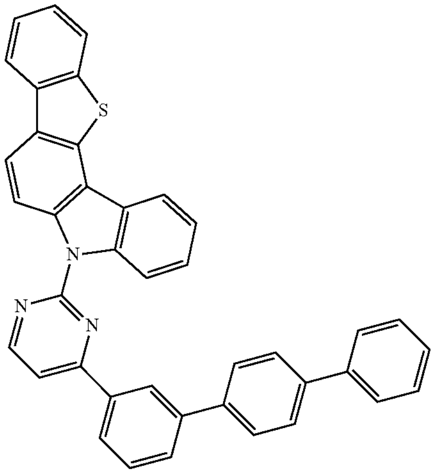

B-197

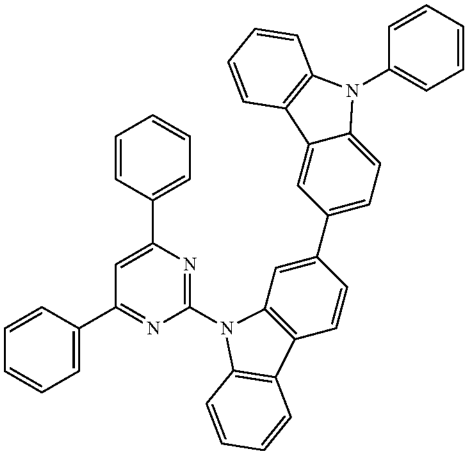

[wherein TPS represents a triphenylsilyl group]

The dopant comprised in the organic electroluminescent device according to the present disclosure is preferably at least one phosphorescent dopant. The phosphorescent dopant materials applied to the organic electroluminescent device according to the present disclosure are not particularly limited, but is preferably selected from metallated complex compounds of iridium (Ir), osmium (Os), copper (Cu), and platinum (Pt), is more preferably selected from ortho-metallated complex compounds of iridium (Ir), osmium (Os), copper (Cu), and platinum (Pt), and is even more preferably an ortho-metallated iridium complex compound.

The dopant comprised in the organic electroluminescent device of the present disclosure may be selected from the group consisting of the compounds represented by formulas 101 to 104 below, but is not limited thereto.

(101)

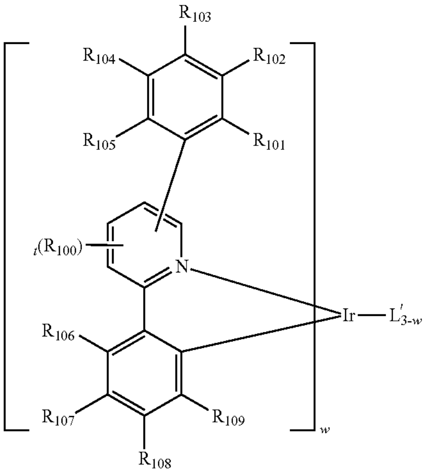

(102)

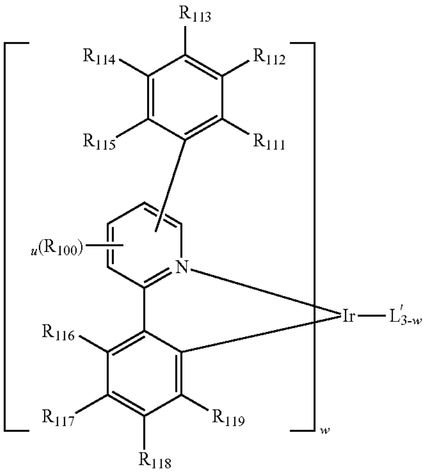

(103)

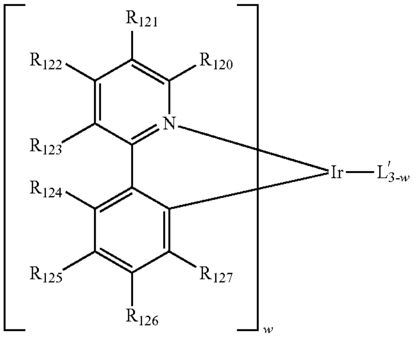

-continued (104)

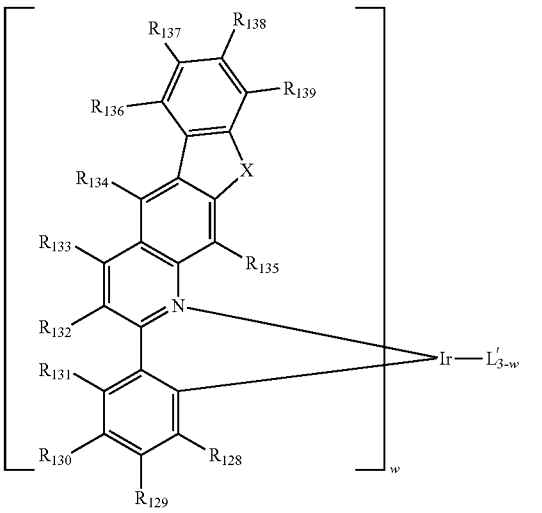

wherein L' is selected from the following structures:

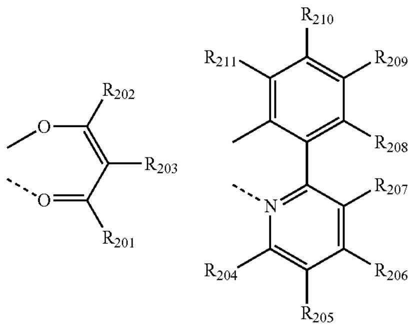

$R_{100}$, $R_{134}$, and $R_{135}$, each independently, represent hydrogen, deuterium, a substituted or unsubstituted (C1-C30)alkyl, or a substituted or unsubstituted (C3-C30)cycloalkyl;

$R_{101}$ to $R_{109}$ and $R_{111}$ to $R_{123}$, each independently, represent hydrogen, deuterium, a halogen, a (C1-C30)alkyl unsubstituted or substituted with deuterium or a halogen, a substituted or unsubstituted (C3-C30)cycloalkyl, a substituted or unsubstituted (C6-C30)aryl, a cyano, or a substituted or unsubstituted (C1-C30)alkoxy; adjacent substituents of $R_{106}$ to $R_{109}$ may be linked to each other to form a substituted or unsubstituted fused ring, e.g., a fluorene unsubstituted or substituted with an alkyl, a dibenzothiophene unsubstituted or substituted with an alkyl, or a dibenzofuran unsubstituted or substituted with an alkyl; and adjacent substituents of $R_{120}$ to $R_{123}$ may be linked to each other to form a substituted or unsubstituted fused ring, e.g., a quinoline unsubstituted or substituted with at least one of an alkyl, an aryl, an aralkyl, and an alkylaryl;

$R_{124}$ to $R_{133}$ and $R_{136}$ to $R_{139}$, each independently, represent hydrogen, deuterium, a halogen, a substituted or unsubstituted (C1-C30)alkyl, or a substituted or unsubstituted (C6-C30)aryl; and adjacent substituents of $R_{124}$ to $R_{127}$ may be linked to each other to form a substituted or unsubstituted fused ring, e.g., a fluorene unsubstituted or substituted with an alkyl, a dibenzothiophene unsubstituted or substituted with an alkyl, or a dibenzofuran unsubstituted or substituted with an alkyl;

X represents $CR_{61}R_{62}$, O, or S;

$R_{61}$ and $R_{62}$, each independently, represent a substituted or unsubstituted (C1-C10)alkyl, or a substituted or unsubstituted (C6-C30)aryl;

$R_{201}$ to $R_{211}$, each independently, represent hydrogen, deuterium, a halogen, a (C1-C30)alkyl unsubstituted or substituted with deuterium or a halogen, a substituted or unsubstituted (C3-C30)cycloalkyl, or a (C6-C30) aryl unsubstituted or substituted with an alkyl or deuterium; and adjacent substituents of $R_{208}$ to $R_{211}$ may be linked to each other to form a substituted or unsubstituted fused ring, e.g., a fluorene unsubstituted or substituted with an alkyl, a dibenzothiophene unsubstituted or substituted with an alkyl, or a dibenzofuran unsubstituted or substituted with an alkyl;

t and u, each independently, represent an integer of 1 to 3; where t or u is an integer of 2 or more, each $R_{100}$ may be the same or different; and w represents an integer of 1 to 3.

The specific examples of the dopant compound are as follows, but are not limited thereto.

D-1

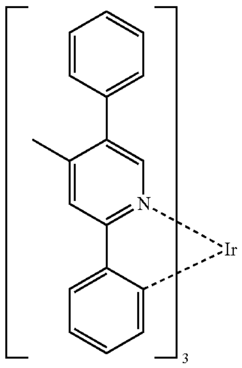

D-2

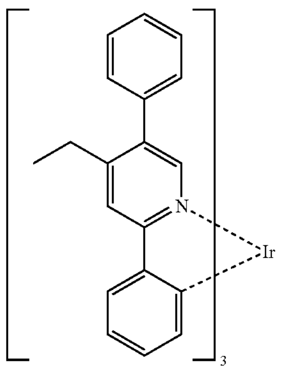

-continued
D-3
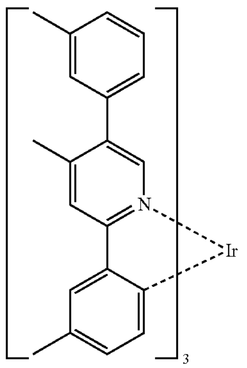
D-4
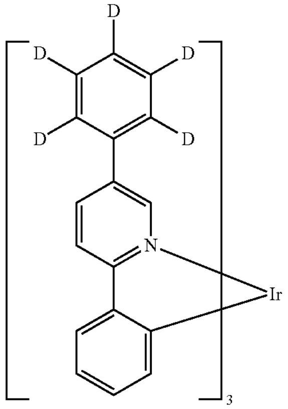
D-5
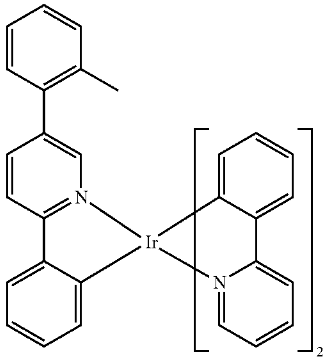
D-6
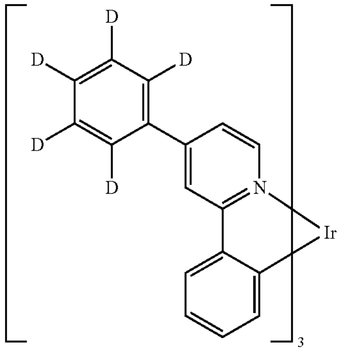
-continued
D-7
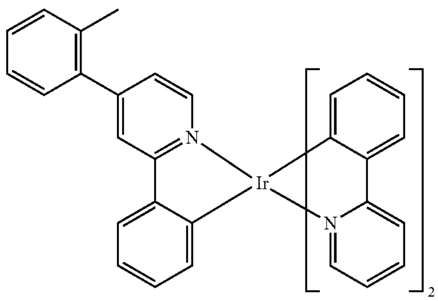
D-8
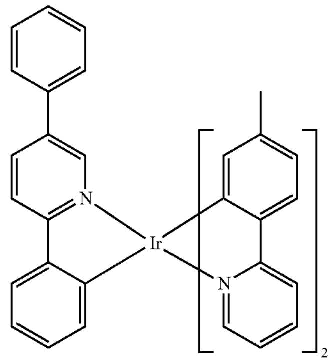
D-9
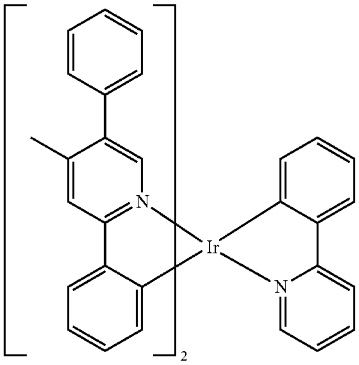
D-10
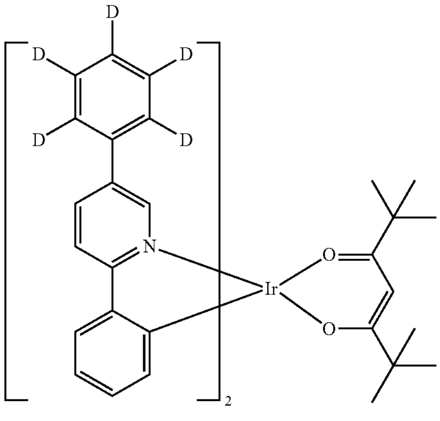

-continued
D-11
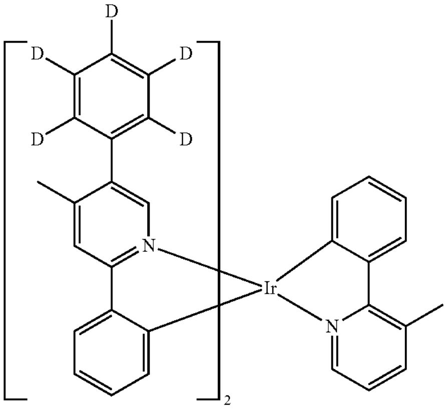
D-12
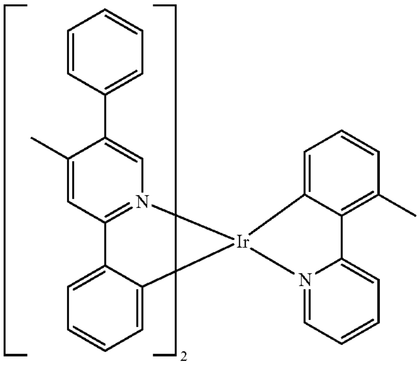
D-13
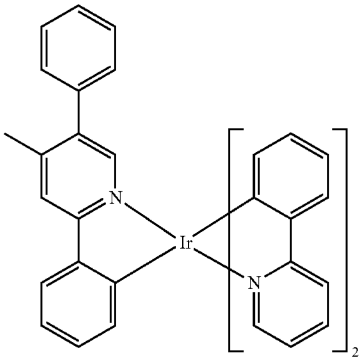
D-14
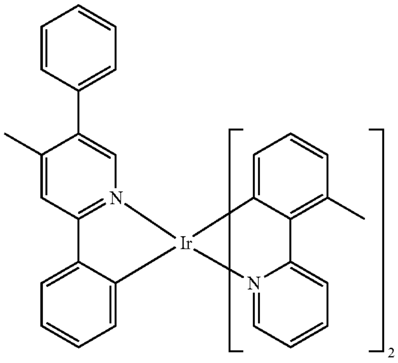
-continued
D-15
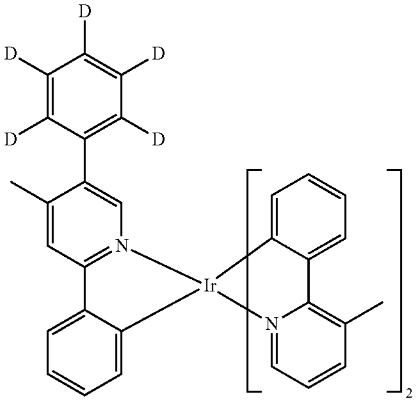
D-16
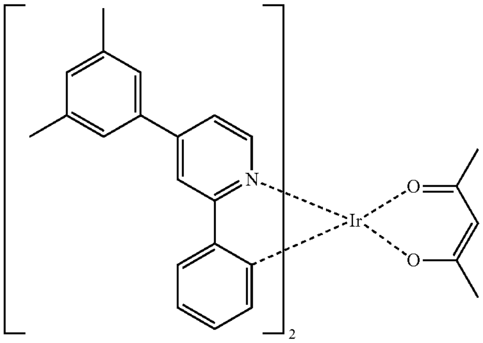
D-17
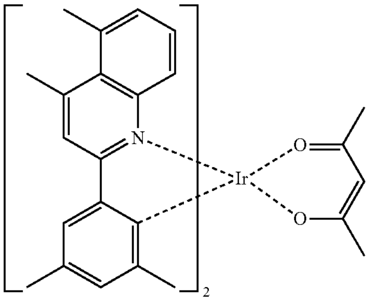
D-18
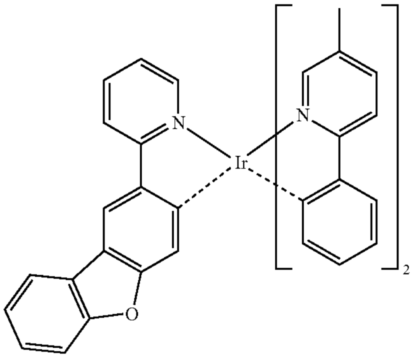

-continued
D-19
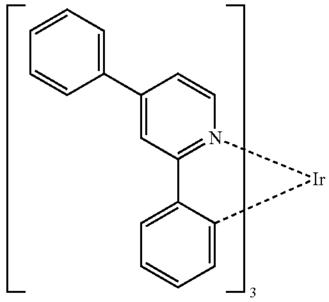
D-20
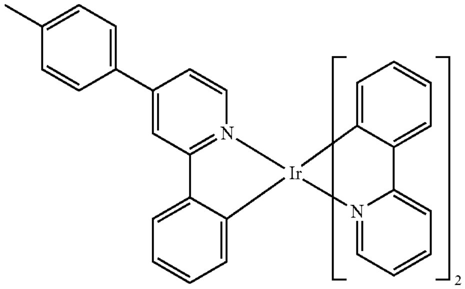
D-21
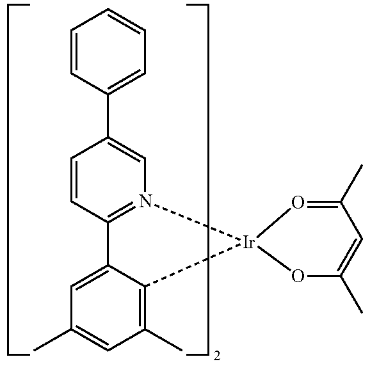
D-22
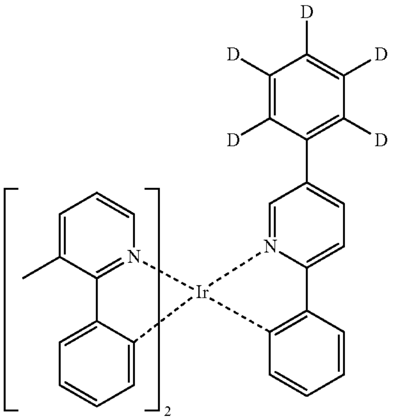
-continued
D-23
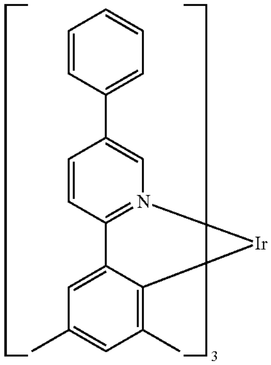
D-24
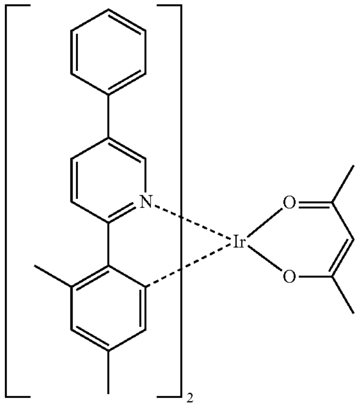
D-25
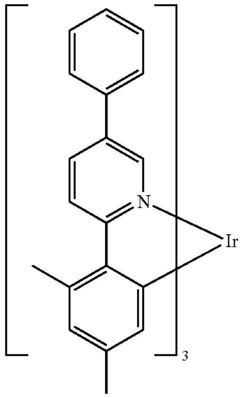
D-26
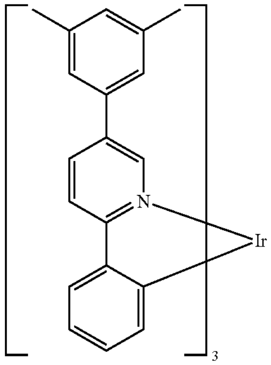

-continued
D-27
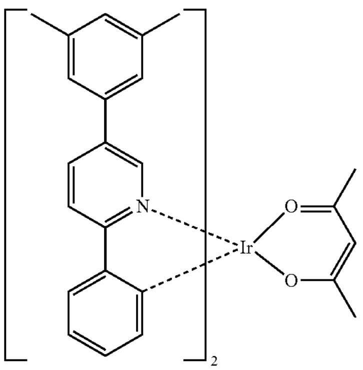
D-28
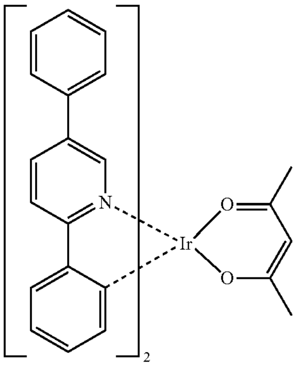
D-29
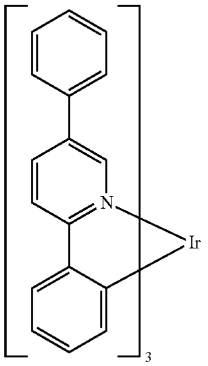
D-30
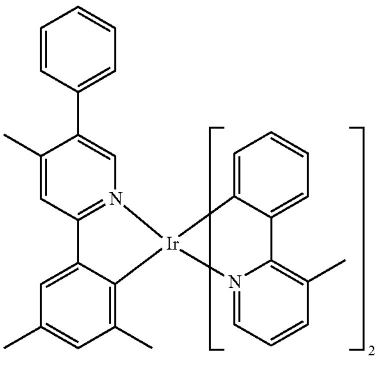
-continued
D-31
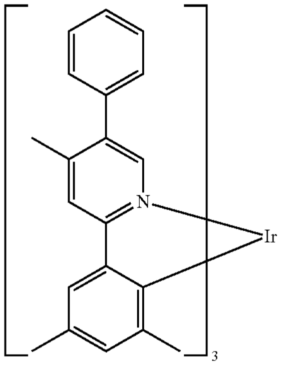
D-32
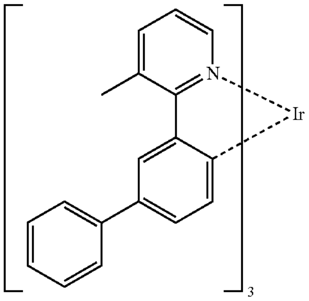
D-33
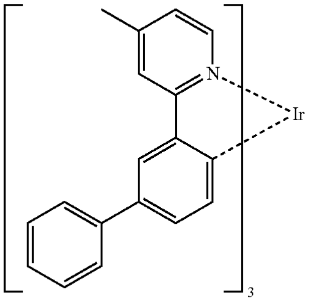
D-34
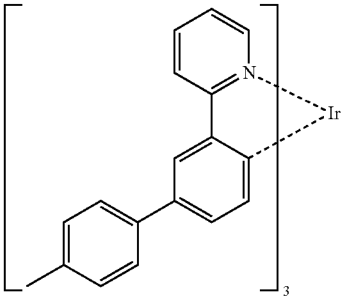
D-35
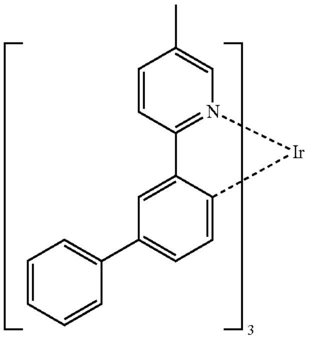

-continued
D-36
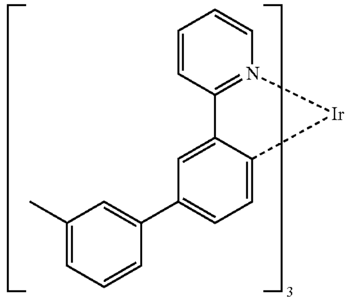
D-37
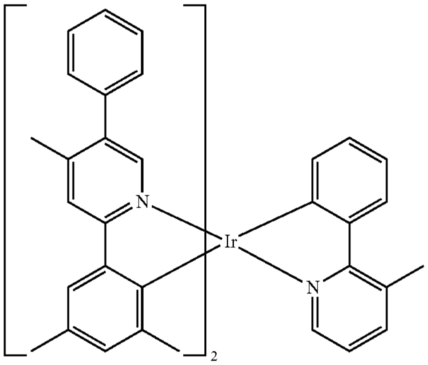
D-38
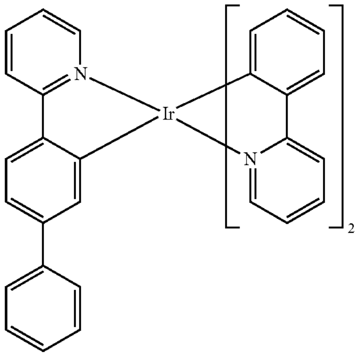
D-39
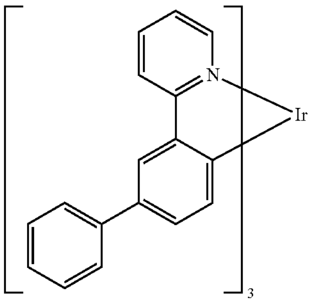
-continued
D-40
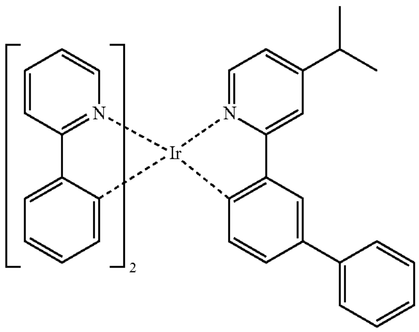
D-41
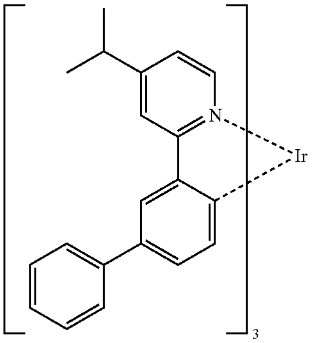
D-42
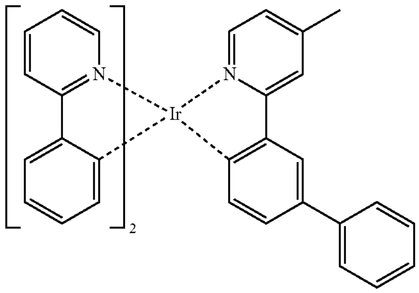
D-43
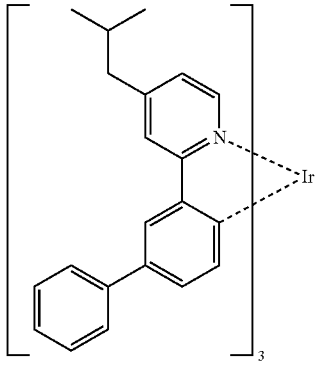

-continued
D-44
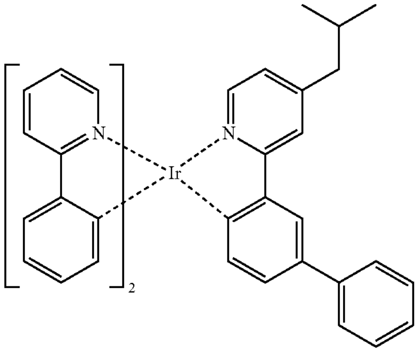
D-45
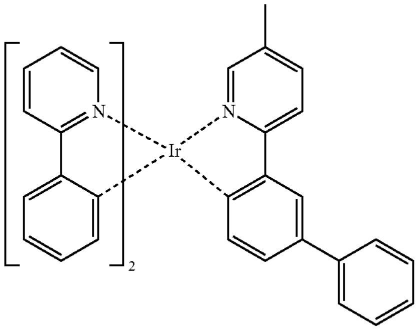
D-46
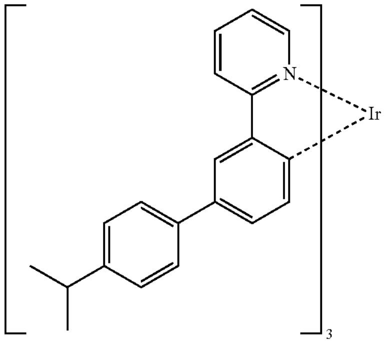
D-47
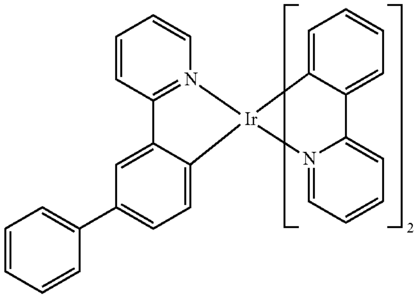
-continued
D-48
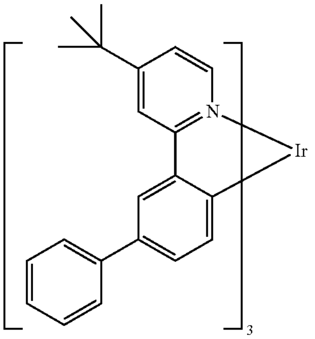
D-49
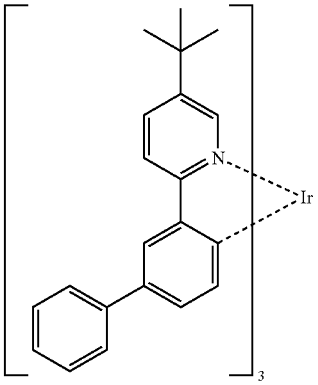
D-50
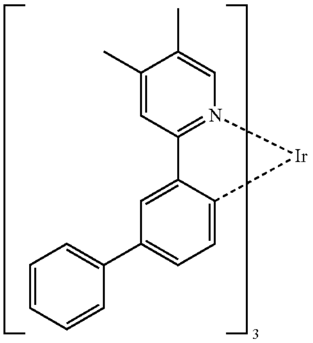
D-51
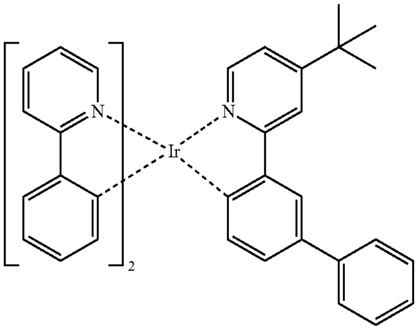

-continued
D-52
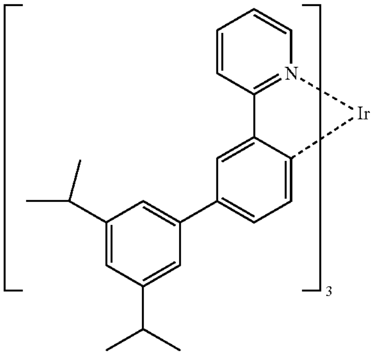
D-53
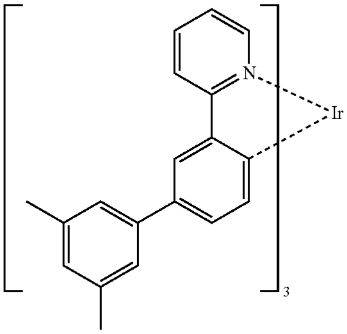
D-54
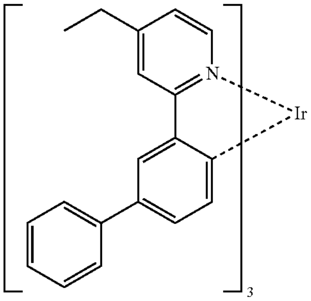
D-55
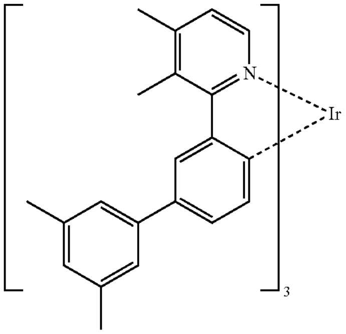
D-56
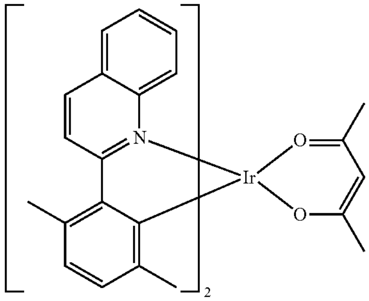
-continued
D-57
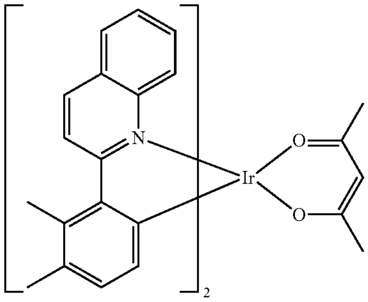
D-58
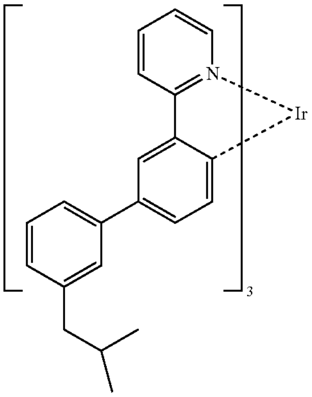
D-59
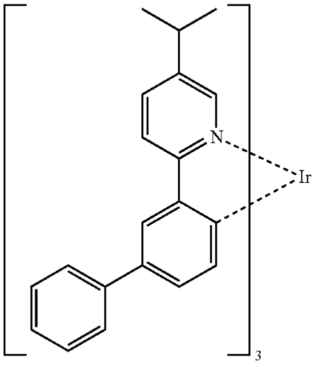
D-60
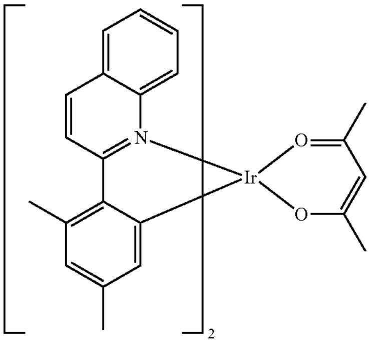

-continued
D-61
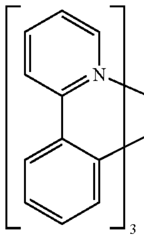
D-62
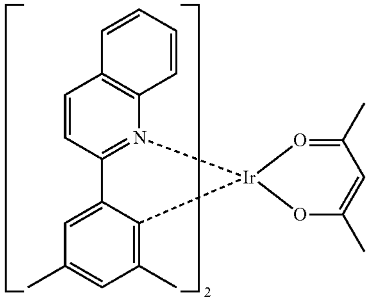
D-63
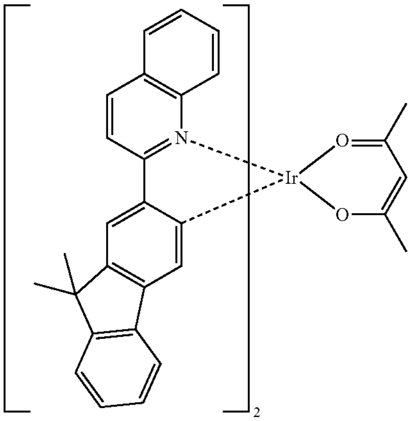
D-64
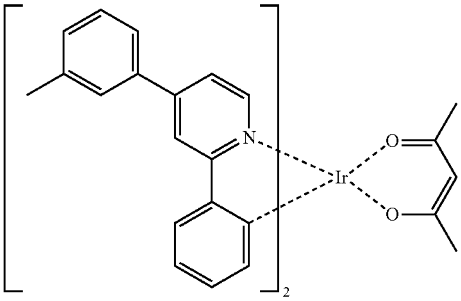
D-65
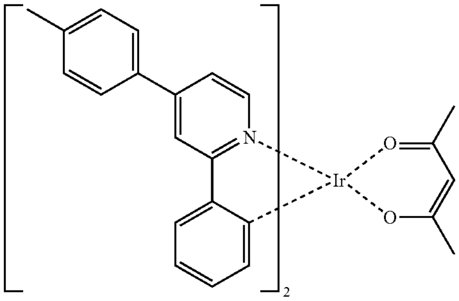
-continued
D-66
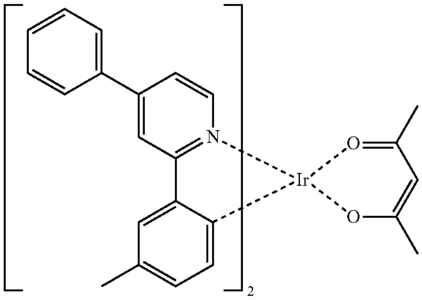
D-67
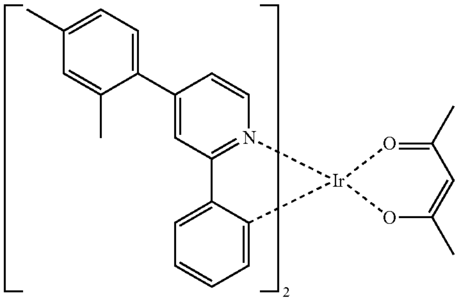
D-68
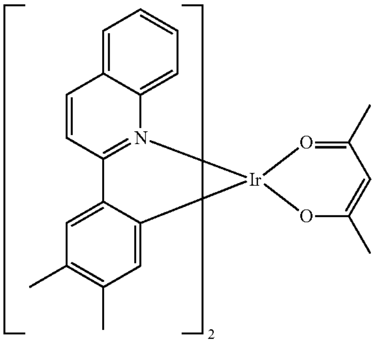
D-69
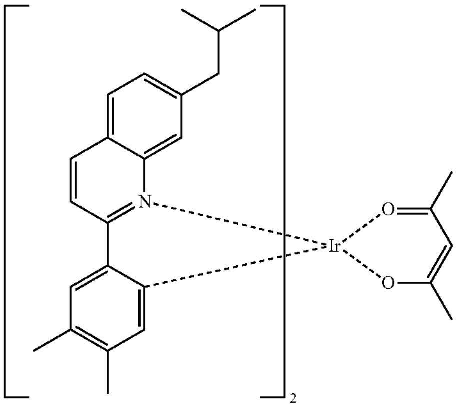

-continued
D-70
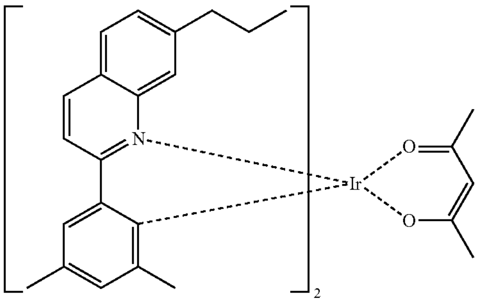
D-71
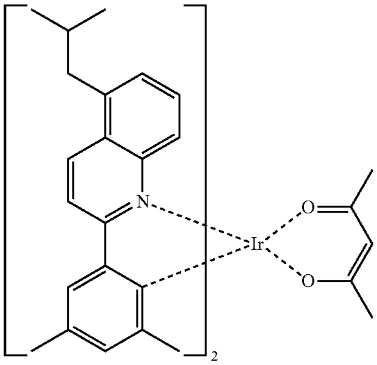
D-72
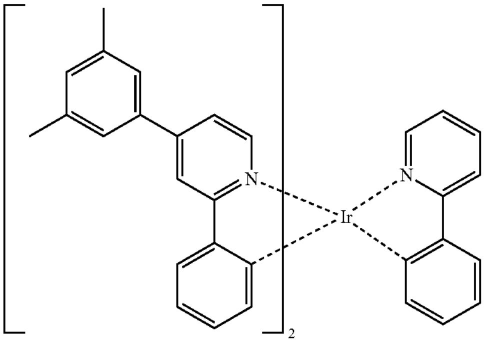
D-73
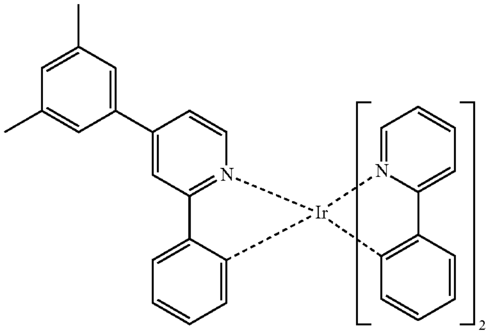
-continued
D-74
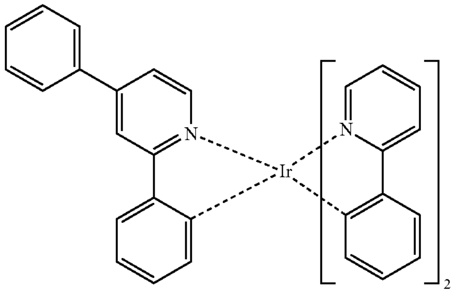
D-75
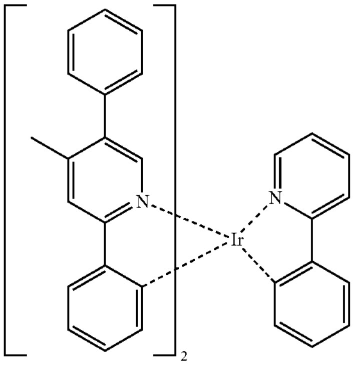
D-76
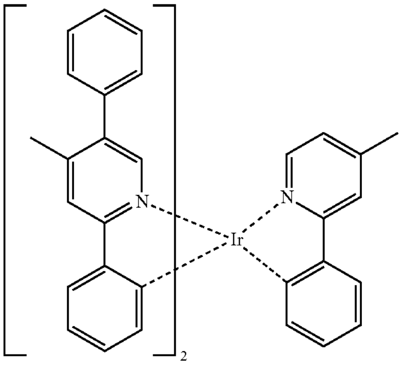
D-77
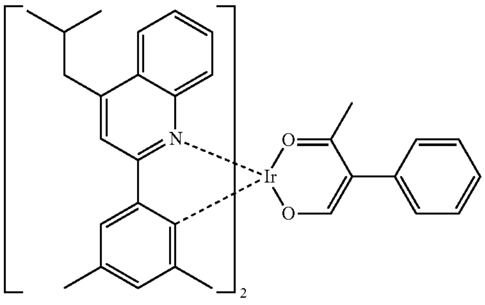

-continued
D-78
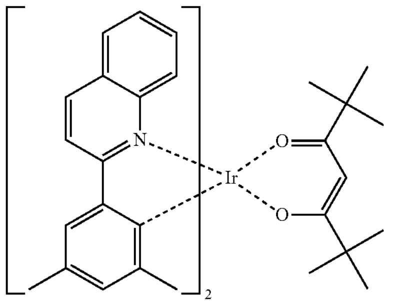
D-79
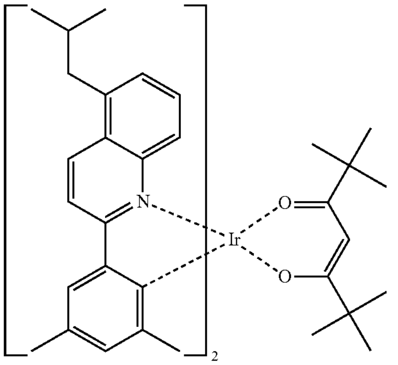
D-80
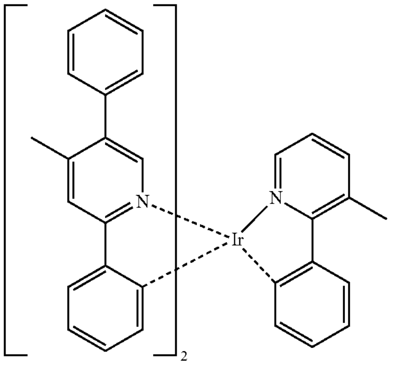
D-81
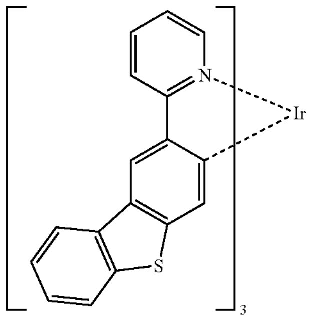
-continued
D-82
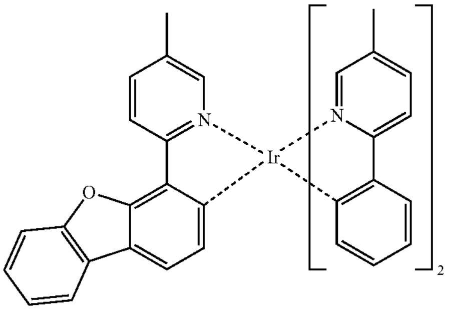
D-83
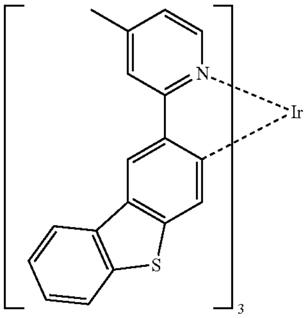
D-84
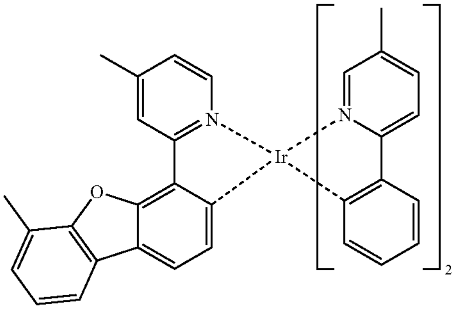
D-85
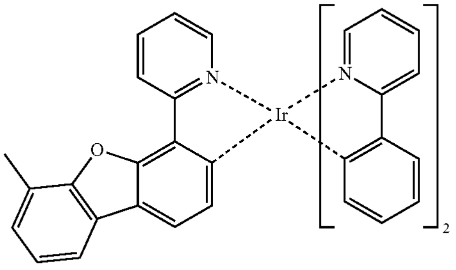
D-86
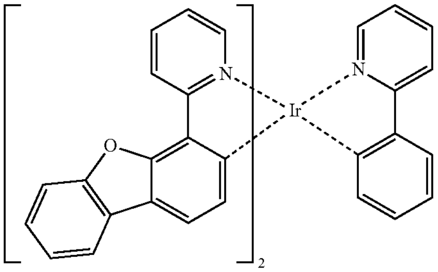

-continued
D-87
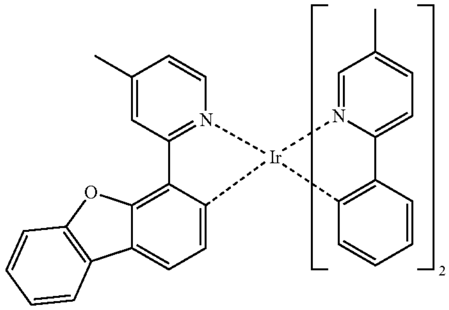
D-88
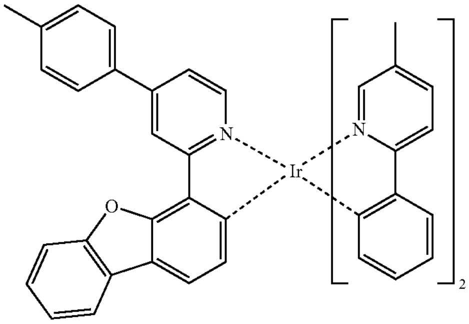
D-89
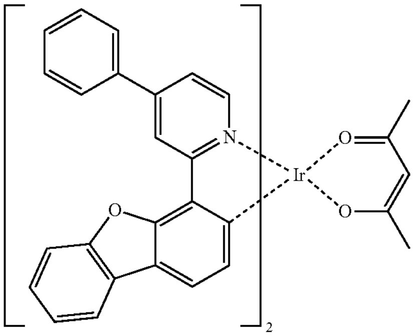
D-90
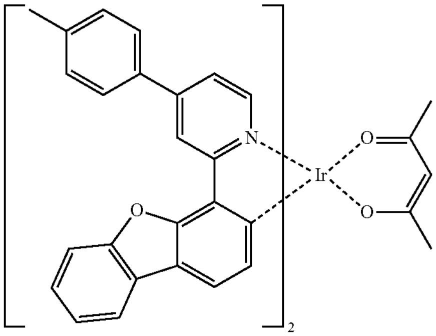
D-91
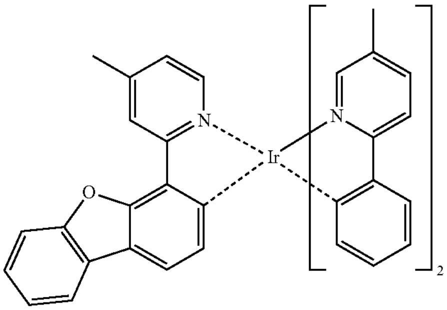
-continued
D-92
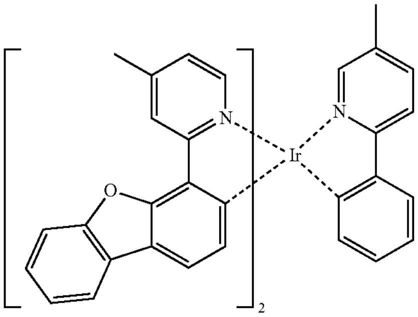
D-93
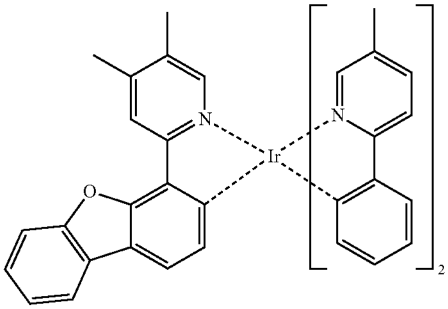
D-94
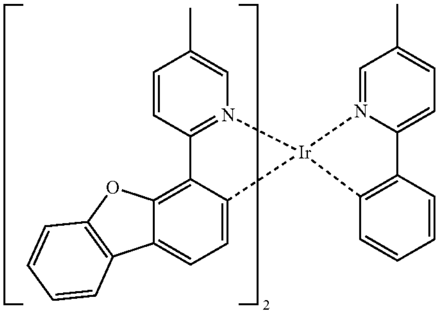
D-95
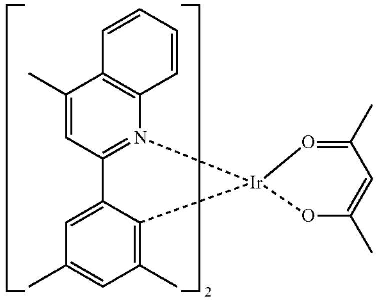
D-96
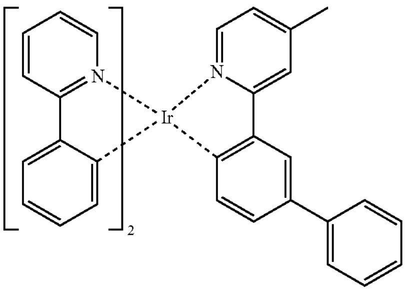

-continued
D-97
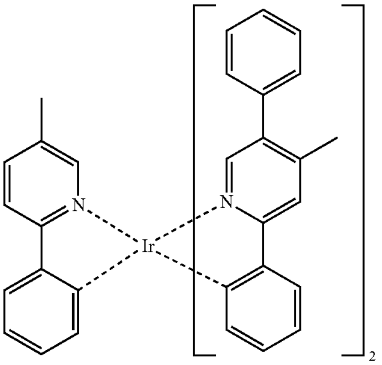
D-98
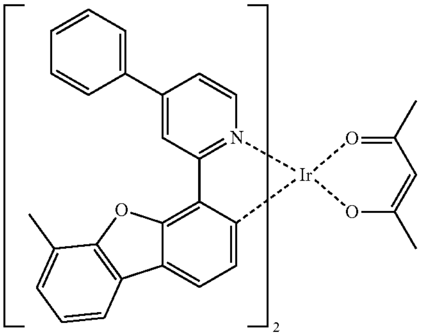
D-99
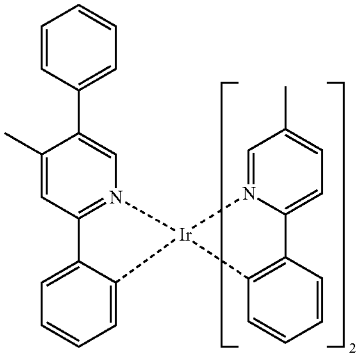
D-100
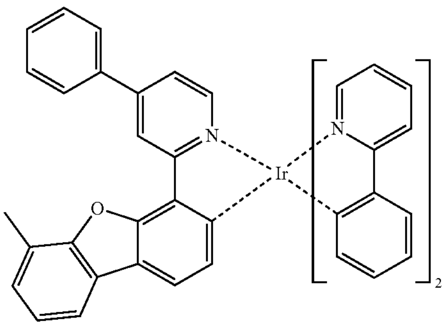
-continued
D-101
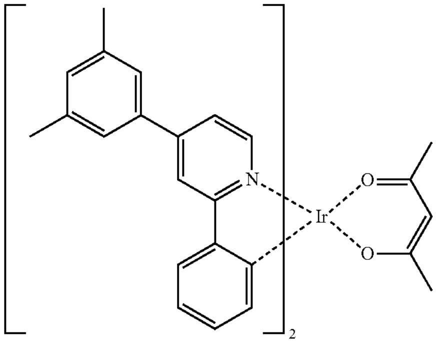
D-102
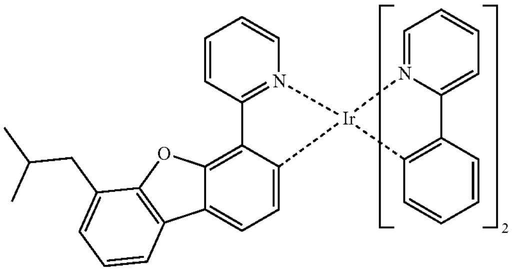
D-103
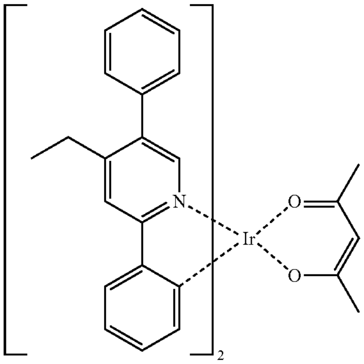
D-104
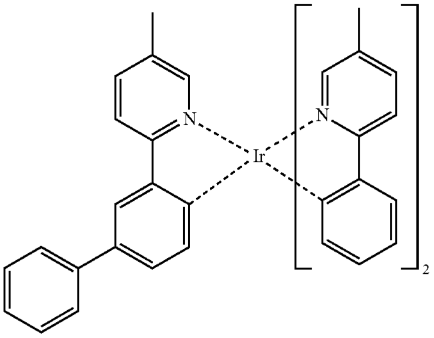

-continued
D-105
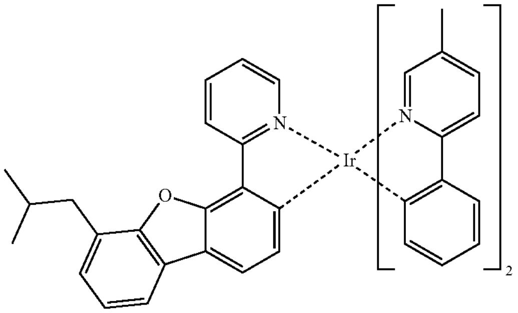
D-106
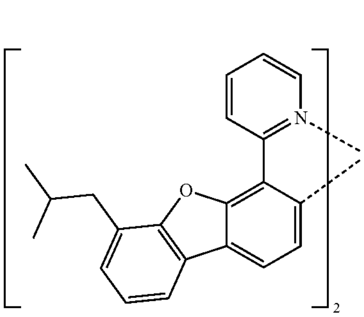
D-107
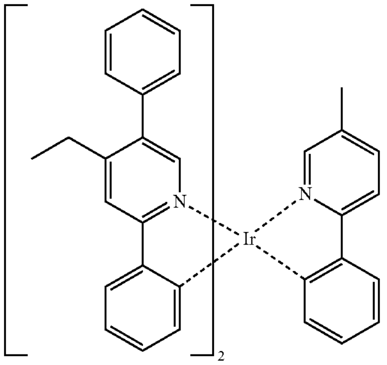
D-108
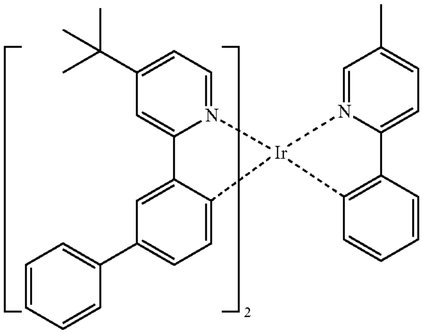
-continued
D-109
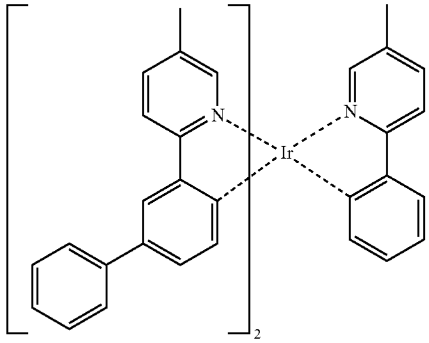
D-110
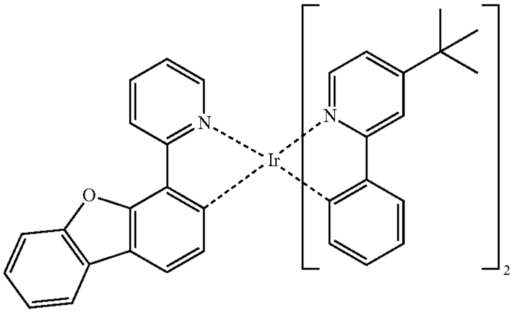
D-111
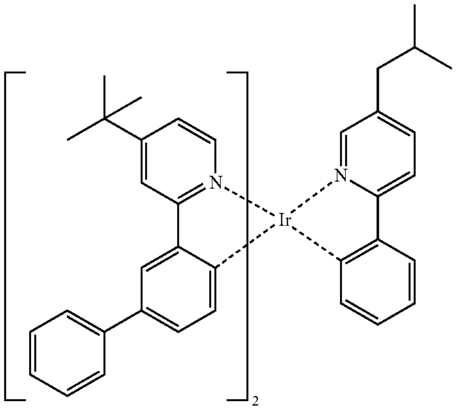
D-112
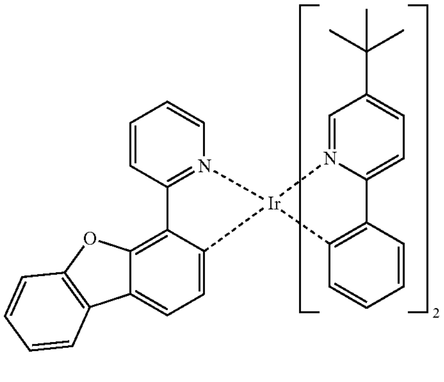

-continued
D-113
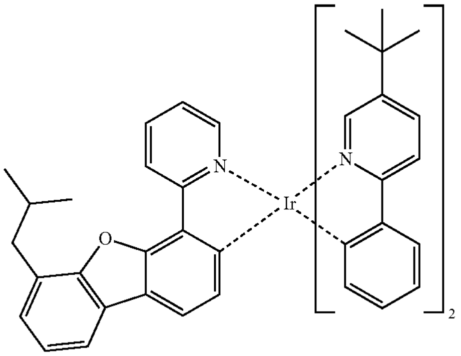
D-114
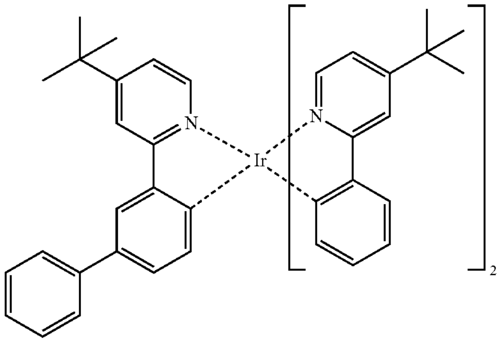
D-115
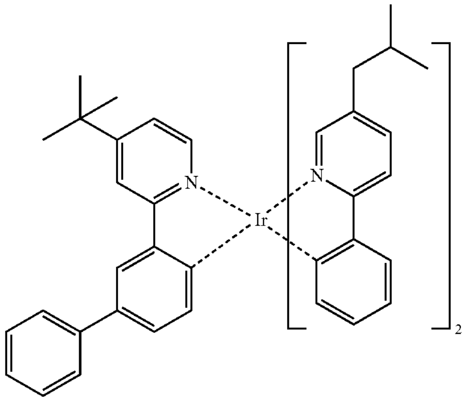
D-116
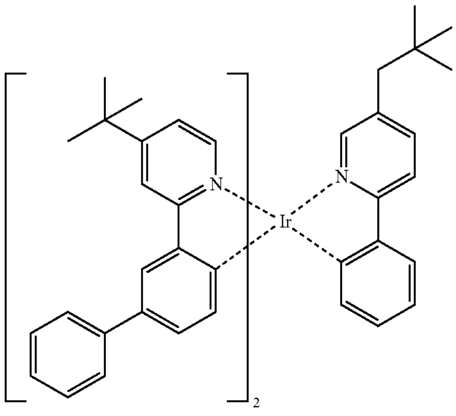
-continued
D-117
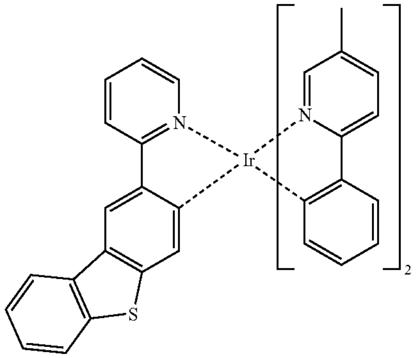
D-118
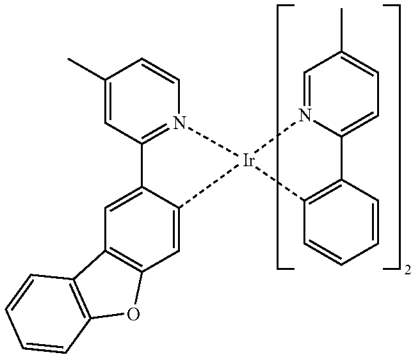
D-119
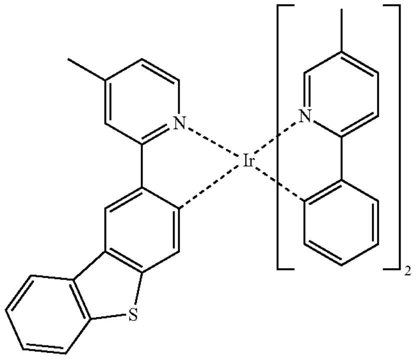
D-120
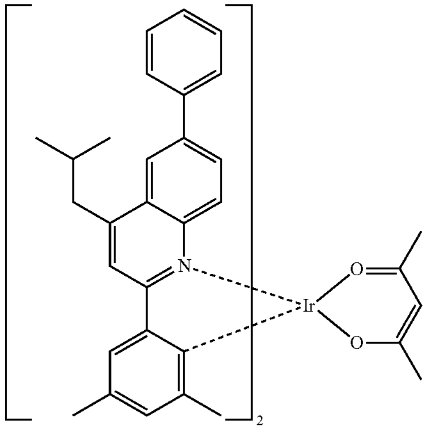

-continued
D-121
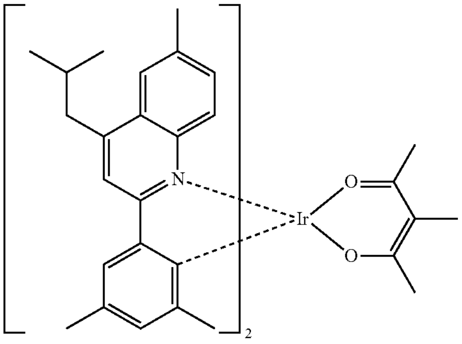
D-122
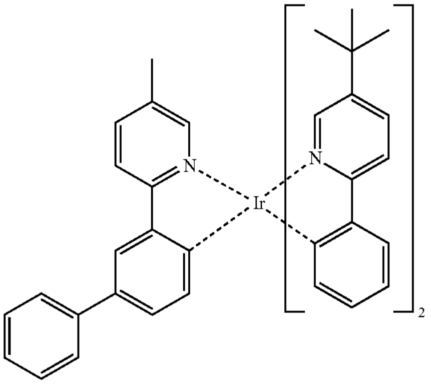
D-123
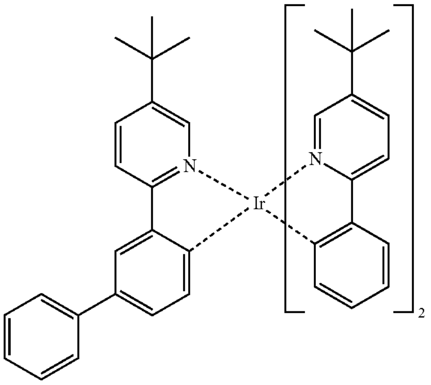
D-124
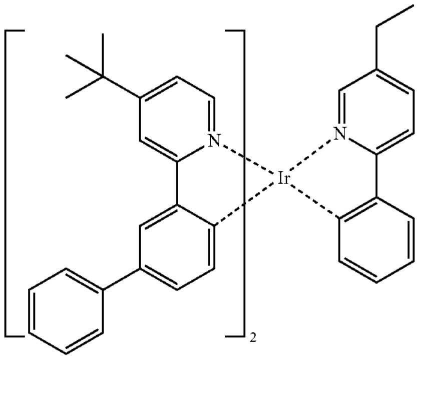
-continued
D-125
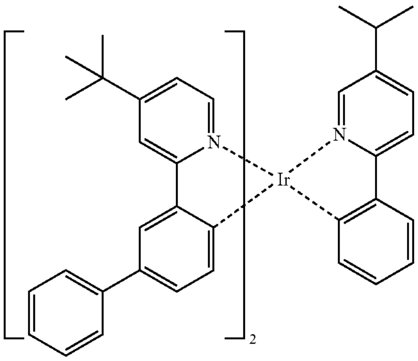
D-126
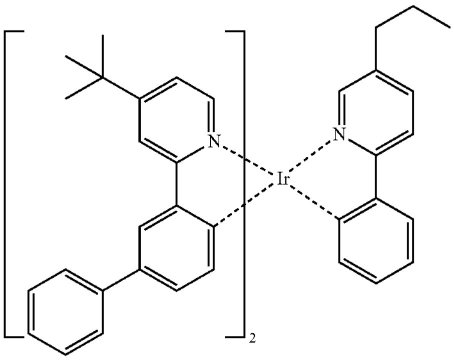
D-127
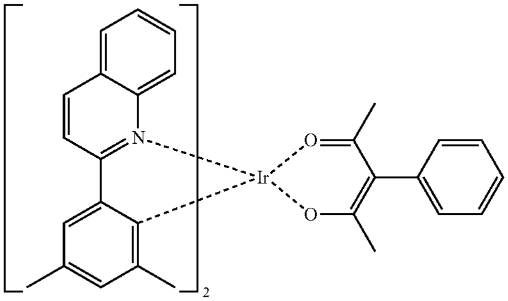
D-128
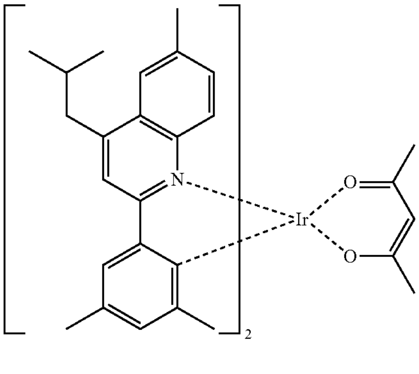

-continued
D-129
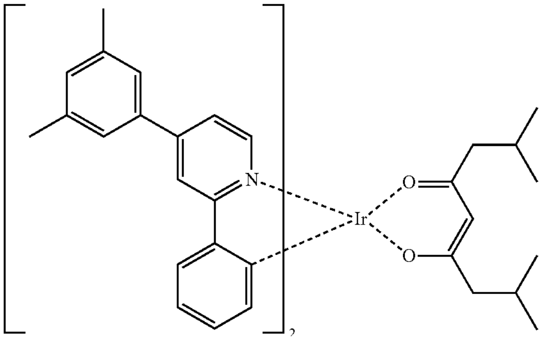
D-130
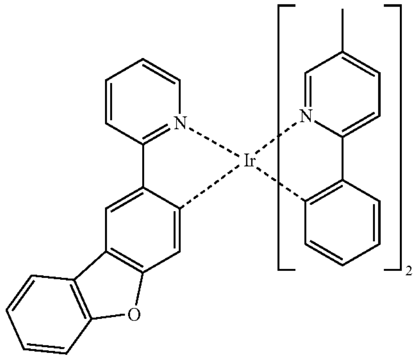
D-131
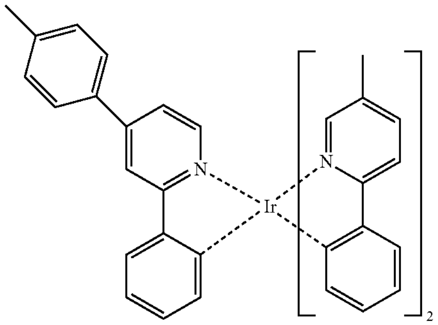
D-132
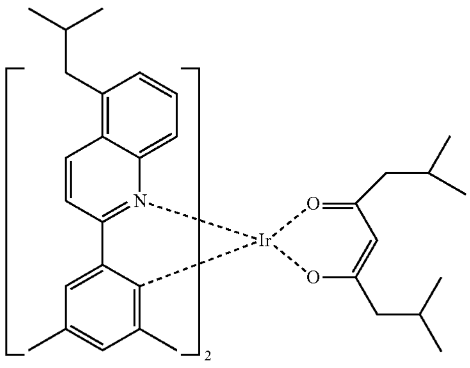
-continued
D-133
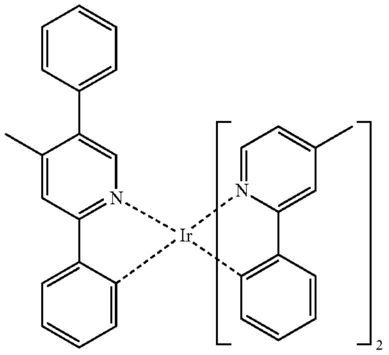
D-134
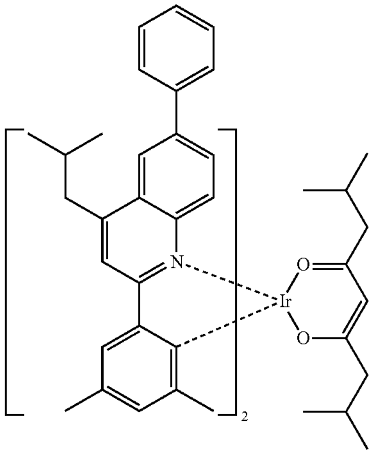
D-135
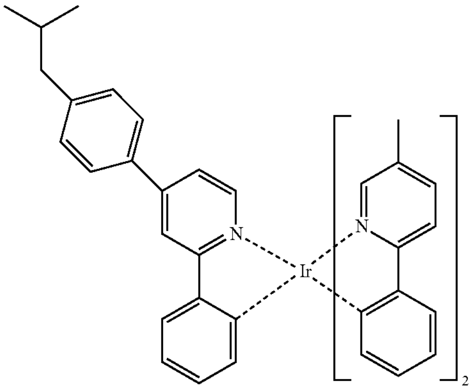
D-136
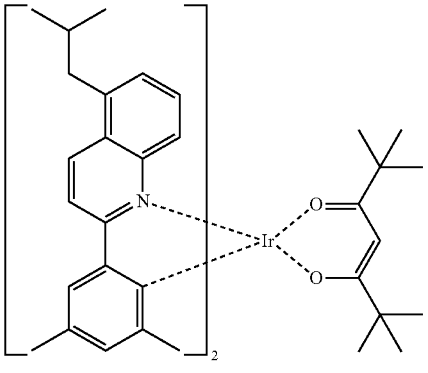

-continued
D-137
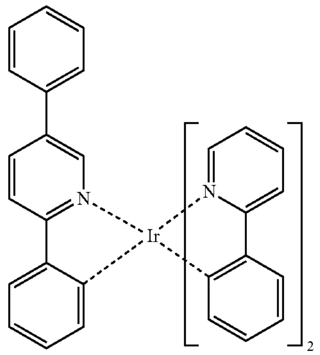
D-138
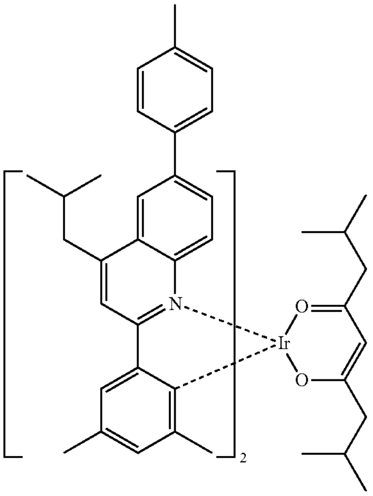
D-139
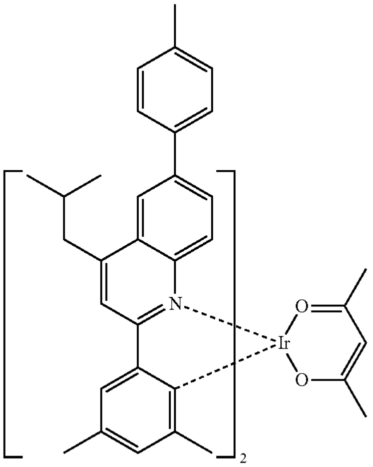
-continued
D-140
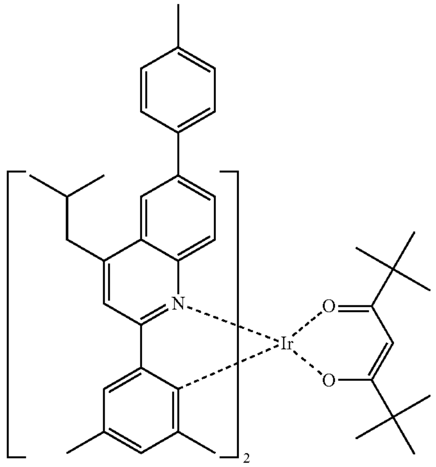
D-141
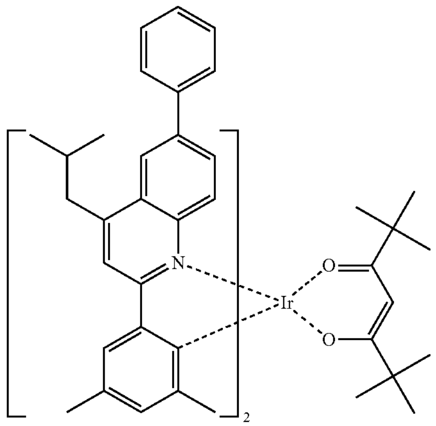
D-142
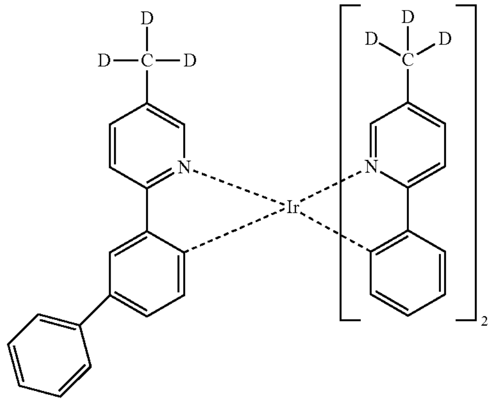
D-143
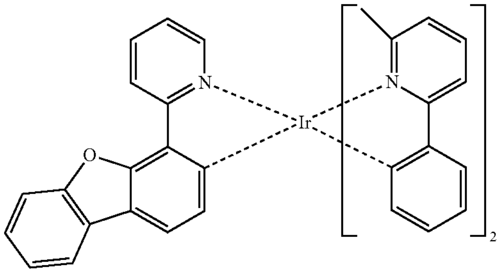

-continued
D-144
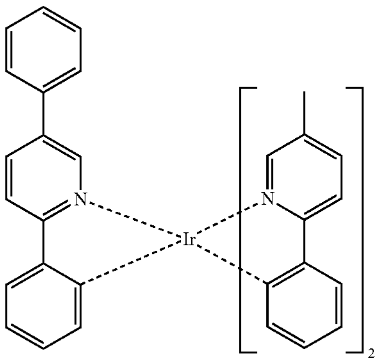
D-145
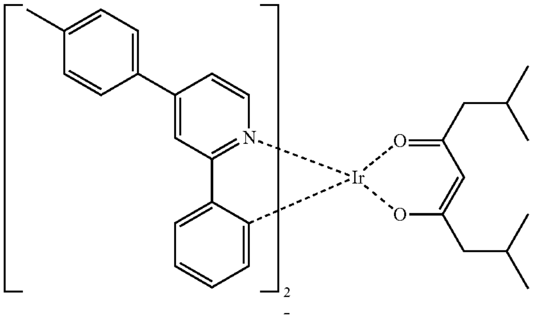
D-146
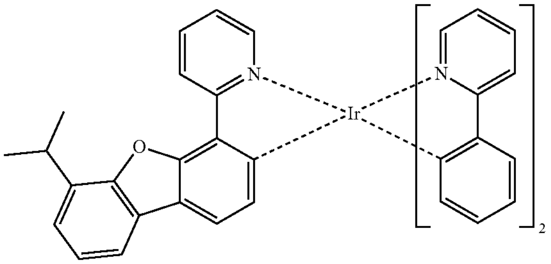
D-147
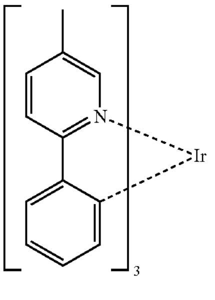
D-148
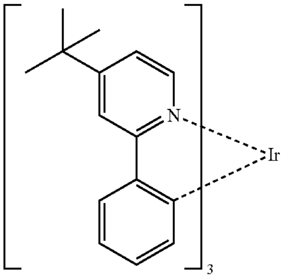
-continued
D-149
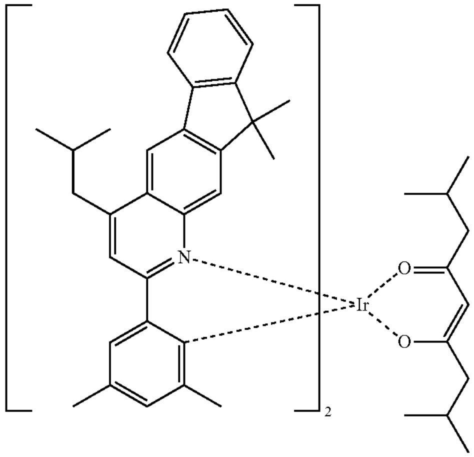
D-150
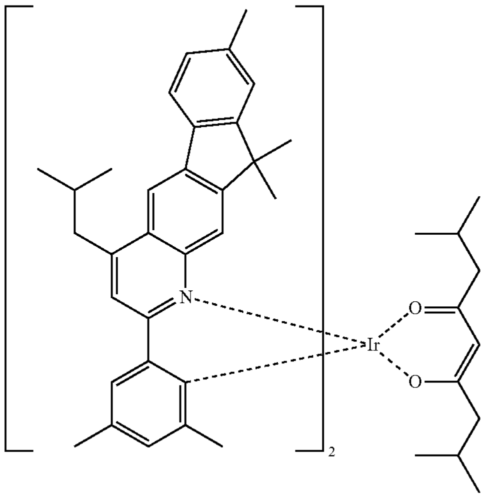
D-151
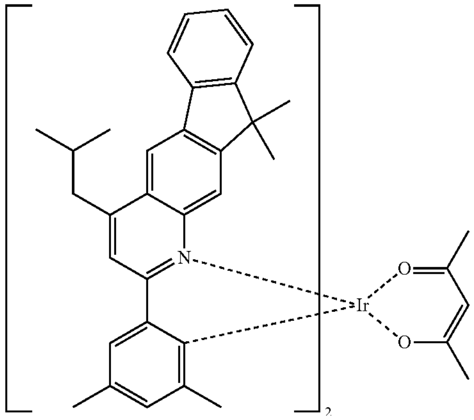

-continued

D-152

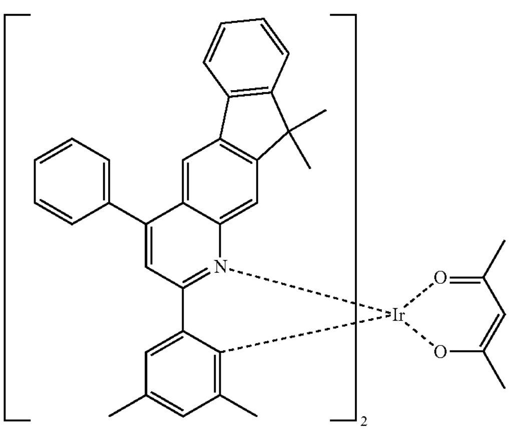

D-153

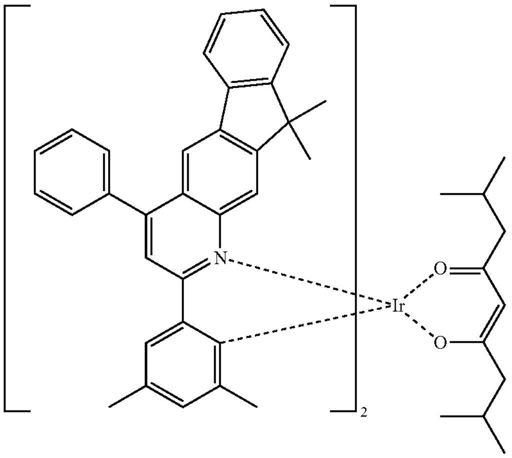

D-154

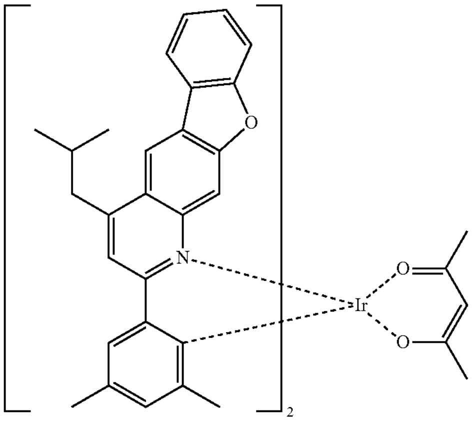

-continued

D-155

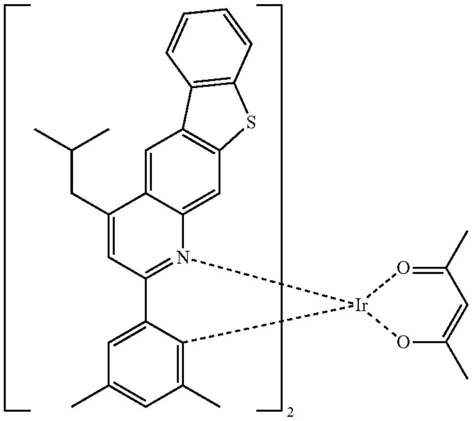

D-156

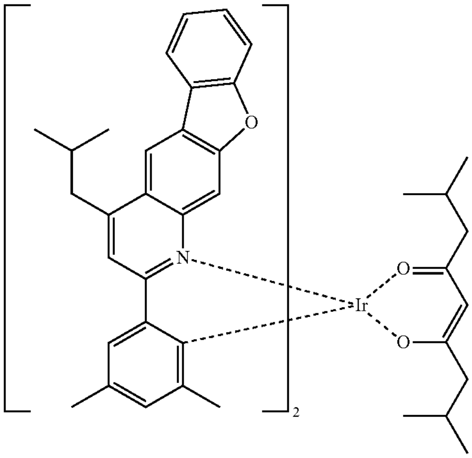

D-157

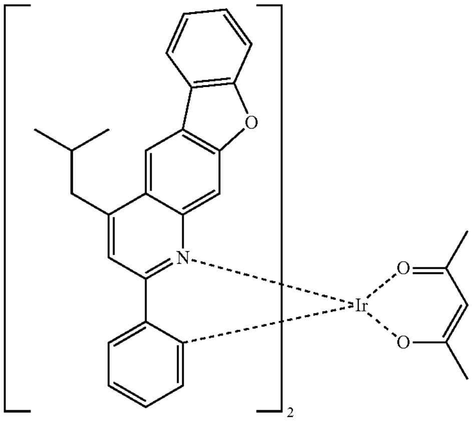

The organic electroluminescent device of the present disclosure may further comprise at least one compound selected from the group consisting of arylamine-based compounds and styrylarylamine-based compounds in the medium layer.

In addition, in the organic electroluminescent device of the present disclosure, the medium layer may further comprise at least one metal selected from the group consisting of metals of Group 1, metals of Group 2, transition metals of the 4th period, transition metals of the $5^{th}$ period, lanthanides and organic metals of d-transition elements of the Periodic Table, or at least one complex compound comprising said metal.

In the organic electroluminescent device of the present disclosure, at least one layer (hereinafter, “a surface layer”) selected from a chalcogenide layer, a metal halide layer and a metal oxide layer may be preferably placed on an inner surface(s) of one or both electrodes. Specifically, a chalcogenide (including oxides) layer of silicon or aluminum is preferably placed on an anode surface of an electroluminescent medium layer, and a metal halide layer or a metal oxide layer is preferably placed on a cathode surface of an electroluminescent medium layer. Such a surface layer may provide operation stability for the organic electroluminescent device. Preferably, the chalcogenide includes $SiO_X$ ($1 \leq X \leq 2$), $AlO_X$ ($1 \leq X \leq 1.5$), SiON, SiAlON, etc.; said metal halide includes LiF, $MgF_2$, $CaF_2$, a rare earth metal fluoride, etc.; and said metal oxide includes $Cs_2O$, $Li_2O$, MgO, SrO, BaO, CaO, etc.

The first electrode may be an anode. Between the anode and the light-emitting layer, a hole transport zone may be comprised, and the hole transport zone may comprise a hole transport layer. In addition to the hole transport layer, a hole injection layer, an electron blocking layer, or a combination thereof may be used. Multi-layers can be used for the hole injection layer in order to lower the hole injection barrier (or hole injection voltage) from the anode to the hole transport layer or the electron blocking layer. Two compounds can be simultaneously used in each layer. The electron blocking layer may also be formed of multi-layers.

The second electrode may be a cathode. Between the light-emitting layer and the cathode, a layer selected from an electron buffer layer, a hole blocking layer, an electron transport layer, or an electron injection layer, or a combination thereof can be used. Multi-layers can be used for the electron buffer layer in order to control the injection of the electrons and enhance the interfacial characteristics between the light-emitting layer and the electron injection layer. Two compounds may be simultaneously used in each layer. The hole blocking layer or the electron transport layer may also be formed of multi-layers, and each layer can comprise two or more compounds.

Preferably, in the organic electroluminescent device of the present disclosure, a mixed region of an electron transport compound and a reductive dopant, or a mixed region of a hole transport compound and an oxidative dopant may be placed on at least one surface of a pair of electrodes. In this case, the electron transport compound is reduced to an anion, and thus it becomes easier to inject and transport electrons from the mixed region to the light-emitting medium. Furthermore, the hole transport compound is oxidized to a cation, and thus it becomes easier to inject and transport holes from the mixed region to the light-emitting medium. Preferably, the oxidative dopant includes various Lewis acids and acceptor compounds; and the reductive dopant includes alkali metals, alkali metal compounds, alkaline earth metals, rare-earth metals, and mixtures thereof. The reductive dopant layer may be employed as a charge-generating layer to prepare an organic EL device having two or more light-emitting layers and emitting white light.

In order to form each layer constituting the organic EL device of the present disclosure, dry film-forming methods such as vacuum deposition, sputtering, plasma, ion plating methods, etc., or wet film-forming methods such as ink jet printing, nozzle printing, slot coating, spin coating, dip coating, flow coating methods, etc., can be used.

When using a wet film-forming method, a thin film is formed by dissolving or dispersing the material constituting each layer in suitable solvents, such as ethanol, chloroform, tetrahydrofuran, dioxane, etc. The solvents are not specifically limited as long as the material constituting each layer is soluble or dispersible in the solvents, which do not cause any problems in forming a layer.

By using the organic electroluminescent device of the present disclosure, a display device, for example, for smartphones, tablets, notebooks, PCs, TVs, or vehicles, or a lighting device, for example, an indoor or outdoor lighting device can be produced.

Hereinafter, the preparation method of the host compound of the present disclosure, the physical properties of the compounds, and the luminous properties of the device comprising the host material and the hole transport material of the present disclosure will be explained in detail.

Synthesis Example 1: Preparation of Compound C-4

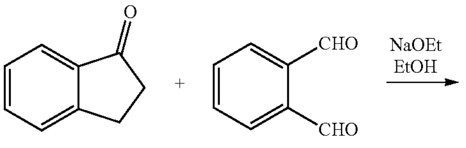

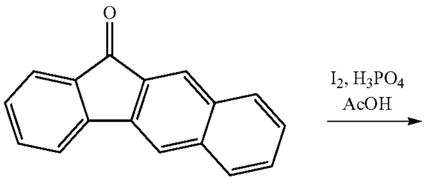

1-1

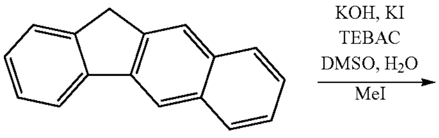

1-2

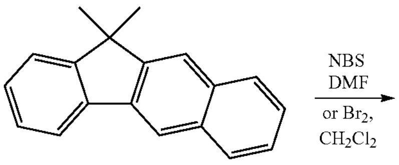

1-3

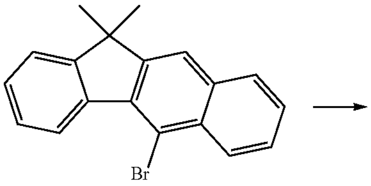

1-4

-continued

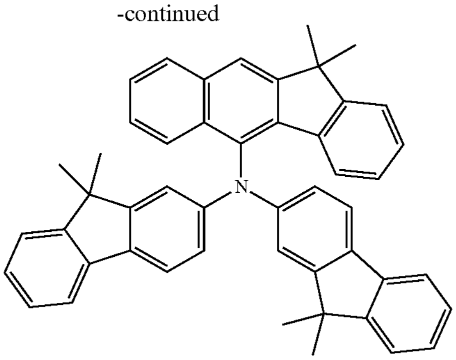

C-4

Preparation of Compound 1-1

100 g of indanone (757 mmol), 111.6 g of phthalaldehyde (832 mmol), 10.3 g of 20% sodium ethoxide ethyl alcohol solution (151 mmol), and 1300 mL of ethyl alcohol were introduced into a reaction vessel. After the mixture was refluxed for 2 hours, the mixture was cooled to room temperature and stirred overnight. The reaction solution was cooled to 0° C., and the separated solid was filtered and washed with cold methyl alcohol and hexane to obtain 95 g of compound 1-1 (yield: 55%).

Preparation of Compound 1-2

33.3 g of iodine (144 mmol), 44 g of hypophosphorous acid (660 mmol, 50% aqueous solution), and 2000 mL of acetic acid were introduced into a reaction vessel, and the mixture was stirred at 80° C. for 30 minutes. 95 g of compound 1-1 (413 mmol) was slowly added dropwise thereto and the mixture was stirred under reflux overnight. The reaction solution was cooled to room temperature, and the separated solid was filtered and washed with cold methyl alcohol and hexane to obtain 73 g of compound 1-2 (yield: 82%).

Preparation of Compound 1-3

30 g of compound 1-2 (139 mmol), 39 g of potassium hydroxide (694 mmol), 2.3 g of potassium iodide (14 mmol), 1.58 g of benzyltriethylammonium chloride (7 mmol), 70 mL of distilled water, and 700 mL of dimethylsulfoxide were introduced into a reaction vessel, and the mixture was stirred at room temperature for 30 minutes. 49 g of methyl iodide (347 mmol) was added thereto and the mixture was stirred at room temperature overnight. The reaction solution was diluted with ethylacetate and washed with distilled water. The extracted organic layer was then dried with magnesium sulfate. The solvent was removed with a rotary evaporator, and the resulting product was purified by column chromatography to obtain 34 g of compound 1-3 (yield: 68%).

Preparation of Compound 1-4

3 g of compound 1-3 (12 mmol) was dissolved in 50 mL of methylene chloride in a reaction vessel. 1.3 g of bromine (16 mmol) was dissolved in 10 mL of methylene chloride and added to the reaction solution. The mixture was then stirred at room temperature for 2 hours. The reaction solution was diluted with methylene chloride and washed with distilled water. The extracted organic layer was then dried with magnesium sulfate. The solvent was removed with a rotary evaporator, and the separated solid was filtered and washed with cold methyl alcohol to obtain 1.8 g of compound 1-4 (yield: 45%).

Compound 1-4 can also be obtained as follows:

1.3 g of compound 1-3 (5 mmol), 10 mL of dimethylformamide, and 1.23 g of N-bromosuccinimide (7 mmol) were introduced into a reaction vessel, and the mixture was stirred at room temperature overnight. The reaction solution was diluted with ethylacetate and washed with distilled water. The extracted organic layer was then dried with magnesium sulfate. The solvent was removed with a rotary evaporator, and the separated solid was filtered and washed with cold methyl alcohol to obtain 620 mg of compound 1-4 (yield: 36%).

Preparation of Compound C-4

10 g of compound 1-4 (31 mmol), 13.7 g of bis-9,9-dimethyl-9H-fluoren-2-ylamine (31 mmol), 1.46 g of tris(dibenzylideneacetone)dipalladium(0) (2 mmol), 2.2 mL of tri-t-butylphosphine (6 mmol, 50% toluene solution), 5.9 g of sodium t-butoxide (62 mmol), and 223 mL of toluene were introduced into a reaction vessel, and the mixture was refluxed for 4 hours. The reaction solution was cooled to room temperature. The solvent was removed with a rotary evaporator, and the resulting product was purified by column chromatography to obtain 10.5 g of compound C-4 (yield: 52%). The properties of compound C-4 are shown in Table 1.

Synthesis Example 2: Preparation of Compound C-5

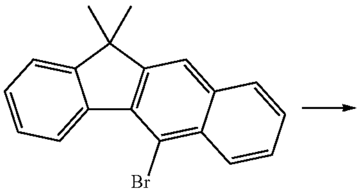

1-4

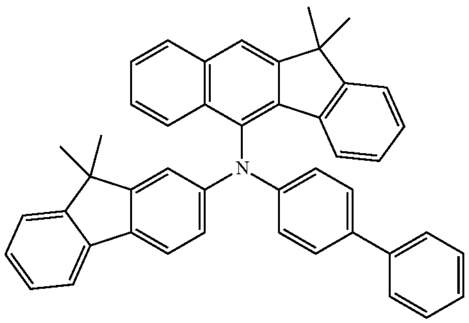

C-5

40 g of compound 1-4 (124 mmol), 44.7 g of N-1,1'-biphenyl-4-yl-9,9-dimethyl-9H-fluorene-2-amine (124 mmol), 3.4 g of tris(dibenzylideneacetone)dipalladium(0) (4 mmol), 3 mL of tri-t-butylphosphine (7 mmol, 50% toluene solution), 17.8 g of sodium t-butoxide (186 mmol), and 600 mL of toluene were introduced into a reaction vessel, and the mixture was refluxed for 3 hours. The reaction solution was cooled to room temperature. The solvent was removed with a rotary evaporator, and the resulting product was purified by column chromatography to obtain 37.8 g of compound C-5 (yield: 51%). The properties of compound C-5 are shown in Table 1.

Synthesis Example 3: Preparation of Compound C-7

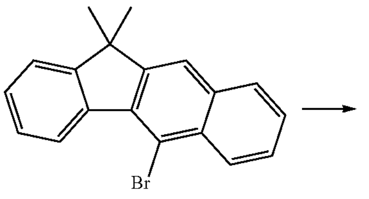

1-4

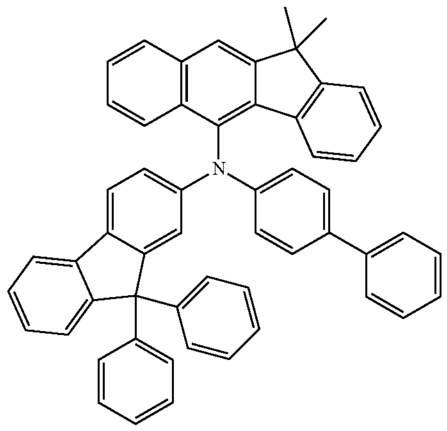

C-7

10 g of compound 1-4 (31 mmol), 16.5 g of N-1,1'-biphenyl-4-yl-9,9-diphenyl-9H-fluorene-2-amine (34 mmol), 1.4 g of tris(dibenzylideneacetone)dipalladium(0) (2 mmol), 1.2 mL of tri-t-butylphosphine (3 mmol, 50% toluene solution), 5.9 g of sodium t-butoxide (62 mmol), and 600 mL of toluene were introduced into a reaction vessel, and the mixture was refluxed for 3 hours. The reaction solution was cooled to room temperature. The solvent was removed with a rotary evaporator, and the resulting product was purified by column chromatography to obtain 11 g of compound C-7 (yield: 49%). The properties of compound C-7 are shown in Table 1.

Synthesis Example 4: Preparation of Compound C-73

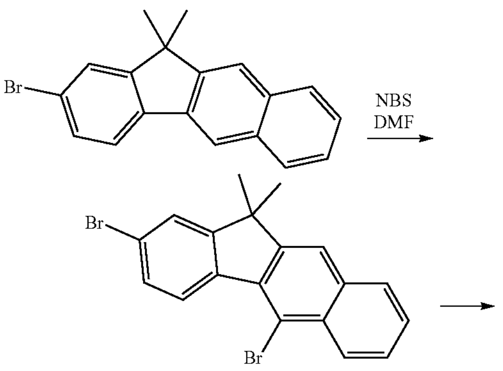

2-1

-continued

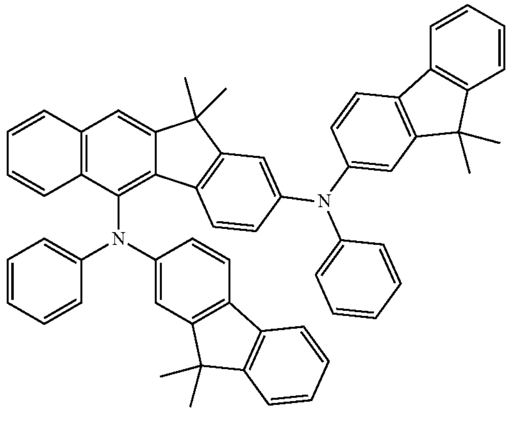

C-73

Preparation of Compound 2-1

10 g of 2-bromo-11,11-dimethyl-11H-benzo[b]fluorene (31 mmol), 10 mL of dimethylformamide, and 7.2 g of N-bromosuccinimide (40 mmol) were introduced into a reaction vessel, and the mixture was stirred at room temperature overnight. The reaction solution was diluted with ethylacetate and washed with distilled water. The extracted organic layer was then dried with magnesium sulfate. The solvent was removed with a rotary evaporator, and the separated solid was filtered and washed with cold methyl alcohol to obtain 10.5 mg of compound 2-1 (yield: 84%).

Preparation of Compound C-73

10 g of compound 2-1 (25 mmol), 15.6 g of N-1,1'-biphenyl-4-yl-9,9-diphenyl-9H-fluorene-2-amine (55 mmol), 2.3 g of tris(dibenzylideneacetone)dipalladium(0) (2.5 mmol), 2 mL of tri-t-butylphosphine (5 mmol, 50% toluene solution), 9.6 g of sodium t-butoxide (99 mmol), and 240 mL of toluene were introduced into a reaction vessel, and the mixture was refluxed for 3 hours. The reaction solution was cooled to room temperature. The solvent was removed with a rotary evaporator, and the resulting product was purified by column chromatography to obtain 9.6 g of compound C-73 (yield: 47%). The properties of compound C-73 are shown in Table 1.

Synthesis Example 5: Preparation of Compound C-25

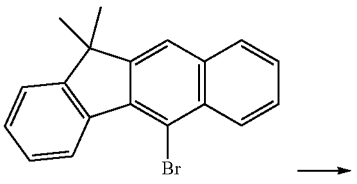

1-4

-continued

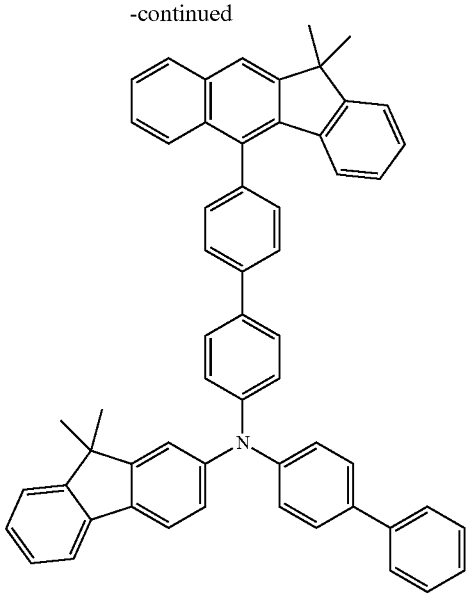

C-25

4 g of compound 1-4 (12 mmol), 7.9 g of N-([1,1'-biphenyl]-4-yl)-9,9-dimethyl-N-(4'-(4,4,5,5-tetramethyl-1,3,2-dioxaborolan-2-yl)-[1,1'-biphenyl]-4-yl)-9H-fluorene-2-amine (12 mmol), 0.72 g of tetrakis(triphenylphosphine) palladium (0.6 mmol), 3.4 g of potassium carbonate (24 mmol), 30 mL of toluene, and 15 mL of ethyl alcohol were introduced into a reaction vessel, 15 mL of distilled water was added thereto, and the mixture was stirred at 80° C. for 18 hours. After completion of the reaction, ethyl alcohol and toluene were removed with a rotary evaporator, and an organic layer was extracted with methylene chloride and distilled water. The organic layer was then dried with magnesium sulfate. The solvent was removed with a rotary evaporator, and the resulting product was purified by column chromatography to obtain 3.1 g of compound C-25 (yield: 33%). The properties of compound C-25 are shown in Table 1.

Synthesis Example 6: Preparation of Compound C-102

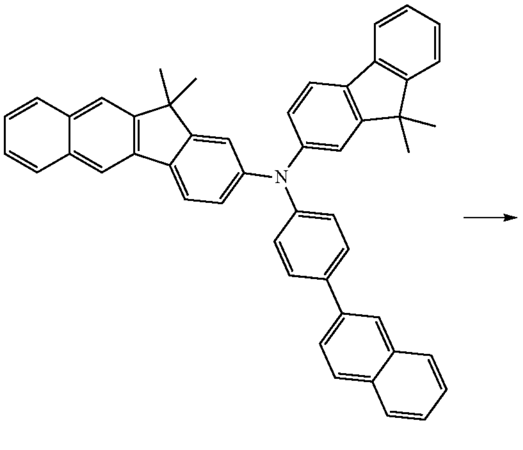

-continued

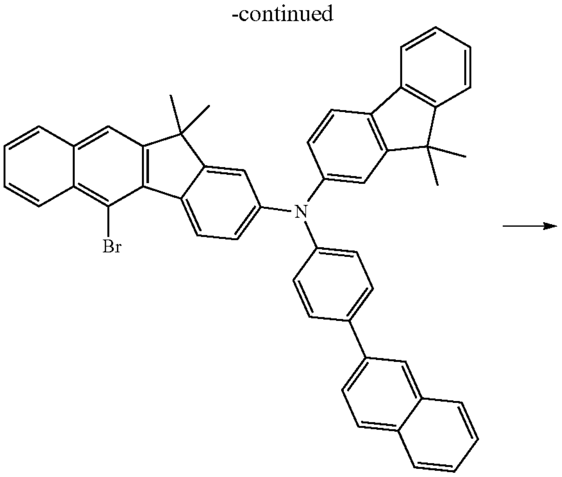

3-1

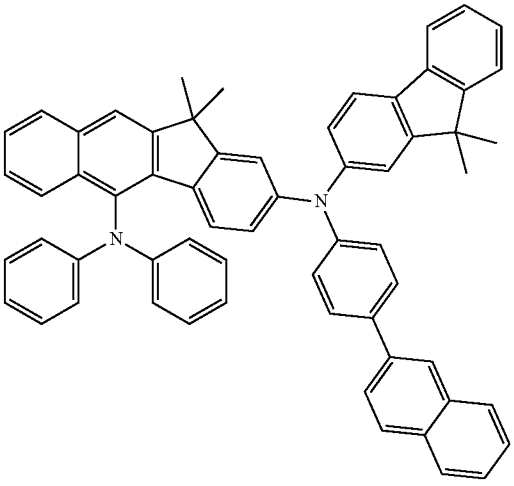

C-102

Preparation of Compound 3-1

15 g of N-(9,9-dimethyl-9H-fluoren-2-yl)-11,11-dimethyl-N-(4-(naphthalen-2-yl)phenyl)-11H-benzo[b]fluorene-2-amine (23 mmol), 120 mL of dimethylformamide, and 5.3 g of N-bromosuccinimide (30 mmol) were introduced into a reaction vessel, and the mixture was stirred at room temperature overnight. The reaction solution was diluted with ethylacetate and washed with distilled water. The extracted organic layer was then dried with magnesium sulfate. The solvent was removed with a rotary evaporator, and the resulting product was purified by column chromatography to obtain 15 g of compound 3-1 (yield: 89%).

Preparation of Compound C-102

10 g of compound 3-1 (14 mmol), 2.7 g of diphenylamine (16 mmol), 0.63 g of tris(dibenzylideneacetone)dipalladium (0) (0.68 mmol), 0.5 mL of tri-t-butylphosphine (1.4 mmol, 50% toluene solution), 2.6 g of sodium t-butoxide (28 mmol), and 260 mL of toluene were introduced into a reaction vessel, and the mixture was refluxed for 3 hours at 80° C. The reaction solution was cooled to room temperature. The solvent was removed with a rotary evaporator, and the resulting product was purified by column chromatography to obtain 3.1 g of compound C-102 (yield: 28%). The properties of compound C-102 are shown in Table 1.

Synthesis Example 7: Preparation of Compound C-103

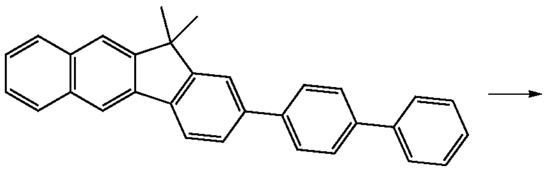

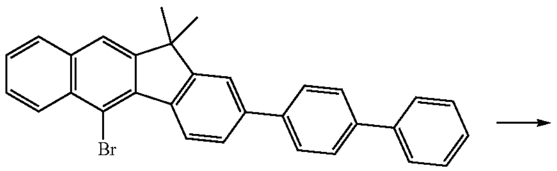

4-1

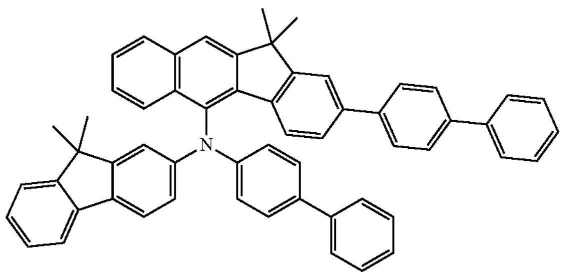

C-103

Preparation of Compound 4-1

26 g of 2-([1,1'-biphenyl]-4yl)-11,11-dimethyl-11H-benzo[b]fluorene (66 mmol), 330 mL of dimethylformamide, 200 mL of methylene chloride, and 15.2 g of N-bromosuccinimide (85 mmol) were introduced into a reaction vessel, and the mixture was stirred at room temperature overnight. The reaction solution was diluted with ethylacetate and washed with distilled water. The extracted organic layer was then dried with magnesium sulfate. The solvent was removed with a rotary evaporator, and the resulting product was purified by column chromatography to obtain 26 g of compound 4-1 (yield: 83%).

Preparation of Compound C-103

13 g of compound 4-1 (27 mmol), 9.9 g of N-1,1'-biphenyl-4-yl-9,9-dimethyl-9H-fluorene-2-amine (27 mmol), 1.25 g of tris(dibenzylideneacetone)dipalladium(0) (1.4 mmol), 1.1 mL of tri-t-butylphosphine (2.7 mmol, 50% toluene solution), 5.3 g of sodium t-butoxide (54 mmol), and 136 mL of toluene were introduced into a reaction vessel, and the mixture was refluxed for 3 hours at 80° C. The reaction solution was cooled to room temperature. The solvent was removed with a rotary evaporator, and the resulting product was purified by column chromatography to obtain 4.5 g of compound C-103 (yield: 22%). The properties of compound C-103 are shown in Table 1.

Synthesis Example 8: Preparation of Compound C-99

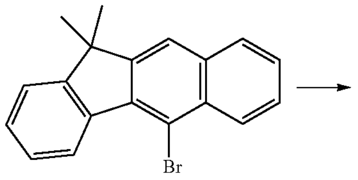

1-4

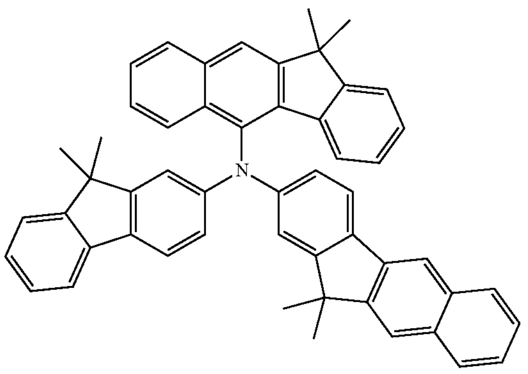

C-99

10 g of compound 1-4 (31 mmol), 14.0 g of N-(9,9-dimethyl-9H-fluoren-2-yl)-11,11'-dimethyl-11H-benzo[b]fluorene-2-amine (31 mmol), 1.42 g of tris(dibenzylideneacetone)dipalladium(0) (1.60 mmol), 1.6 mL of tri-t-butylphosphine (3.1 mmol, 50% toluene solution), 5.9 g of sodium t-butoxide (62 mmol), and 155 mL of toluene were introduced into a reaction vessel, and the mixture was refluxed for 16 hours at 80° C. The reaction solution was cooled to room temperature. The solvent was removed with a rotary evaporator, and the resulting product was purified by column chromatography to obtain 9.1 g of compound C-99 (yield: 42%). The properties of compound C-99 are shown in Table 1.

Synthesis Example 9: Preparation of Compound C-98

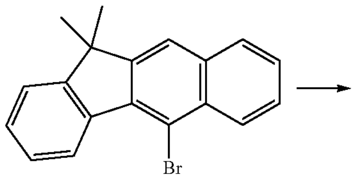

1-4

-continued

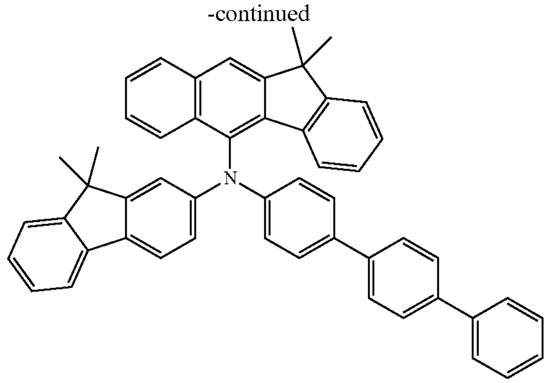

C-98

8 g of compound 1-4 (25 mmol), 11.9 g of N-([1,1':4',1"-terphenyl]-4-yl)-9,9-dimethyl-9H-fluorene-2-amine (27 mmol), 1.13 g of tris(dibenzylideneacetone)dipalladium(0) (1.35 mmol), 1.0 mL of tri-t-butylphosphine (2.7 mmol, 50% toluene solution), 4.8 g of sodium t-butoxide (50 mmol), and 125 mL of toluene were introduced into a reaction vessel, and the mixture was refluxed for 3 hours at 80° C. The reaction solution was cooled to room temperature. The solvent was removed with a rotary evaporator, and the resulting product was purified by column chromatography to obtain 5.7 g of compound C-98 (yield: 34%). The properties of compound C-98 are shown in Table 1.

Synthesis Example 10: Preparation of Compound C-10

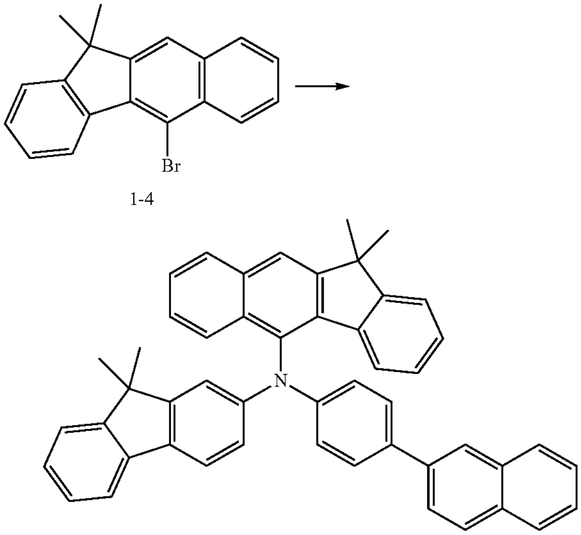

1-4

C-10

7.4 g of compound 1-4 (23 mmol), 9.4 g of 9,9-dimethyl-N-(4-(naphthalen-2-yl)phenyl)-9H-fluorene-2-amine (23 mmol), 1.05 g of tris(dibenzylideneacetone)dipalladium(0) (1.15 mmol), 1.2 mL of tri-t-butylphosphine (2.3 mmol, 50% toluene solution), 4.4 g of sodium t-butoxide (46 mmol), and 200 mL of toluene were introduced into a reaction vessel, and the mixture was refluxed for 3 hours at 80° C. The reaction solution was cooled to room temperature. The solvent was removed with a rotary evaporator, and the resulting product was purified by column chromatography to obtain 3.7 g of compound C-10 (yield: 25%). The properties of compound C-10 are shown in Table 1.

TABLE 1

| Compound | Yield (%) | UV (nm) | PL (nm) | M.P. (° C.) | MS/EIMS (M + H) Found | Calculated |
|---|---|---|---|---|---|---|
| C-4 | 52 | 422 | 481 | 222 | 644.2 | 644.3 |
| C-5 | 51 | 384 | 473 | 250 | 604.2 | 604.3 |
| C-7 | 49 | 418 | 447 | 251 | 728.2 | 728.3 |
| C-73 | 47 | 418 | 445 | 286 | 811.3 | 811.4 |
| C-25 | 33 | 392 | 459 | 179 | 756.2 | 756.4 |
| C-102 | 28 | 415 | 461 | 295 | 821.2 | 821.4 |
| C-103 | 22 | 378 | 489 | 184 | 756.2 | 756.4 |
| C-99 | 42 | 418 | 479 | 174 | 694.2 | 694.4 |
| C-98 | 34 | 394 | 449 | 258 | 680.2 | 680.3 |
| C-10 | 25 | 410 | 473 | 165 | 654.2 | 654.3 |

In addition, the compound of formula 2 of the present disclosure is a known compound, and may be produced by a known synthesis method in the art.

Device Example 1: Production of an OLED Device Comprising the Combination of the Hole Transport Material and the Host Compound of the Present Disclosure An OLED device comprising the combination of the hole transport material and the host compound of the present disclosure was produced. A transparent electrode indium tin oxide (ITO) thin film (10 Ω/sq) on a glass substrate for an organic light-emitting diode (OLED) device (Geomatec, Japan) was subjected to an ultrasonic washing with acetone and isopropanol, sequentially, and was then stored in isopropanol. Next, the ITO substrate was mounted on a substrate holder of a vacuum vapor depositing apparatus. Compound HI-1 was introduced into a cell of said vacuum vapor depositing apparatus, and then the pressure in the chamber of said apparatus was controlled to $10^{-6}$ torr. Thereafter, an electric current was applied to the cell to evaporate the above-introduced material, thereby forming a first hole injection layer having a thickness of 90 nm on the ITO substrate. Compound HI-2 was then introduced into another cell of said vacuum vapor depositing apparatus, and was evaporated by applying an electric current to the cell, thereby forming a second hole injection layer having a thickness of 5 nm on the first hole injection layer. Compound HT-1 was introduced into another cell of said vacuum vapor depositing apparatus, and was evaporated by applying an electric current to the cell, thereby forming a first hole transport layer having a thickness of 10 nm on the second hole injection layer. The second hole transport material of Table 2 below was introduced into another cell of said vacuum vapor depositing apparatus, and was evaporated by applying an electric current to the cell, thereby forming a second hole transport layer having a thickness of 60 nm on the first hole transport layer. After forming the hole injection layers and the hole transport layers, a light-emitting layer was then deposited as follows. Compound H-17 as below was introduced into one cell of the vacuum vapor depositing apparatus as a host of the light-emitting layer, and compound D-71 was introduced into another cell. The two materials were evaporated at different rates and were deposited in a doping amount of 2 wt % (the amount of dopant) based on the total amount of the host and dopant to form a light-emitting layer having a thickness of 40 nm on the second hole transport layer. Compound ET-1 and compound EI-1 were then introduced into another two cells, evaporated at the rate of 1:1, and deposited to form an electron transport layer having a thickness of 35 nm on the light-emitting layer. Next, after depositing compound EI-1 as an electron injection layer having a thickness of 2 nm on the electron transport layer, an Al cathode having a thickness of 80 nm was deposited by another vacuum vapor deposition apparatus on the electron injection layer. Thus, an OLED device was produced.

Device Examples 2 to 6: Production of an OLED Device Comprising the Combination of the Hole Transport Material and the Host Compound of the Present Disclosure OLED devices were produced in the same manner as in Device Example 1, except for using the compounds shown in Table 2 for the second hole transport material.

The evaluation results of the devices of each of Device Examples 1 to 6 are shown in Table 2. The driving voltage, luminous efficiency, and CIE color coordinates at a luminance of 1,000 nit of the OLED devices are provided in Table 2 below.

Comparative Examples 1 to 3: Production of an OLED Device not Comprising the Combination of the Hole Transport Material and the Host Compound of the Present Disclosure OLED devices were produced in the same manner as in Device Example 1, except for using the compounds shown in Table 2 for the second hole transport material.

The evaluation results of the devices of each of Comparative Examples 1 to 3 are shown in Table 2 below.

TABLE 2

| | Second hole transport material | Host material | Driving voltage (V) @ 1,000 nit | Efficiency (cd/A) @ 1,000 nit | Color coordinate (x) | Color coordinate (y) |
|---|---|---|---|---|---|---|
| Device Example 1 | C-4 | H-17 | 2.8 | 19 | 0.670 | 0.329 |
| Device Example 2 | C-5 | | 2.7 | 24.7 | 0.671 | 0.329 |
| Device Example 3 | C-7 | | 2.7 | 26.2 | 0.671 | 0.328 |
| Device Example 4 | C-25 | | 2.8 | 25.0 | 0.670 | 0.330 |
| Device Example 5 | C-71 | | 2.9 | 18.8 | 0.667 | 0.331 |
| Device Example 6 | C-98 | | 2.7 | 21.6 | 0.669 | 0.330 |
| Comparative Example 1 | R-1 | | 2.9 | 12.2 | 0.667 | 0.331 |
| Comparative Example 2 | R-2 | | 2.8 | 15.2 | 0.669 | 0.329 |
| Comparative Example 3 | R-3 | | 2.9 | 15.8 | 0.670 | 0.329 |

Device Examples 7 to 14: Production of an OLED Device Comprising the Combination of the Hole Transport Material and the Host Compound of the Present Disclosure OLED devices were produced in the same manner as in Device Example 1, except for using the compounds shown in Table 3 for the second hole transport material, and using compound H-12 for the host.

The driving voltage, luminous efficiency, and CIE color coordinates at a luminance of 1,000 nit of the OLED devices of Device Examples 7 to 14 are provided in Table 3 below.

Comparative Examples 4 and 5: Production of an OLED Device not Comprising the Combination of the Hole Transport Material and the Host Compound of the Present Disclosure OLED devices were produced in the same manner as in Device Example 1, except for using the compounds shown in Table 3 for the second hole transport material, and using compound H-12 for the host.

The driving voltage, luminous efficiency, and CIE color coordinates at a luminance of 1,000 nit of the OLED devices of Comparative Examples 4 and 5 are provided in Table 3 below.

TABLE 3
| | Second hole transport material | Host material | Driving voltage (V) @ 1,000 nit | Efficiency (cd/A) @ 1,000 nit | Color coordinate (x) | Color coordinate (y) |
|---|---|---|---|---|---|---|
| Device Example 7 | C-10 | H-12 | 2.7 | 25.1 | 0.667 | 0.332 |
| Device Example 8 | C-99 | | 2.8 | 20.4 | 0.666 | 0.332 |
| Device Example 9 | C-98 | | 2.8 | 23.7 | 0.669 | 0.331 |
| Device Example 10 | C-73 | | 2.8 | 19.7 | 0.666 | 0.333 |
| Device Example 11 | C-71 | | 2.8 | 20.6 | 0.668 | 0.331 |
| Device Example 12 | C-102 | | 3.2 | 18.6 | 0.666 | 0.333 |
| Device Example 13 | C-103 | | 2.9 | 26.0 | 0.669 | 0.331 |
| Device Example 14 | C-25 | | 2.9 | 24.4 | 0.669 | 0.331 |
| Comparative Example 4 | R-1 | | 3.0 | 14.3 | 0.663 | 0.334 |
| Comparative Example 5 | R-3 | | 3.0 | 16.3 | 0.667 | 0.332 |
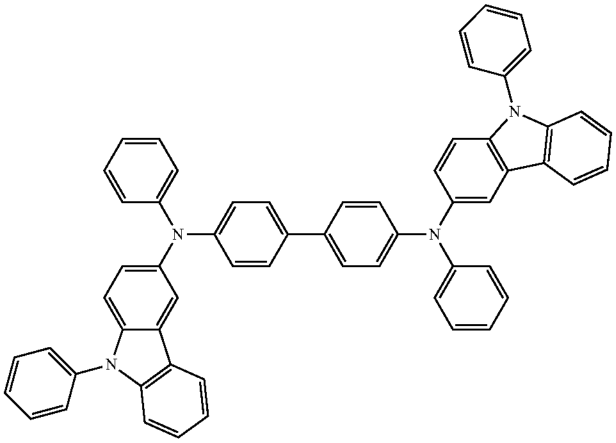
HI-1
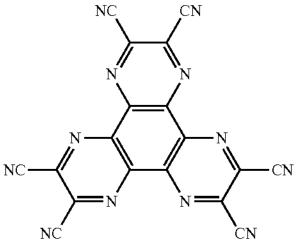
HI-2
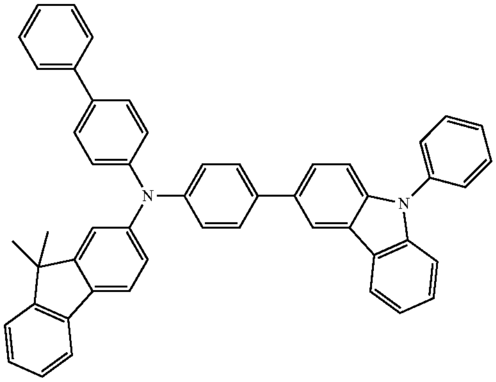
HT-1

TABLE 3-continued
| | Second hole transport material | Host material | Driving voltage (V) @ 1,000 nit | Efficiency (cd/A) @ 1,000 nit | Color coordinate (x) | Color coordinate (y) |
|---|---|---|---|---|---|---|
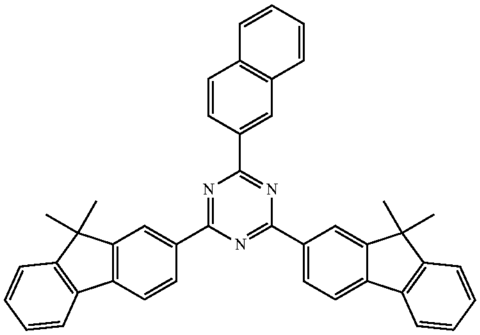
ET-1
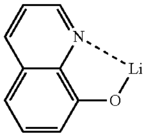
EI-1
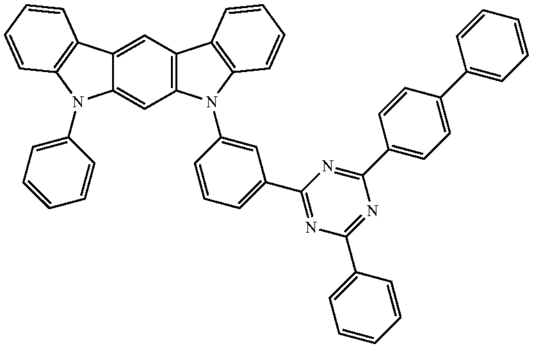
H-17
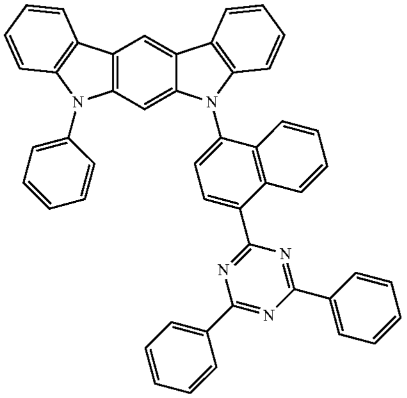
H-12

TABLE 3-continued
| Second hole transport material | Host material | Driving voltage (V) @ 1,000 nit | Efficiency (cd/A) @ 1,000 nit | Color coordinate (x) | Color coordinate (y) |
|---|---|---|---|---|---|
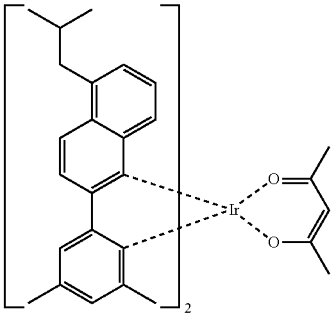
D-71
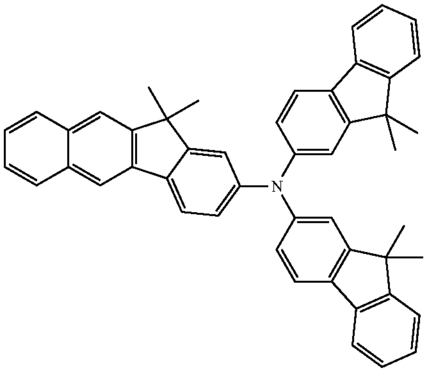
R-1
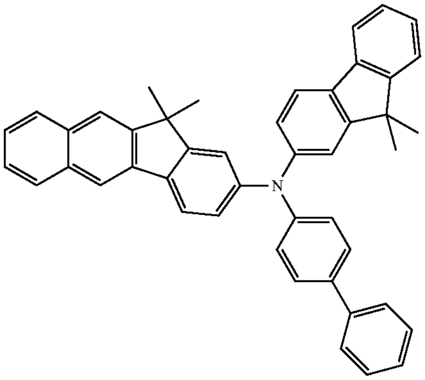
R-2
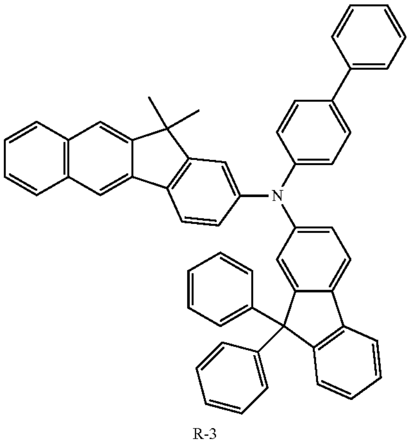
R-3

TABLE 3-continued
| | Second hole transport material | Host material | Driving voltage (V) @ 1,000 nit | Efficiency (cd/A) @ 1,000 nit | Color coordinate (x) | Color coordinate (y) |
|---|---|---|---|---|---|---|
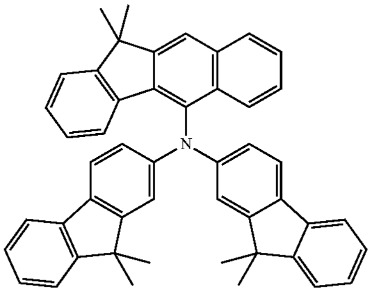
C-4
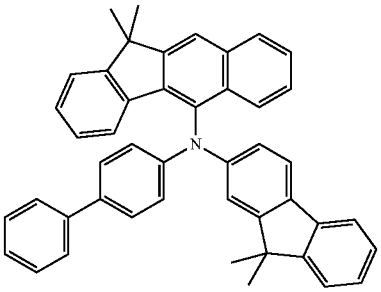
C-5
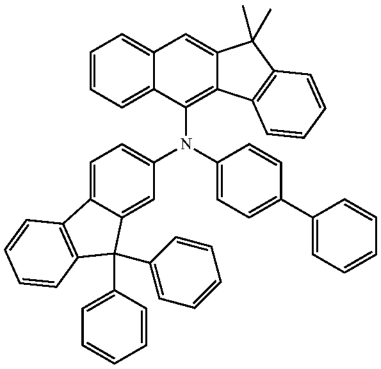
C-7
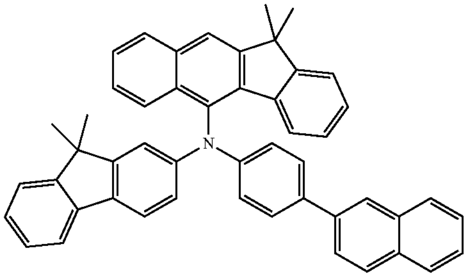
C-10

TABLE 3-continued
| Second hole transport material | Host material | Driving voltage (V) @ 1,000 nit | Efficiency (cd/A) @ 1,000 nit | Color coordinate (x) | Color coordinate (y) |
|---|---|---|---|---|---|
| 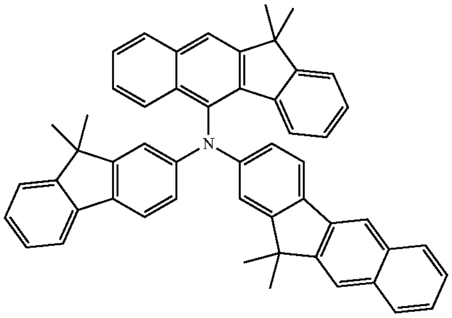 C-99 | | | | | |
| 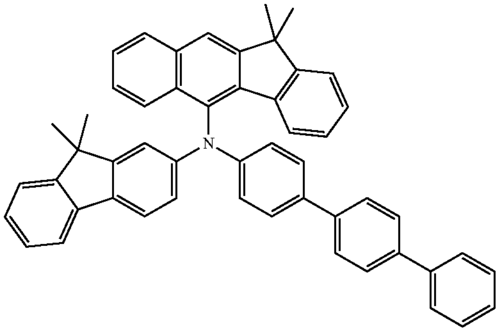 C-98 | | | | | |
| 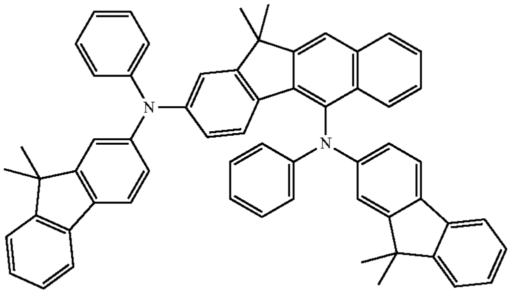 C-73 | | | | | |
| 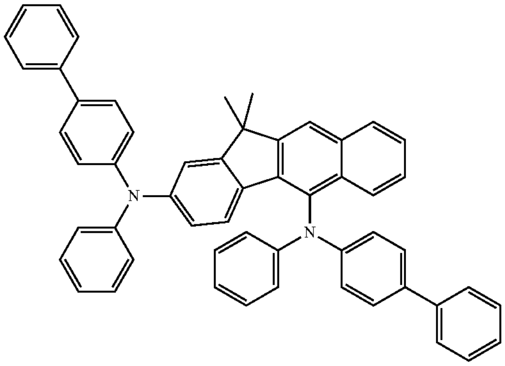 C-71 | | | | | |

TABLE 3-continued

| Second hole transport material | Host material | Driving voltage (V) @ 1,000 nit | Efficiency (cd/A) @ 1,000 nit | Color coordinate (x) | Color coordinate (y) |
|---|---|---|---|---|---|

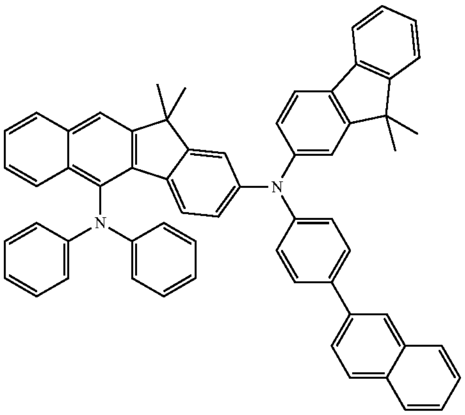

C-102

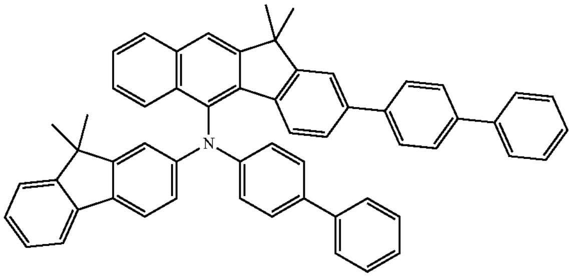

C-103

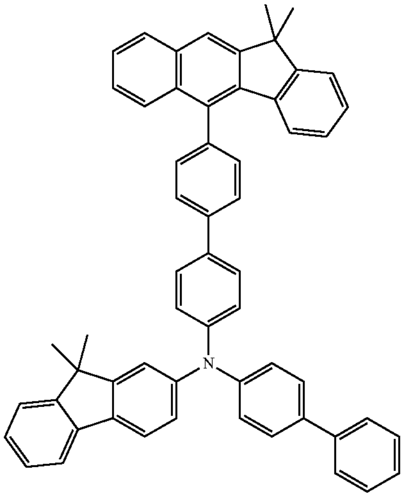

C-25

As shown in Tables 2 and 3 above, the devices of Device Examples 1 to 14 have better driving voltage and luminous efficiency characteristics than the devices of the Comparative Examples. Upon comparing Device Examples 1 to 14 and the Comparative Examples, it is understood that this is because a higher luminous efficiency characteristic is obtained due to low HOMO (highest occupied molecular orbital) energy level of the hole transport material of the present disclosure, and lower driving voltage is obtained due to the fast hole transport ability of the fluorene (but not limited by the theory). It is shown that the problem of the increase of the driving voltage if the luminous efficiency increases is overcome.

Considering the main characteristic of a hole transport layer (HTL), i.e. hole transport ability, a fast hole transport is generally required for low driving voltage. Accordingly, a high HOMO energy level is required. At a high HOMO energy level, the driving voltage decreases, but it is difficult to obtain high efficiency. In addition, also for the light-emitting layer, the efficiency decreases at a low driving voltage, and thus it is not easy to obtain high efficiency. By using the combination of the hole transport layer and the light-emitting layer of the present disclosure, relatively low driving voltage and high efficiency may be obtained.

It is understood that this is because the 5(b)benzofluorene has a relatively lower HOMO energy level than the 2(b) benzofluorene, and thus provides higher efficiency (but not limited by the theory). If the HOMO energy level decreases, the driving voltage increases. However, the fluorene offsets the increased driving voltage and finally low driving voltage can be provided.

The invention claimed is:

1. An organic electroluminescent device comprising: a first electrode; a second electrode opposing the first electrode; one or more light-emitting layers disposed between the first electrode and the second electrode; and a hole transport zone of one or more layers disposed between the first electrode and the light-emitting layer, wherein at least one layer of the hole transport zone comprises a compound selected from the group consisting of:

C-1

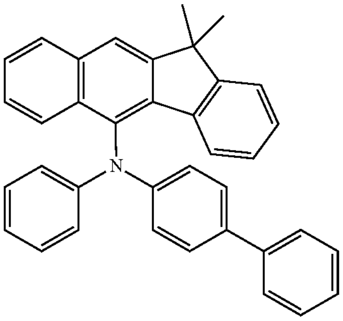

C-2

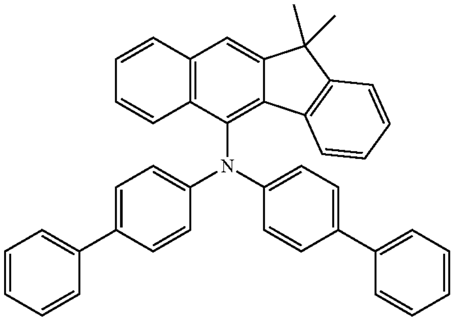

C-3

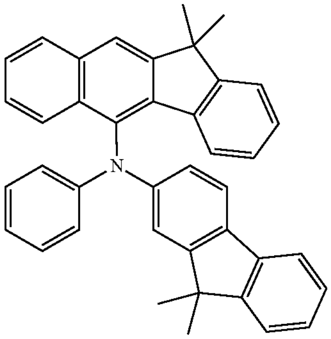

-continued

C-4

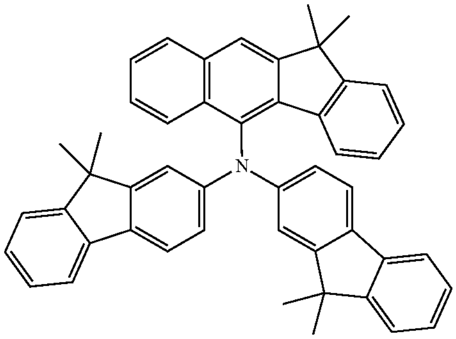

C-5

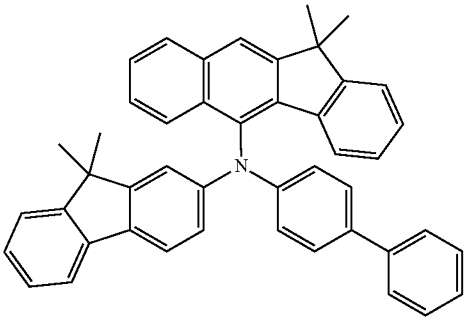

C-6

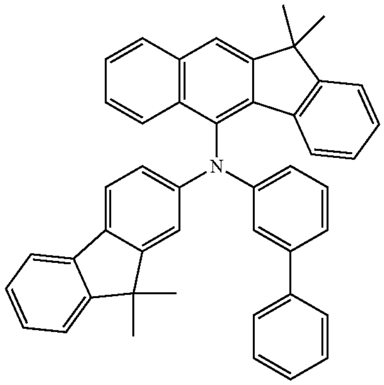

C-7

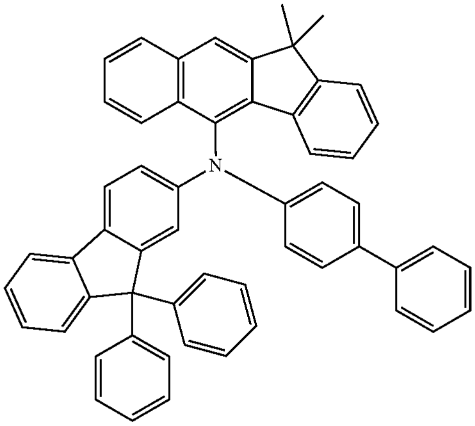

-continued
C-8
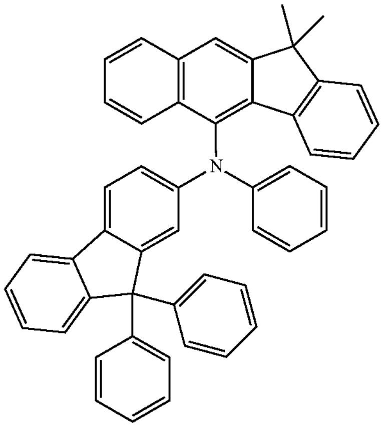
C-9
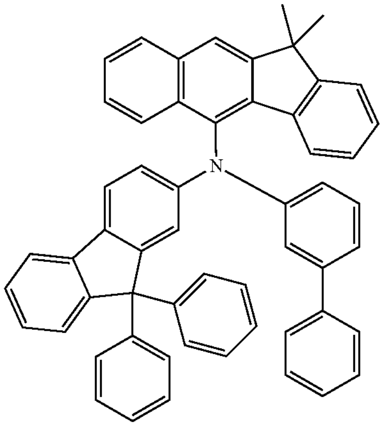
C-10
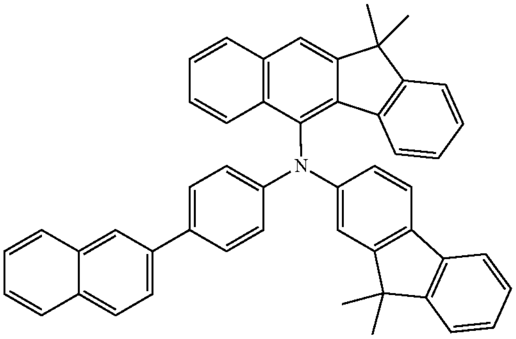
-continued
C-11
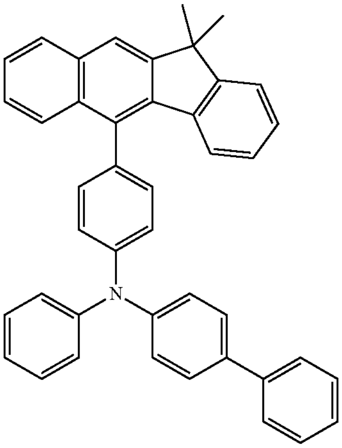
C-12
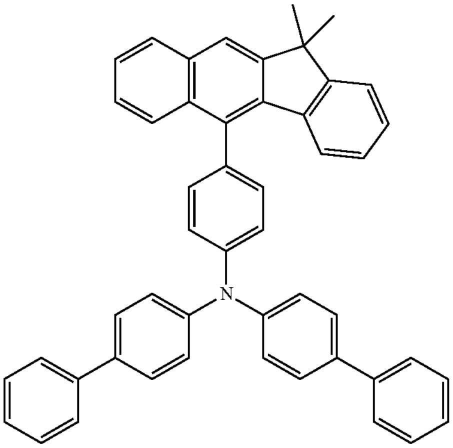
C-13
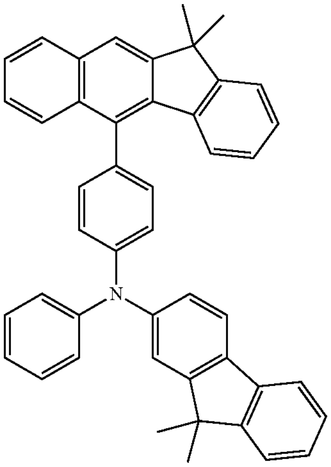

-continued
C-14
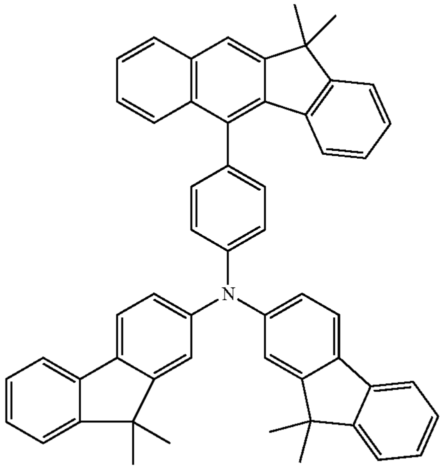
C-15
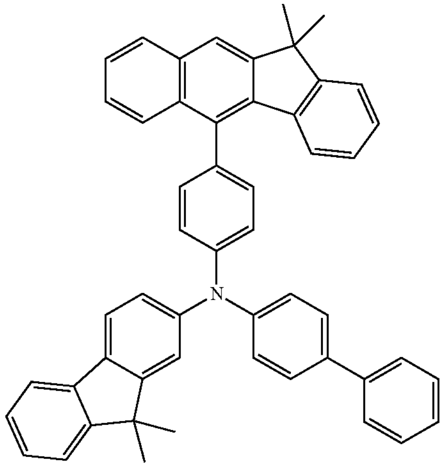
C-16
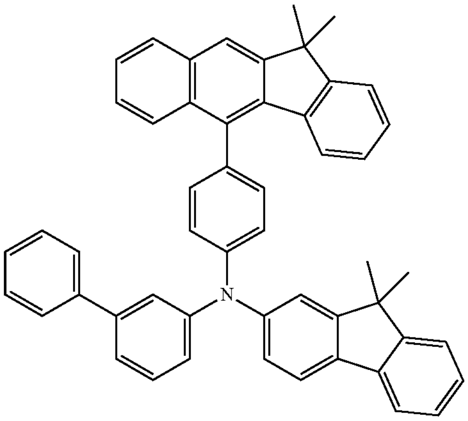
-continued
C-17
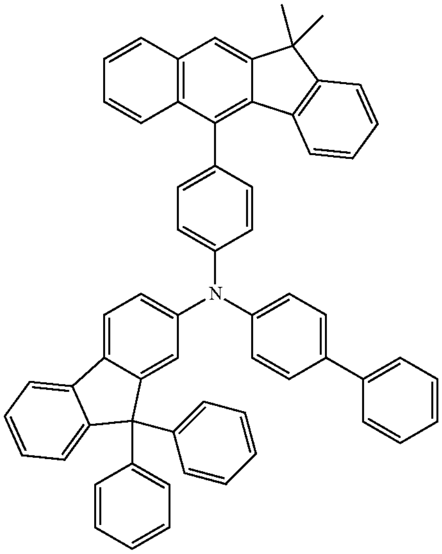
C-18
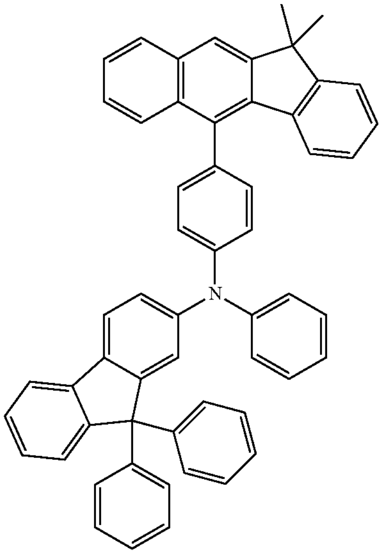
C-19
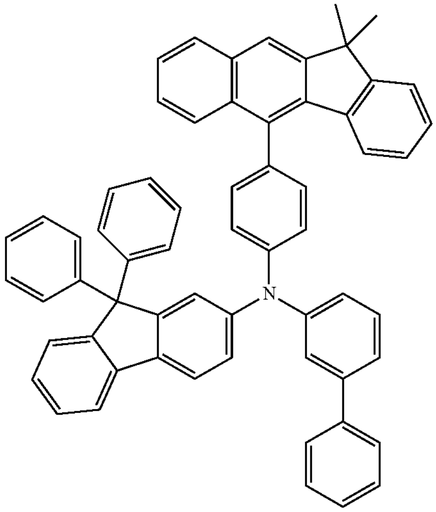

-continued
C-20
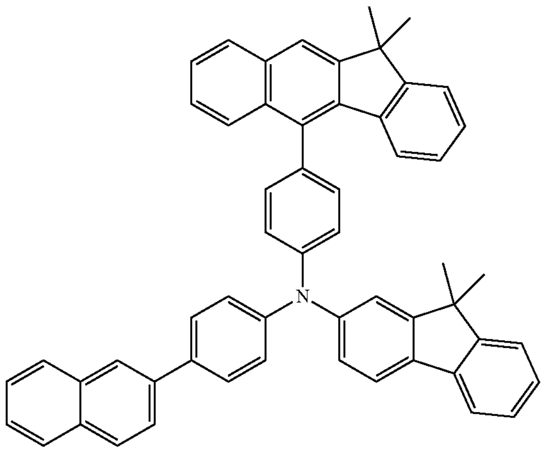
C-21
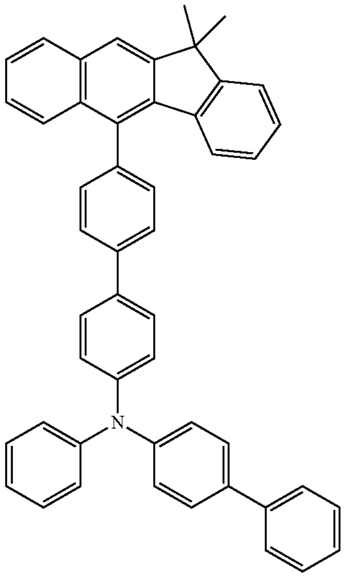
C-22
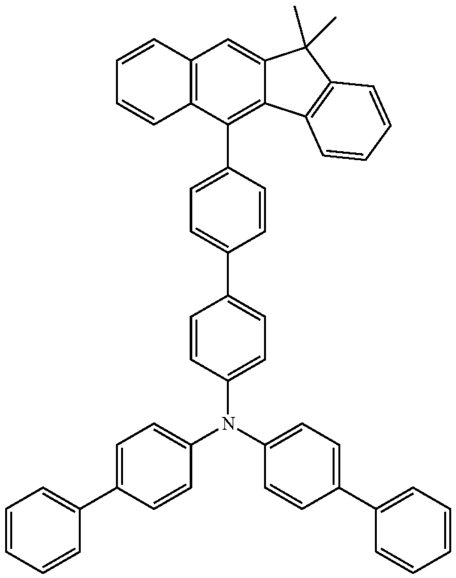
-continued
C-23
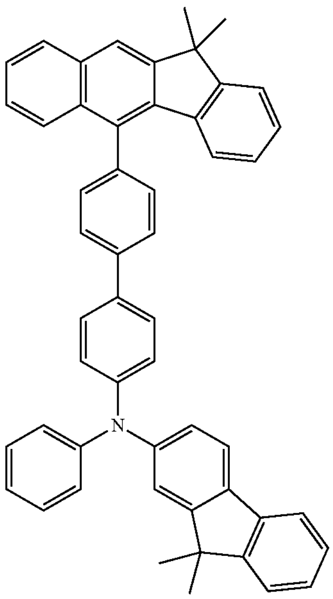
C-24
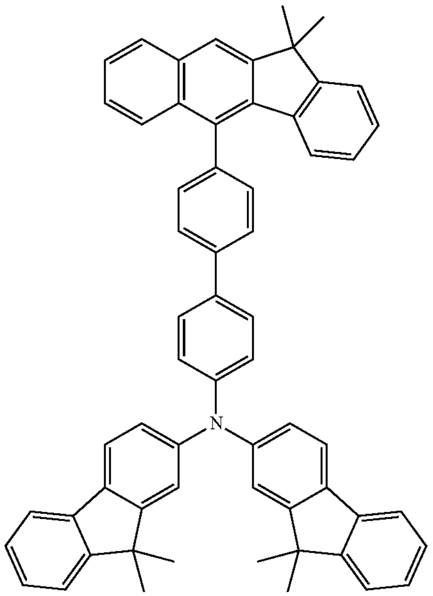

-continued
C-25
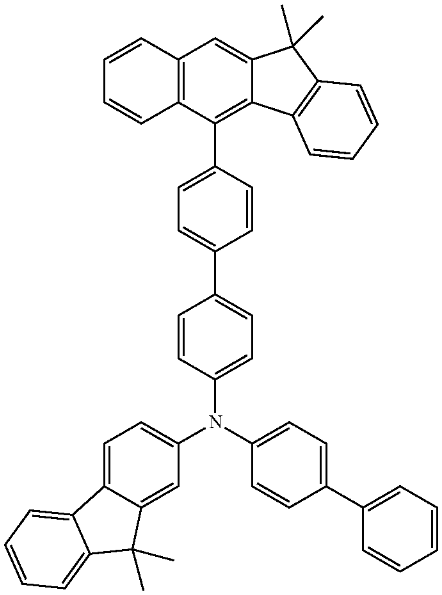
C-26
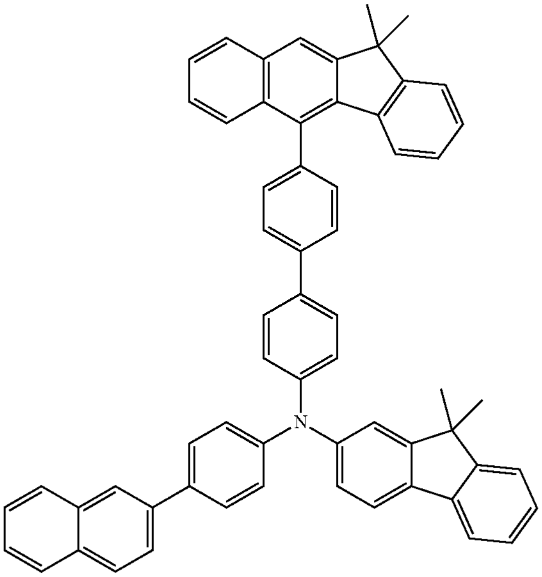
-continued
C-27
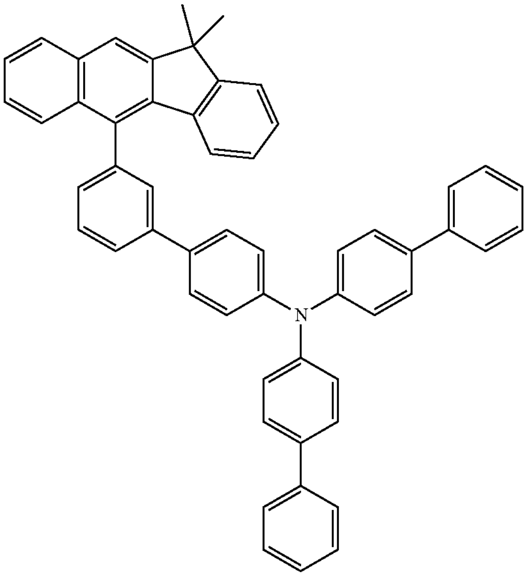
C-28
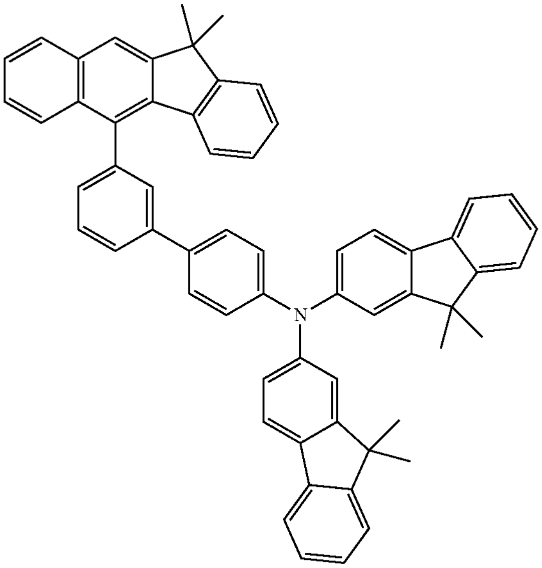

-continued
C-29
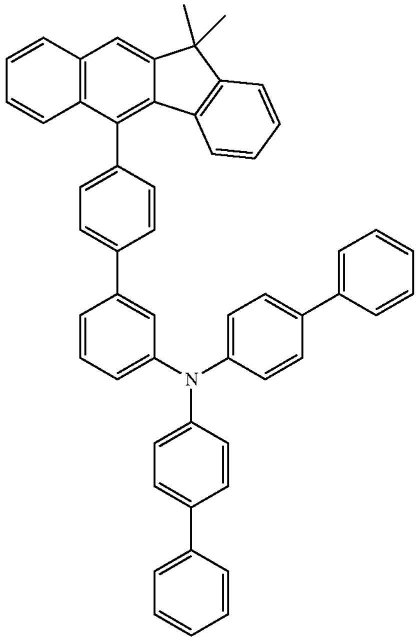
C-30
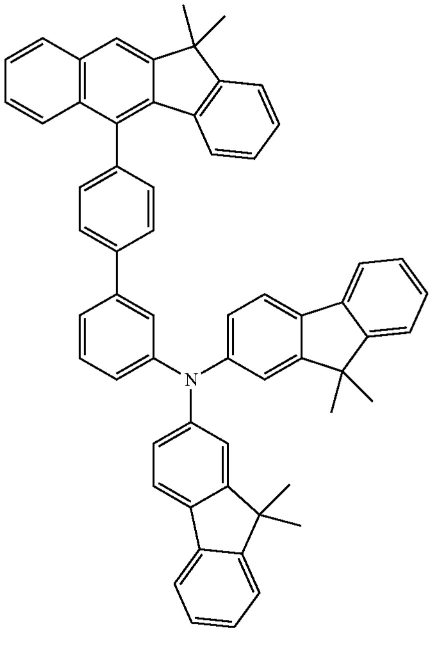
-continued
C-31
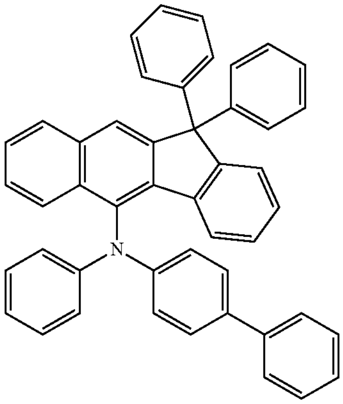
C-41
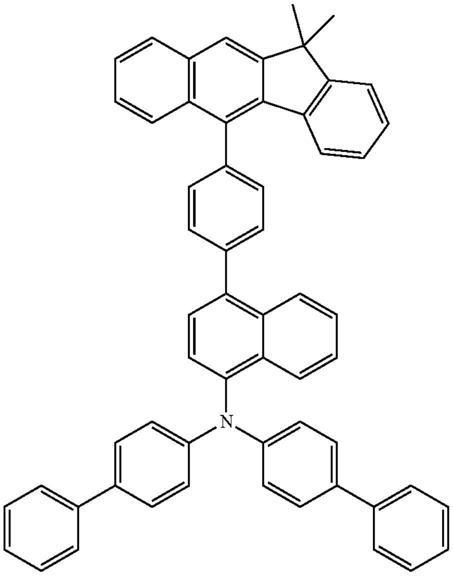
C-42
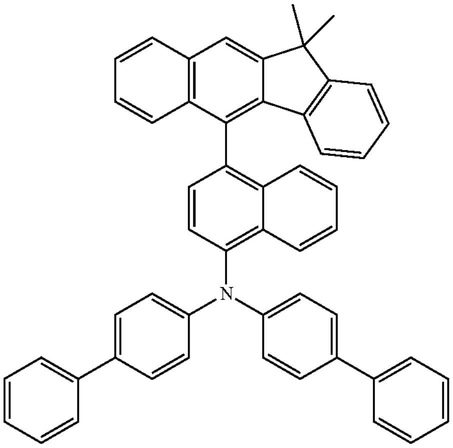

-continued
C-43
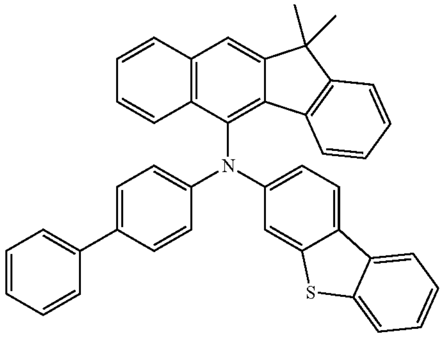
C-43
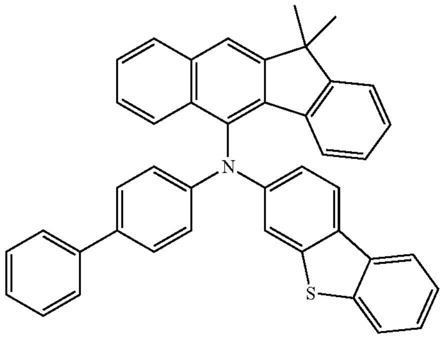
C-44
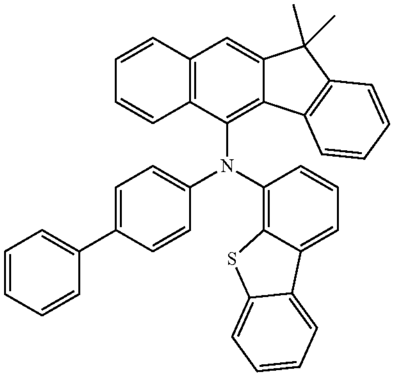
C-45
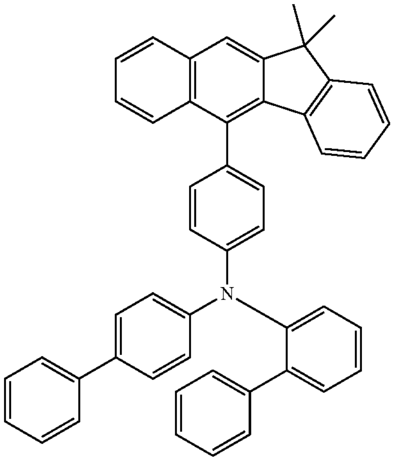
-continued
C-46
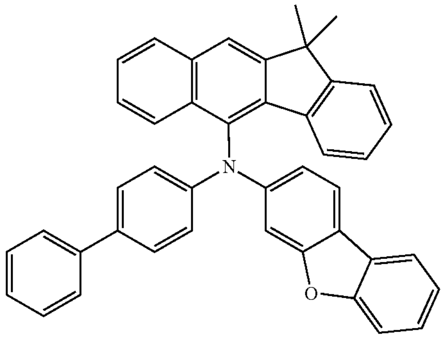
C-47
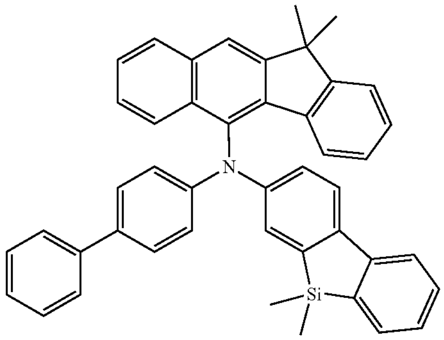
C-48
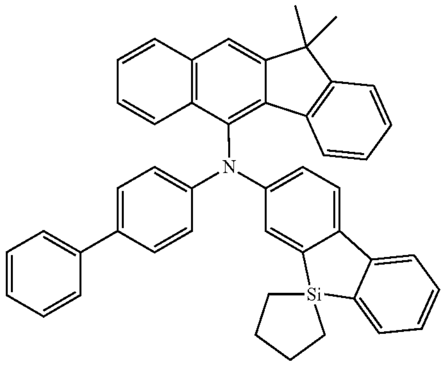
C-49
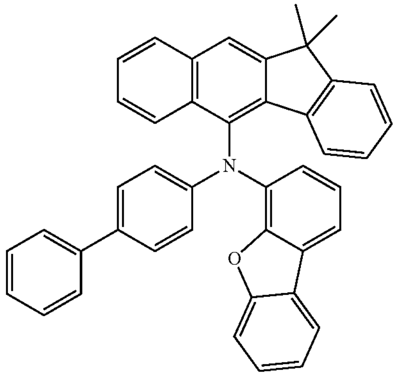

-continued
C-50
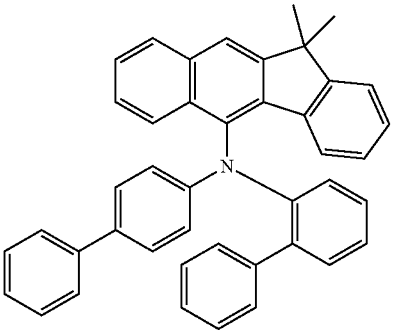
C-51
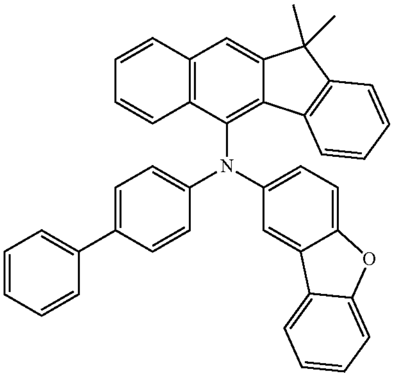
C-52
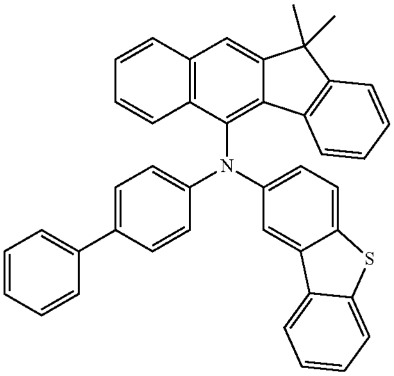
C-53
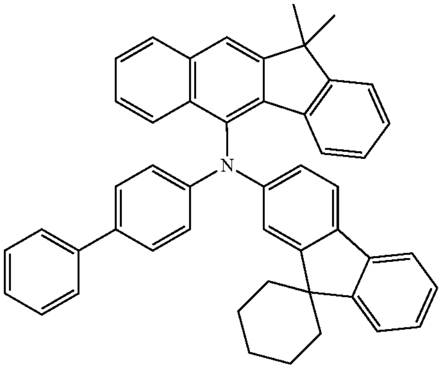
-continued
C-54
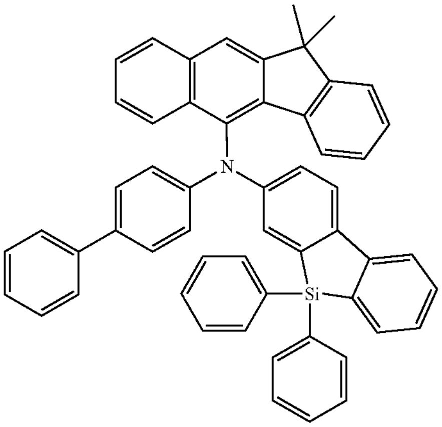
C-55
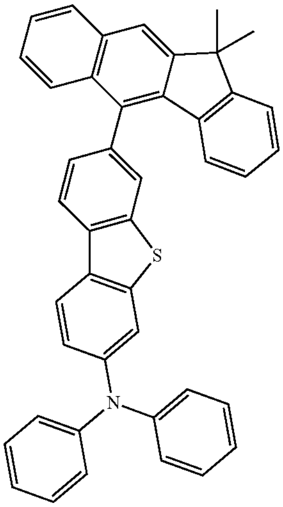
C-56
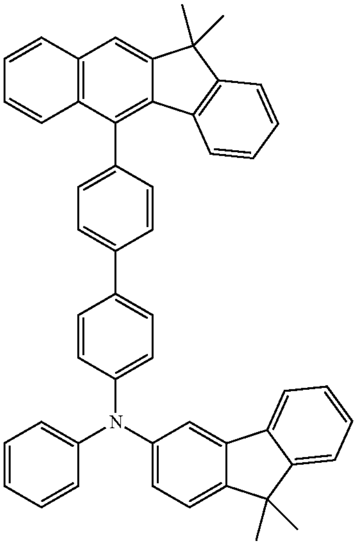

-continued
C-57
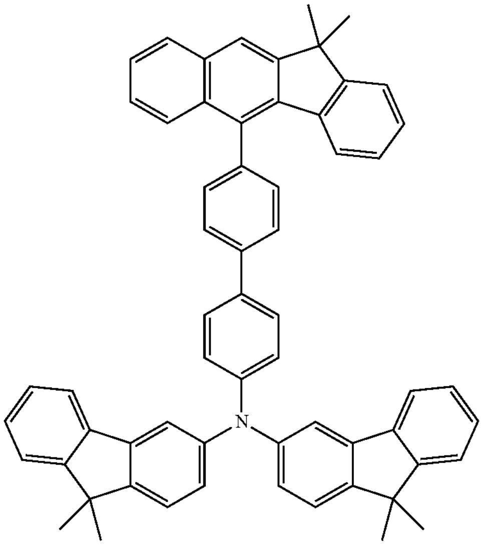
C-58
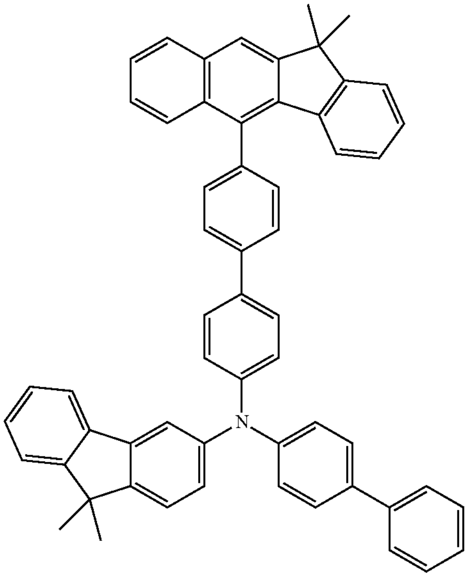
C-59
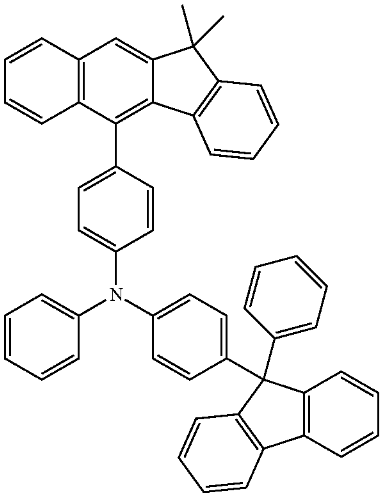
-continued
C-60
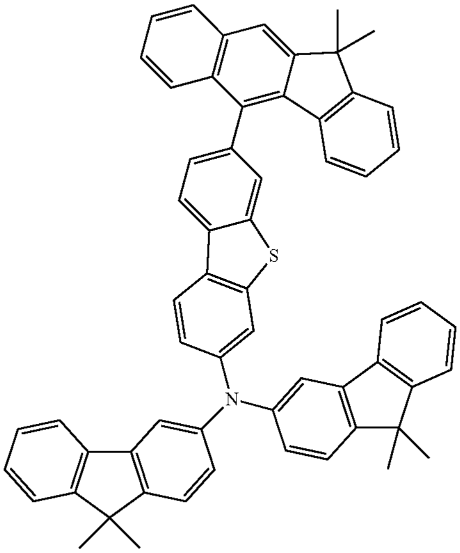
C-64
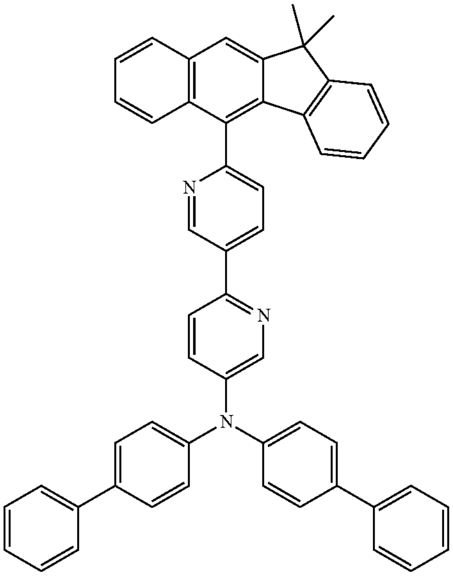
C-65
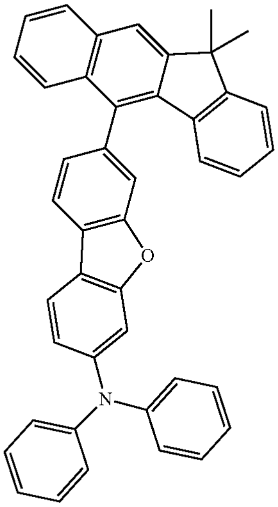

-continued
C-66
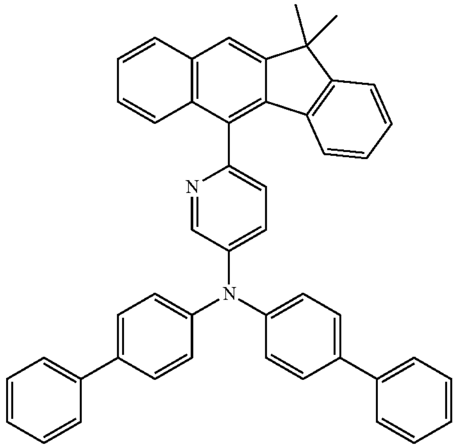
C-67
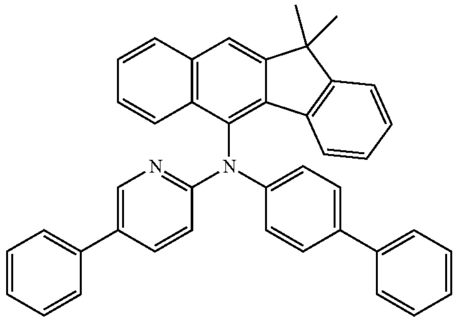
C-68
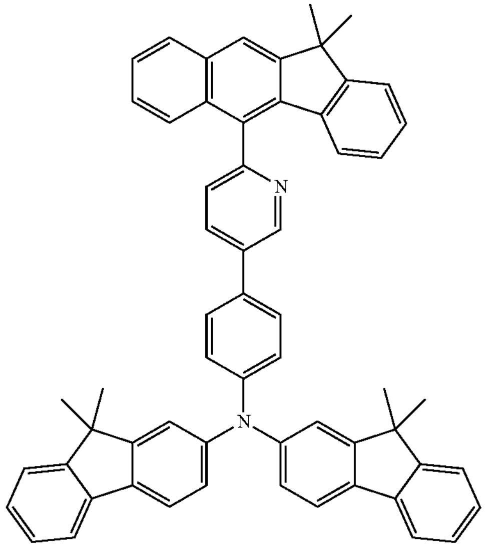
-continued
C-69
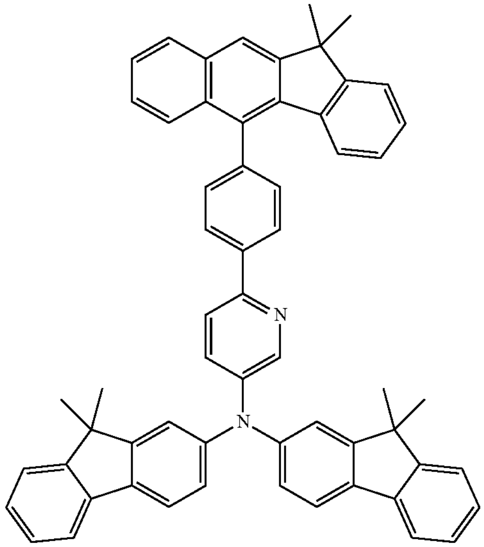
C-70
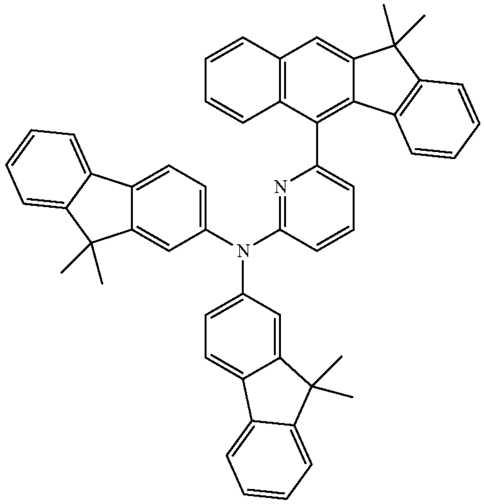
C-91
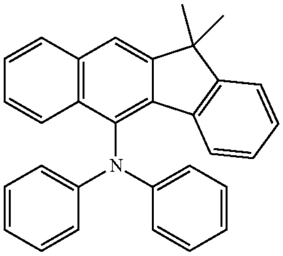

-continued
C-92
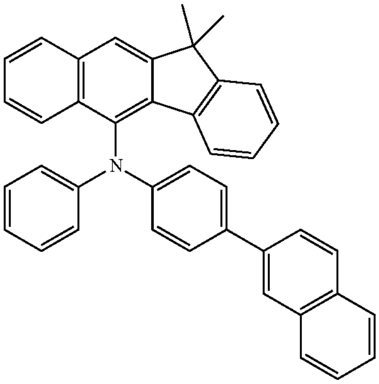
C-93
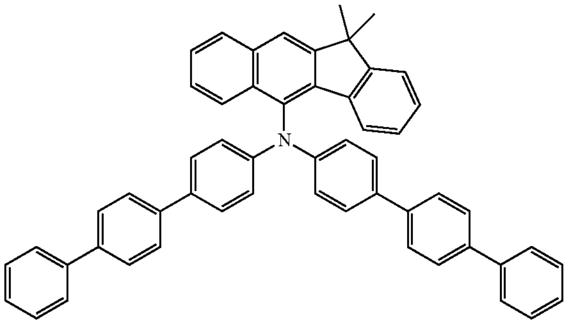
C-94
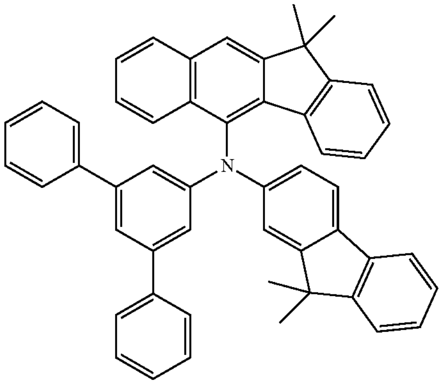
C-95
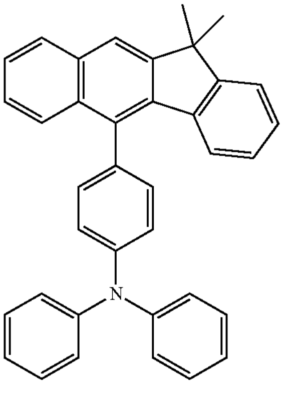
-continued
C-96
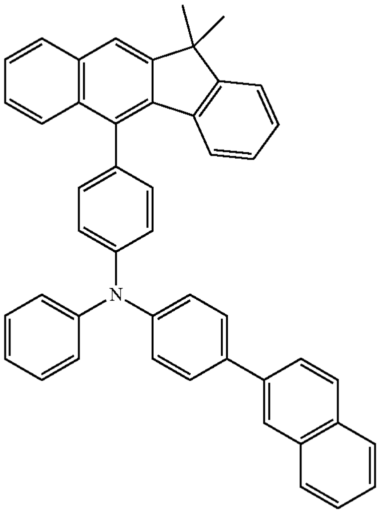
C-97
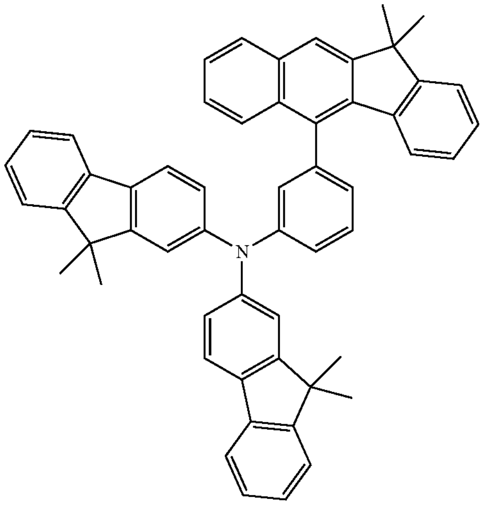
C-98
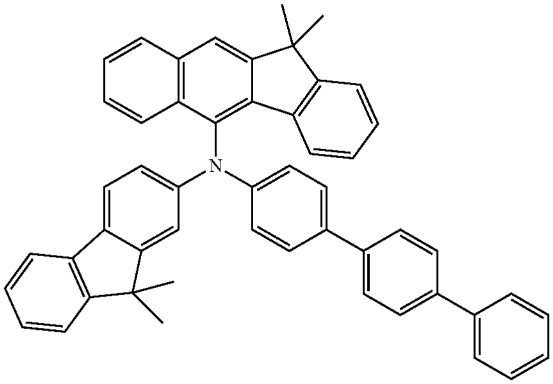

-continued

C-98

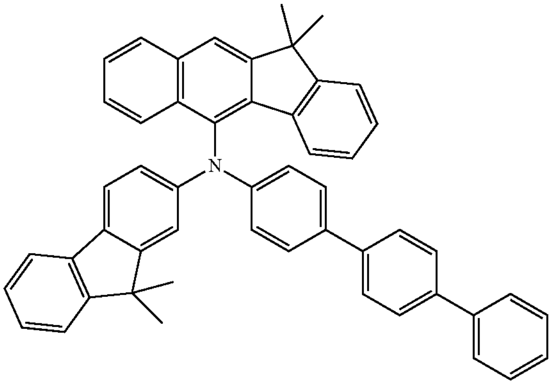

C-99

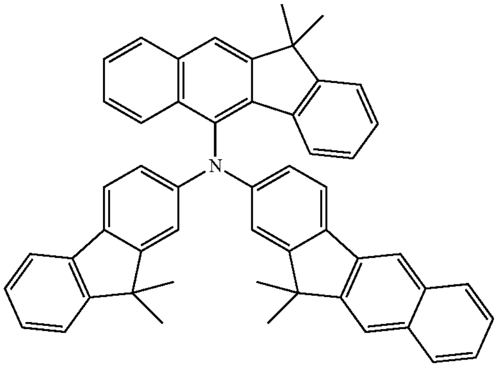

C-100

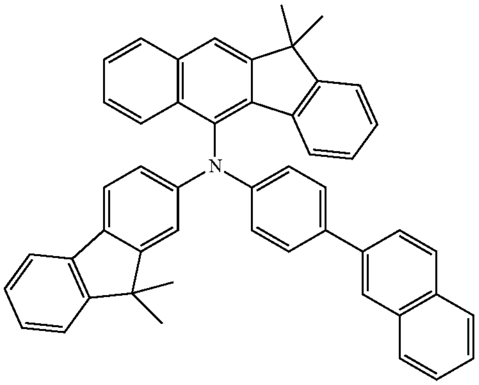

and

C-101

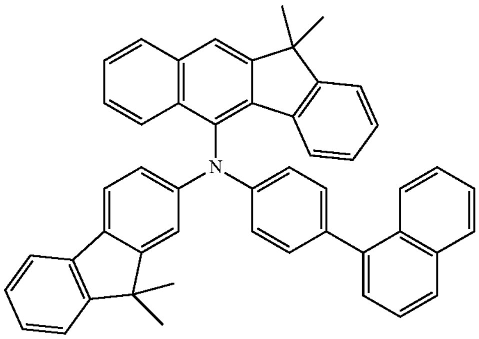

;

and at least one layer of the light-emitting layers comprises a compound represented by the following formula 2:

(2)

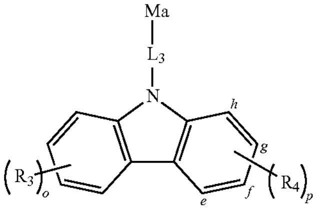

(2-a)

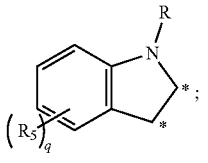

;

wherein

Ma represents a substituted or unsubstituted nitrogen-containing (3- to 30-membered)heteroaryl;

$L_3$ represents a substituted or unsubstituted (C6-C30) arylene;

formula 2 and formula 2-a are fused at the positions of e and f, f and g, or g and h of formula 2 and at the positions of * of formula 2-a to form a ring;

$R_3$ to $R_5$ each independently represent hydrogen, deuterium, a substituted or unsubstituted (C1-C30)alkyl, a substituted or unsubstituted (C6-C30)aryl(C1-C30)alkyl, a substituted or unsubstituted (C6-C30)aryl, a substituted or unsubstituted (C1-C30)alkyl(C6-C30) aryl, a substituted or unsubstituted (3- to 30-membered) heteroaryl, a substituted or unsubstituted (C3-C30) cycloalkyl, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl (C6-C30)arylamino;

R represents hydrogen, deuterium, a substituted or unsubstituted (C1-C30)alkyl, a substituted or unsubstituted (C6-C30)aryl(C1-C30)alkyl, a substituted or unsubstituted (C6-C30)aryl, a substituted or unsubstituted (C1-C30)alkyl(C6-C30)aryl, a substituted or unsubstituted (3- to 30-membered)heteroaryl, a substituted or unsubstituted (C3-C30)cycloalkyl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino;

o and q each independently represent an integer of 1 to 4, and p represents an integer of 1 to 2, where o, p, and q are an integer of 2 or more, each of $R_3$ to $R_5$ may be the same or different; and the heteroaryl(ene) contains at least one hetero atom selected from B, N, O, S, Si, and P.

2. The organic electroluminescent device according to claim 1, wherein formula 2 is represented by any one of the following formulas 5 to 10:

(5)

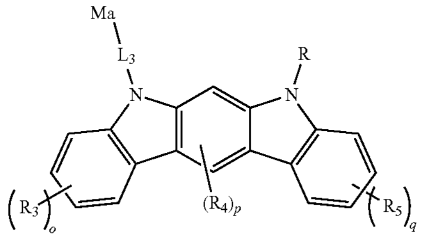

(6)

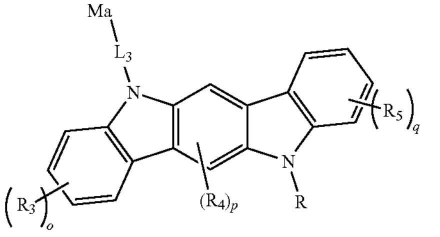

(7)

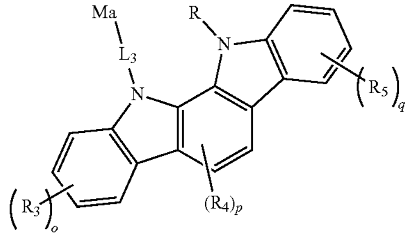

(8)

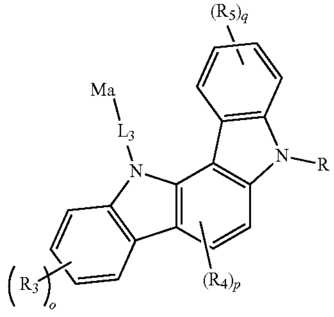

(9)

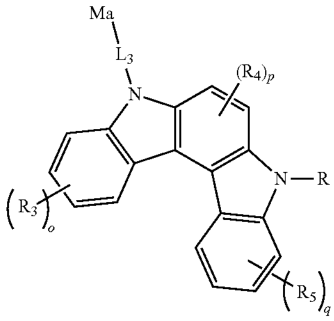

-continued (10)

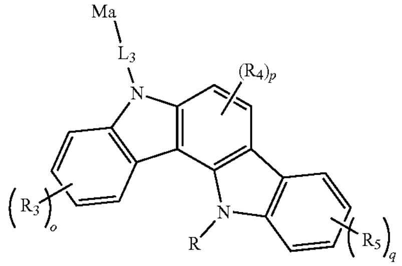

wherein Ma, $L_3$, $R_3$ to $R_5$, R, o, p, and q are as defined in claim 1.

3. The organic electroluminescent device according to claim 1, wherein in formula 2, Ma represents a substituted or unsubstituted pyridyl, a substituted or unsubstituted pyrimidinyl, a substituted or unsubstituted triazinyl, a substituted or unsubstituted quinazolinyl, or a substituted or unsubstituted quinoxalinyl.

4. The organic electroluminescent device according to claim 1, wherein in formula 2, R represents a substituted or unsubstituted (C6-C15)aryl, or a substituted or unsubstituted nitrogen-containing (5- to 15-membered)heteroaryl.

5. The organic electroluminescent device according to claim 1, wherein the compound represented by formula 2 is selected from the group consisting of:

H-2

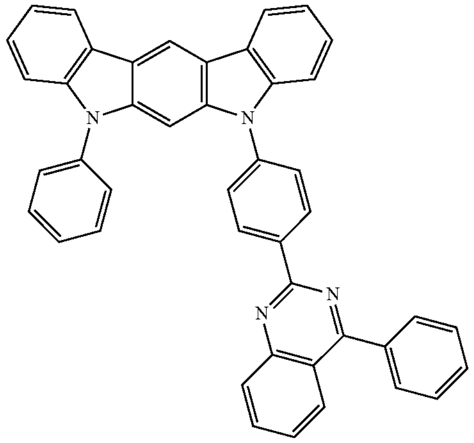

H-3

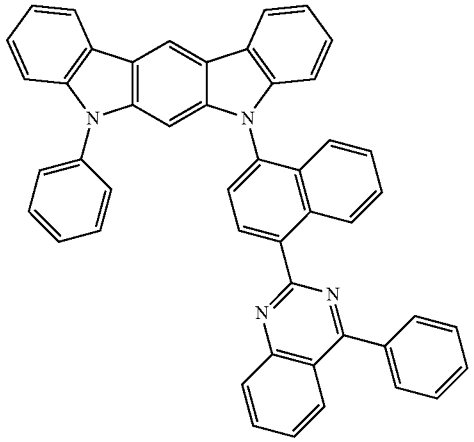

-continued
H-6
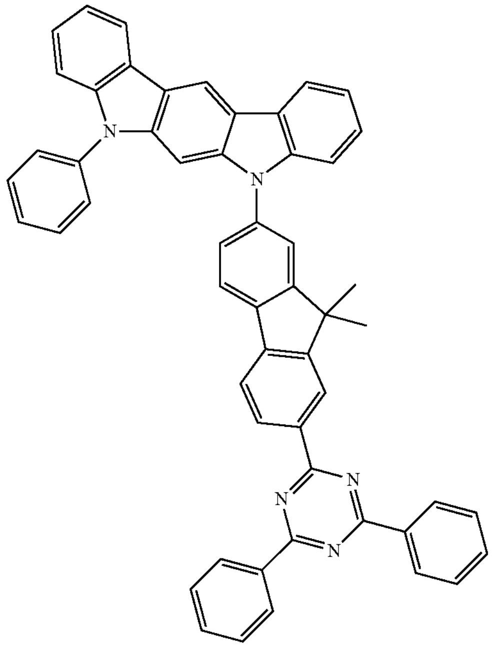
H-8
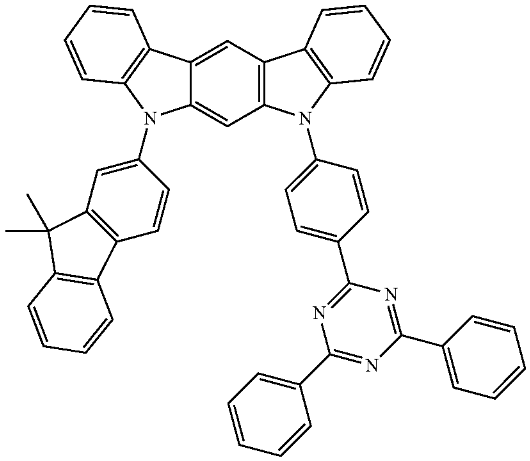
H-9
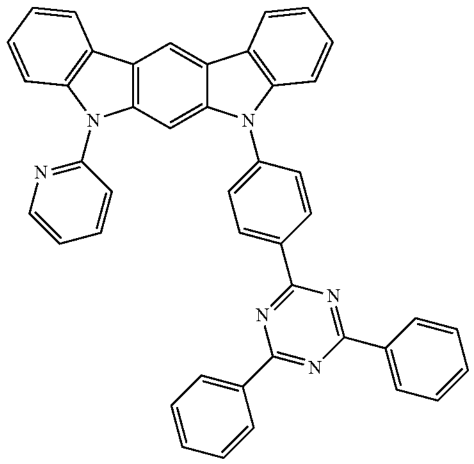
-continued
H-11
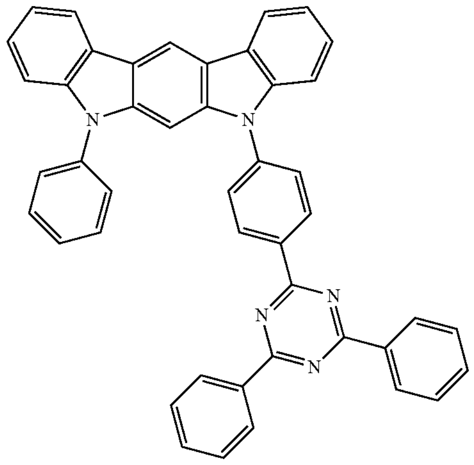
H-12
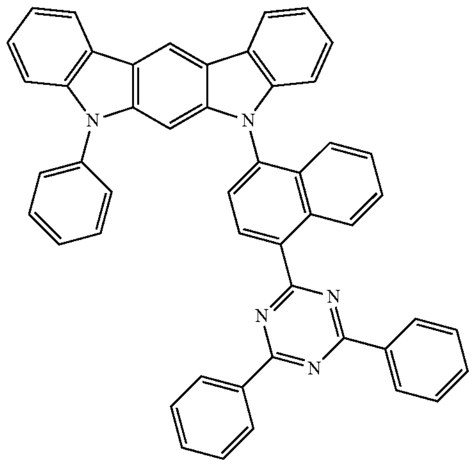
H-13
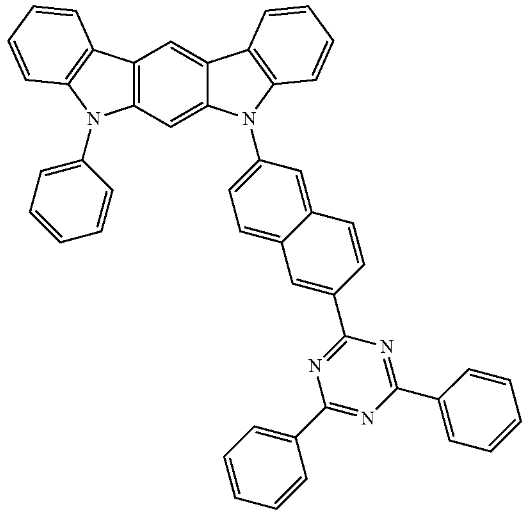

-continued
H-15
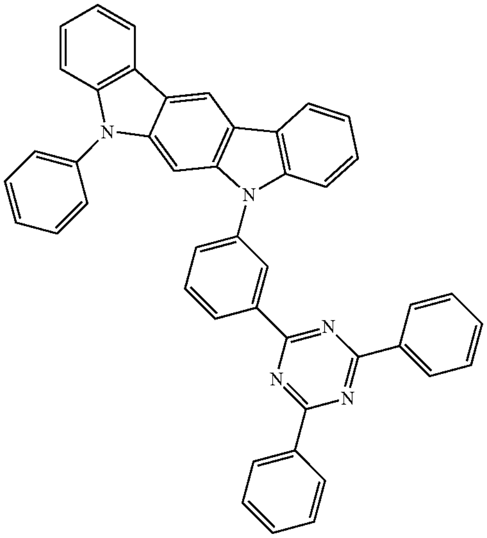
H-16
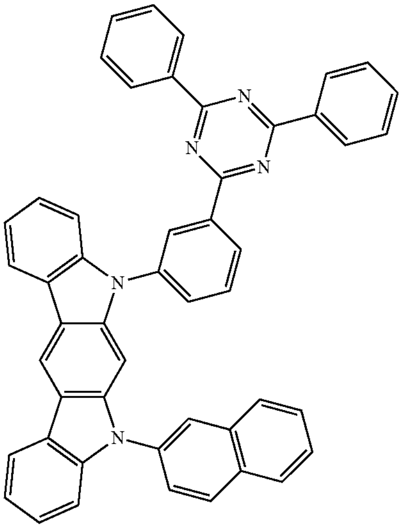
H-17
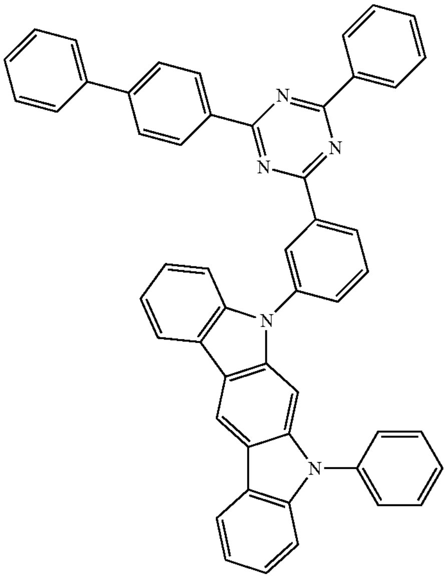
-continued
H-18
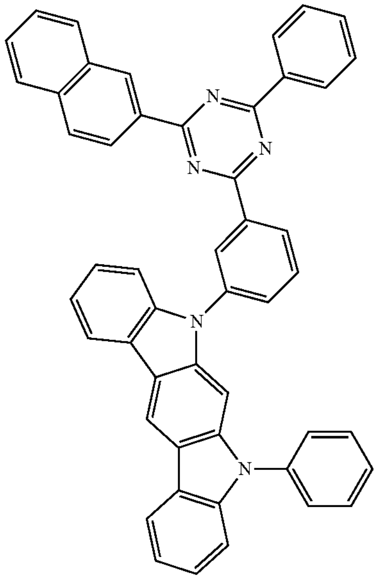
H-19
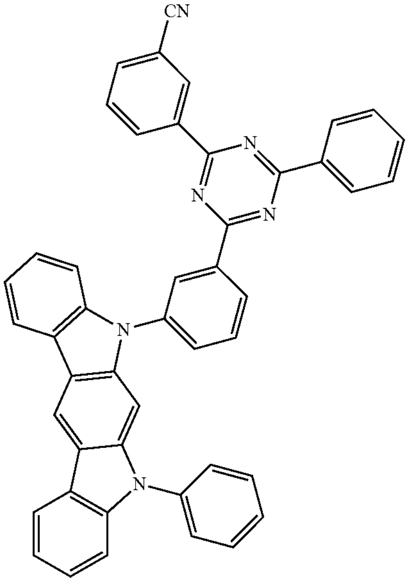

H-20
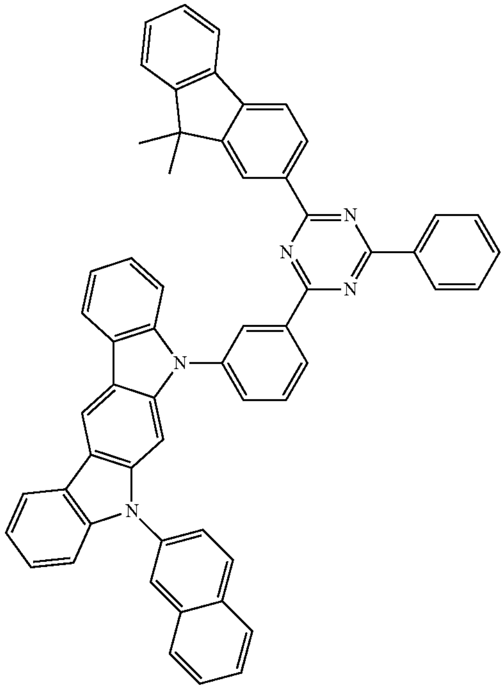
H-21
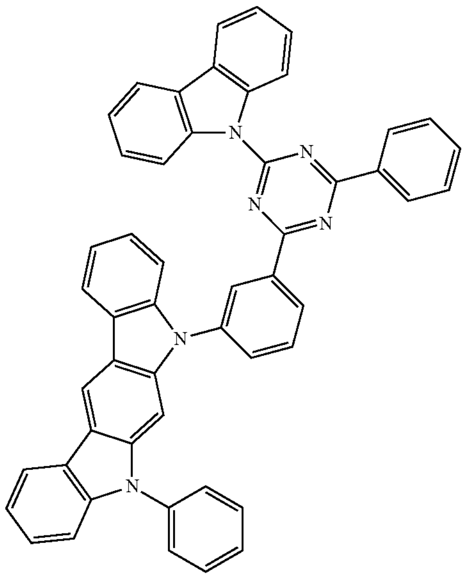
H-22
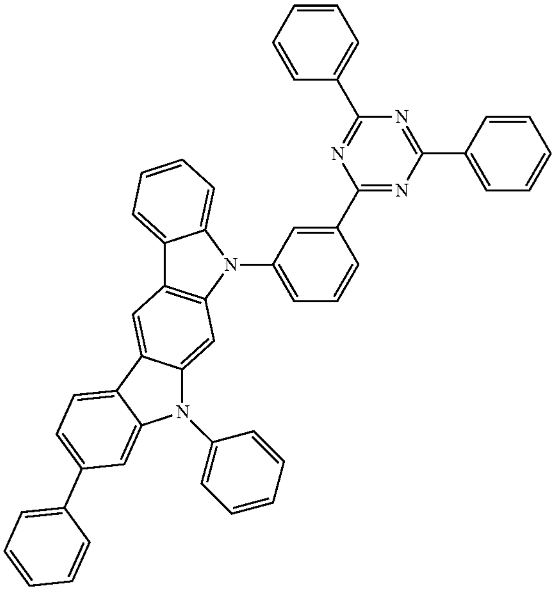
H-24
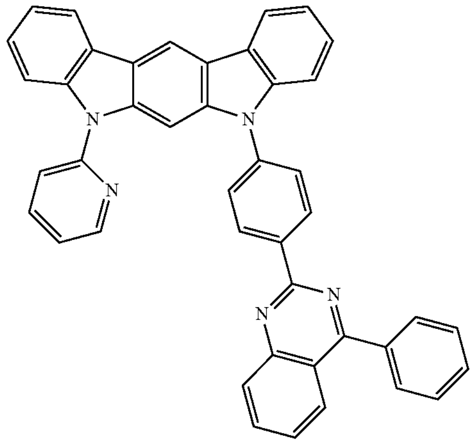
H-25
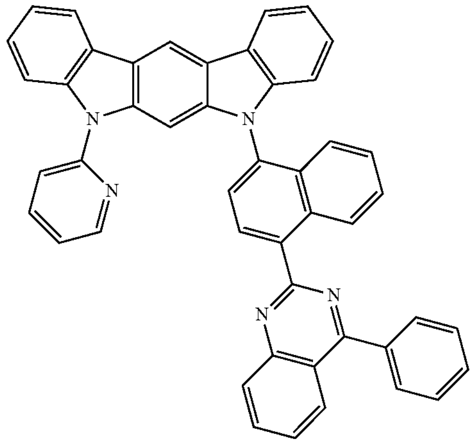

-continued
H-26
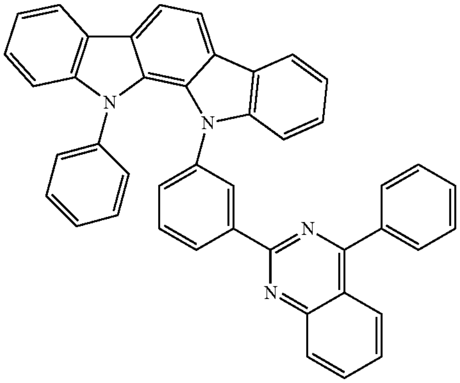
H-31
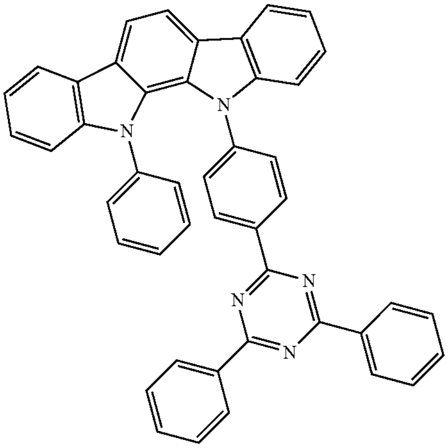
H-33
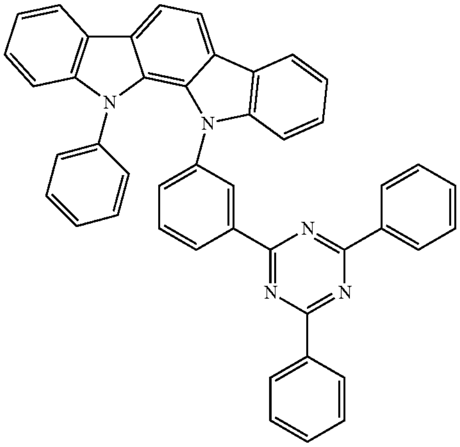
-continued
H-36
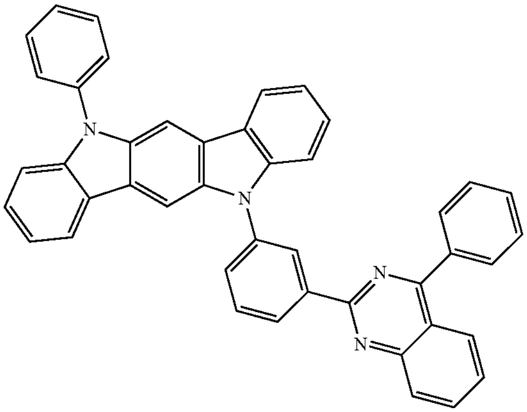
H-41
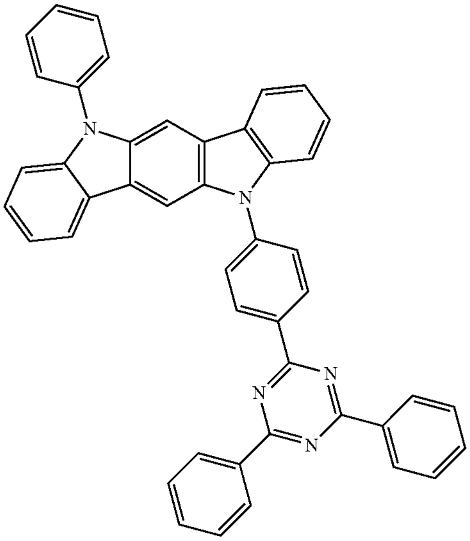
H-43
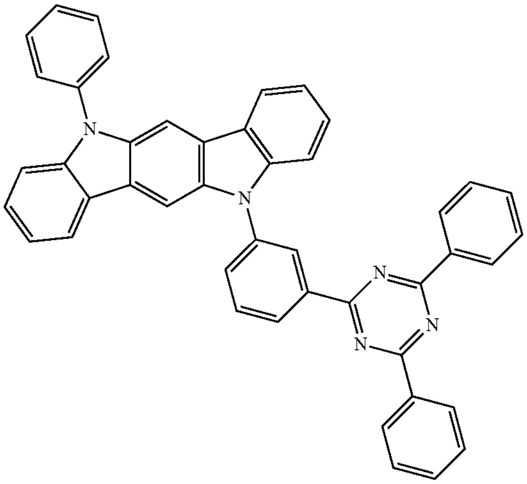

-continued
H-46
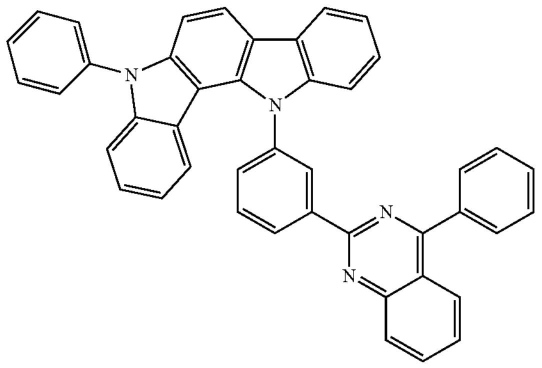
H-51
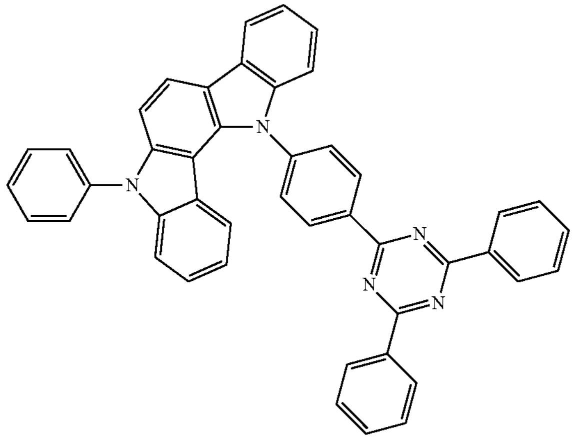
H-53
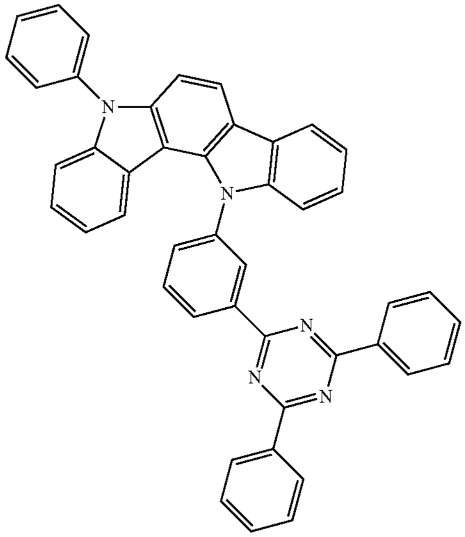
-continued
H-57
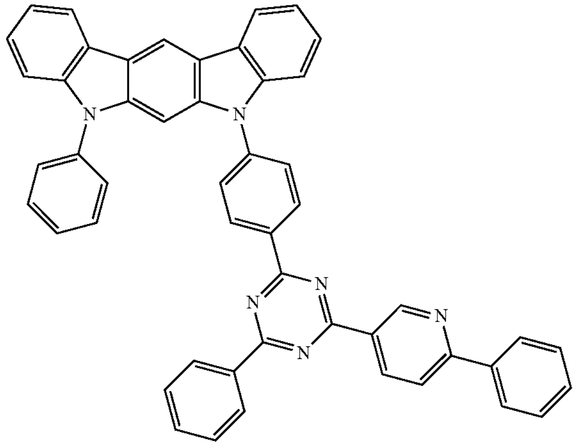
H-58
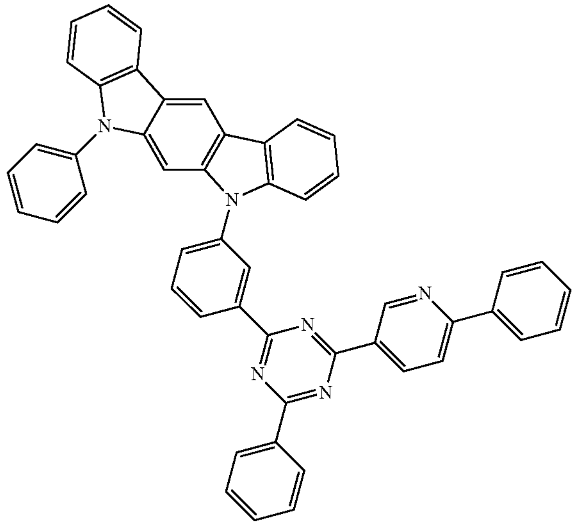
H-59
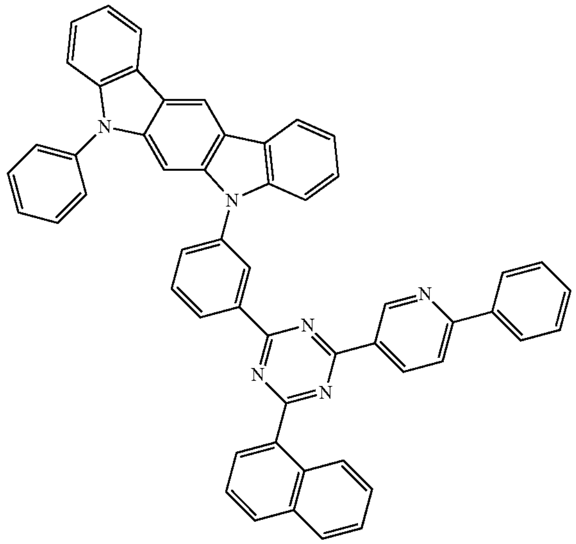

-continued
H-60
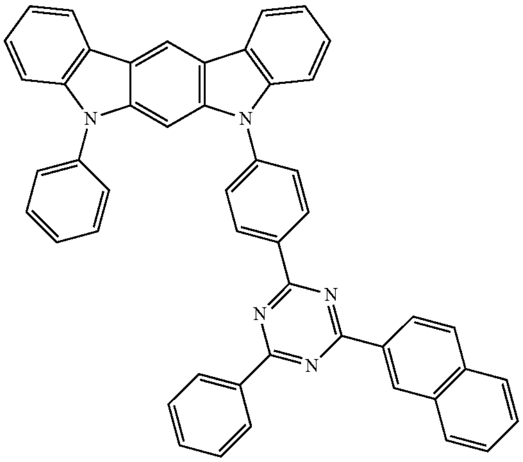
H-61
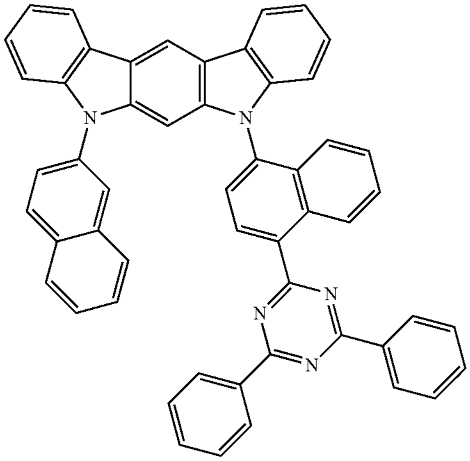
-continued
and
H-62
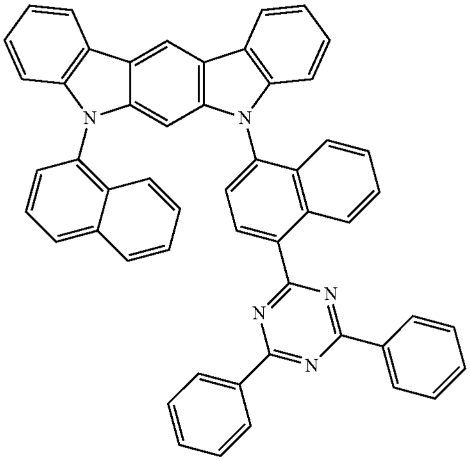
.
6. The organic electroluminescent device according to claim 1, wherein the hole transport zone comprises a hole transport layer, and further comprises at least one layer of a hole injection layer, an electron blocking layer, and a hole auxiliary layer.
* * * * *